US012690384B2

(12) United States Patent
Kim et al.

(10) Patent No.: US 12,690,384 B2
(45) Date of Patent: Jul. 21, 2026

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Minje Kim, Yongin-si (KR); Mieun Jun, Yongin-si (KR); Changwoong Chu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1071 days.

(21) Appl. No.: 17/842,448

(22) Filed: Jun. 16, 2022

(65) Prior Publication Data

US 2023/0165143 A1 May 25, 2023

(30) Foreign Application Priority Data

Nov. 4, 2021 (KR) ........................ 10-2021-0150855

(51) Int. Cl.

*H10K 85/60* (2023.01)
*H10K 50/15* (2023.01)
*H10K 50/16* (2023.01)
*H10K 59/123* (2023.01)

(52) U.S. Cl.

CPC ..... *H10K 85/6572* (2023.02); *H10K 85/6574* (2023.02); *H10K 85/6576* (2023.02); *H10K 50/15* (2023.02); *H10K 50/16* (2023.02); *H10K 59/123* (2023.02)

(58) Field of Classification Search

CPC ...... H10K 50/15; H10K 50/16; H10K 50/156; H10K 50/166; H10K 2101/27

See application file for complete search history.

(56) References Cited

U.S. PATENT DOCUMENTS

| | | | | | |
|---|---|---|---|---|---|
| 5,925,980 | A * | 7/1999 | So | H10K 50/14 | 313/506 |
| 6,614,175 | B2 * | 9/2003 | Aziz | H10K 50/11 | 313/504 |
| 8,310,147 | B2 * | 11/2012 | Seo | H10K 50/11 | 313/507 |
| 8,853,680 | B2 * | 10/2014 | Yamazaki | H10K 85/6572 | 438/82 |
| 2005/0194892 | A1 * | 9/2005 | Lu | H10K 50/11 | 313/504 |
| 2014/0217392 | A1 * | 8/2014 | Hong | H10K 85/654 | 257/40 |
| 2015/0155511 | A1 * | 6/2015 | Ohsawa | H10K 50/131 | 257/40 |
| 2016/0293846 | A1 * | 10/2016 | Lee | H10K 85/6576 | |

(Continued)

FOREIGN PATENT DOCUMENTS

| | | | |
|---|---|---|---|
| JP | 2007-042875 | A | 2/2007 |
| KR | 10-2019-0083020 | A | 7/2019 |

(Continued)

*Primary Examiner* — Michael M Dollinger

(74) *Attorney, Agent, or Firm* — Womble Bond Dickinson (US) LLP

(57) ABSTRACT

A light-emitting device in which an interlayer includes a contact layer including an electron-transporting host and a hole-transporting host is provided. The contact layer is in direct contact with an emission layer, and the emission layer includes a first dopant and a second dopant.

16 Claims, 2 Drawing Sheets

10

(56) References Cited

U.S. PATENT DOCUMENTS

| | | | | |
|---|---|---|---|---|
| 2019/0207118 | A1* | 7/2019 | Lee | C07D 251/24 |
| 2020/0308209 | A1* | 10/2020 | Yoon | C07F 15/0033 |
| 2021/0104682 | A1 | 4/2021 | Shin et al. | |
| 2021/0184135 | A1 | 6/2021 | Kim et al. | |
| 2021/0184152 | A1 | 6/2021 | Chu et al. | |

FOREIGN PATENT DOCUMENTS

| | | | |
|---|---|---|---|
| KR | 10-2020-0115890 | A | 10/2020 |
| KR | 10-2021-0041167 | A | 4/2021 |
| KR | 10-2021-0076220 | A | 6/2021 |
| KR | 10-2021-0077091 | A | 6/2021 |

* cited by examiner

LIGHT-EMITTING DEVICE AND ELECTRONIC APPARATUS INCLUDING THE SAME

CROSS-REFERENCE TO RELATED APPLICATION

This application claims priority to and the benefit of Korean Patent Application No. 10-2021-0150855, filed on Nov. 4, 2021, in the Korean Intellectual Property Office, the entire content of which is hereby incorporated by reference.

BACKGROUND

1. Field

One or more embodiments of the present disclosure relate to a light-emitting device and an electronic apparatus including the same.

2. Description of the Related Art

Light-emitting devices are self-emissive devices that, as compared with devices of the related art, have wide viewing angles, high contrast ratios, short response times, and excellent or suitable characteristics in terms of luminance, driving voltage, and response speed.

In an example, a light-emitting device may have a structure in which a first electrode is arranged on a substrate, and a hole transport region, an emission layer, an electron transport region, and a second electrode are sequentially formed on the first electrode. Holes provided from the first electrode move toward the emission layer through the hole transport region, and electrons provided from the second electrode move toward the emission layer through the electron transport region. Carriers, such as holes and electrons, recombine in the emission layer to produce light.

SUMMARY

Aspects of one or more embodiments of the present disclosure are directed toward a light-emitting device having improved (increased) efficiency and a long lifespan.

Additional aspects of embodiments of the present disclosure will be set forth in part in the description, which follows and, in part, will be apparent from the disclosure, or may be learned by practice of the presented embodiments of the disclosure.

According to one or more embodiments, a light-emitting device includes a first electrode, a second electrode facing the first electrode, and an interlayer arranged between the first electrode and the second electrode and including an emission layer (in the interlayer), wherein the interlayer includes a contact layer that includes an electron-transporting host and a hole-transporting host, the contact layer is in direct contact with the emission layer, and the emission layer includes a first dopant and a second dopant.

According to one or more embodiments, an electronic apparatus includes the light-emitting device.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
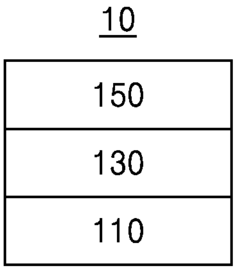
FIG. 1 is a schematic view of a light-emitting device according to an embodiment.

Reference will now be made in more detail to embodiments, examples of which are illustrated in the accompanying drawings, wherein like reference numerals refer to like elements throughout, and duplicative descriptions thereof may not be provided, the specification. In this regard, the present embodiments may have different forms and should not be construed as being limited to the descriptions set forth herein. Accordingly, the embodiments are merely described, by referring to the drawings, to explain aspects of embodiments of the present disclosure. As utilized herein, the term "and/or" includes any and all combinations of one or more of the same associated listed items. Throughout the disclosure, the expression "one of a, b, or c", "at least one of a, b or c", "one of a to c", or the like indicates only a, only b, only c, both a and b, both a and c, both b and c, all of a, b, and c, or variations thereof.

An aspect of an embodiment of the present disclosure provides a light-emitting device including:

a first electrode;

a second electrode facing the first electrode; and an interlayer arranged between the first electrode and the second electrode and including an emission layer (in the interlayer), wherein the interlayer includes a layer (e.g., a contact layer) that includes an electron-transporting host and a hole-transporting host, the layer is in direct contact with the emission layer, and the emission layer includes a first dopant and a second dopant.

In an embodiment, the first electrode may be an anode, and the second electrode may be a cathode, and the interlayer may further include a hole transport region that is arranged between the first electrode and the emission layer and includes a hole injection layer, a hole transport layer, or one or more combinations thereof.

In an embodiment, the first electrode may be an anode, and the second electrode may be a cathode, and the interlayer may further include an electron transport region that is arranged between the second electrode and the emission layer and includes an electron transport layer, an electron injection layer, or one or more combinations thereof.

In an embodiment, the emission layer may emit red light, green light, blue light, or white light, and for example, may emit blue light.

In an embodiment, the layer that is in contact with the emission layer and includes the electron-transporting host and the hole-transporting host may allow electrons and holes leaking toward the first electrode or the second electrode, respectively, to be utilized as excitons once more. Accordingly, luminescence efficiency of the light-emitting device may be improved (increased).

In some embodiments, the layer (e.g., contact layer) may suppress or reduce deterioration of the emission layer by reducing density of overcrowded excitons at the interface of an emission zone, thereby improving (increasing) a lifespan of the light-emitting device.

In an embodiment, the electron-transporting host and the hole-transporting host may both (e.g., simultaneously) have a $T_1$ energy level of greater than 2.8 eV.

When the electron-transporting host or the hole-transporting host has a $T_1$ energy level of 2.8 eV or less, the host itself may emit light, resulting in emission of undesired light. Consequently, the light-emitting device may have a decrease in efficiency.

In an embodiment, in the layer, an amount of the electron-transporting host may be greater than that of the hole-transporting host. For example, the layer may include (e.g., consist of) the electron-transporting host and the hole-transporting host, and the amount of the electron-transporting host may be greater than that of the hole-transporting host. For example, the amount of the electron-transporting host may be in a range of about 55 wt % to about 85 wt % based on 100 wt % of the total amounts of the electron-transporting host and the hole-transporting host. For example, the amount of the electron-transporting host may be in a range of about 60 wt % to about 70 wt % based on 100 wt % of the total amounts of the electron-transporting host and the hole-transporting host.

In this embodiment, the interlayer may further include an electron transport layer, and the interlayer may be in direct contact with the electron transport layer. The layer (e.g., contact layer) may serve to block or reduce holes and inject electrons, and as described above, may allow holes leaking toward the second electrode to be utilized as excitons once more. Accordingly, luminescence efficiency of the light-emitting device may be improved (increased).

The layer (e.g., contact layer) may have a thickness in a range of, for example, about 1 Å to about 1,000 Å, and for example, about 5 Å to about 100 Å. When the thickness of the layer is within the ranges above, the layer may have satisfactory (suitable) roles of blocking holes (e.g., the layer may suitably block and preserve the holes) without a substantial increase in driving voltage and injecting electrons, and thus the holes may be utilized as excitons once more.

In an embodiment, in the layer (e.g., contact layer), the amount of the hole-transporting host may be greater than that of the electron-transporting host. For example, the layer may include (e.g., consist of) the electron-transporting host and the hole-transporting host, and the amount of the hole-transporting host may be greater than that of the electron-transporting host. For example, the amount of the hole-transporting host may be in a range of about 55 wt % to about 85 wt % based on 100 wt % of the total amounts of the electron-transporting host and the hole-transporting host. For example, the amount of the hole-transporting host may be in a range of about 60 wt % to about 70 wt % based on 100 wt % of the total amounts of the electron-transporting host and the hole-transporting host.

In this embodiment, the interlayer may further include a hole transport layer, and the interlayer may be in direct contact with the hole transport layer. The layer may serve to block or reduce electrons and inject holes, and as described above, may allow electrons leaking toward the first electrode to be utilized as excitons once more. Accordingly, luminescence efficiency of the light-emitting device may be improved.

The layer (e.g., contact layer) may have a thickness in a range of, for example, about 1 Å to about 1,000 Å, and for example, about 5 Å to about 100 Å. When the thickness of the layer is within the ranges above, the layer may have satisfactory (suitable) roles of blocking electrons (e.g., the layer may suitably block and preserve the holes) without a substantial increase in driving voltage and injecting holes, and thus the electrons may be utilized as excitons once more.

In an embodiment, the layer may include the first layer and the second layer, and the interlayer may further include the electron transport layer and the hole transport layer,

- the first layer may include the electron-transporting host and the hole-transporting host, and the amount of the hole-transporting host may be greater than that of the electron-transporting host,
- the second layer may include the electron-transporting host and the hole-transporting host, and the amount of the electron-transporting host may be greater than that of the hole-transporting host,
- the first layer may be in direct contact with the hole transport layer, and
- the second layer may be in direct contact with the hole transport layer.

In this case, for example, the first layer may include (e.g., consist of) the electron-transporting host and the hole-transporting host, and the amount of the hole-transporting host may be greater than that of the electron-transporting host, and

- the second layer may include (e.g., consist of) the electron-transporting host and the hole-transporting host, and the amount of the electron-transporting host may be greater than that of the hole-transporting host.

For example, the amount of the hole-transporting host in the first layer may be in a range of about 55 wt % to about 85 wt % based on 100 wt % of the total amounts of the electron-transporting host and the hole-transporting host. For example, the amount of the hole-transporting host may be in a range of about 60 wt % to about 70 wt % based on 100 wt % of the total amounts of the electron-transporting host and the hole-transporting host.

For example, the amount of the electron-transporting host in the second layer may be in a range of about 55 wt % to about 85 wt % based on 100 wt % of the total amounts of the electron-transporting host and the hole-transporting host. For example, the amount of the electron-transporting host may be in a range of about 60 wt % to about 70 wt % based on 100 wt % of the total amounts of the electron-transporting host and the hole-transporting host.

The first layer may serve to block or reduce electrons and inject holes, and may allow electrons leaking toward the first electrode to be utilized as excitons once more. The second layer may serve to block or reduce holes and inject electrons, and may allow holes leaking toward the second electrode to be utilized as excitons once more. Accordingly, luminescence efficiency of the light-emitting device may be improved.

The first layer and the second layer may each independently have a thickness in a range of, for example, about 1 Å to about 1,000 Å, and for example, about 5 Å to about 100 Å.

When the thicknesses of the first layer and the second layer and the host amounts are satisfied within the ranges above, the layer may have satisfactory roles of blocking electrons or holes without a substantial increase in driving voltage, injecting holes or electrons, and utilizing electrons or holes as excitons once more.

In an embodiment, one of the first dopant or the second dopant may be a phosphorescent dopant, and the other of the first dopant or the second dopant may be a fluorescent dopant. For example, the first dopant may be a phosphorescent dopant, and the second dopant may be a fluorescent dopant. For example, the first dopant may be a fluorescent dopant, and the second dopant may be a phosphorescent dopant.

In an embodiment, in one of the first dopant or the second dopant, intersystem crossing (ISC) may occur more actively (frequently) than emission of light.

In an embodiment, one of the first dopant or the second dopant may be a phosphorescent dopant, and the other of the first dopant or the second dopant may be a fluorescent dopant, and in such a phosphorescent dopant, the ISC may occur more actively (frequently) than emission of light.

In an embodiment, the emission layer may include a first host, or may include both (e.g., simultaneously) a first host and a second host. The first host and the second host may each independently be identical to or different from the electron-transporting host and the hole-transporting host.

For example, the first dopant may be a phosphorescent dopant, and the ISC may occur more actively (frequently) than emission of light in such a phosphorescent dopant. Singlet excitons generated in the host may be transferred to the second dopant by the ICS.

For example, 50% or less of the phosphorescent dopant which is the first dopant may emit triplet excitons, whereas more than 50% of the same may transfer the energy from the first dopant to the second dopant through a Forster Resonance Energy Transfer (FRET) mechanism, a Dexter Energy Transfer (DEXT) mechanism, and/or the like. Singlet excitons generated in the first host (in the presence of a second host, singlet excitons generated in the second host and/or excitons generated in the first host and the second host) may be transferred to the fluorescent dopant which is the second dopant by the ISC.

In an embodiment, the fluorescent dopant may be a thermally activated delayed fluorescence dopant.

In an embodiment, an amount of each of the first dopant and the second dopant may be in a range of about 0.2 wt % to about 30 wt % based on the total amount of the hosts. A ratio of the first dopant to the second dopant may be a weight ratio in a range of about 1:99 to about 99:1. When the weight ratio of the first dopant to the second dopant is within the ranges above, operation of emission system passing through the ISC may be enhanced.

When the emission layer includes a first host and a second host, the first host and the second host may have a weight ratio in a range of about 1:9 to about 9:1. For example, the emission layer may include the first host and the second host at a weight ratio in a range of about 3:7 to about 7:3. When the weight ratio of the first host and the second host is within the ranges above, the hole transport may be in a desirable (suitable) balance with the electron transport.

The hosts and the dopants may be the same as described herein.

Another aspect of embodiments of the present disclosure provides an electronic apparatus including the light-emitting device.

In an embodiment, the electron apparatus may further include a thin-film transistor, wherein the thin-film transistor includes a source electrode and a drain electrode, and the first electrode of the light-emitting device may be electrically connected to either the source electrode of the thin-film transistor or the drain electrode of the thin-film transistor.

In an embodiment, the electronic apparatus may further include a color filter, a color conversion layer, a touch screen layer, a polarizing layer, or one or more combinations thereof.

The term "interlayer" as utilized herein refers to a single layer and/or all of a plurality of layers arranged between the first electrode and the second electrode of the light-emitting device.

Description of FIG. 1

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described with reference to FIG. 1.

First Electrode 110

In FIG. 1, a substrate may be additionally arranged under the first electrode 110 or above the second electrode 150. In an embodiment, as the substrate, a glass substrate and/or a plastic substrate may be utilized. In one or more embodiments, the substrate may be a flexible substrate, and for example, may include plastics with excellent or suitable heat resistance and durability, such as polyimide, polyethylene terephthalate (PET), polycarbonate, polyethylene napthalate, polyarylate (PAR), polyetherimide, or one or more combinations thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. In an embodiment, when the first electrode 110 is a transmissive electrode, a material for forming the first electrode 110 may include indium tin oxide (ITO), indium zinc oxide (IZO), tin oxide ($SnO_2$), zinc oxide (ZnO), or one or more combinations thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or one or more combinations thereof.

The first electrode 110 may have a single-layered structure including (e.g., consisting) of a single layer or a multi-layered structure including a plurality of layers. For example, the first electrode 110 may have a three-layered structure of ITO/Ag/ITO.

Interlayer 130

The interlayer 130 is arranged on the first electrode 110. The interlayer 130 may include an emission layer.

The interlayer 130 may further include a hole transport region between the first electrode 110 and the emission layer, and an electron transport region between the emission layer and the second electrode 150.

The interlayer 130 may further include, in addition to one or more suitable organic materials, a metal-containing compound, such as an organometallic compound, an inorganic material, such as a quantum dot, and/or the like.

In one or more embodiments, the interlayer 130 may include i) two or more emission layers sequentially stacked between the first electrode 110 and the second electrode 150 and ii) a charge generation layer arranged between the two or more emission layers. When the interlayer 130 includes the emission layer and the charge generation layer as described above, the light-emitting device 10 may be a tandem light-emitting device.

Hole Transport Region in Interlayer 130

The hole transport region may have: i) a single-layered structure including (e.g., consisting of) a single layer including (e.g., consisting of) a single material; ii) a single-layered structure including (e.g., consisting of) a single layer including (e.g., consisting of) a plurality of different materials; or iii) a multi-layered structure including a plurality of layers including different materials.

The hole transport region may include a hole injection layer, a hole transport layer, an emission auxiliary layer, an electron blocking layer, or one or more combinations thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein constituent layers of each structure are stacked sequentially from the first electrode 110.

The hole transport region may include a compound represented by Formula 201, a compound represented by Formula 202, or a combination thereof:

Formula 201

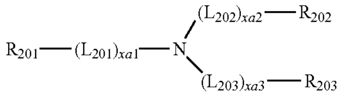

Formula 202

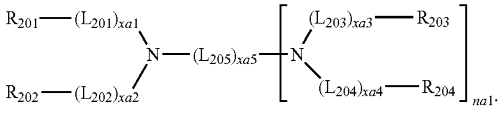

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one of the groups represented by Formulae CY201 to CY217:

CY201

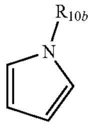

CY202

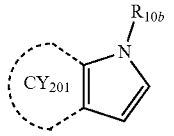

CY203

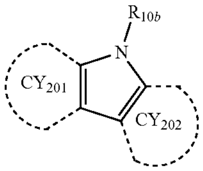

CY204

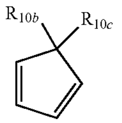

CY205

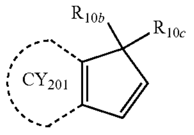

CY206

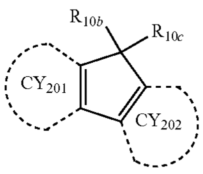

-continued

CY207

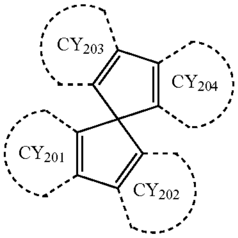

CY208

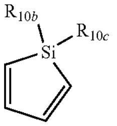

CY209

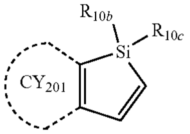

CY210

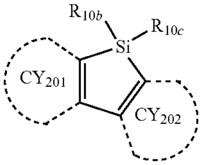

CY211

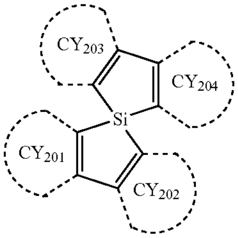

CY212

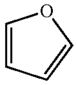

CY213

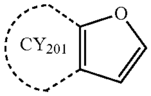

CY214

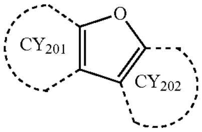

CY215

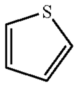

-continued

CY216

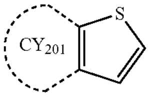

CY217

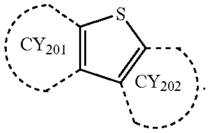

In Formulae CY201 to CY217, $R_{10b}$ and $R_{10c}$ may each be the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In one or more embodiments, ring CY201 to ring CY204 in Formulae CY201 to CY217 may each independently be a benzene group, a naphthalene group, a phenanthrene group, or an anthracene group.

In one or more embodiments, each of Formulae 201 and 202 may include at least one of the groups represented by Formulae CY201 to CY203.

In one or more embodiments, Formula 201 may include at least one of the groups represented by Formulae CY201 to CY203 and at least one of groups represented by Formulae CY204 to CY217.

In one or more embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include (e.g., may exclude) the groups represented by Formulae CY201 to CY203.

In one or more embodiments, each of Formulae 201 and 202 may not include (e.g., may exclude) the groups represented by Formulae CY201 to CY203, and may include at least one of the groups represented by Formulae CY204 to CY217.

In one or more embodiments, each of Formulae 201 and 202 may not include (e.g., may exclude) the groups represented by Formulae CY201 to CY217.

For example, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or one or more combinations thereof:

HT1
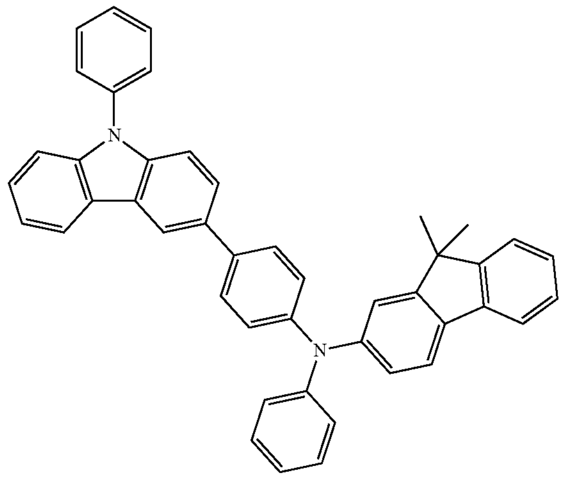
HT2
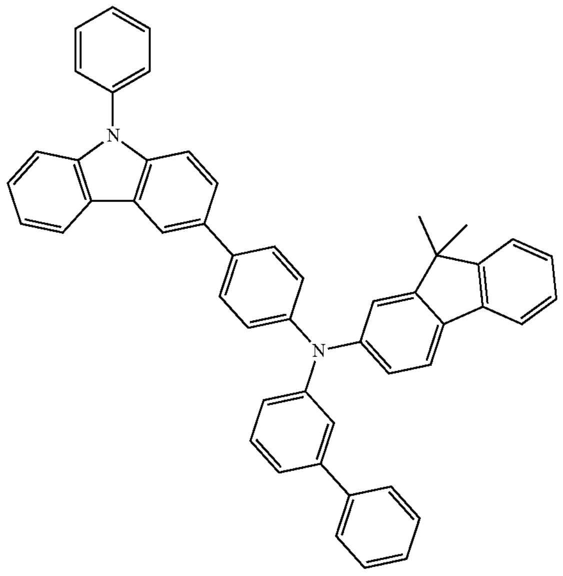
HT3
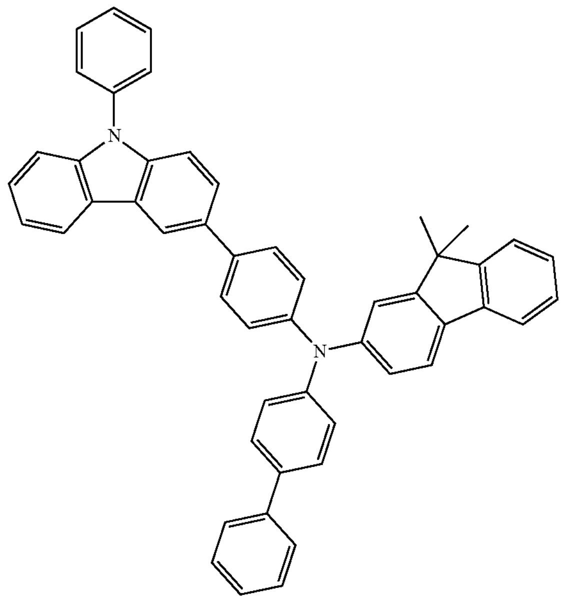
HT4
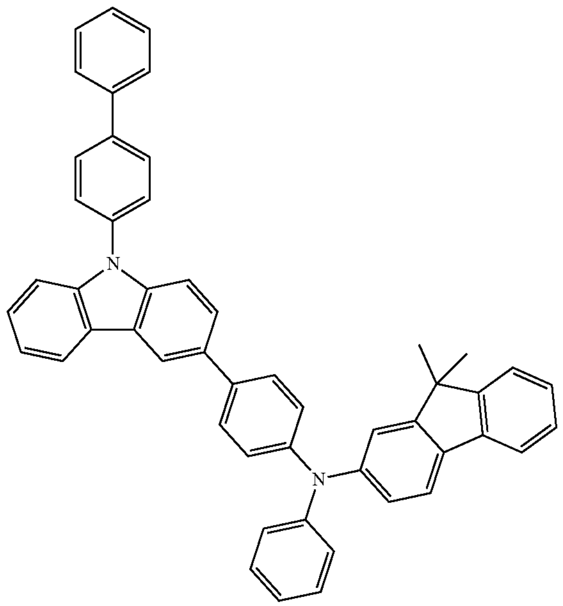

-continued
HT5
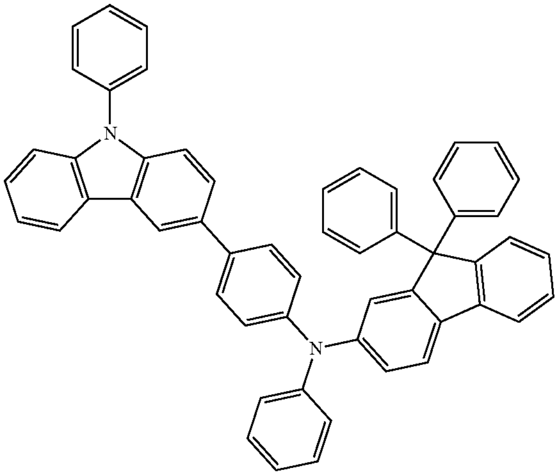
HT6
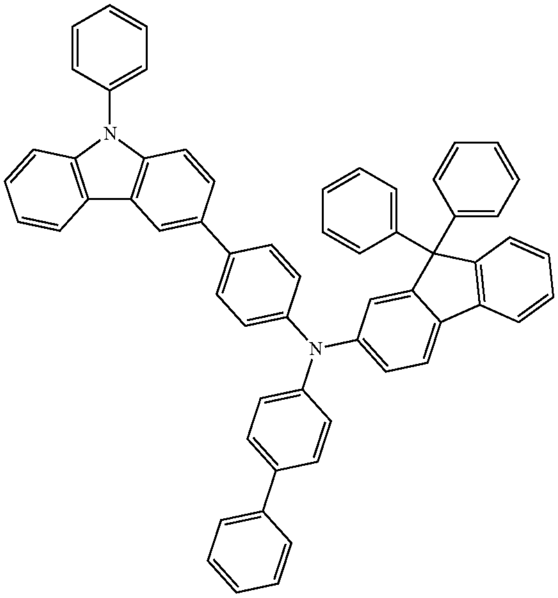
HT7
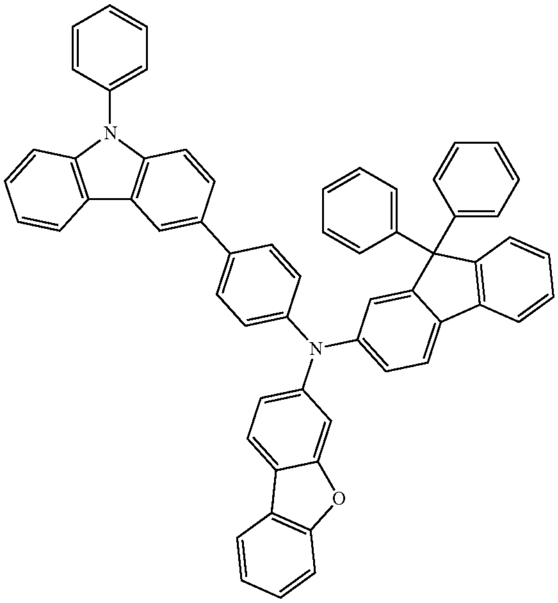
HT8
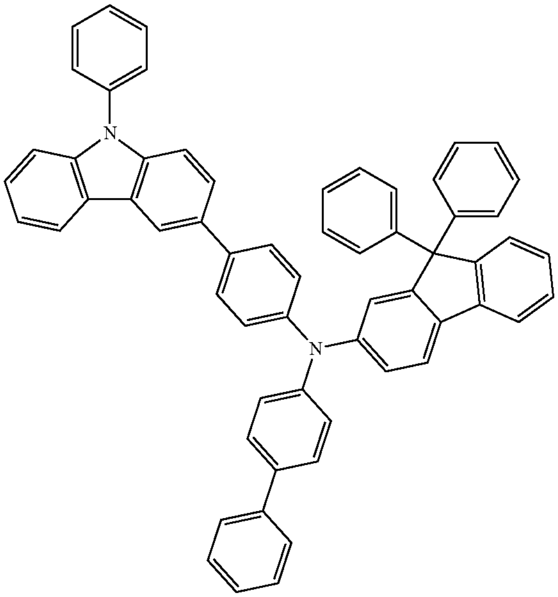

-continued
HT9
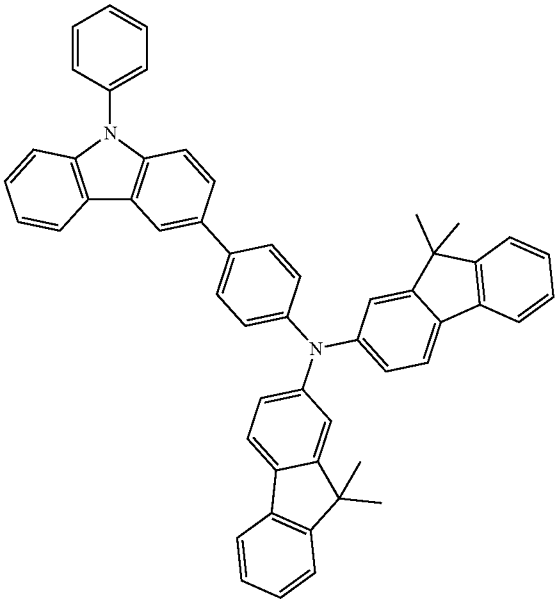
HT10
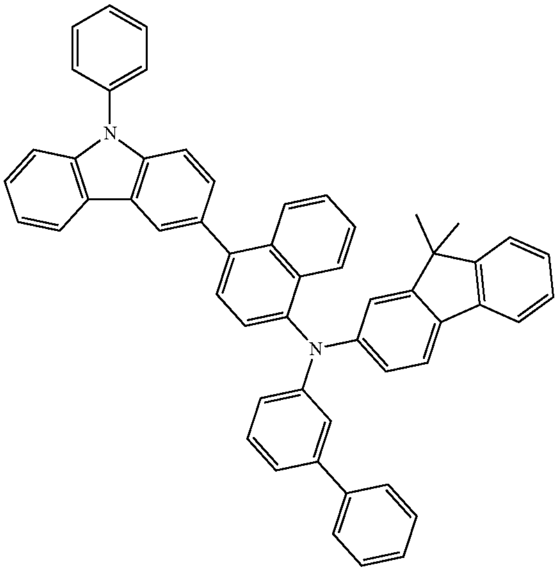
HT11
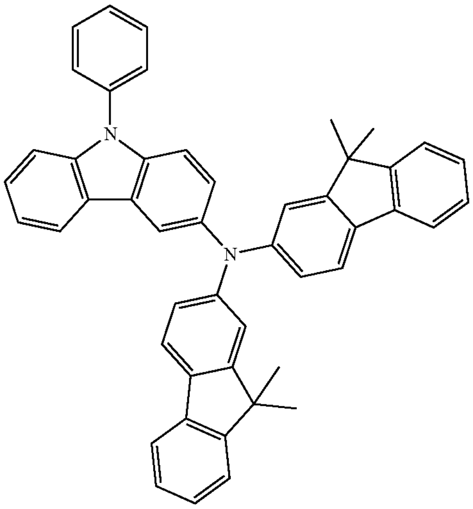
HT12
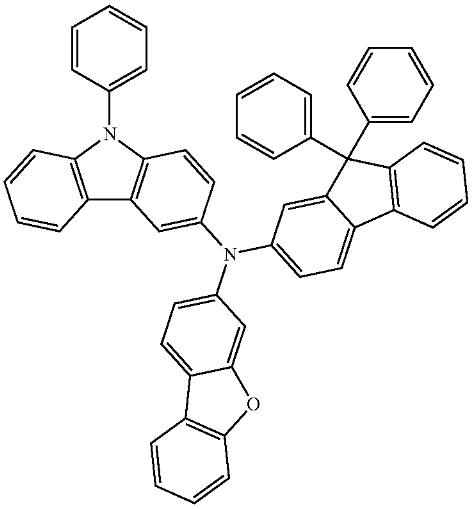

-continued
HT13
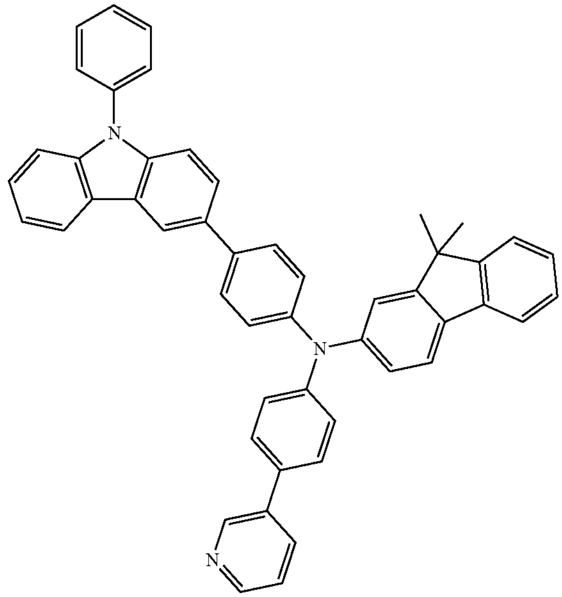
HT14
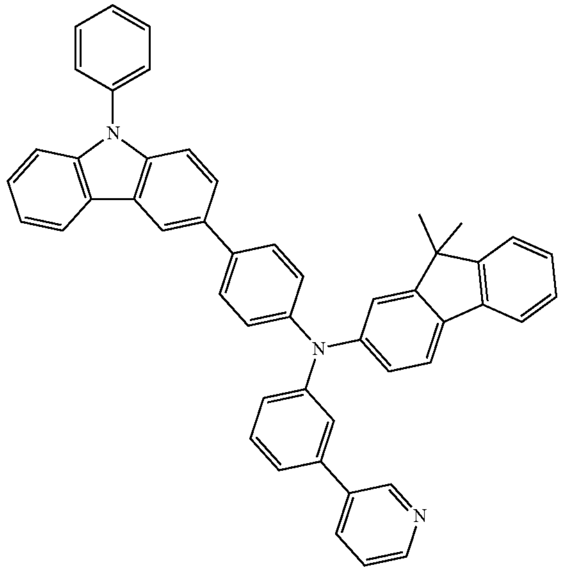
HT15
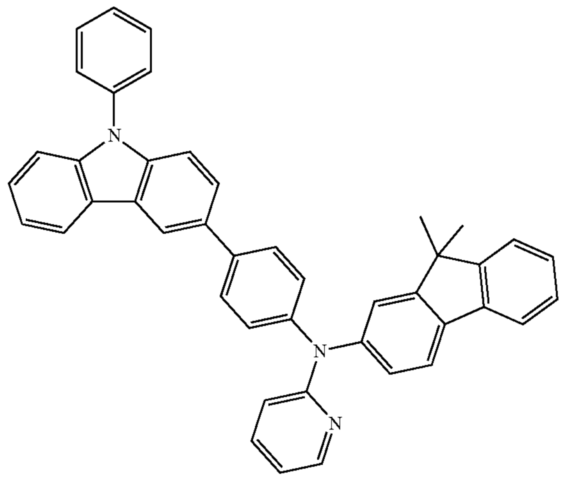
HT16
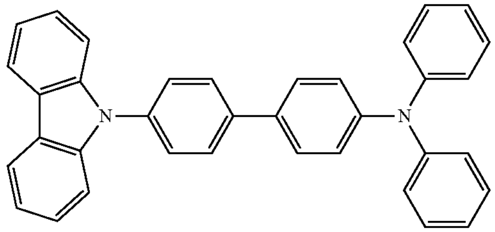
HT17
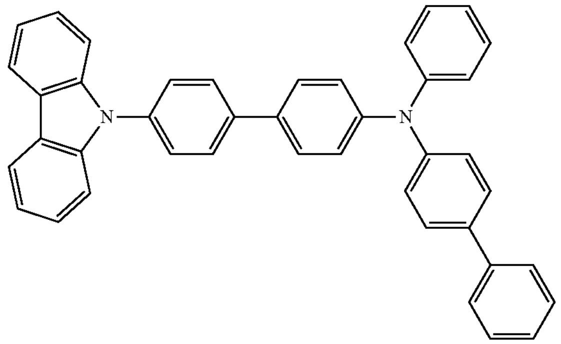
HT18
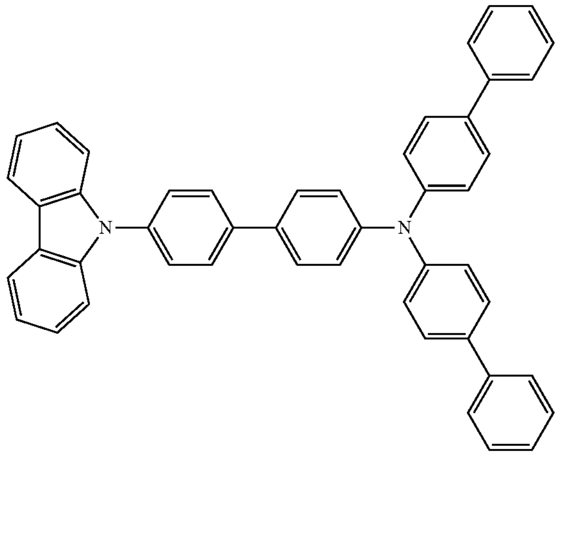

-continued
HT19
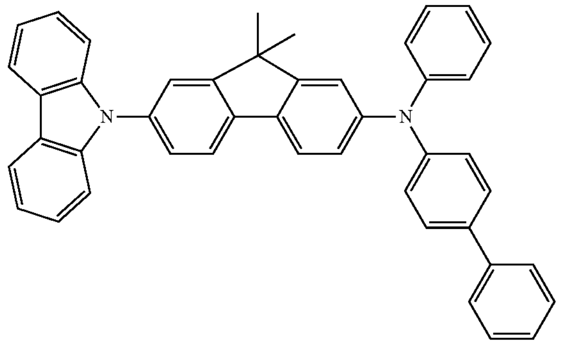
HT20
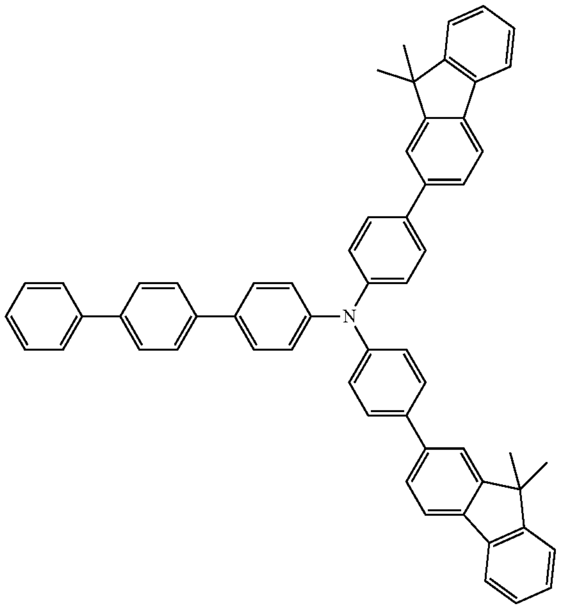
HT21
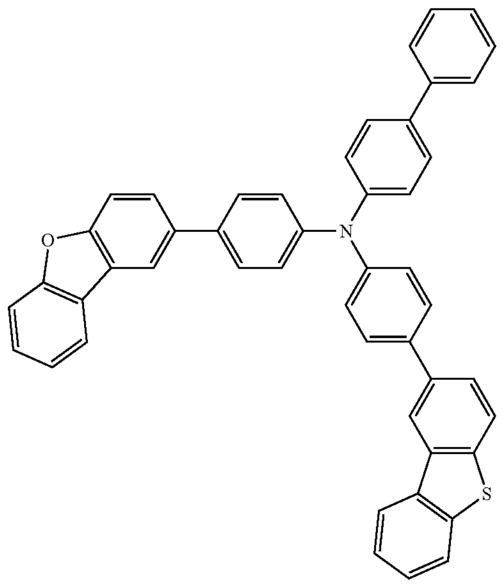
HT22
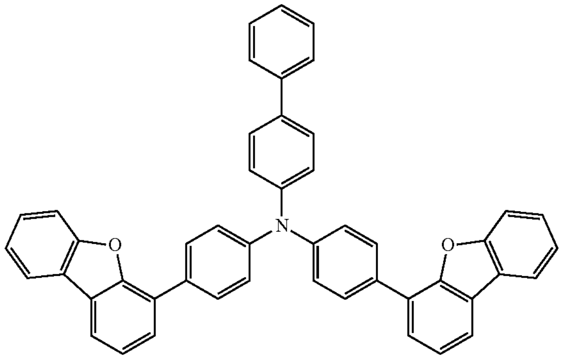

-continued
HT23
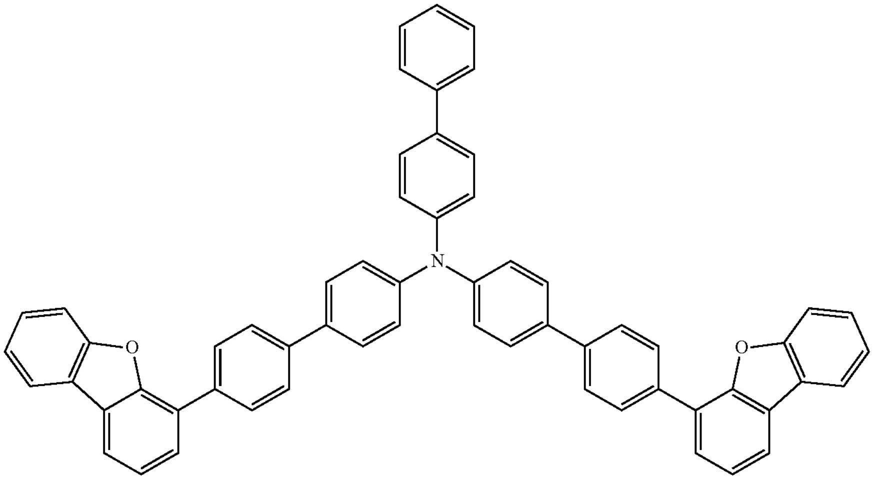
H24
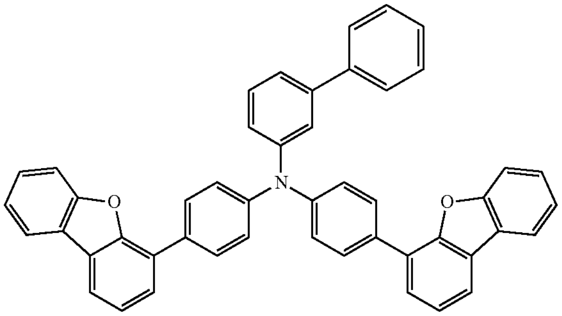
HT25
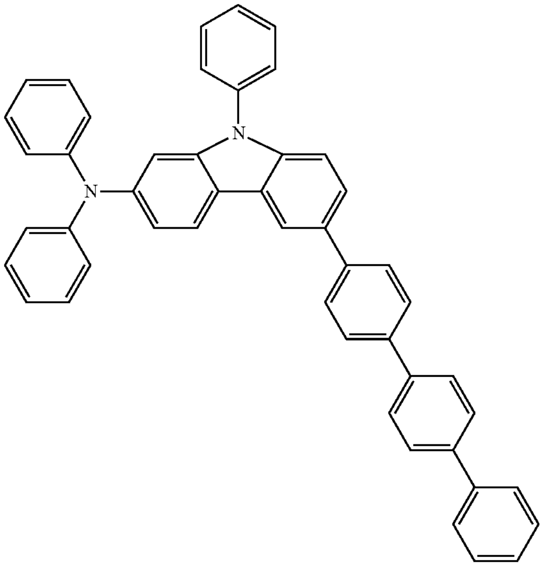
HT26
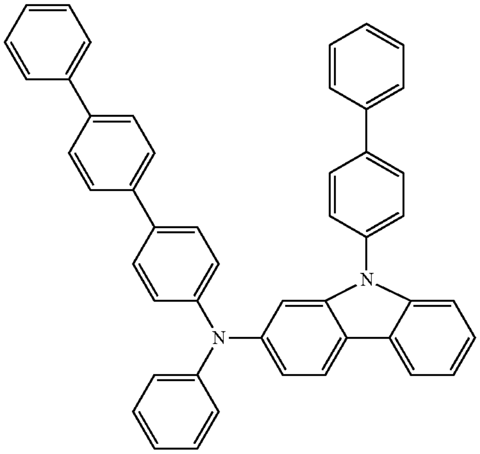
HT27
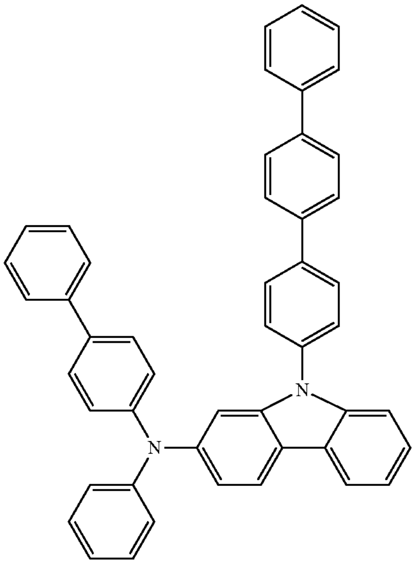

-continued
HT28
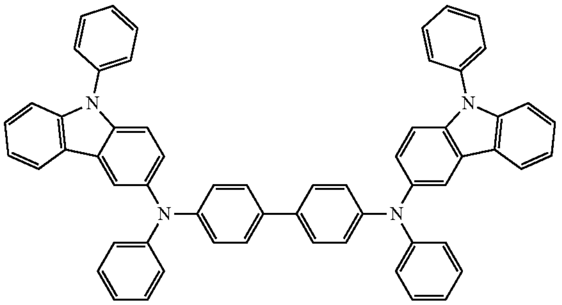
HT29
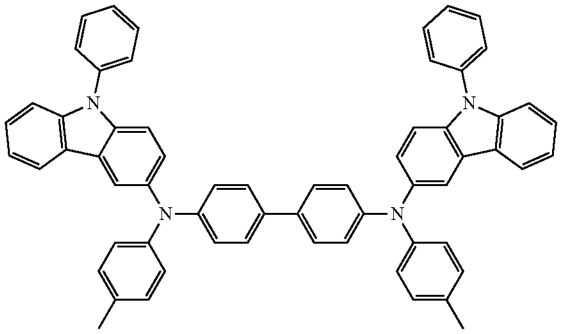
HT30
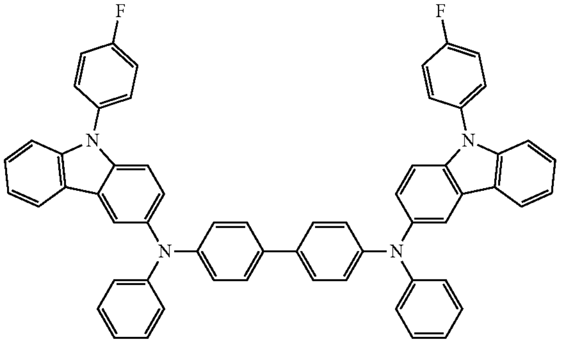
HT31
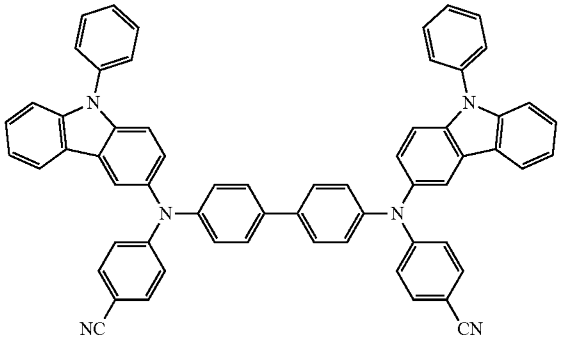
HT32
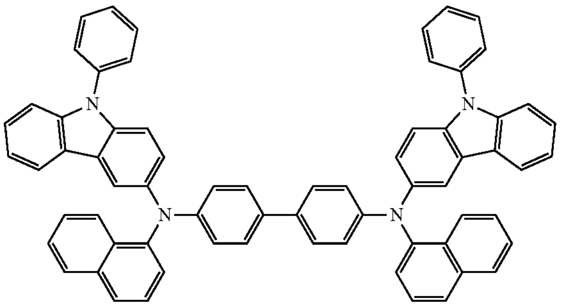
HT33
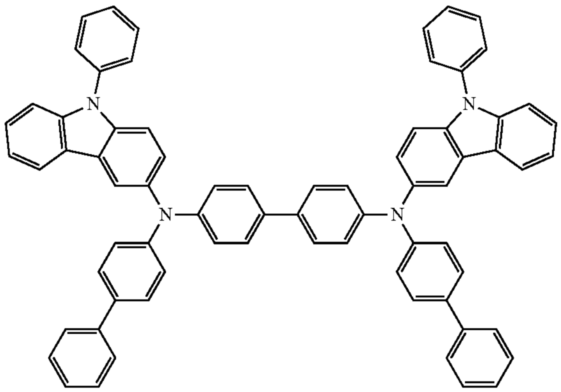
HT34
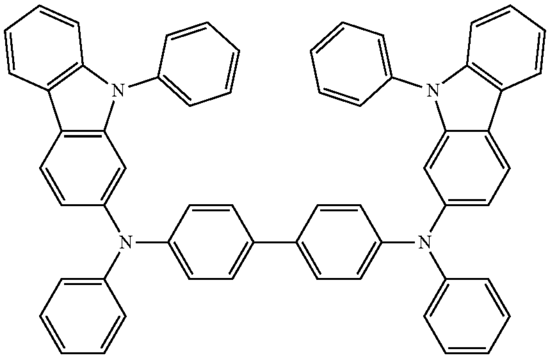
HT35
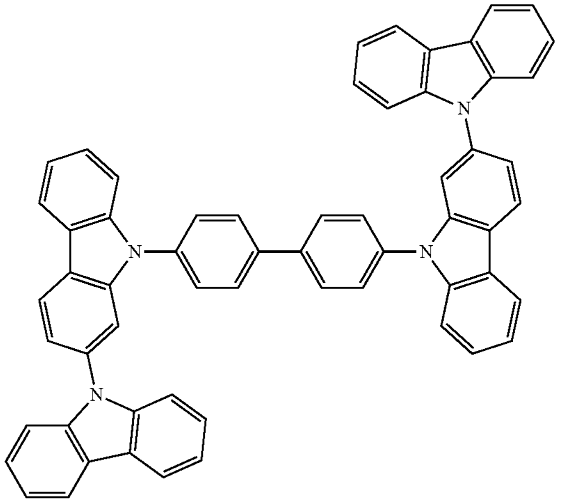

-continued
HT36
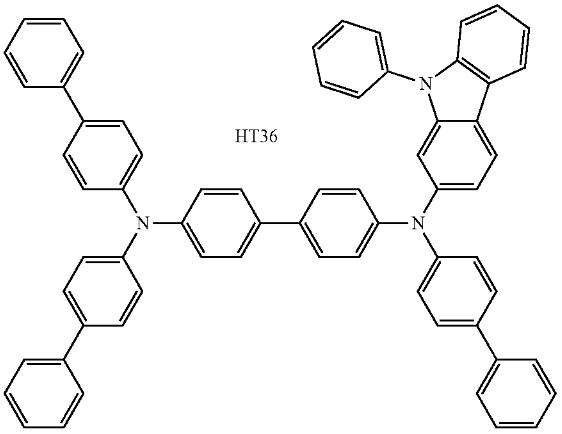
HT36
HT37
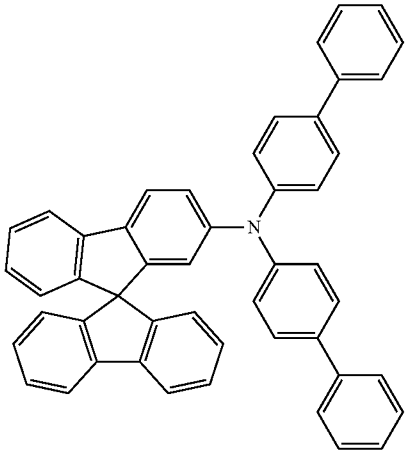
HT38
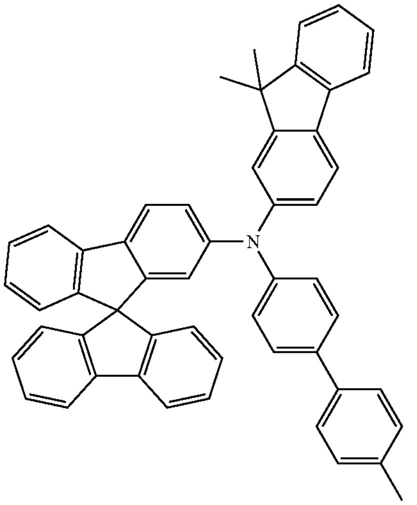
HT39
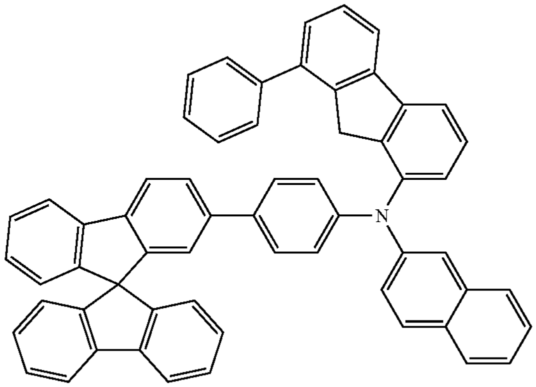
HT40
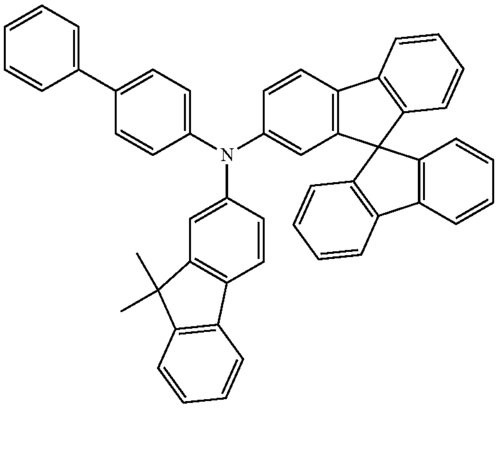
HT41
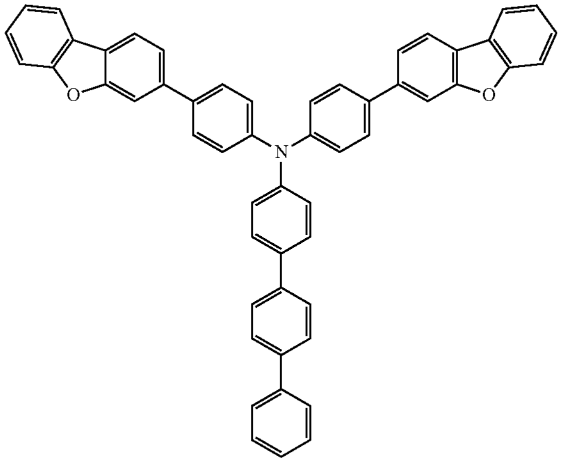

-continued
HT42
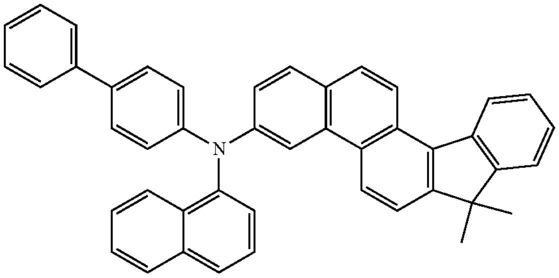
HT43
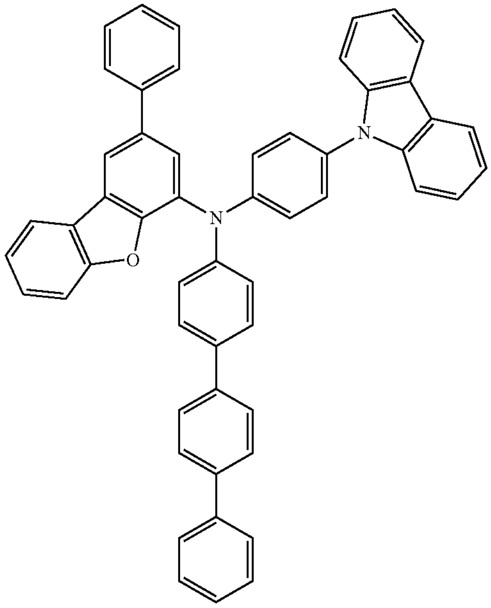
HT44
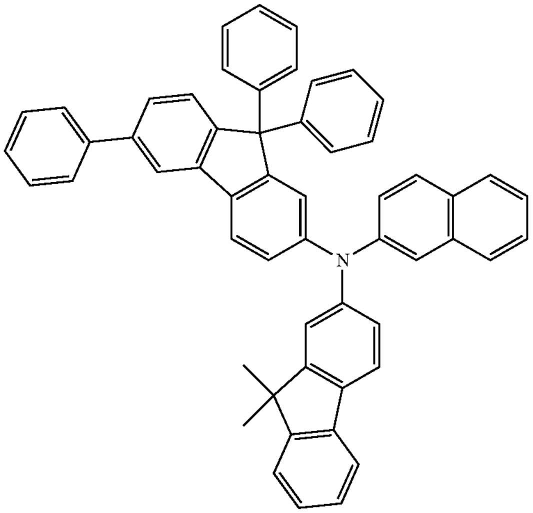
HT45
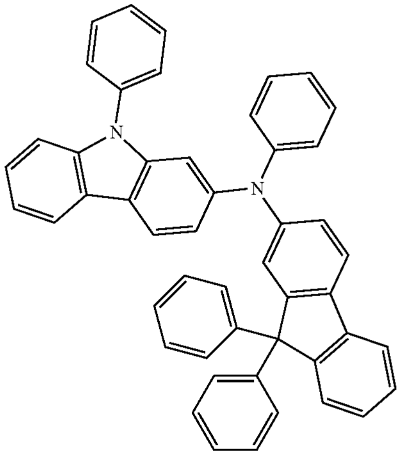

-continued
HT46
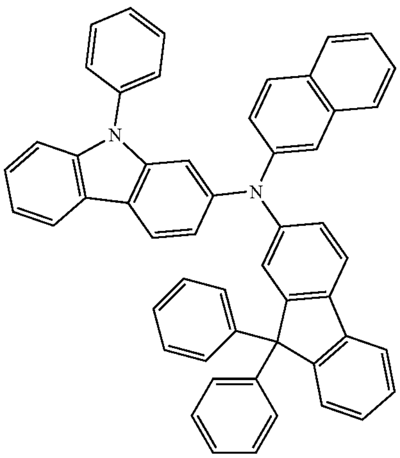
m-MTDATA
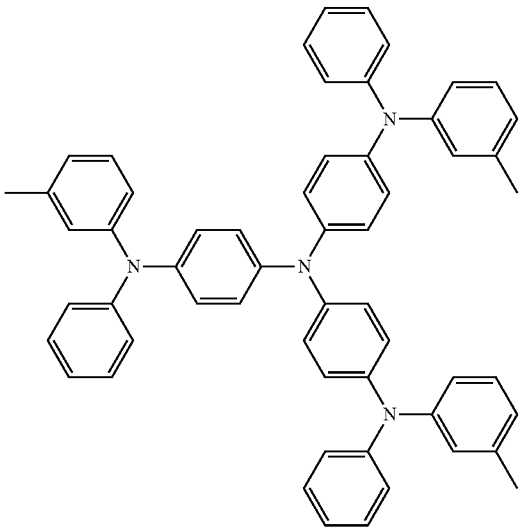
TDATA
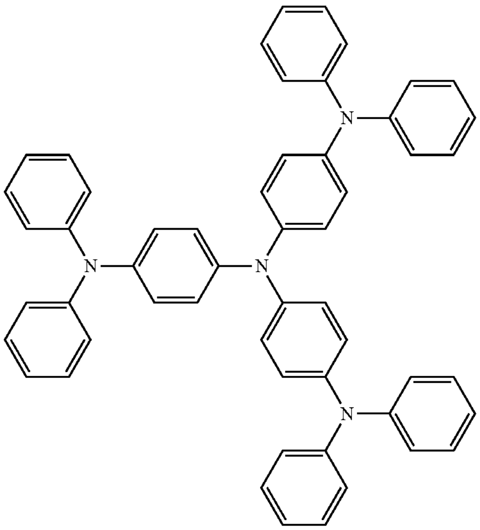
2-TNATA
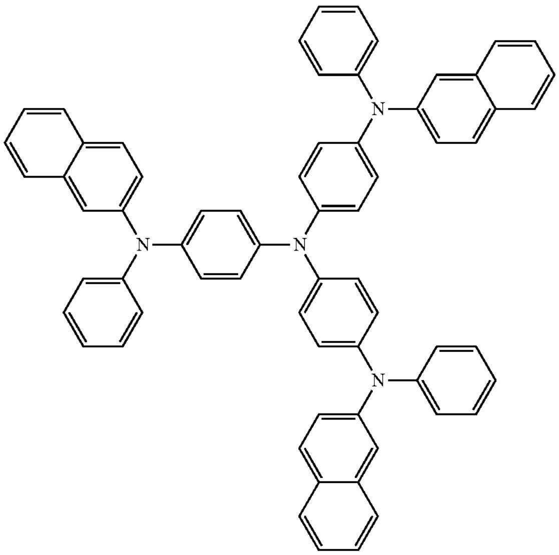
NPB
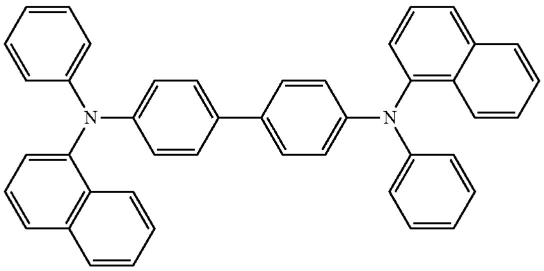
β-NPB
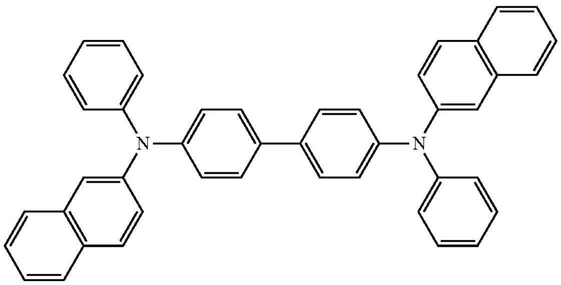

-continued

TPD

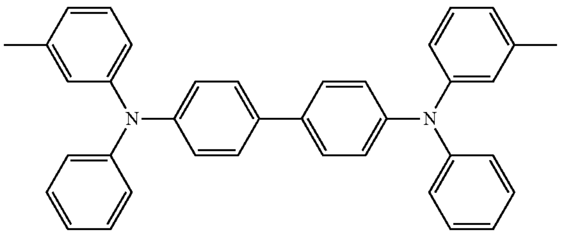

Spiro-TPD

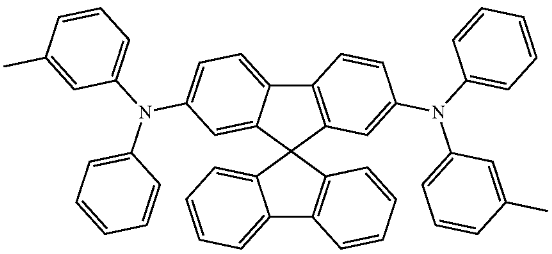

Spiro-NPB

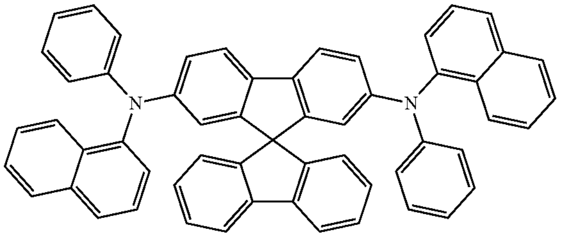

methylated-NPB

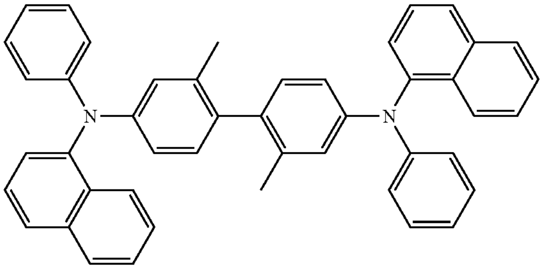

TAPC

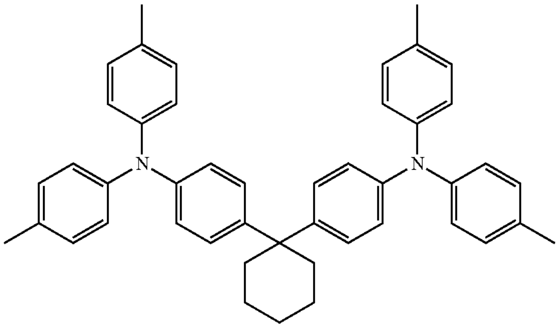

HMTPD

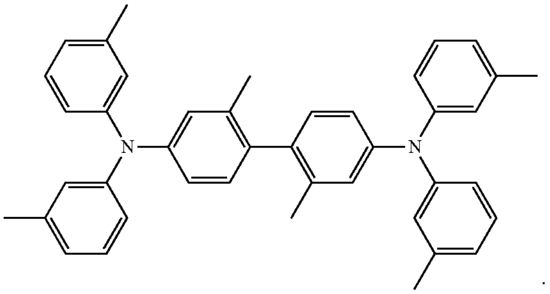

A thickness of the hole transport region may be in a range of about 50 Å to about 10,000 Å, for example, about 100 Å to about 4,000 Å. When the hole transport region includes a hole injection layer, a hole transport layer, or a combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory (suitable) hole transporting characteristics may be obtained without a substantial increase in driving voltage.

The emission auxiliary layer may increase light-emission efficiency by compensating for an optical resonance distance according to the wavelength of light emitted from the emission layer, and the electron-blocking layer may block or reduce the leakage of electrons from the emission layer to the hole transport region. Materials that may be included in the hole transport region may be included in the emission auxiliary layer and/or the electron-blocking layer.

p-Dopant

The hole transport region may further include, in addition to the materials described above, a charge-generation material for the improvement of conductive properties. The charge-generation material may be substantially uniformly or non-uniformly dispersed in the hole transport region (for example, in the form of a single layer including (e.g., consisting of) a charge-generation material).

The charge-generation material may be, for example, a p-dopant.

For example, the p-dopant may have a lowest unoccupied molecular orbital (LUMO) energy level of about −3.5 eV or less.

In an embodiment, the p-dopant may include a quinone derivative, a cyano group-containing compound, a compound including element EL1 and element EL2, or one or more combinations thereof.

Examples of the quinone derivative are TCNQ, F4-TCNQ, and/or the like.

Examples of the cyano group-containing compound are HAT-CN, a compound represented by Formula 221, and/or the like:

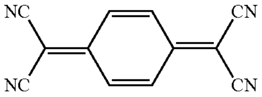

TCNQ

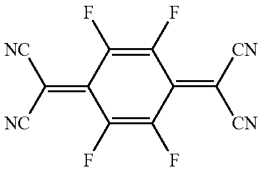

F4-TCNQ

-continued

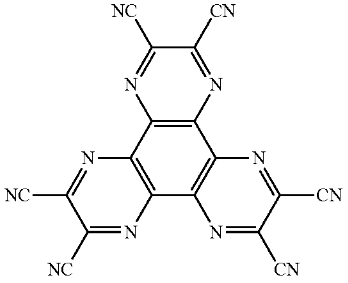

HAT-CN

Formula 221

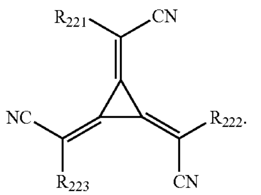

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or one or more combinations thereof.

In the compound including element EL1 and element EL2, element EL1 may be metal, metalloid, or a combination thereof, and element EL2 may be non-metal, metalloid, or a combination thereof.

Examples of the metal are an alkali metal (for example, lithium (Li), sodium (Na), potassium (K), rubidium (Rb), cesium (Cs), and/or the like); alkaline earth metal (for example, beryllium (Be), magnesium (Mg), calcium (Ca), strontium (Sr), barium (Ba), and/or the like); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); post-transition metal (for example, zinc (Zn), indium (In), tin (Sn), and/or the like); lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or the like); and/or the like.

Examples of the metalloid are silicon (Si), antimony (Sb), tellurium (Te), and/or the like.

Examples of the non-metal are oxygen (O), halogen (for example, F, Cl, Br, I, and/or the like), and/or the like.

Examples of the compound including element EL1 and element EL2 are metal oxide, metal halide (for example, metal fluoride, metal chloride, metal bromide, metal iodide, and/or the like), metalloid halide (for example, metalloid fluoride, metalloid chloride, metalloid bromide, metalloid iodide, and/or the like), metal telluride, or one or more combinations thereof.

Examples of the metal oxide are tungsten oxide (for example, WO, $W_2O_3$, $WO_2$, $WO_3$, $W_2O_5$, and/or the like), vanadium oxide (for example, VO, $V_2O_3$, $VO_2$, $V_2O_5$, and/or the like), molybdenum oxide (MoO, $Mo_2O_3$, $MoO_2$, $MoO_3$, $Mo_2O_5$, and/or the like), rhenium oxide (for example, $ReO_3$ and/or the like), and/or the like.

Examples of the metal halide are alkali metal halide, alkaline earth metal halide, transition metal halide, post-transition metal halide, lanthanide metal halide, and/or the like.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, CsI, and/or the like.

Examples of the alkaline earth metal halide are $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $Mg_{12}$, $CaI_2$, $SrI_2$, $BaI_2$, and/or the like.

Examples of the transition metal halide are titanium halide (for example, $TiF_4$, $TiCl_4$, $TiBr_4$, $TiI_4$, and/or the like), zirconium halide (for example, $ZrF_4$, $ZrCl_4$, $ZrBr_4$, $ZrI_4$, and/or the like), hafnium halide (for example, $HfF_4$, $HfCl_4$, $HfBr_4$, $Hfl_4$, and/or the like), vanadium halide (for example, $VF_3$, $VCl_3$, $VBr_3$, $VI_3$, and/or the like), niobium halide (for example, $NbF_3$, $NbCl_3$, $NbBr_3$, $NbI_3$, and/or the like), tantalum halide (for example, $TaF_3$, $TaCl_3$, $TaBr_3$, $TaI_3$, and/or the like), chromium halide (for example, $CrF_3$, $CrCl_3$, $CrBr_3$, $CrI_3$, and/or the like), molybdenum halide (for example, $MoF_3$, $MoCl_3$, $MoBr_3$, $MoI_3$, and/or the like), tungsten halide (for example, $WF_3$, $WCl_3$, $WBr_3$, $WI_3$, and/or the like), manganese halide (for example, $MnF_2$, $MnCl_2$, $MnBr_2$, $MnI_2$, and/or the like), technetium halide (for example, $TcF_2$, $TcCl_2$, $TcBr_2$, $TcI_2$, and/or the like), rhenium halide (for example, $ReF_2$, $ReCl_2$, $ReBr_2$, $ReI_2$, and/or the like), iron halide (for example, $FeF_2$, $FeCl_2$, $FeBr_2$, $FeI_2$, and/or the like), ruthenium halide (for example, $RuF_2$, $RuCl_2$, $RuBr_2$, $RuI_2$, and/or the like), osmium halide (for example, $OsF_2$, $OsCl_2$, $OsBr_2$, $OsI_2$, and/or the like), cobalt halide (for example, $CoF_2$, $CoCl_2$, $CoBr_2$, $CoI_2$, and/or the like), rhodium halide (for example, $RhF_2$, $RhCl_2$, $RhBr_2$, $RhI_2$, and/or the like), iridium halide (for example, $IrF_2$, $IrCl_2$, $IrBr_2$, $IrI_2$, and/or the like), nickel halide (for example, $NiF_2$, $NiCl_2$, $NiBr_2$, $NiI_2$, and/or the like), palladium halide (for example, $PdF_2$, $PdCl_2$, $PdBr_2$, $PdI_2$, and/or the like), platinum halide (for example, $PtF_2$, $PtCl_2$, $PtBr_2$, $PtI_2$, and/or the like), copper halide (for example, CuF, CuCl, CuBr, CuI, and/or the like), silver halide (for example, AgF, AgCl, AgBr, AgI, and/or the like), gold halide (for example, AuF, AuCl, AuBr, AuI, and/or the like), and/or the like.

Examples of the post-transition metal halide are zinc halide (for example, $ZnF_2$, $ZnCl_2$, $ZnBr_2$, $ZnI_2$, and/or the like), indium halide (for example, $InI_3$ and/or the like), tin halide (for example, $SnI_2$ and/or the like), and/or the like.

Examples of the lanthanide metal halide are YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, $SmI_3$, and/or the like.

Examples of the metalloid halide are antimony halide (for example, $SbCl_5$ and/or the like) and/or the like.

Examples of the metal telluride are alkali metal telluride (for example, $Li_2Te$, a $na_2Te$, $K_2Te$, $Rb_2Te$, $Cs_2Te$, and/or the like), alkaline earth metal telluride (for example, BeTe, MgTe, CaTe, SrTe, BaTe, and/or the like), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and/or the like), post-transition metal telluride (for example, ZnTe, and/or the like), lanthanide metal telluride (for example, LaTe, CeTe, PrTe, NdTe, PmTe, EuTe, GdTe, TbTe, DyTe, HoTe, ErTe, TmTe, YbTe, LuTe, and/or the like), and/or the like.

Emission Layer in Interlayer 130

When the light-emitting device 10 is a full-color light-emitting device, the emission layer may be patterned into a red emission layer, a green emission layer, and/or a blue emission layer, according to a subpixel. In an embodiment, the emission layer may have a stacked structure in which two or more layers among a red emission layer, a green emission layer, and a blue emission layer contact each other or are separated from each other to emit white light. In one or more embodiments, the emission layer may have a structure in which two or more materials among a red light-emitting material, a green light-emitting material, and a blue light-emitting material are mixed with each other in a single layer to emit white light.

In an embodiment, the emission layer may include a host and a dopant. The dopant may include a phosphorescent dopant, a fluorescent dopant, or a combination thereof.

An amount of the dopant included in the emission layer may be in a range of about 0.01 part by weight to about 30 parts by weight based on 100 parts by weight of the host.

For example, a total amount of the first dopant and the second dopant included in the emission layer may be in a range of about 0.01 part by weight to about 30 parts by weight based on 100 parts by weight of the host.

In one or more embodiments, the emission layer may include a quantum dot.

In one or more embodiments, the emission layer may include a delayed fluorescence material. The delayed fluorescence material may act as the host or the dopant in the emission layer.

A thickness of the emission layer may be in a range of about 100 Å to about 1,000 Å, for example, about 200 Å to about 600 Å. When the thickness of the emission layer is within these ranges, excellent or suitable luminescence characteristics may be obtained without a substantial increase in driving voltage.

Host

The hole-transporting host may be a compound having strong hole properties. The expression "a compound having strong hole properties" refers to a compound that may easily accept holes, and such properties may be obtained by including a hole-receiving moiety (also, referred to as a hole-transporting moiety).

Such a hole-receiving moiety may include, for example, a π-electron-rich heteroaromatic compound (for example, a carbazole derivative or an indole derivative), or an aromatic amine compound.

The electron-transporting host may be a compound having strong electron properties. The expression "a compound having strong electron properties" refers to a compound that may easily accept electrons, and such properties may be obtained by including an electron-receiving moiety (also, referred to as an electron-transporting moiety).

Such an electron-receiving moiety may include, for example, a π electron-deficient heteroaromatic compound. For example, the electron-receiving may include a nitrogen-containing heteroaromatic compound.

In the light-emitting device disclosed herein, the layer (for example, the first layer and/or the second layer) included in the interlayer may include the hole-transporting host and/or the electron-transporting host.

When a compound includes only a hole-transporting moiety or only an electron-transporting moiety, it is clear whether the nature of the compound has hole-transporting properties or electron-transporting properties.

In an embodiment, a compound may include both (e.g., simultaneously) a hole-transporting moiety and an electron-transporting moiety. In this embodiment, a simple comparison between the total number of the hole-transporting moieties and the total number of the electron-transporting moieties in the compound may be a criterion for predicting whether the compound is a hole-transporting compound or an electron-transporting compound, but cannot be an absolute criterion. One of the reasons why such a simple comparison cannot be an absolute criterion is that one hole-transporting moiety and one electron-transporting moiety do not have exactly the same ability to attract holes and electrons, respectively.

Therefore, a relatively reliable way to determine whether a compound having a certain structure is a hole-transporting compound or an electron-transporting compound is to directly implement the compound in a device.

In an embodiment, the host may include a compound represented by Formula 301:

$$[Ar_{301}]_{xb11}\text{-}[(L_{301})_{xb1}\text{-}R_{301}]_{xb21} \qquad \text{Formula 301}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each be the same as described in connection with $Q_1$.

For example, when xb11 in Formula 301 is 2 or more, two or more of $Ar_{301}$ may be linked together via a single bond.

In one or more embodiments, the host may include a compound represented by Formula 301-1, a compound represented by Formula 301-2, or a combination thereof:

Formula 301-1

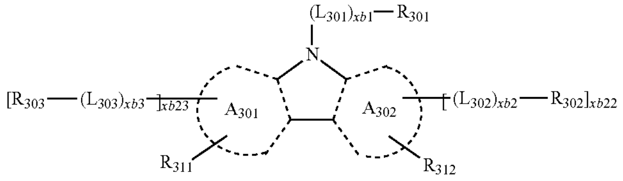

Formula 301-2

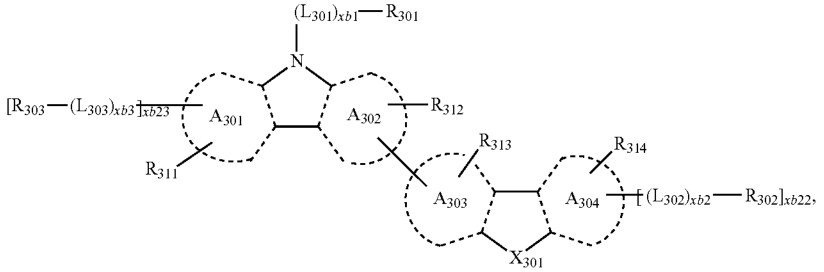

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each be the same as described in connection with $R_{301}$.

In one or more embodiments, the host may include an alkaline earth-metal complex. In one or more embodiments, the host may include a Be complex (for example, Compound H55), an Mg complex, a Zn complex, or one or more combinations thereof.

In one or more embodiments, the host may include one of Compounds H1 to H124, one of Compounds HT-01 to HT17, one of Compounds ET-01 to ET015, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or one or more combinations thereof:

H1

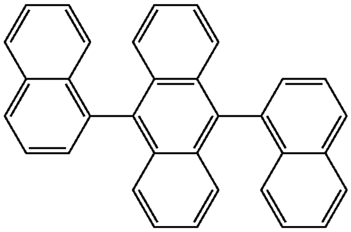

-continued

H2

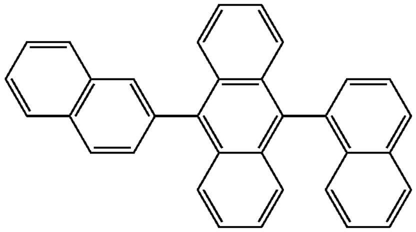

H3

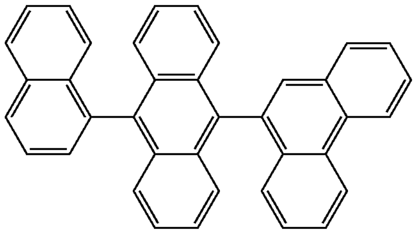

H4

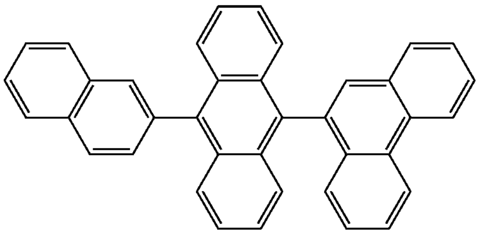

H5

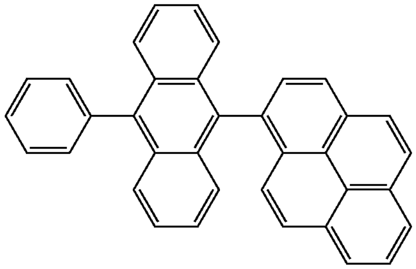

-continued
H6
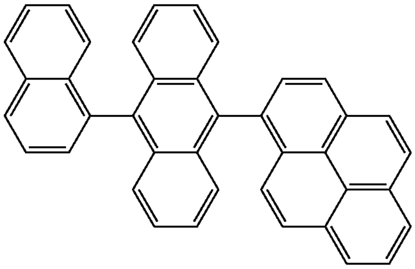
H7
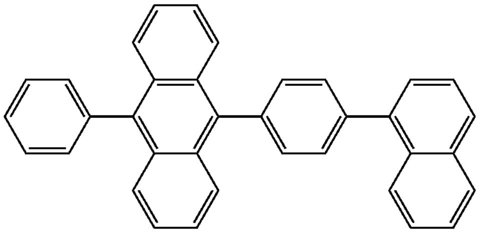
H8
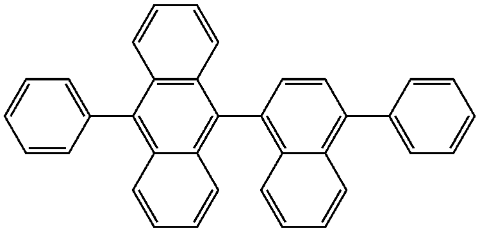
H9
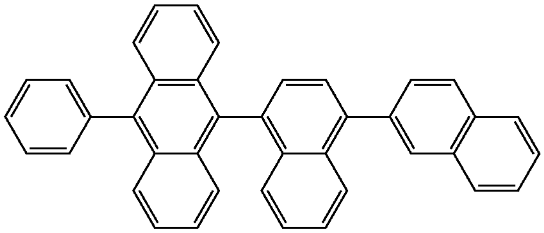
H10
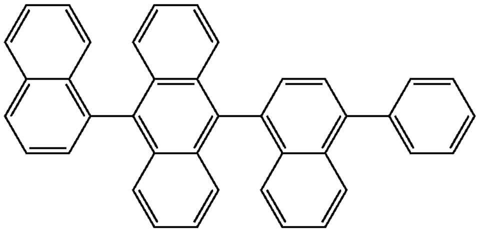
H11
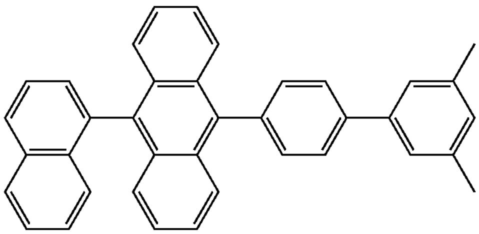
-continued
H12
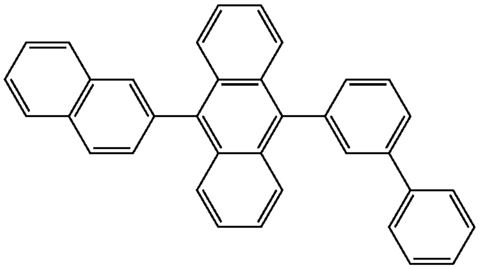
H13
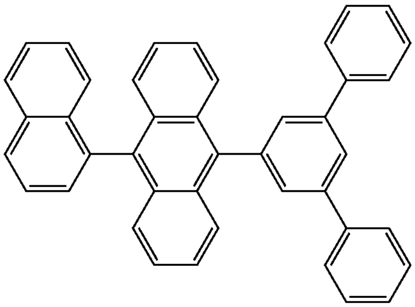
H14
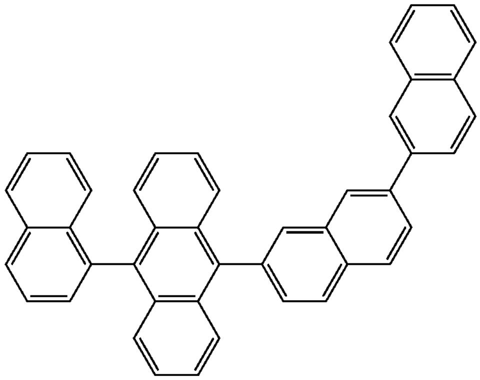
H15
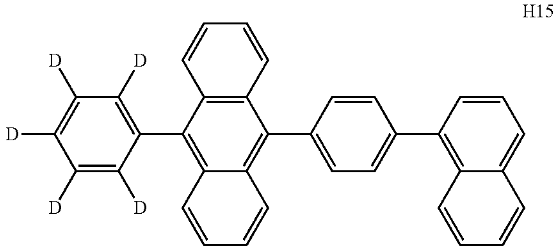
H16
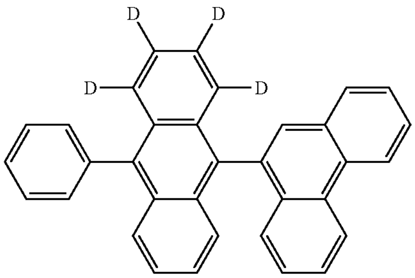

-continued
H17
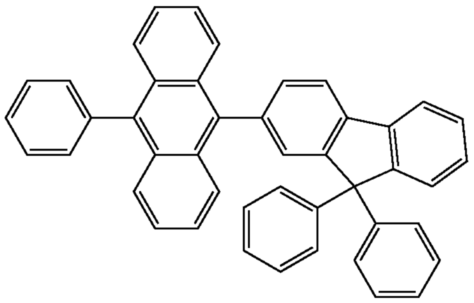
H18
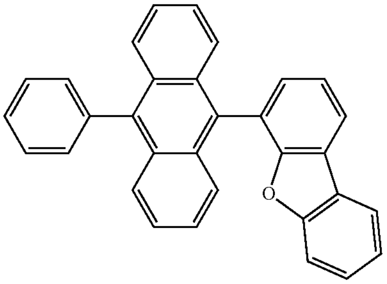
H19
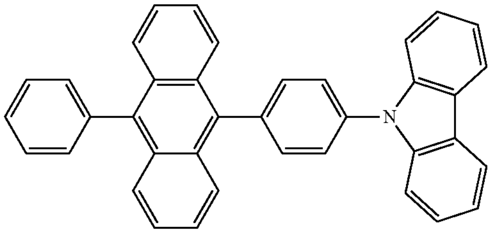
H20
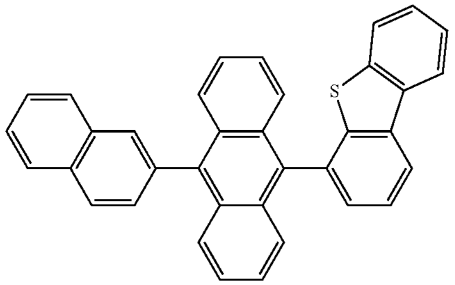
H21
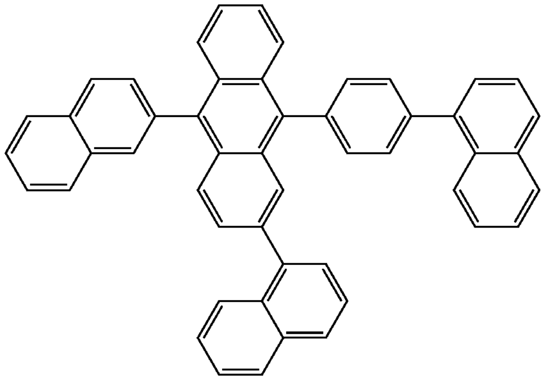
-continued
H22
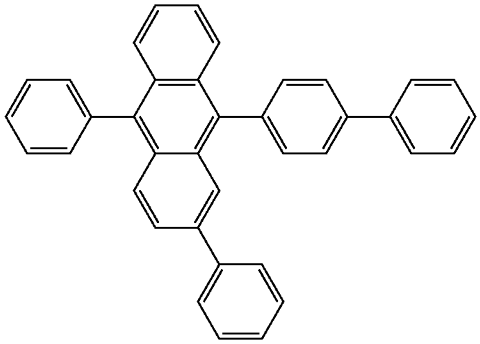
H23
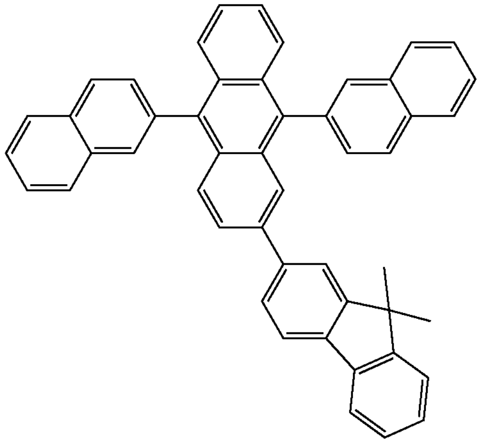
H24
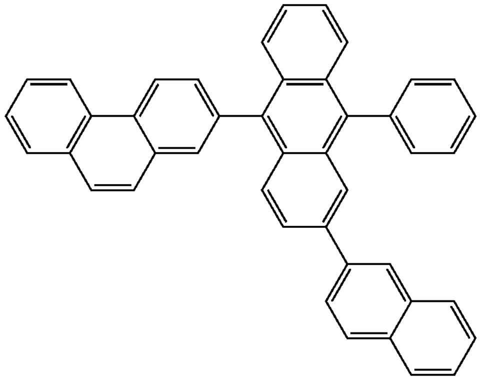

-continued
H25
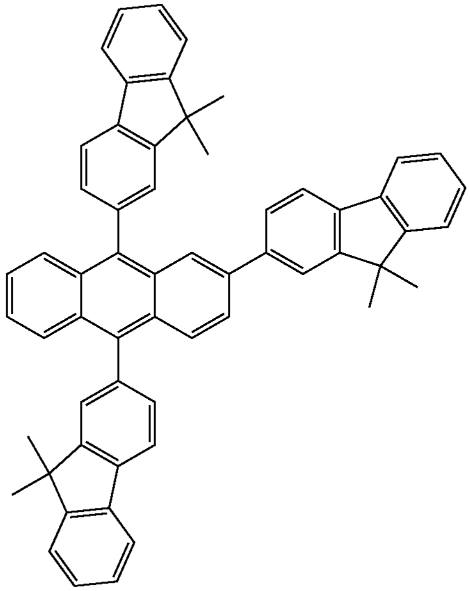
H26
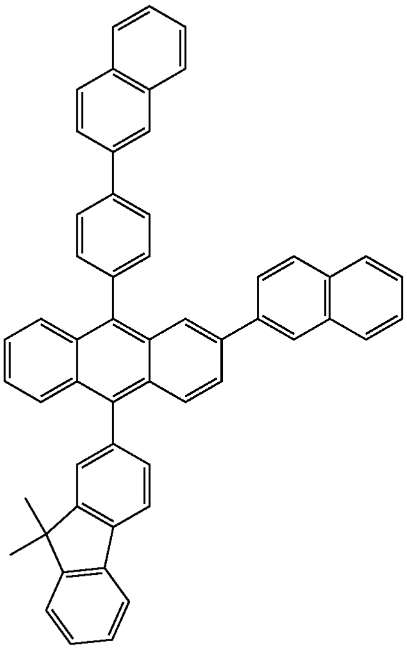
-continued
H27
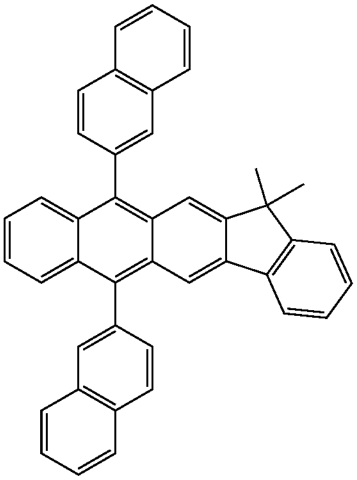
H28
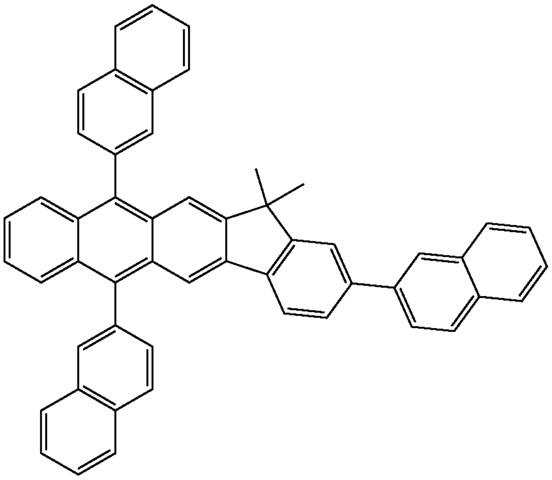
H29
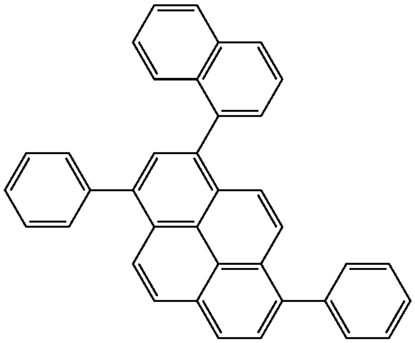

-continued
H30
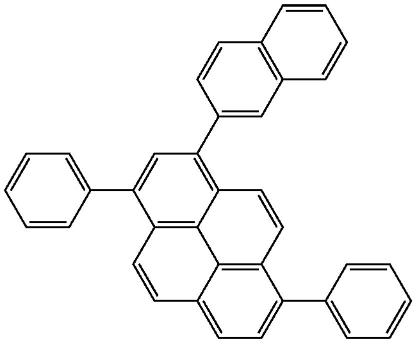
H31
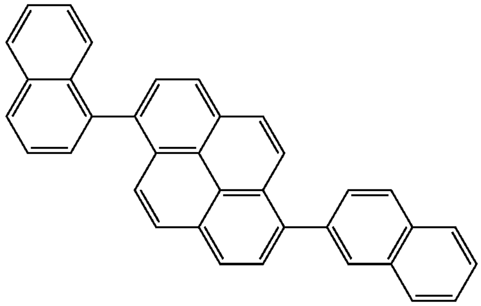
H32
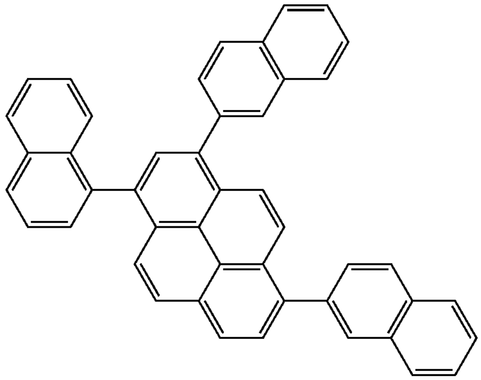
H33
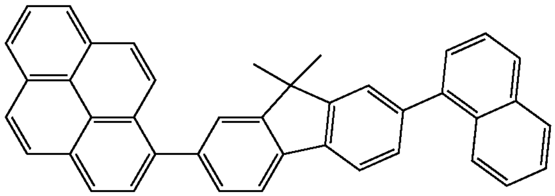
H34
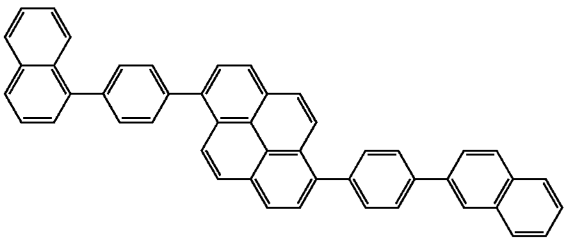
-continued
H35
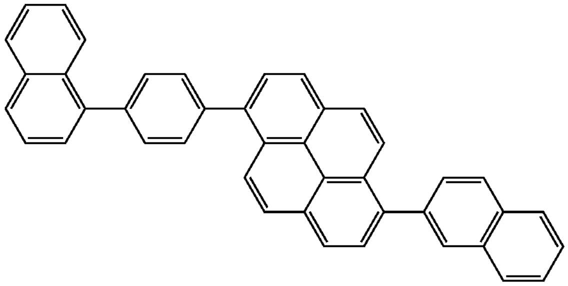
H36
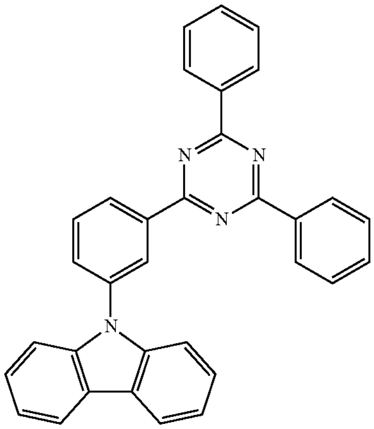
H37
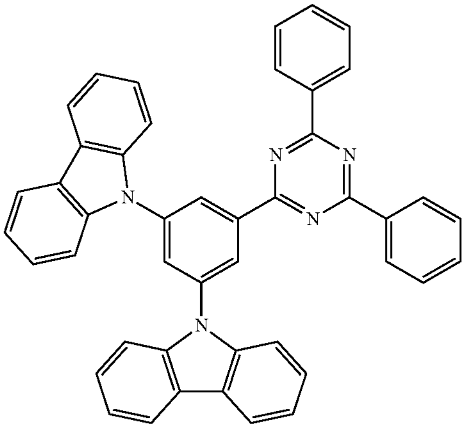
H38
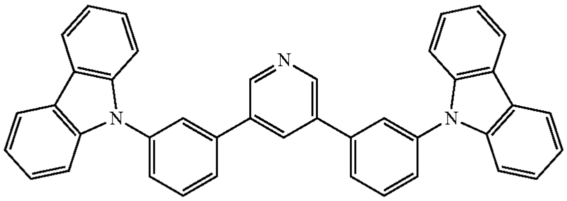

-continued
H39
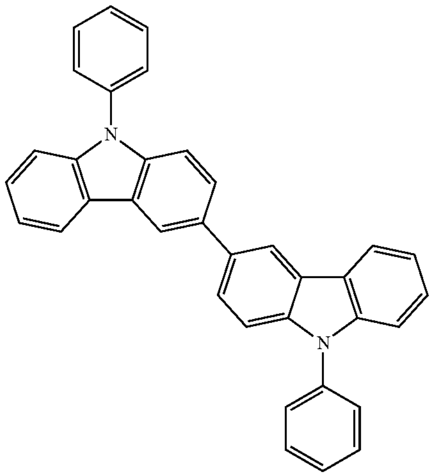
H40
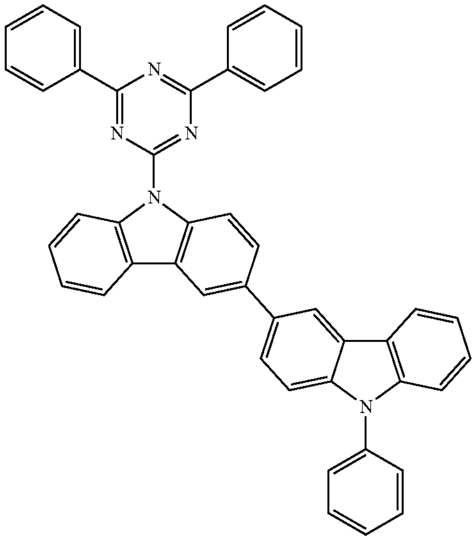
H41
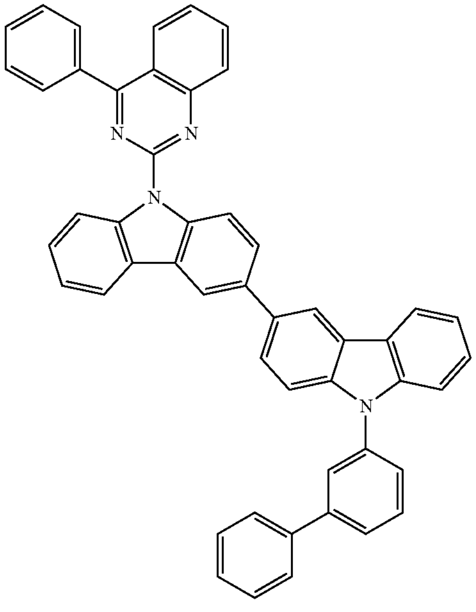
-continued
H42
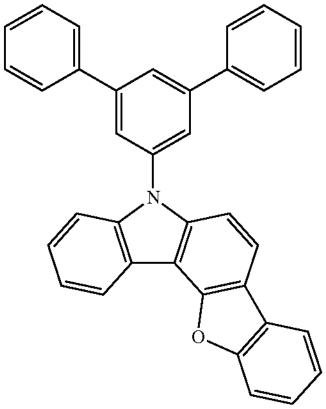
H43
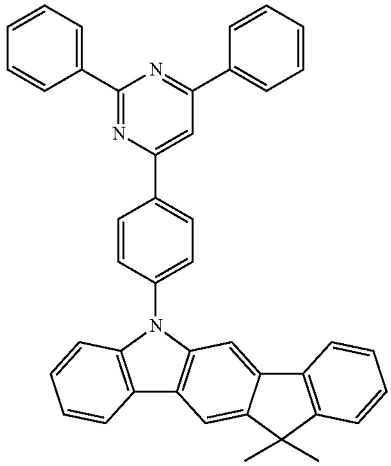
H44
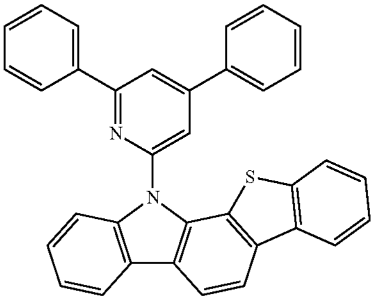
H45
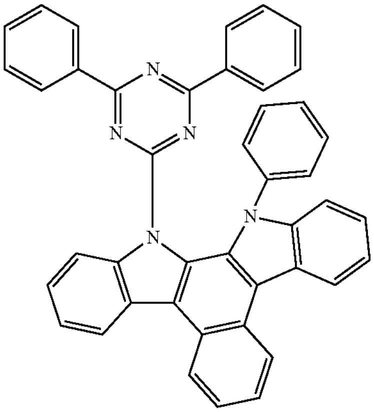

-continued
H46
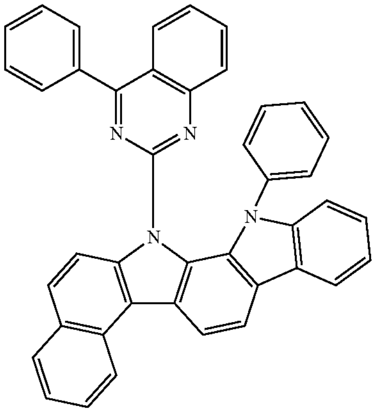
H47
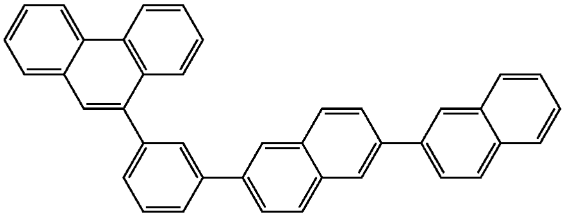
H48
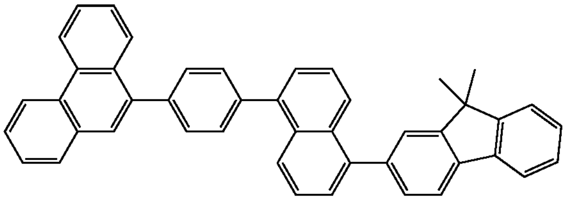
H49
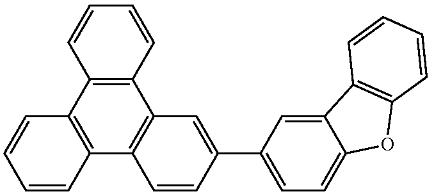
H50
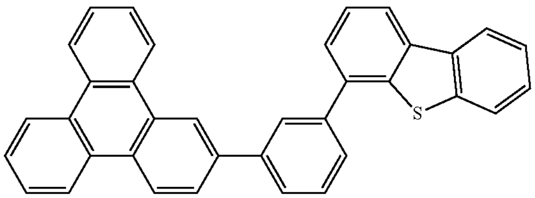
H51
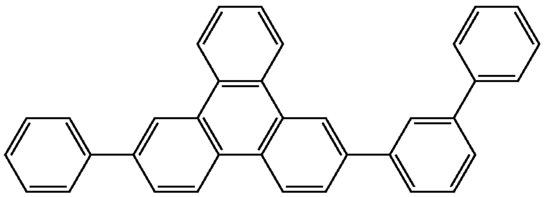
-continued
H52
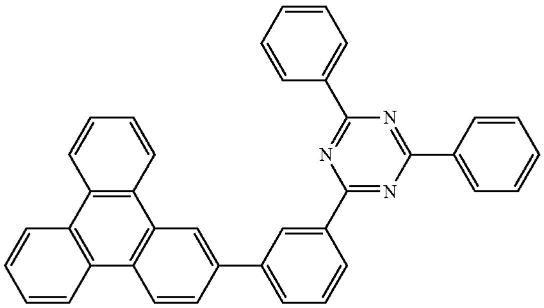
H53
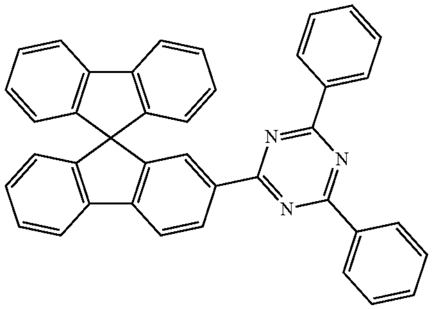
H54
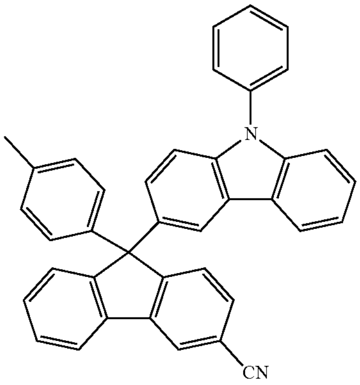
H55
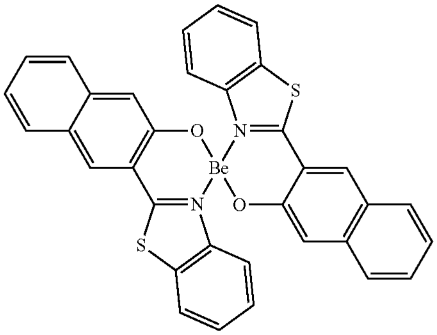

-continued
H56
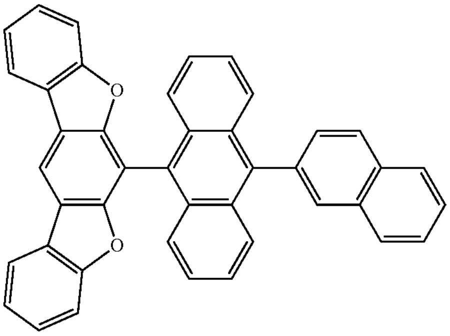
H57
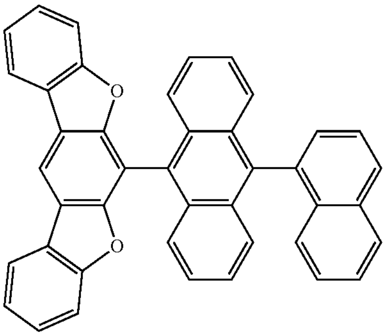
H58
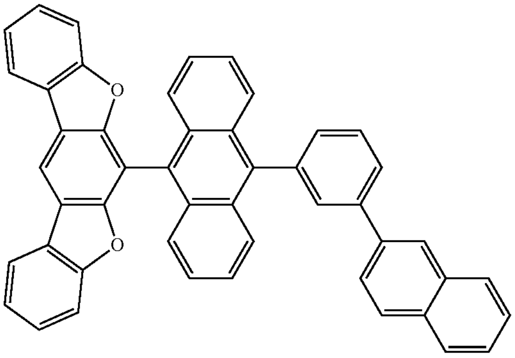
H59
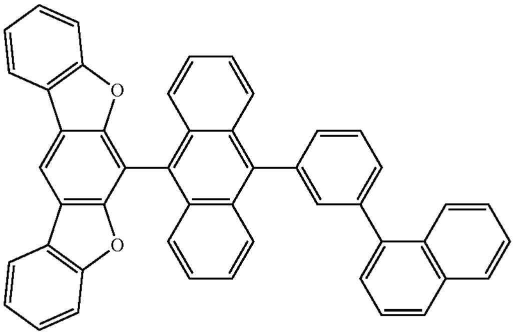
-continued
H60
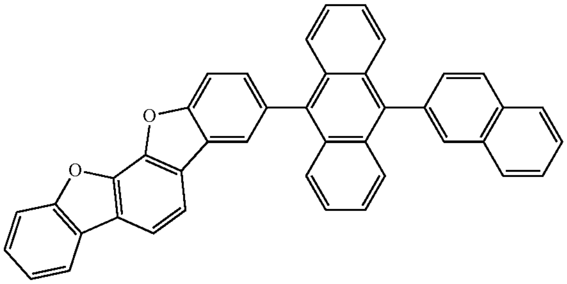
H61
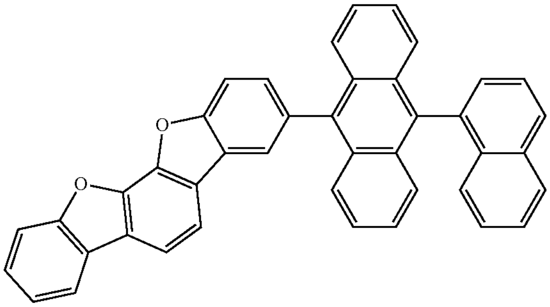
H62
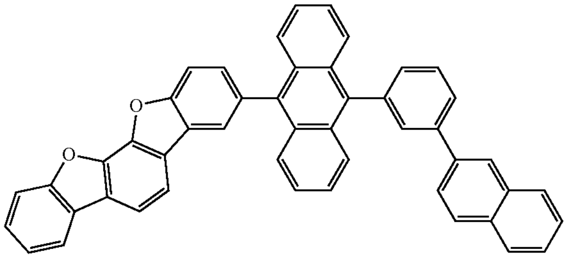
H63
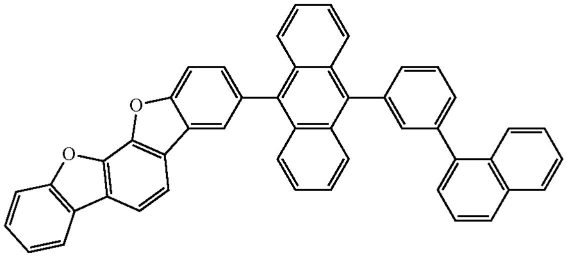
H64
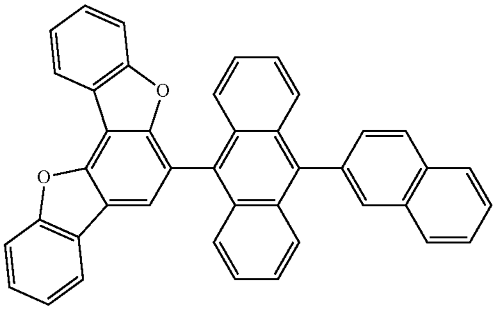

-continued
H65
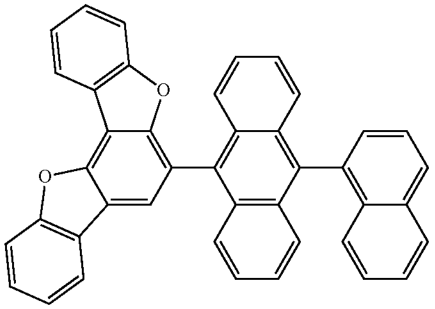
H66
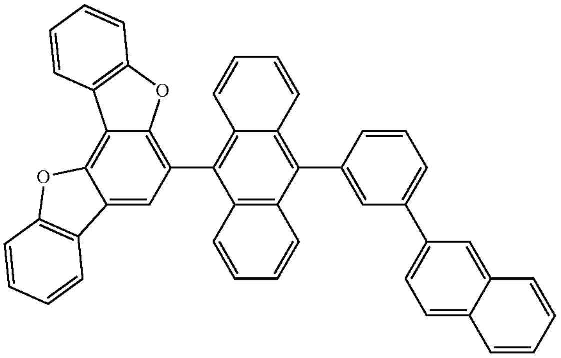
H67
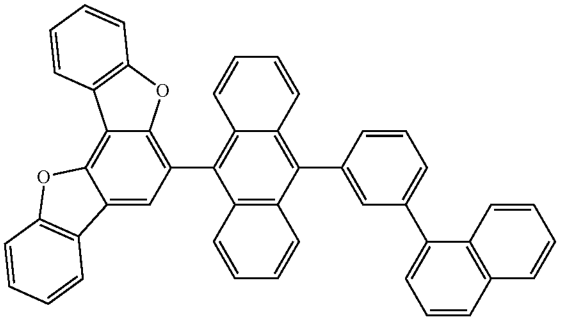
H68
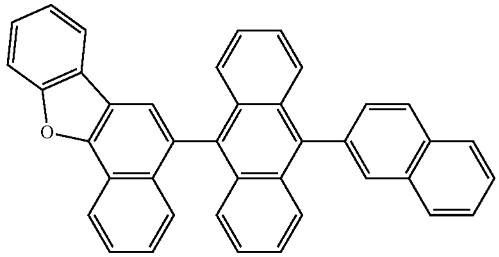
H69
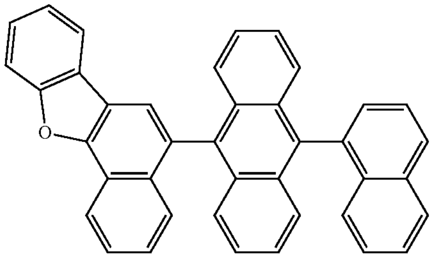
-continued
H70
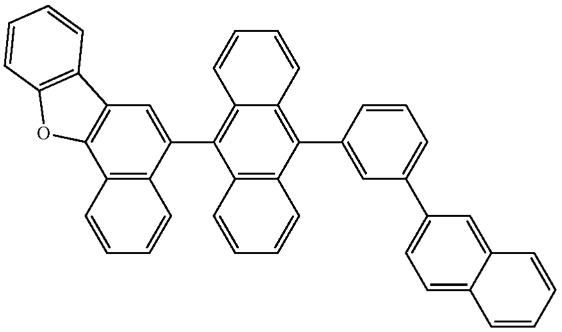
H71
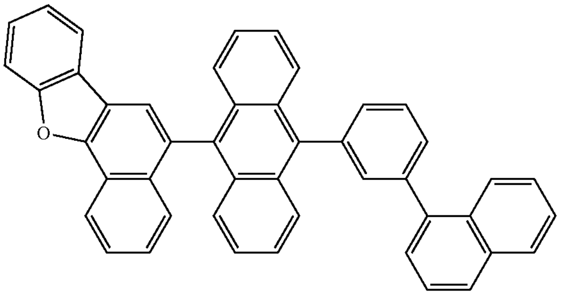
H72
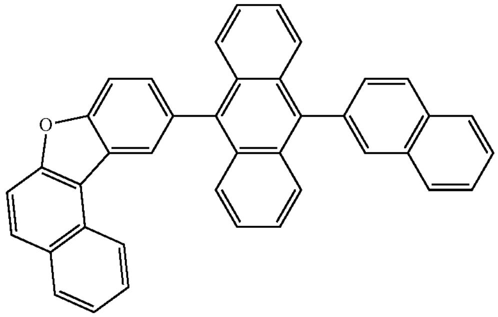
H73
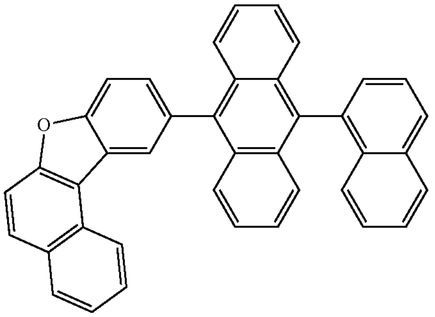

-continued
H74
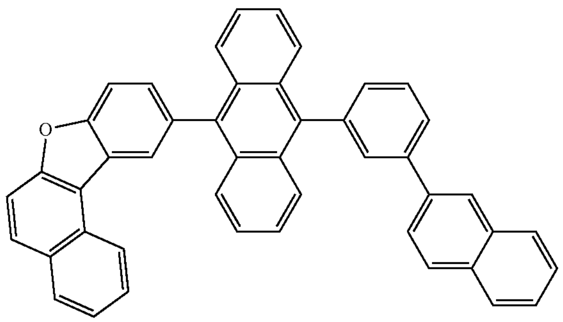
H75
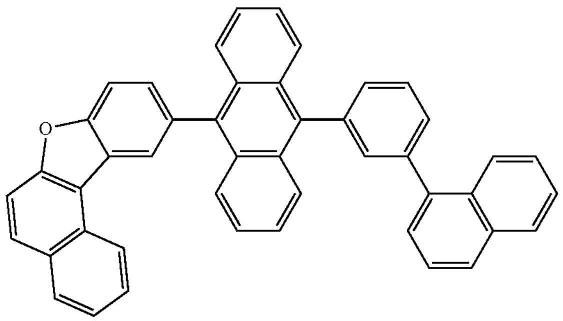
H76
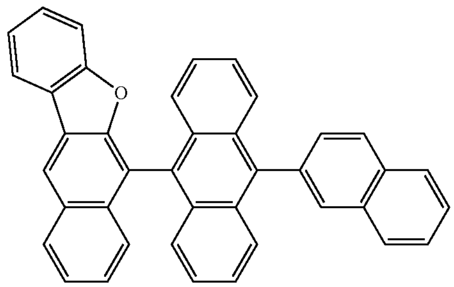
H77
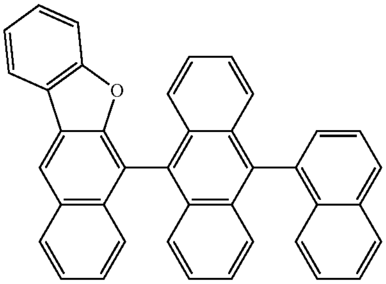
H78
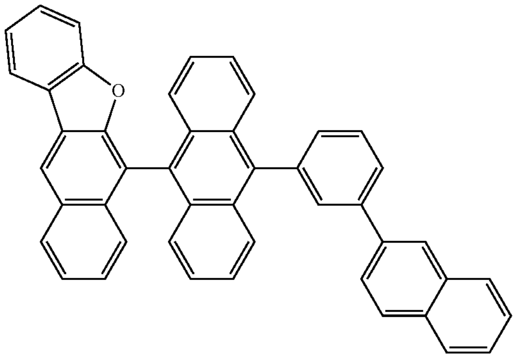
-continued
H79
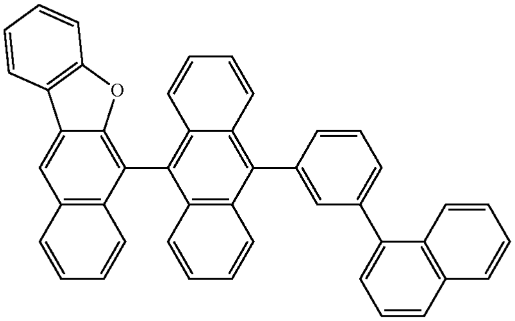
H80
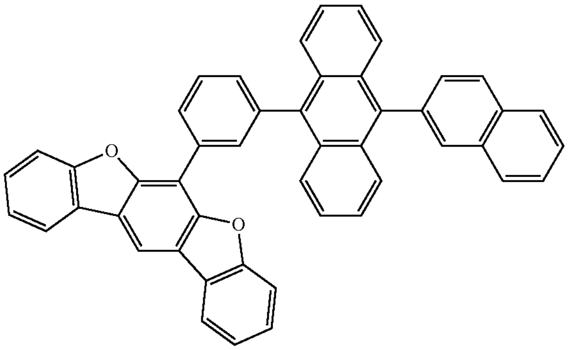
H81
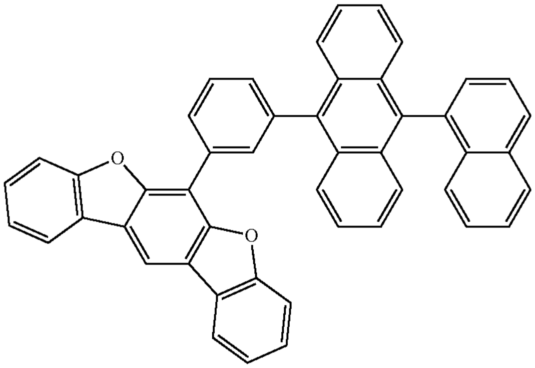
H82
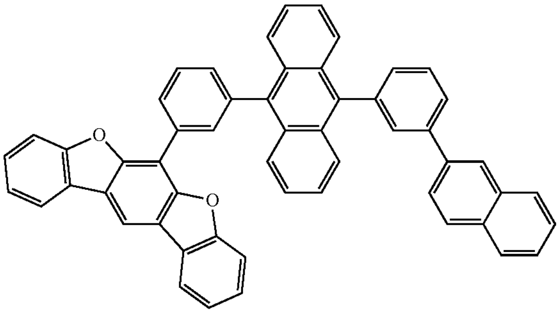

-continued
H83
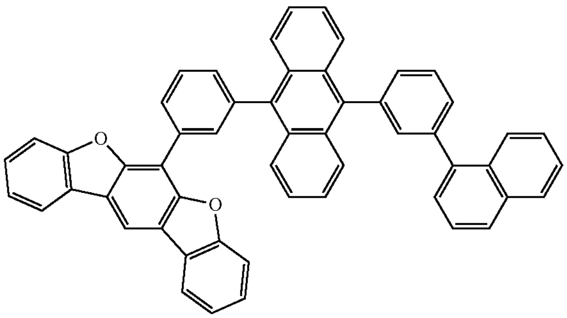
H84
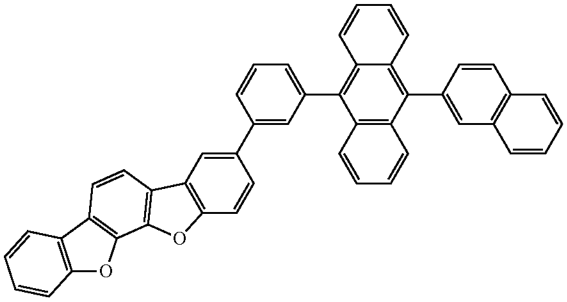
H85
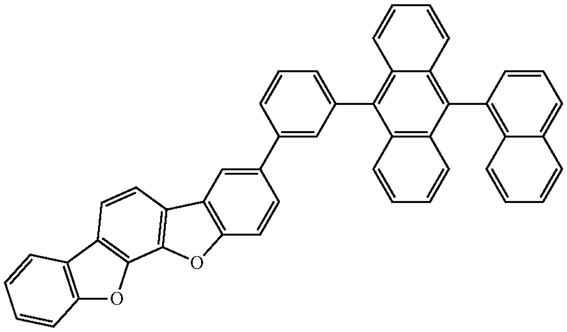
H86
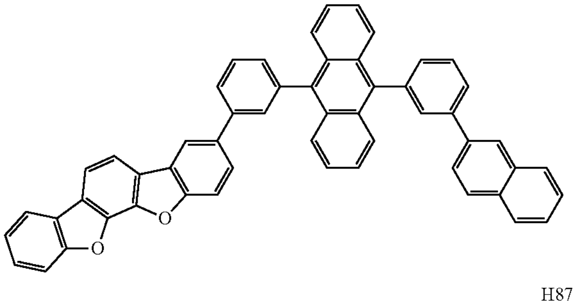
H87
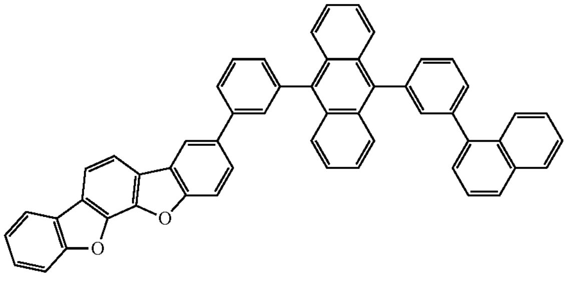
-continued
H88
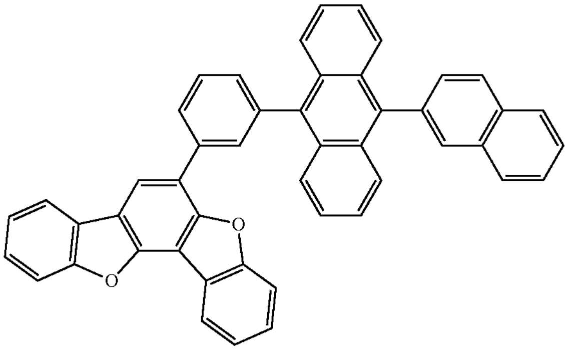
H89
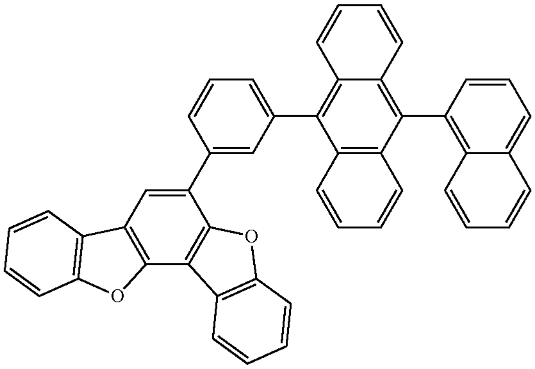
H90
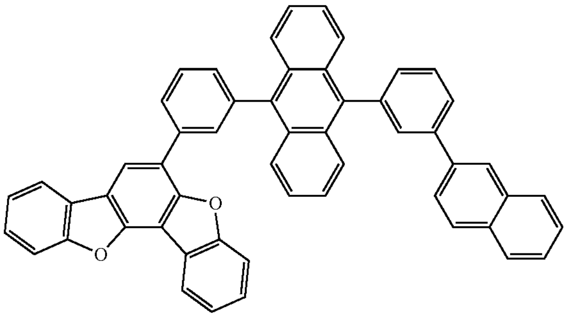
H91
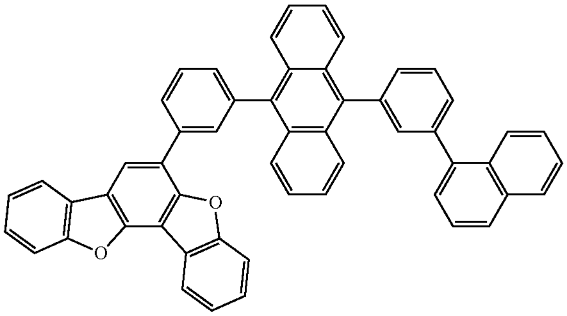

-continued
H92
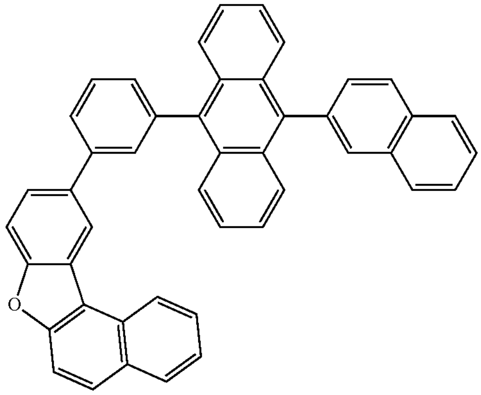
H93
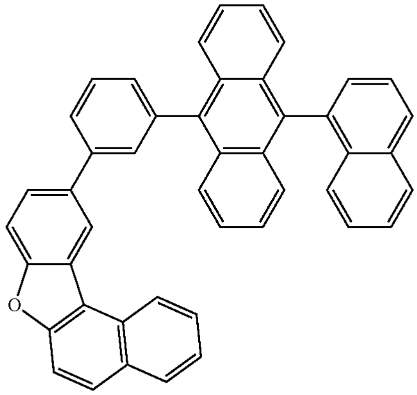
H94
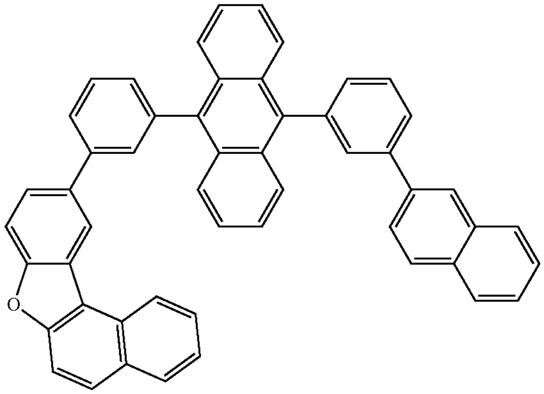
H95
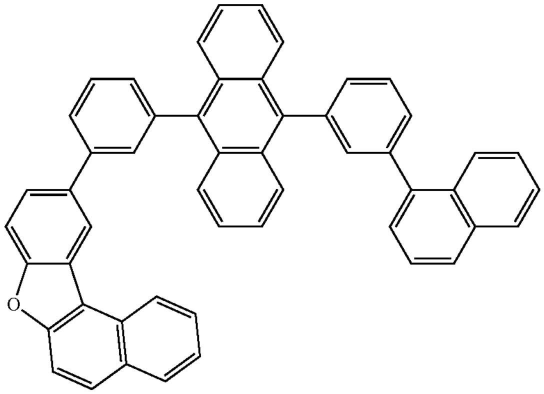
-continued
H96
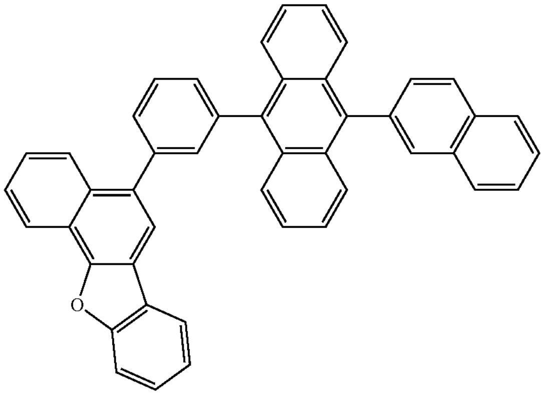
H97
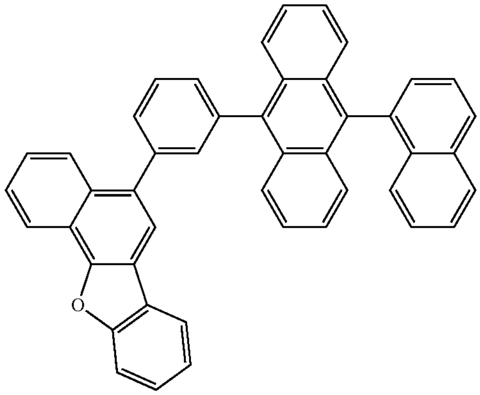
H98
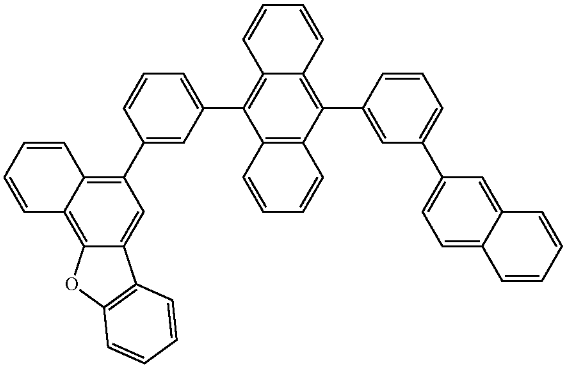
H99
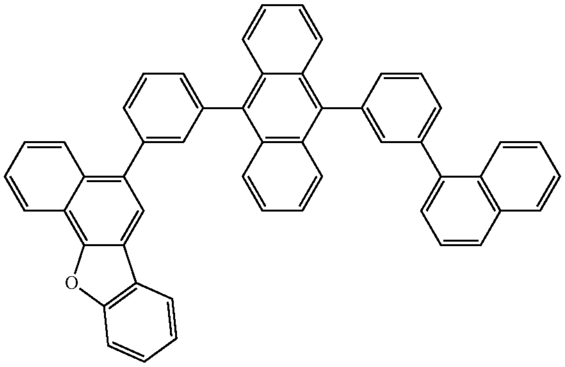

-continued
H100
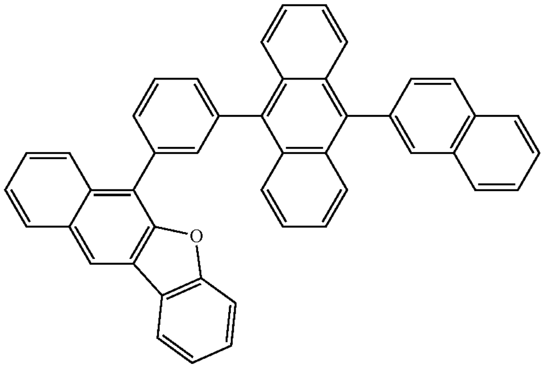
H101
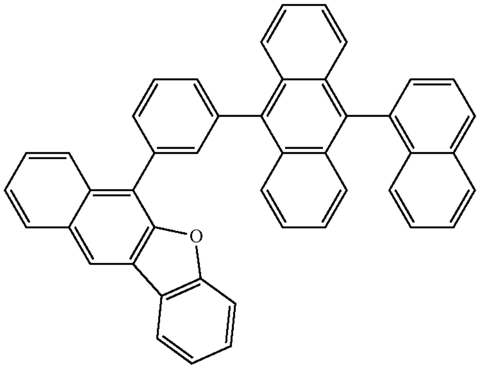
H102
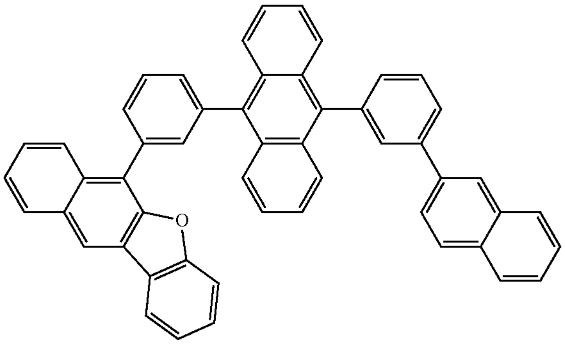
H103
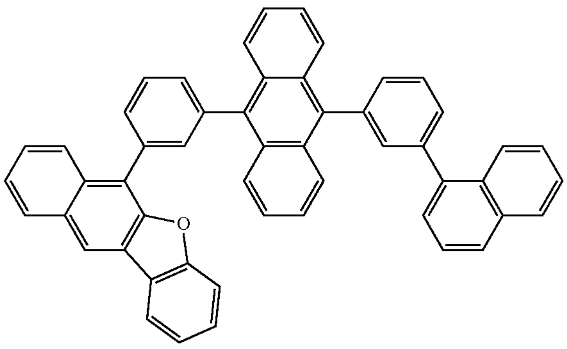
-continued
H104
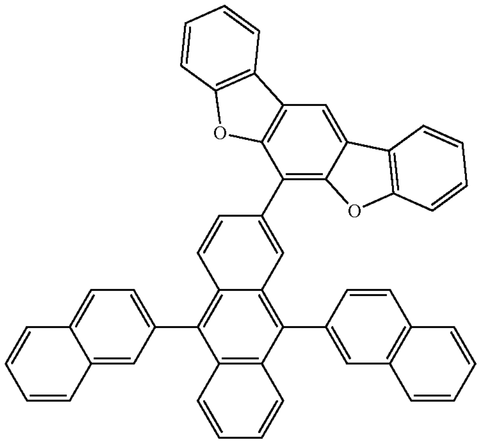
H105
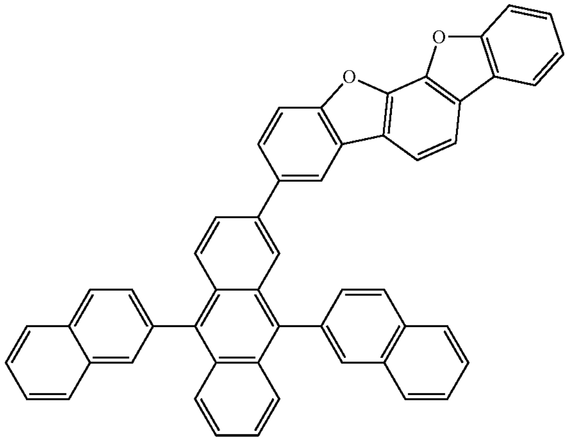
H106
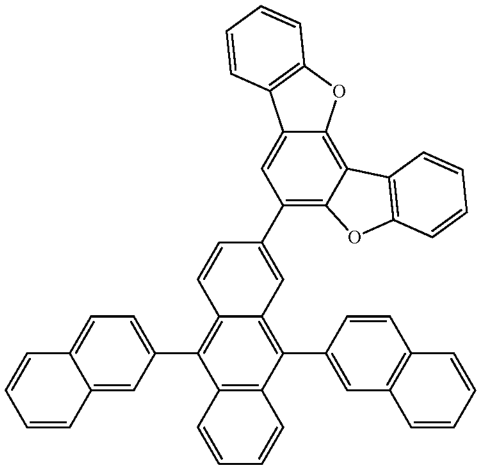

-continued
H107
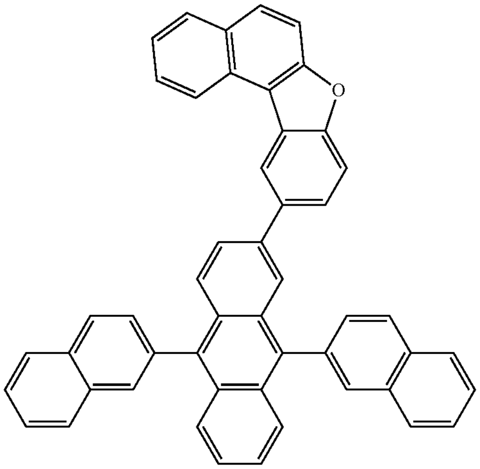
H108
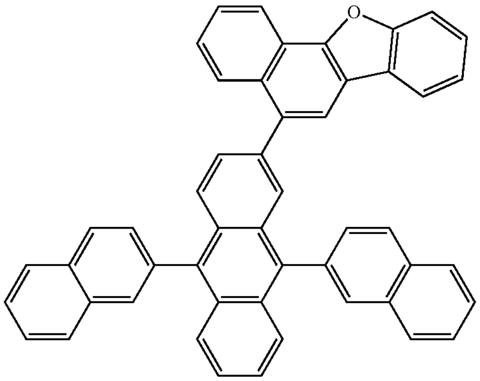
H109
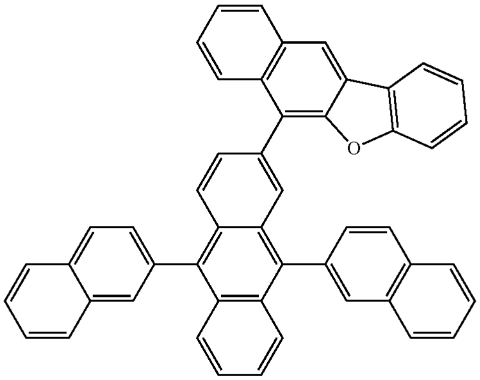
H110
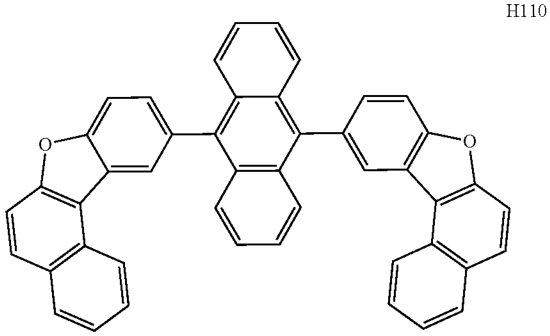
-continued
H111
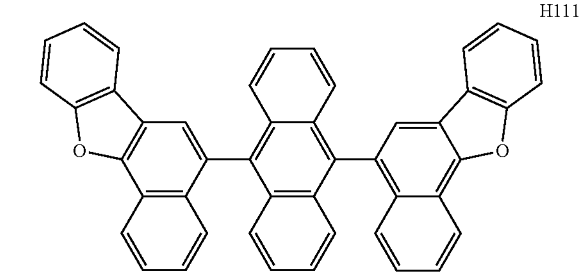
H112
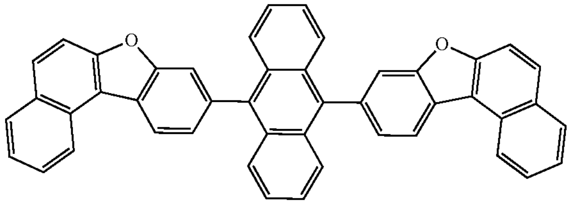
H113
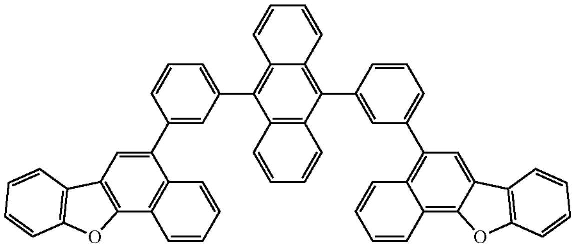
H114
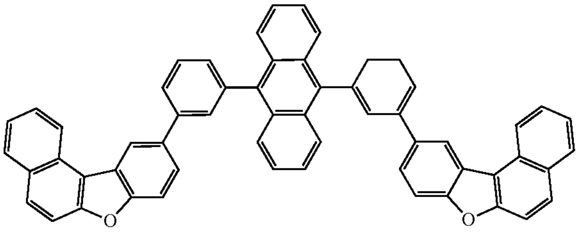
H115
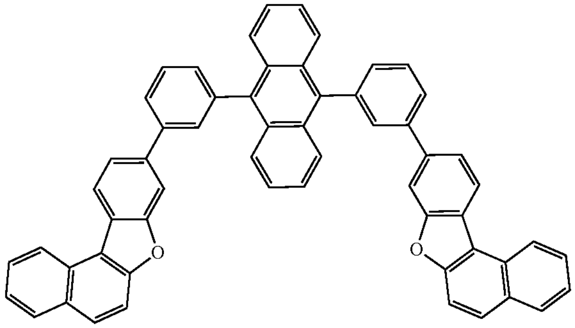

-continued
H116
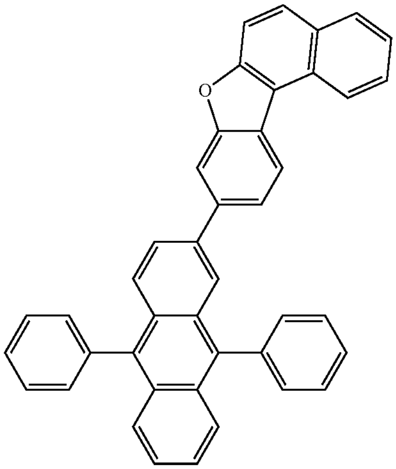
H117
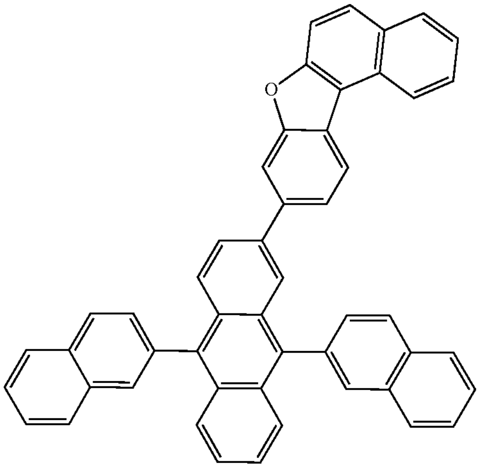
H118
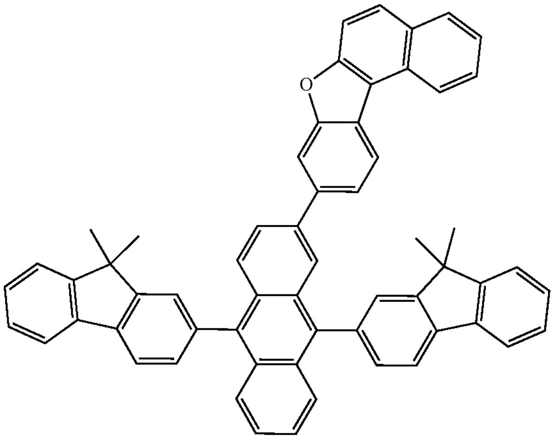
-continued
H119
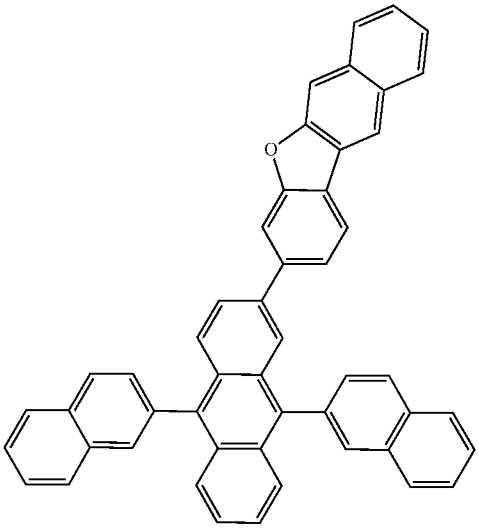
H120
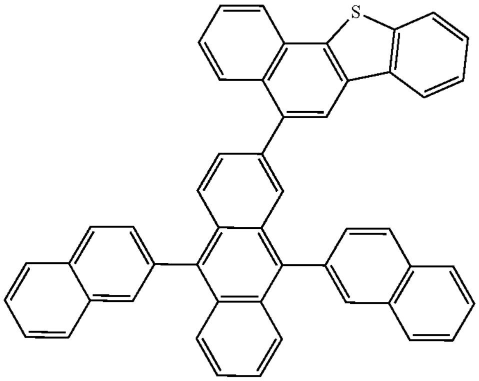
H121
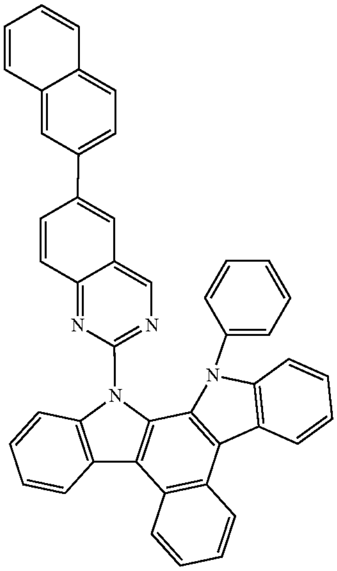

-continued
H122
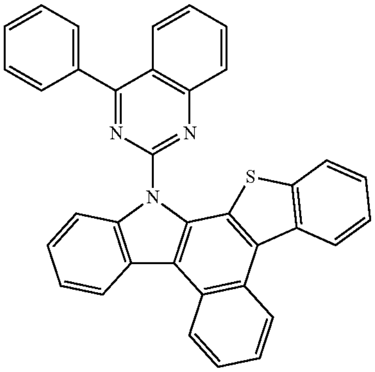
H123
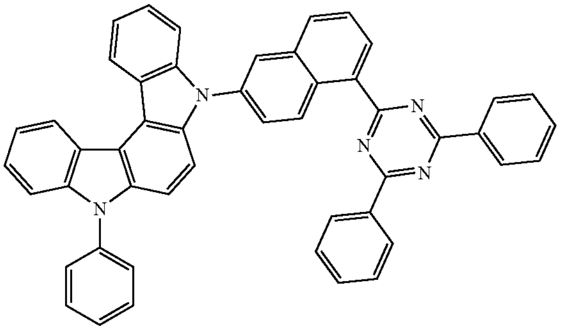
H124
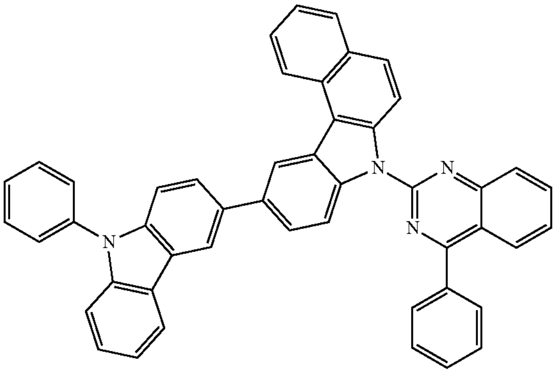
HT-01
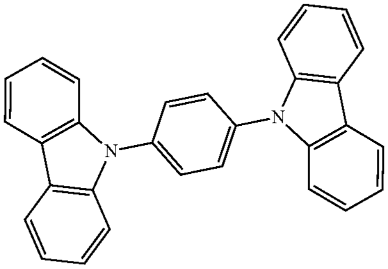
HT-02
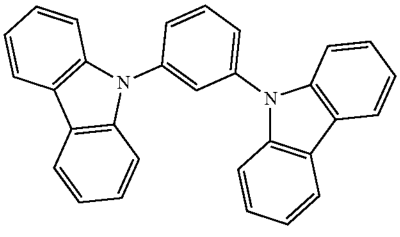
-continued
HT-03
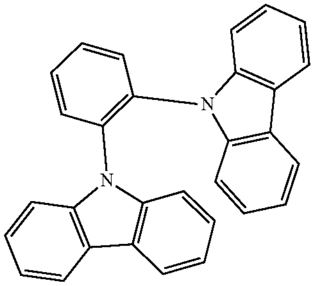
HT-04
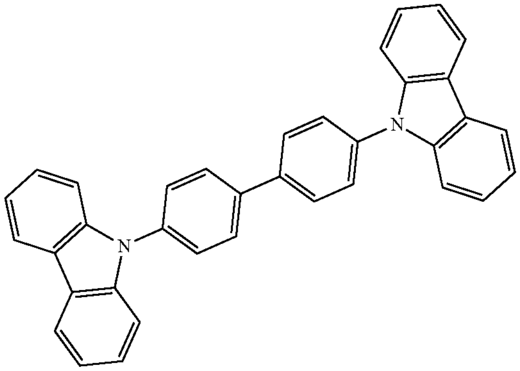
HT-05
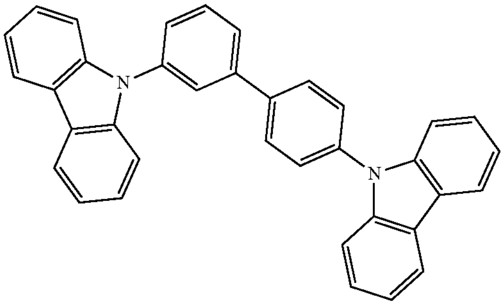
HT-06
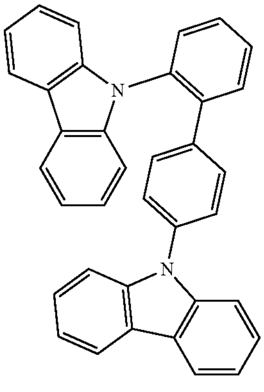

-continued
HT-07
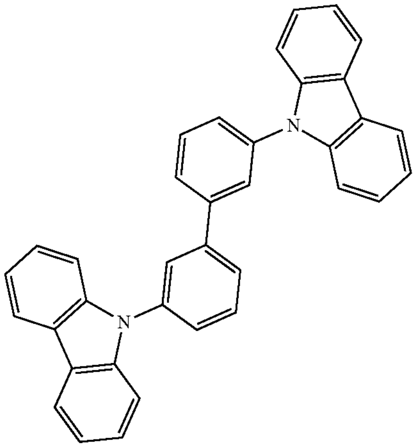
HT-08
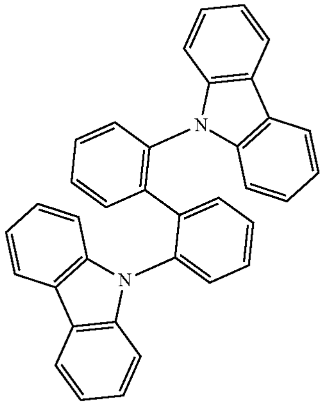
HT-09
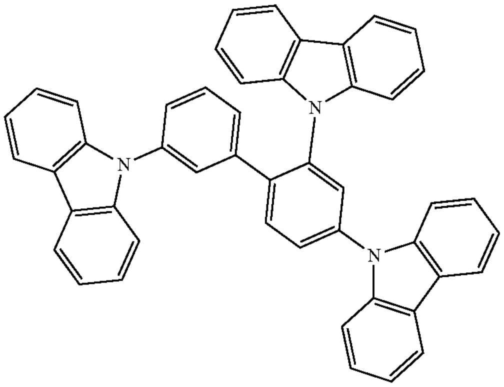
-continued
HT-10
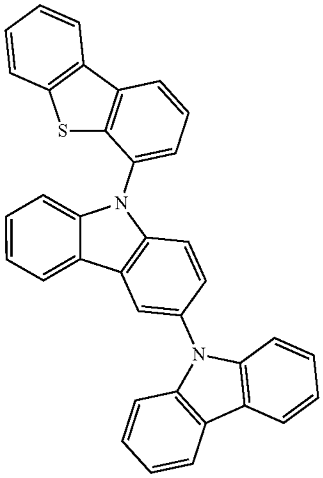
HT-11
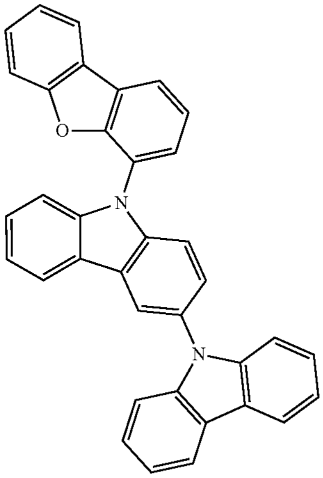
HT-12
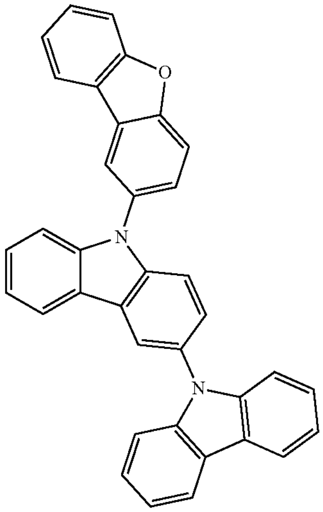

-continued
HT-13
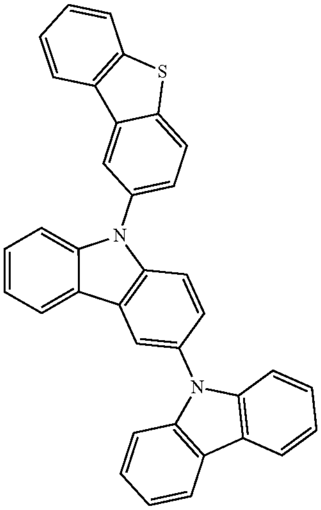
HT-14
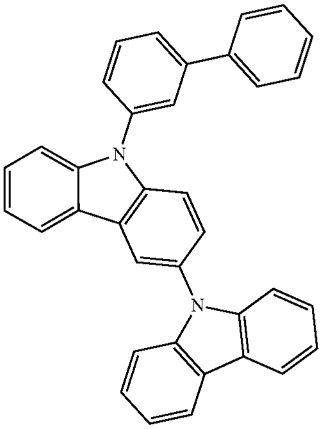
HT-15
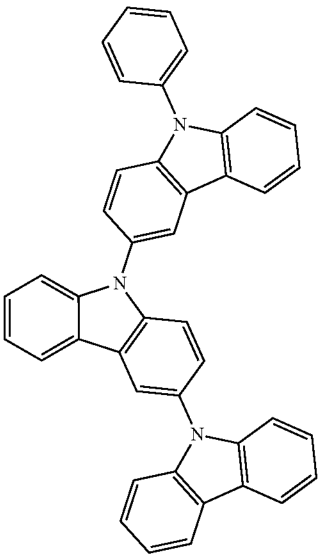
-continued
HT-16
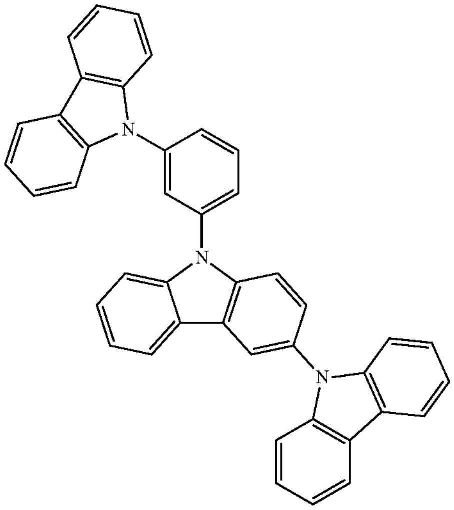
HT-17
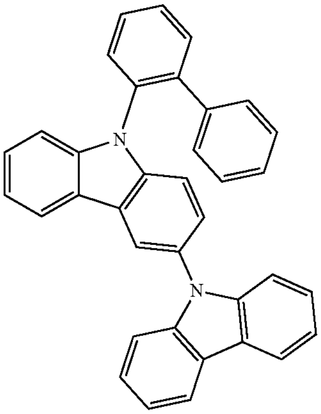
ET-01
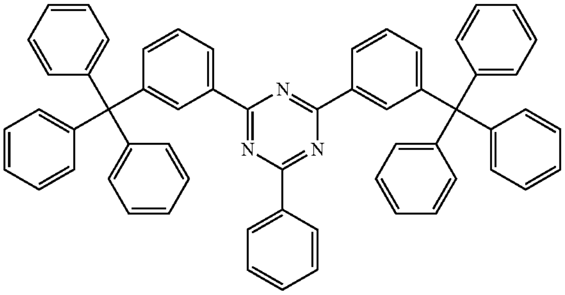
ET-02
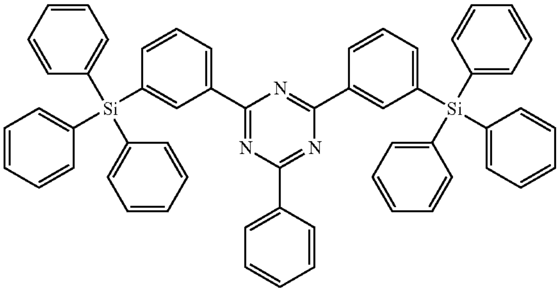

-continued
ET-03
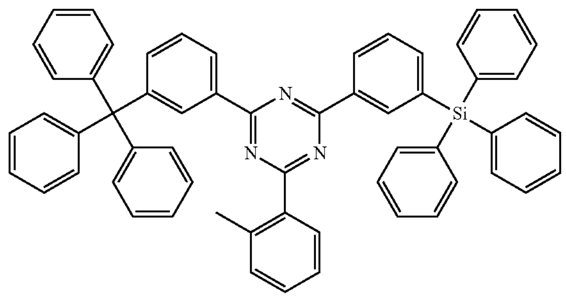
ET-04
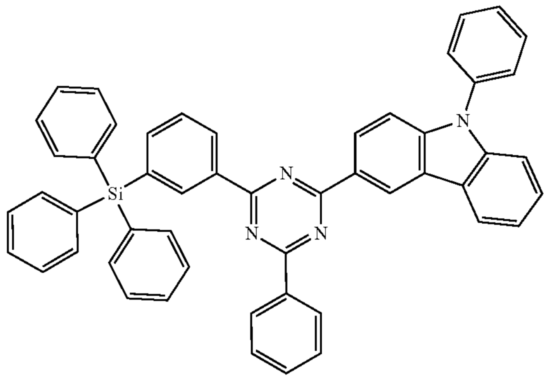
ET-05
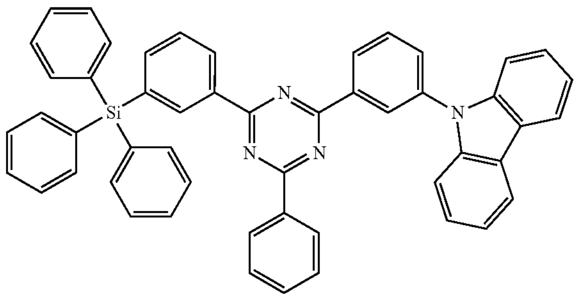
ET-06
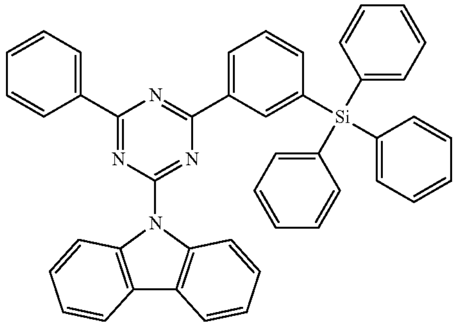
-continued
ET-07
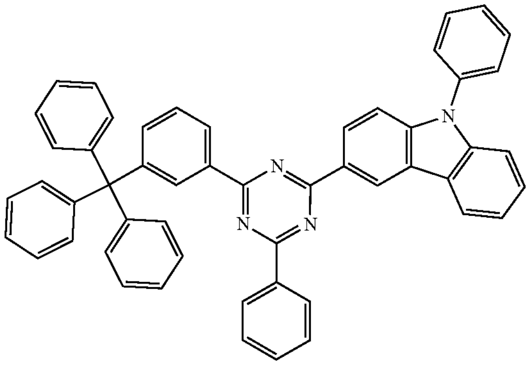
ET-08
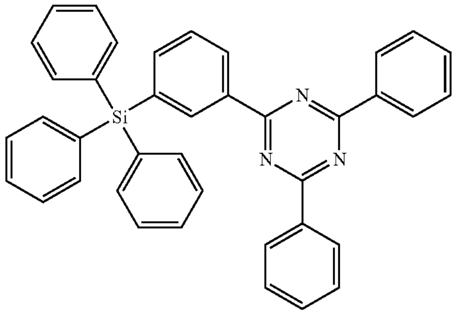
ET-09
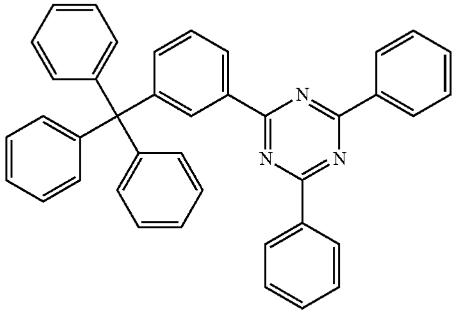
ET-010
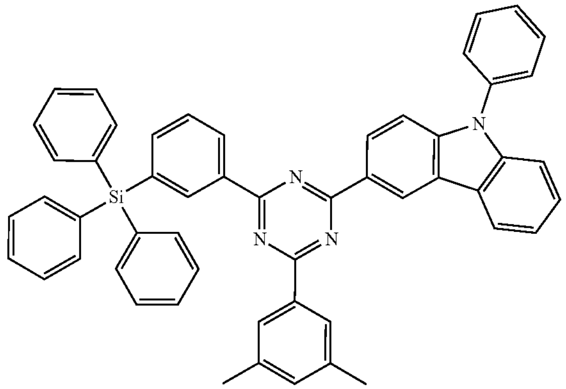

-continued

ET-011

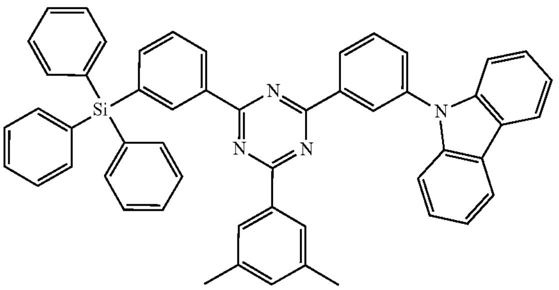

ET-012

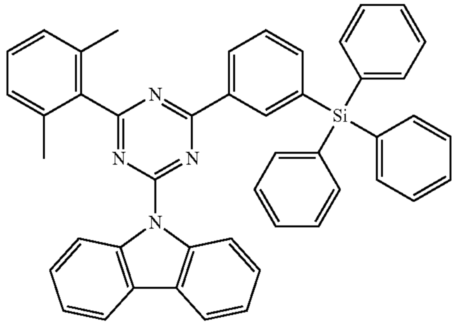

ET-013

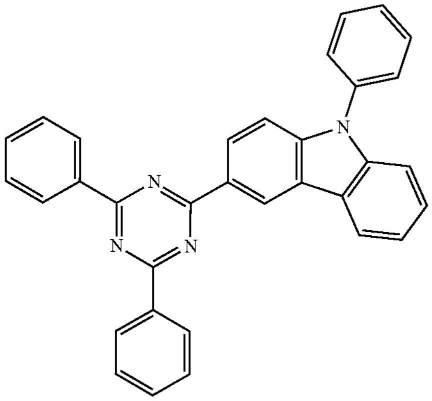

ET-014

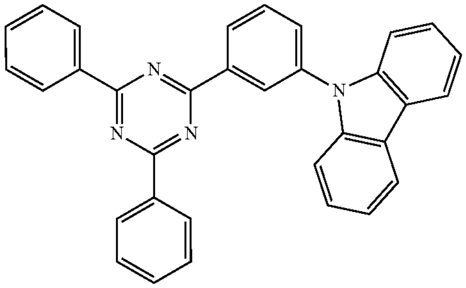

-continued

ET-015

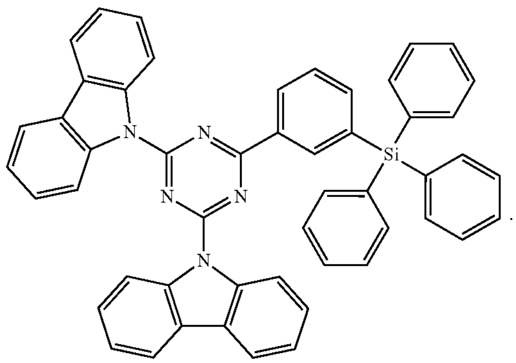

Phosphorescent Dopant

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or one or more combinations thereof.

The phosphorescent dopant may be electrically neutral.

For example, the phosphorescent dopant may include an organometallic compound represented by Formula 401:

$$M(L_{401})_{xc1}(L_{402})_{xc2}$$ Formula 401

Formula 402

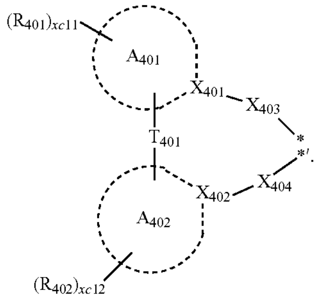

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$ may be identical to or different from each other, $L_{402}$ may be an organic ligand, and xc2 may be 0, 1, 2, 3, or 4, wherein, when xc2 is 2 or more, two or more of $L_{402}$ may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C($Q_{411}$)=, $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be the same as described in connection with $Q_1$, xc11 and xc12 may each independently be an integer from 0 to 10, and

* and *' in Formula 402 each indicate a binding site to M in Formula 401.

For example, in Formula 402, i) $X_{401}$ may be nitrogen, and $X_{402}$ may be carbon, or ii) each of $X_{401}$ and $X_{402}$ may be nitrogen.

In an embodiment, when xc1 in Formula 401 is 2 or more, two ring $A_{401}$(s) among two or more of $L_{401}$ may optionally be linked to each other via $T_{402}$, which is a linking group, and two ring $A_{402}$(s) among two or more of $L_{401}$ may optionally be linked to each other via $T_{403}$, which is a linking group (see e.g., Compounds PD1 to PD4 and PD7). $T_{402}$ and $T_{403}$ may each be the same as described in connection with $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(=O), an isonitrile group, a —CN group, a phosphorus group (for example, a phosphine group, a phosphite group, and/or the like), or one or more combinations thereof.

The phosphorescent dopant may include, for example, one of Compounds PD1 to PD39, one of Compounds 1 to 120, or one or more combinations thereof:

PD1

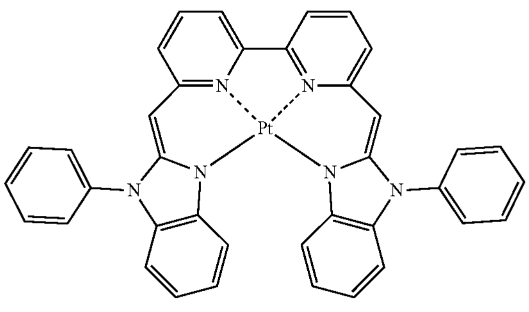

-continued

PD2

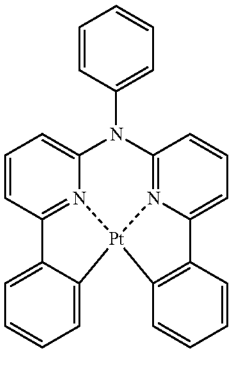

PD3

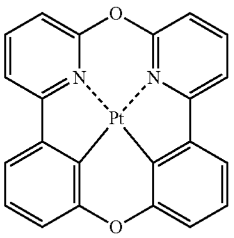

PD4

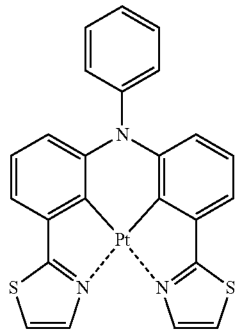

PD5

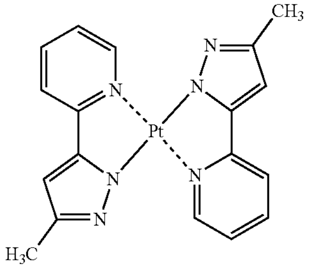

PD6

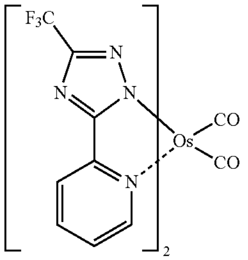

-continued
PD7
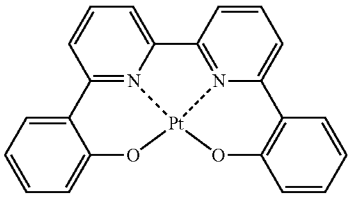
PD8
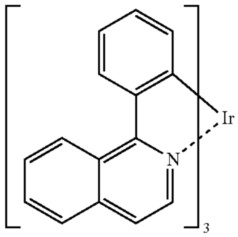
PD9
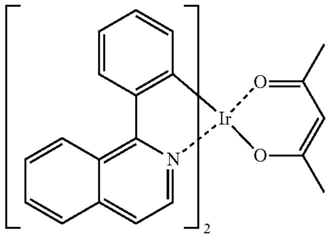
PD10
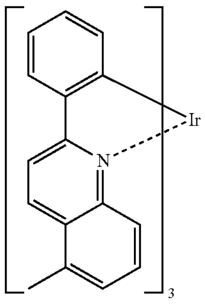
PD11
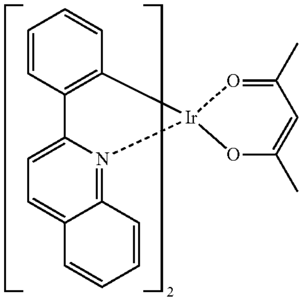
-continued
PD12
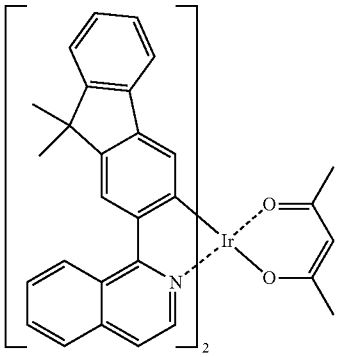
PD13
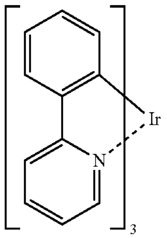
PD14
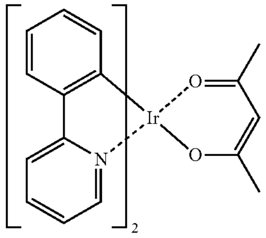
PD15
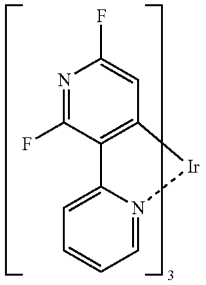
PD16
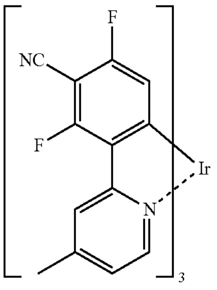

-continued
PD17
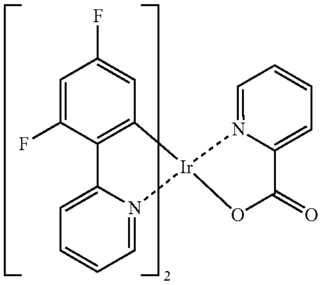
PD18
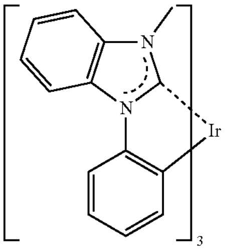
PD19
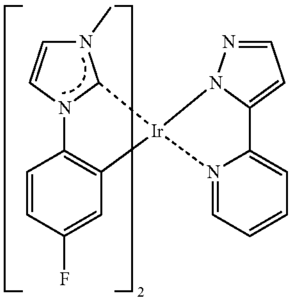
PD20
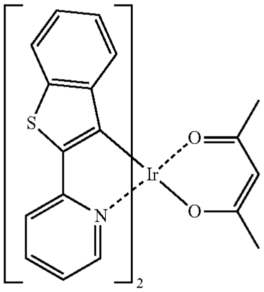
PD21
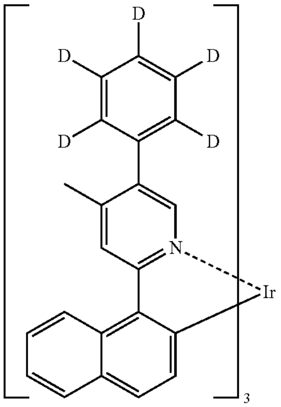
-continued
PD22
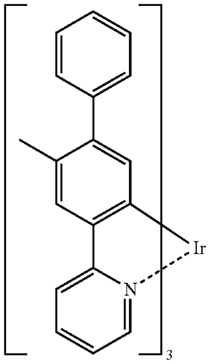
PD23
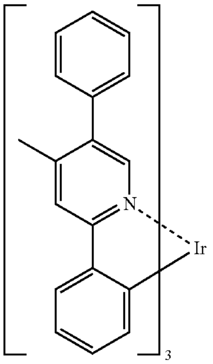
PD24
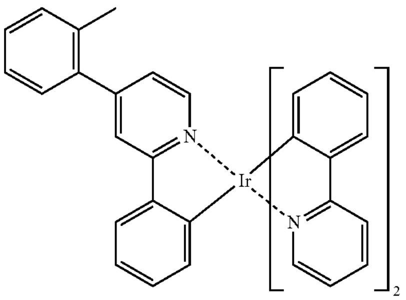
PD25
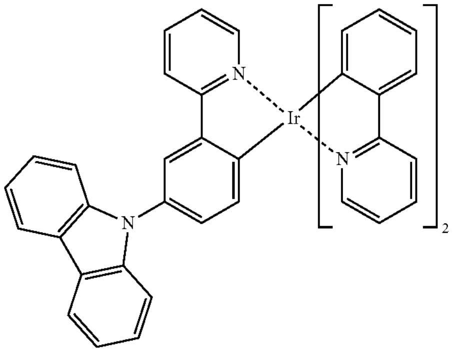

-continued
PD26
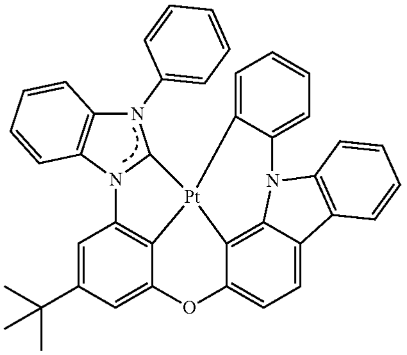
PD27
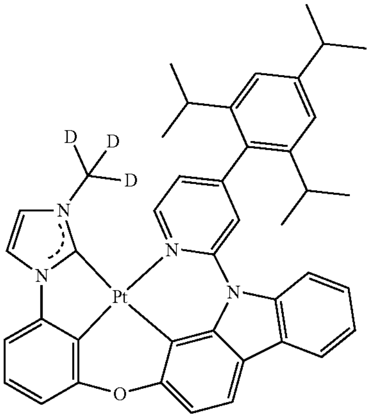
PD28
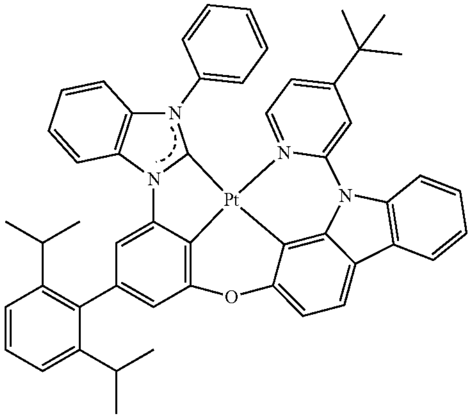
PD29
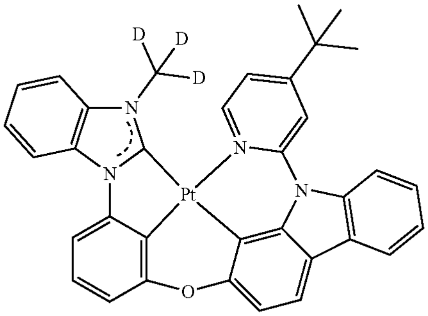
-continued
PD30
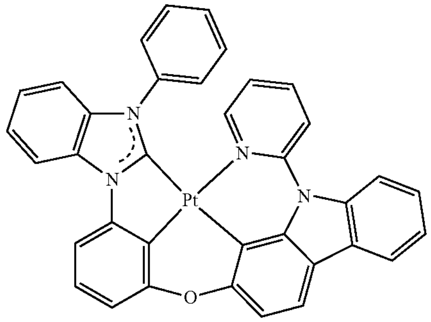
PD31
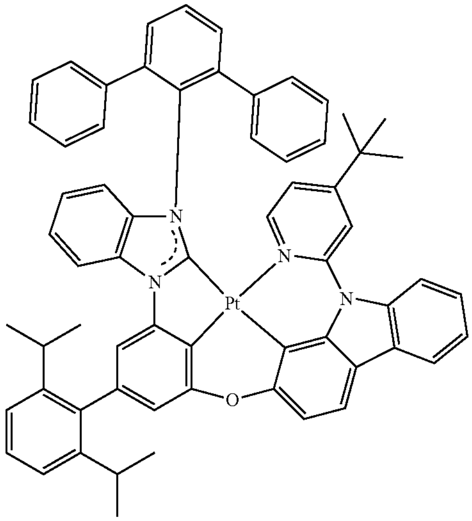
PD32
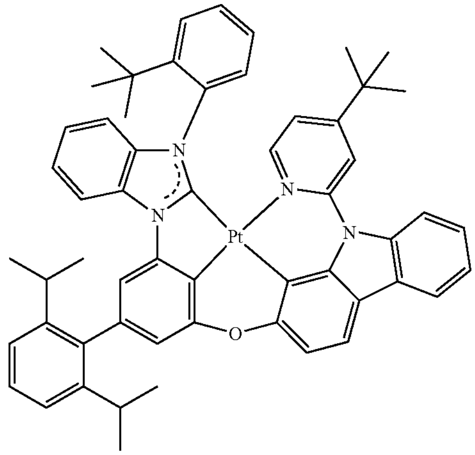

-continued
PD33
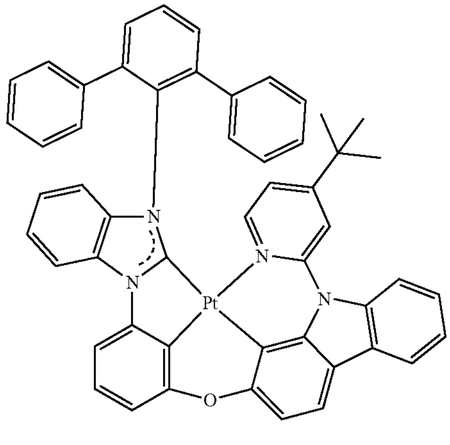
PD34
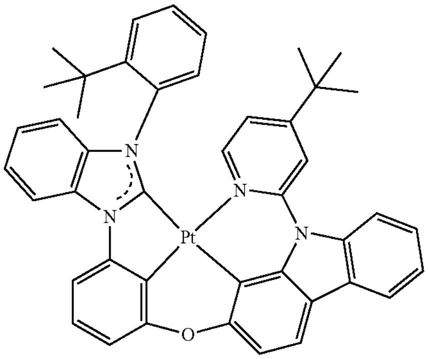
PD35
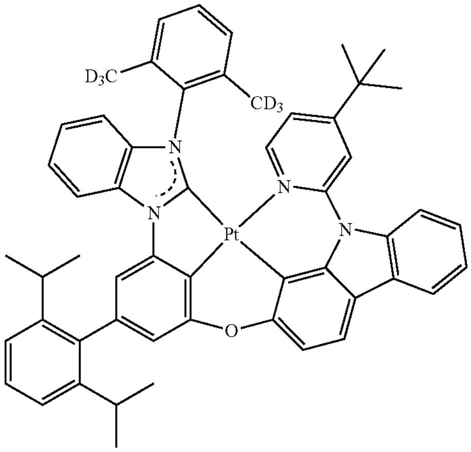
-continued
PD36
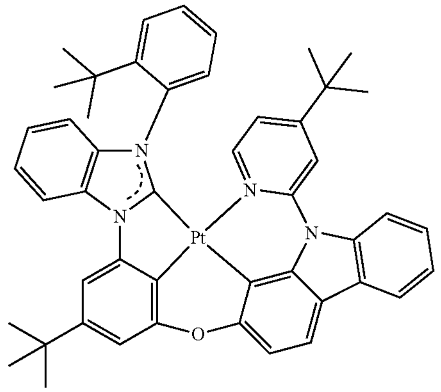
PD37
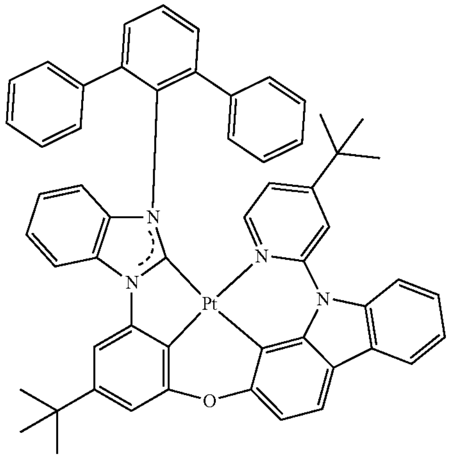
PD38
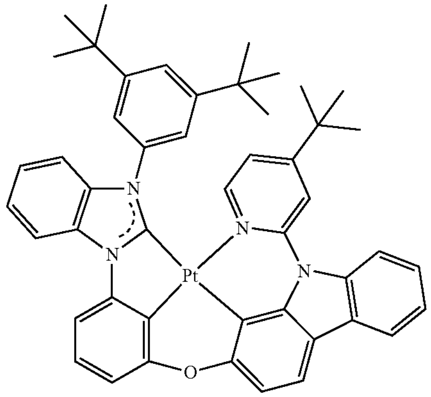

PD39
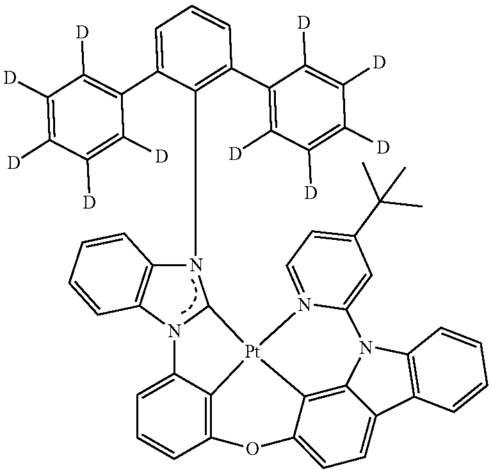
1
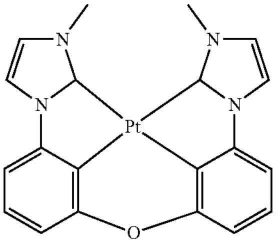
2
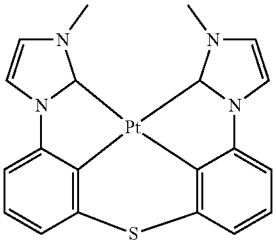
3
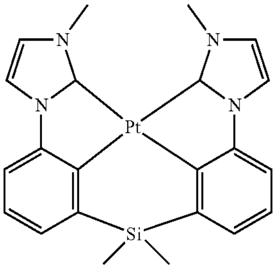
4
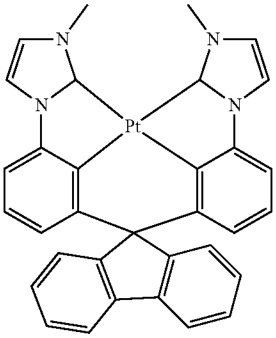
5
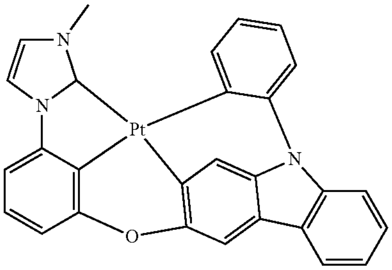
6
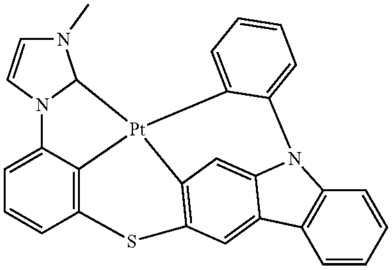
7
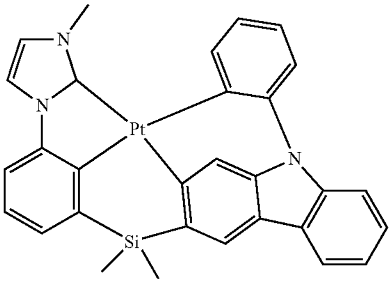
8
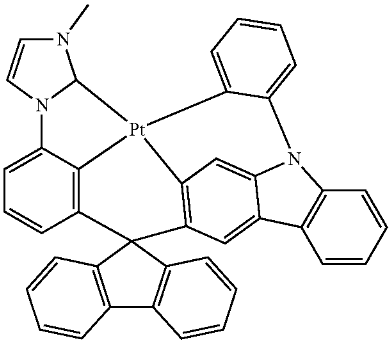
9
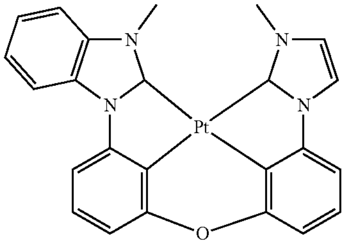

-continued
10
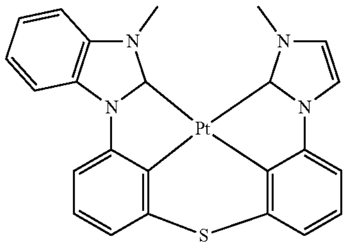
11
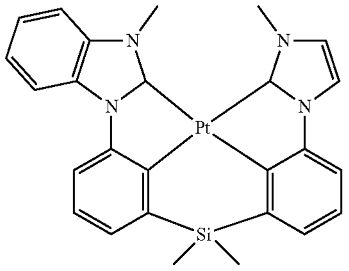
12
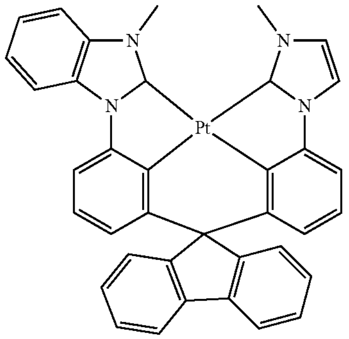
13
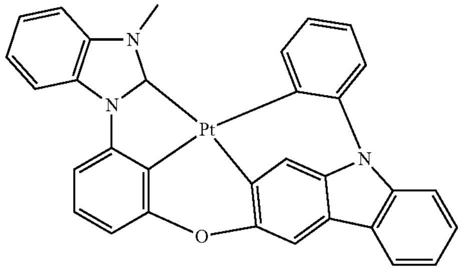
14
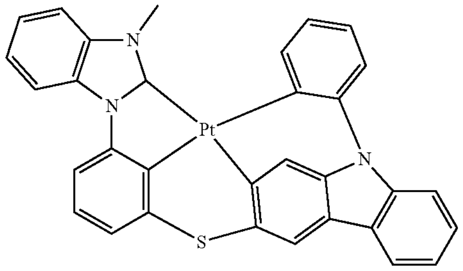
-continued
15
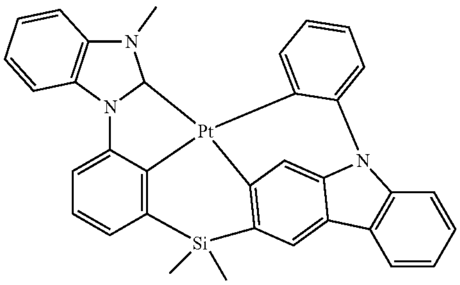
16
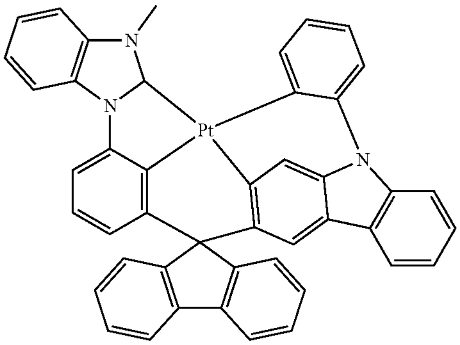
17
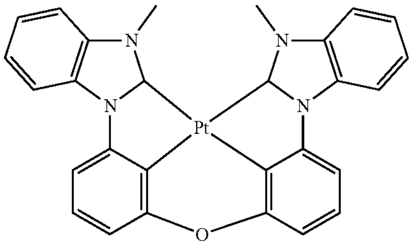
18
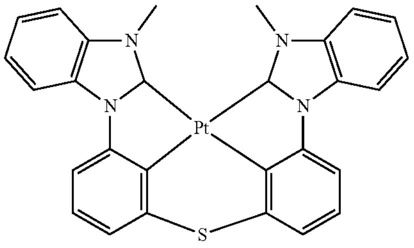
19
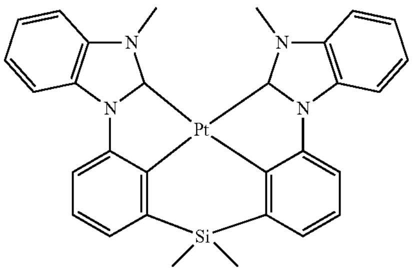

-continued
20
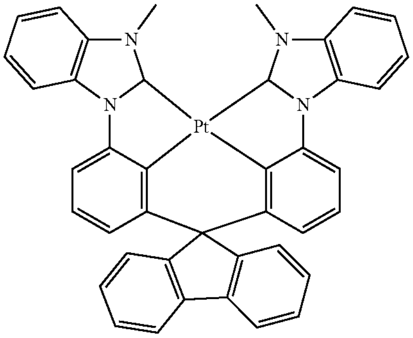
21
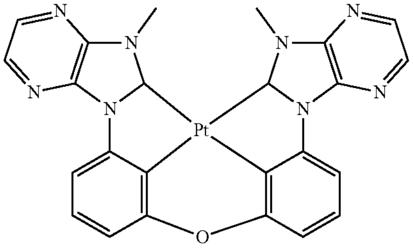
22
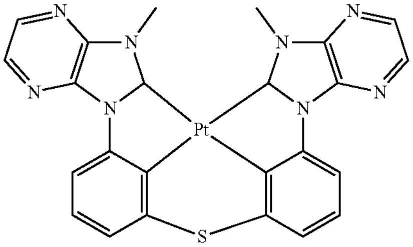
23
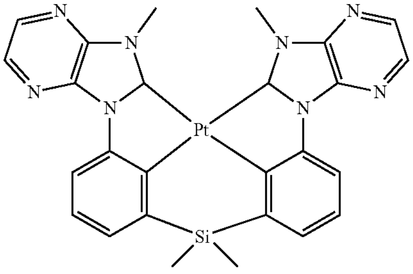
24
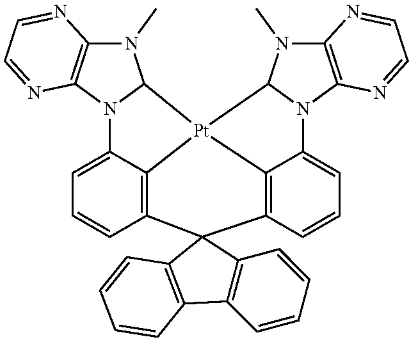
-continued
25
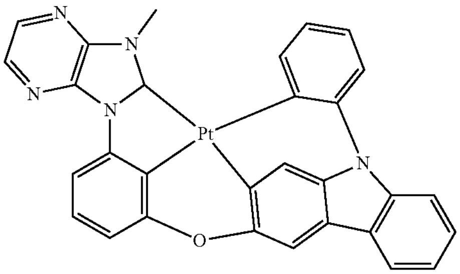
26
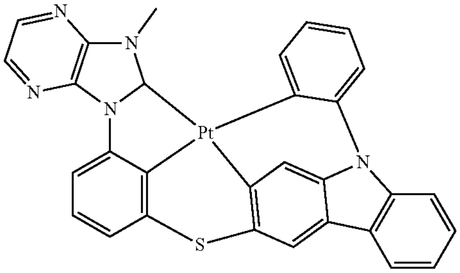
27
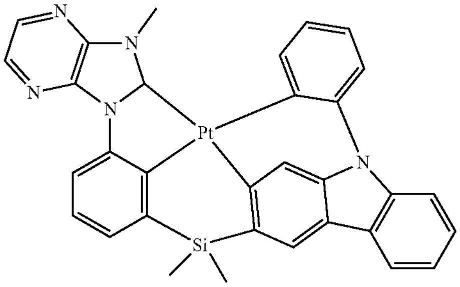
28
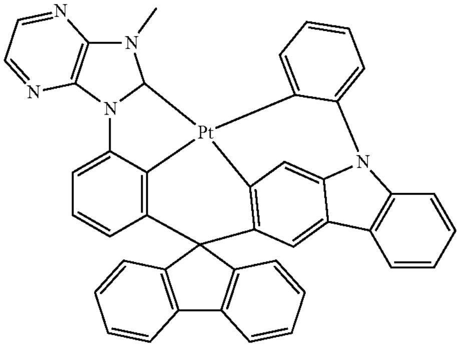
29
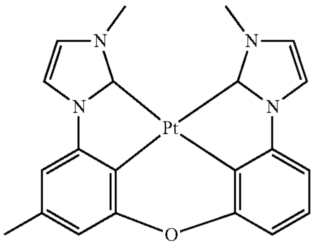

-continued
30
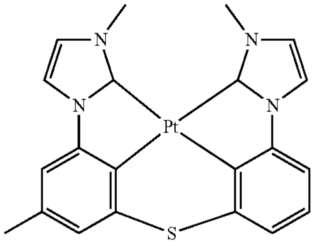
31
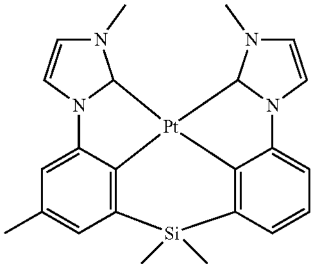
32
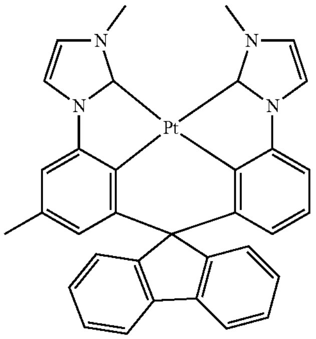
33
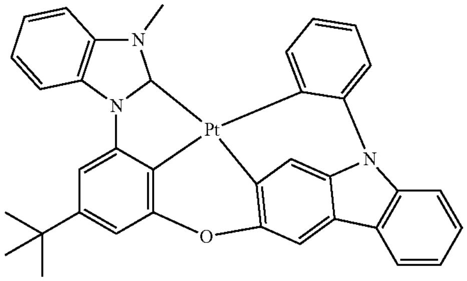
34
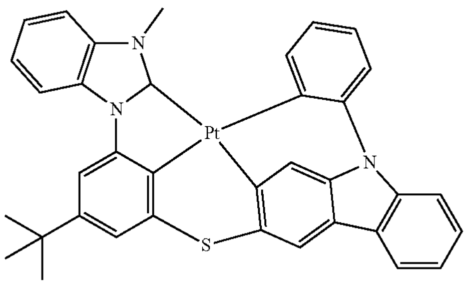
-continued
35
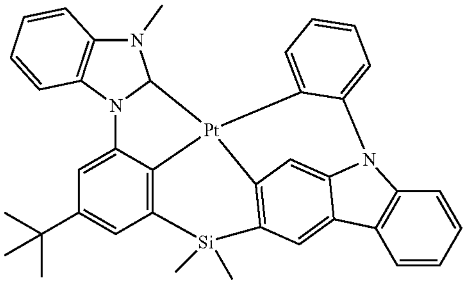
36
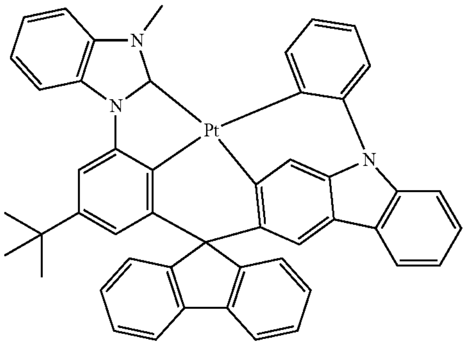
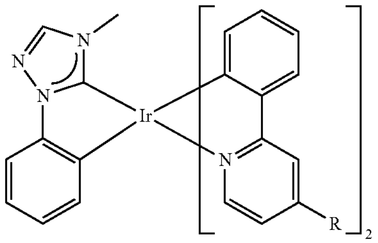
37 (R = H)
38 (R = Me)
39 (R = iso-Pr)
40 (R = tert-Bu)
41 (R = $NMe_2$)
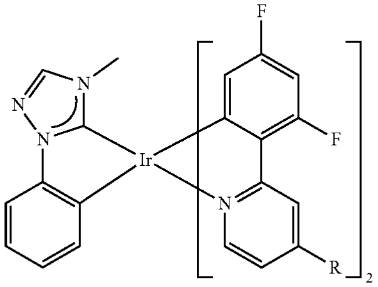
42 (R = H)
43 (R = Me)
44 (R = iso-Pr)
45 (R = tert-Bu)
46 (R = $NMe_2$)

-continued
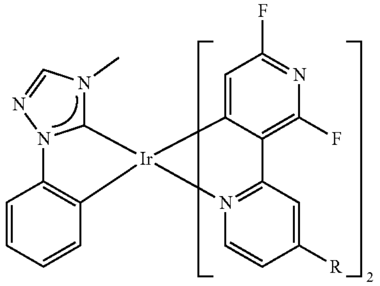
47 (R = H)
48 (R = Me)
49 (R = iso-Pr)
50 (R = tert-Bu)
51 (R = $NMe_2$)
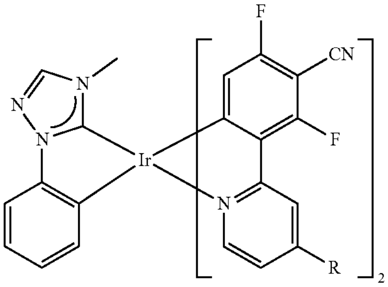
52 (R = H)
53 (R = Me)
54 (R = iso-Pr)
55 (R = tert-Bu)
56 (R = $NMe_2$)
57
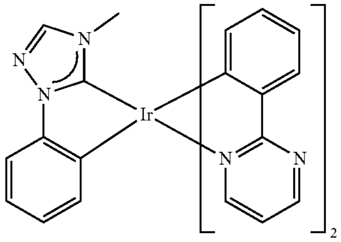
58
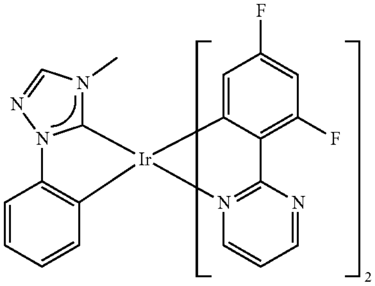
59
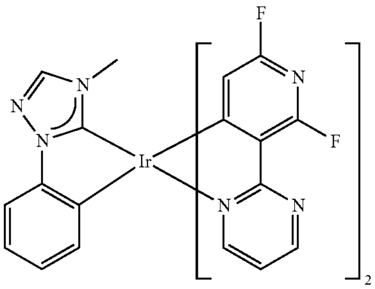
-continued
60
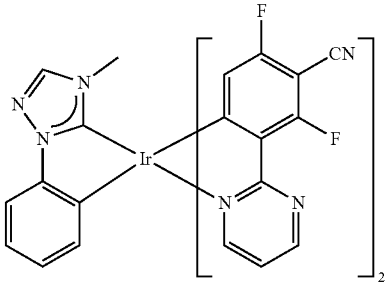
61
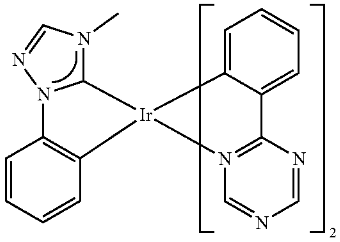
62
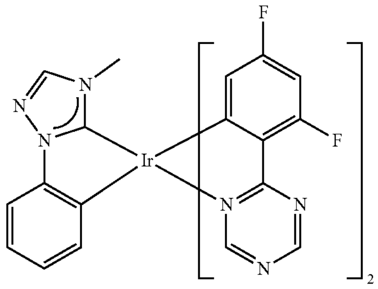
63
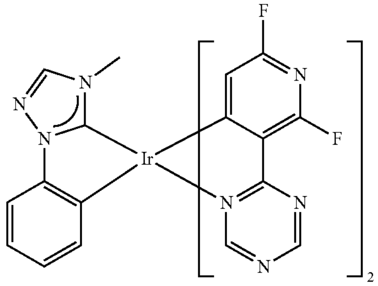
64
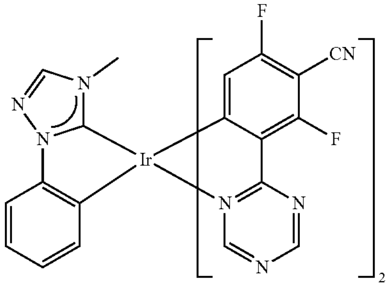

-continued
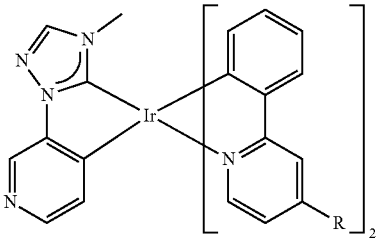
65 (R = H)
66 (R = Me)
67 (R = iso-Pr)
68 (R = tert-Bu)
69 (R = $NMe_2$)
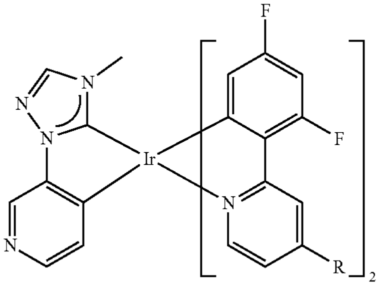
70 (R = H)
71 (R = Me)
72 (R = iso-Pr)
73 (R = tert-Bu)
74 (R = $NMe_2$)
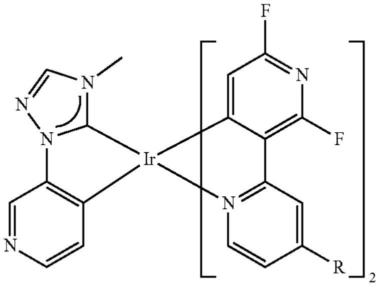
75 (R = H)
76 (R = Me)
77 (R = iso-Pr)
78 (R = tert-Bu)
79 (R = $NMe_2$)
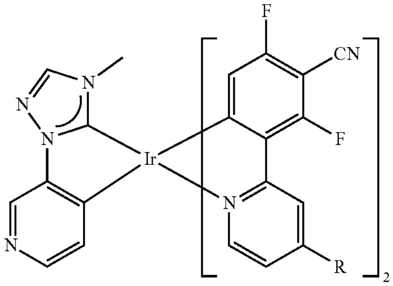
80 (R = H)
81 (R = Me)
82 (R = iso-Pr)
83 (R = tert-Bu)
84 (R = $NMe_2$)
-continued
85
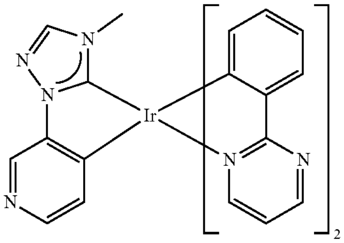
86
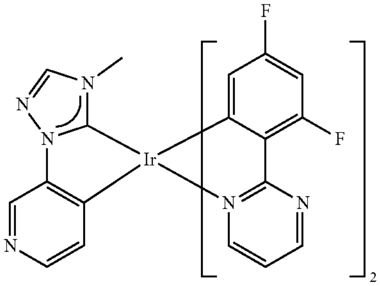
87
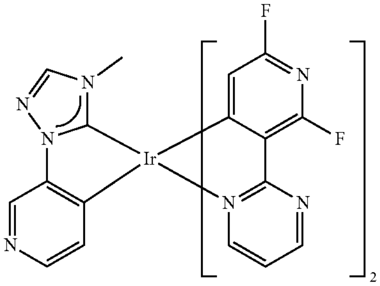
88
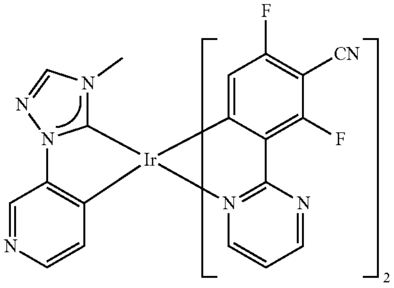
89
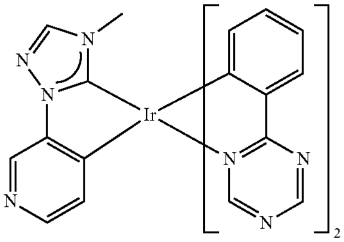

-continued
90
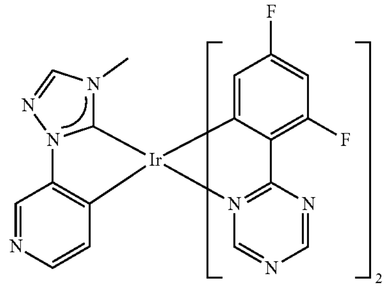
91
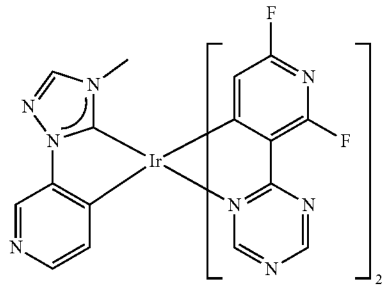
92
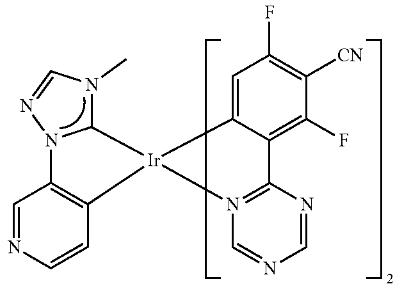
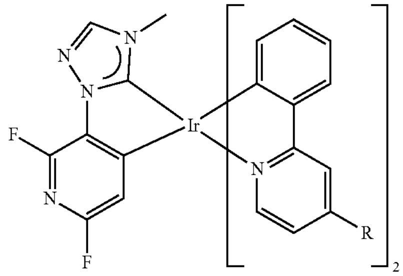
93 (R = H)
94 (R = Me)
95 (R = iso-Pr)
96 (R = tert-Bu)
97 (R = $NMe_2$)
-continued
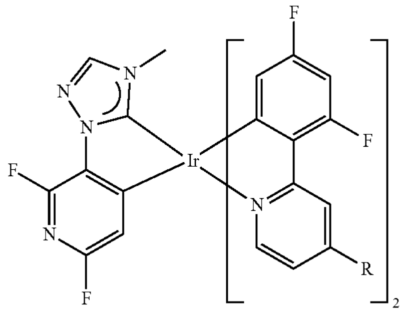
98 (R = H)
99 (R = Me)
100 (R = iso-Pr)
101 (R = tert-Bu)
102 (R = $NMe_2$)
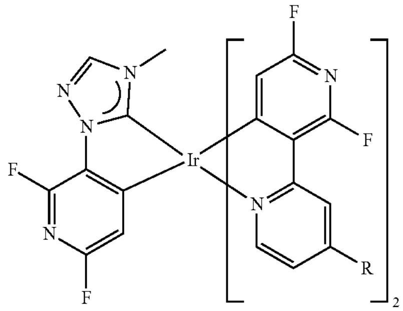
103 (R = H)
104 (R = Me)
105 (R = iso-Pr)
106 (R = tert-Bu)
107 (R = $NMe_2$)
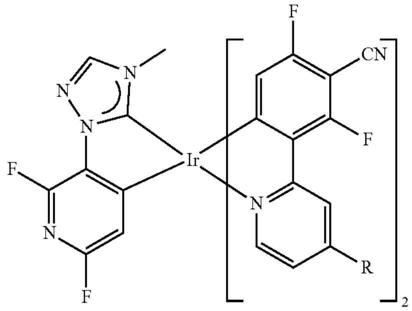
108 (R = H)
109 (R = Me)
110 (R = iso-Pr)
111 (R = tert-Bu)
112 (R = $NMe_2$)
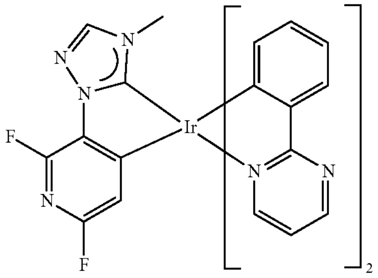
113

-continued

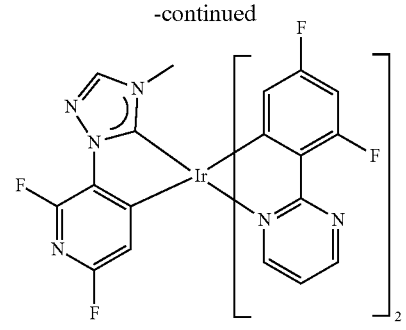

114

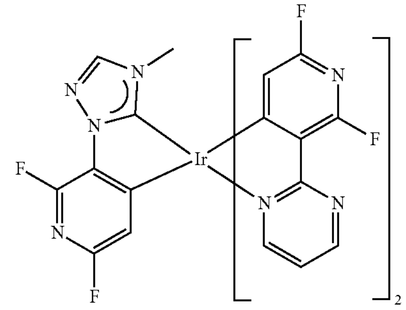

115

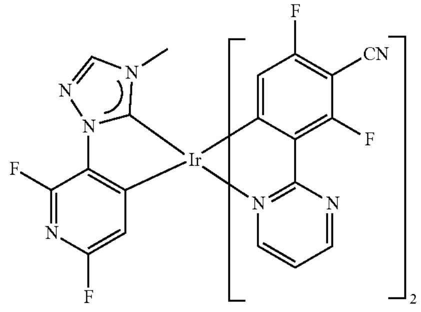

116

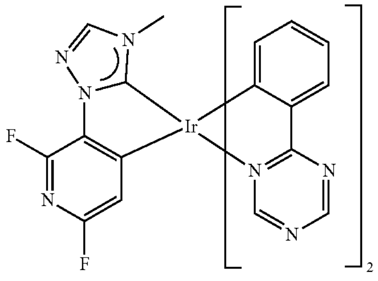

117

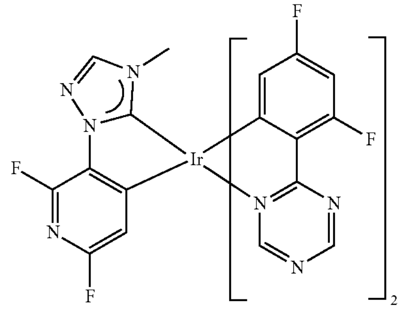

118

-continued

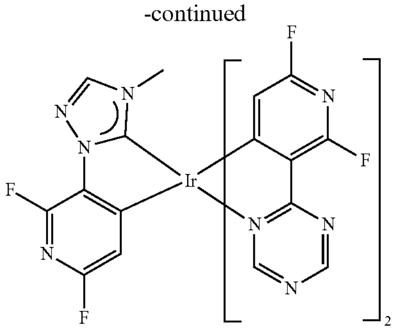

119

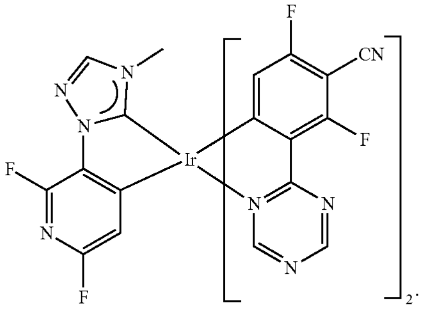

120

Fluorescent Dopant

The fluorescent dopant may include an amine group-containing compound, a styryl group-containing compound, or a combination thereof.

For example, the fluorescent dopant may include a compound represented by Formula 501:

Formula 501

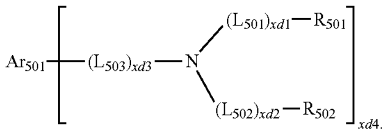

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may be a condensed cyclic group (for example, an anthracene group, a chrysene group, a pyrene group, and/or the like) in which three or more monocyclic groups are condensed together.

For example, xd4 in Formula 501 may be 2.

In one or more embodiments, the fluorescent dopant may include: one of Compounds FD1 to FD36; DPVBi; DPAVBi; or one or more combinations thereof:

FD1
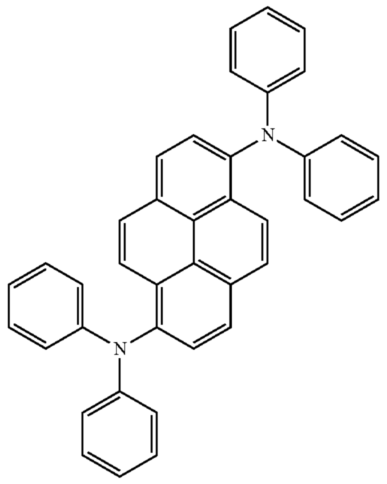
FD2
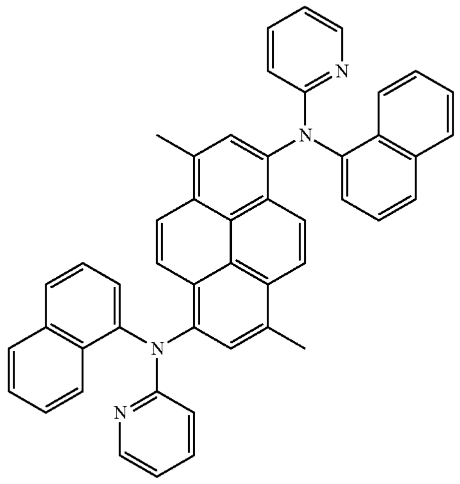
FD3
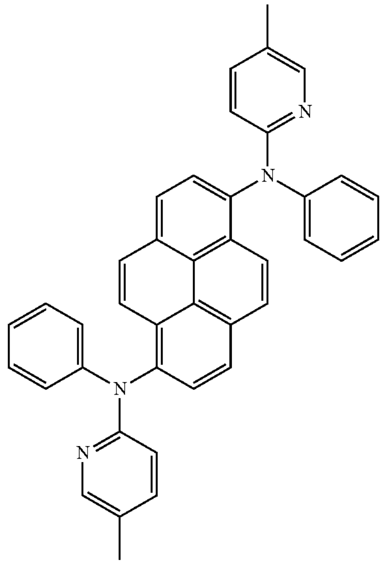

-continued
FD4
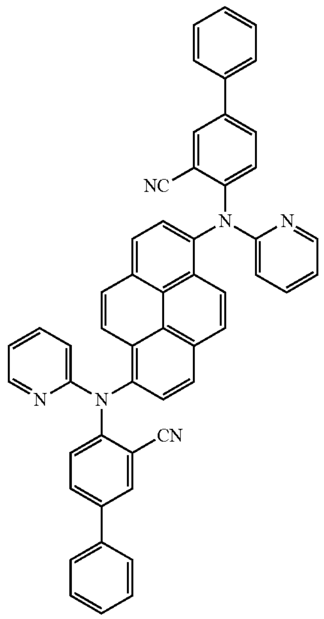
FD5
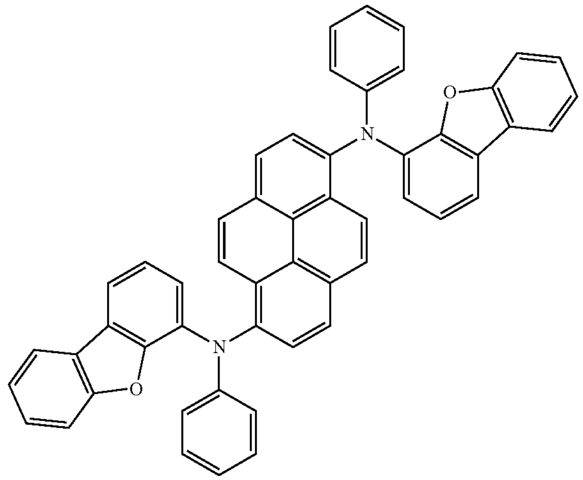
FD6
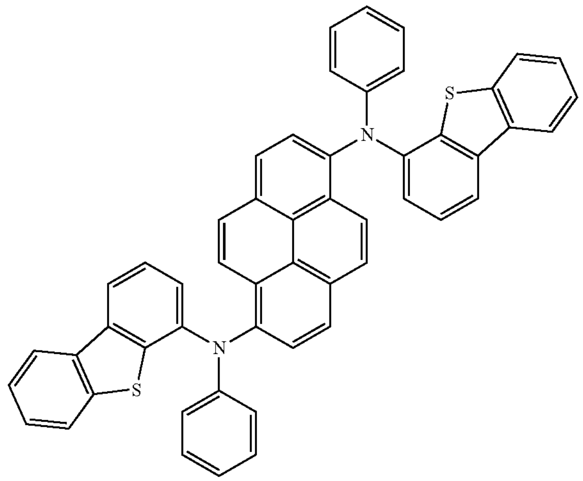

-continued
FD7
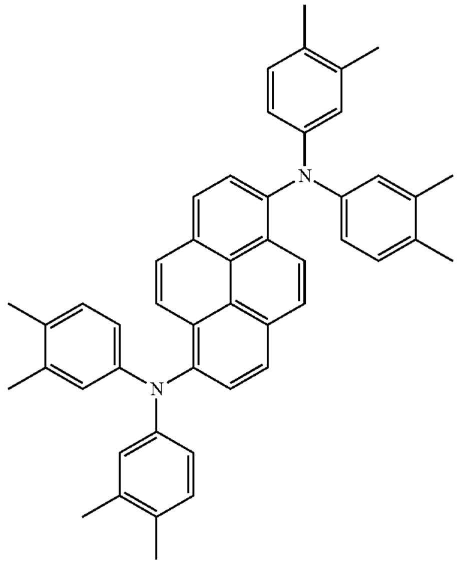
FD8
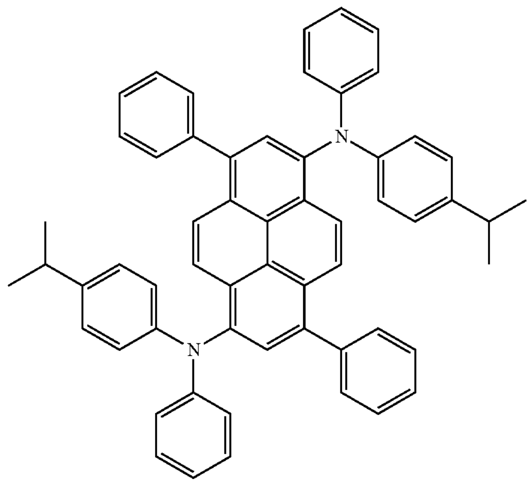
FD9
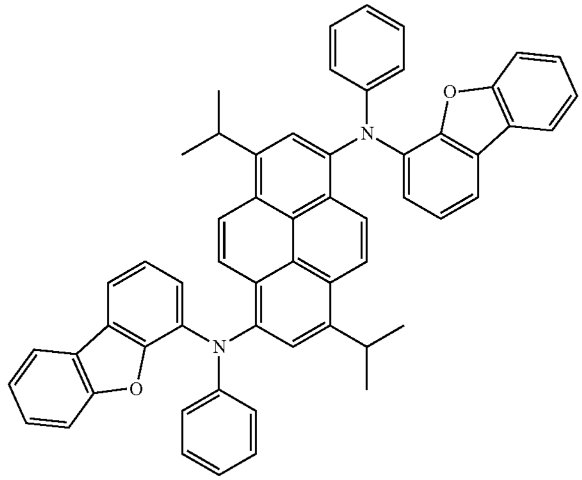

-continued
FD10
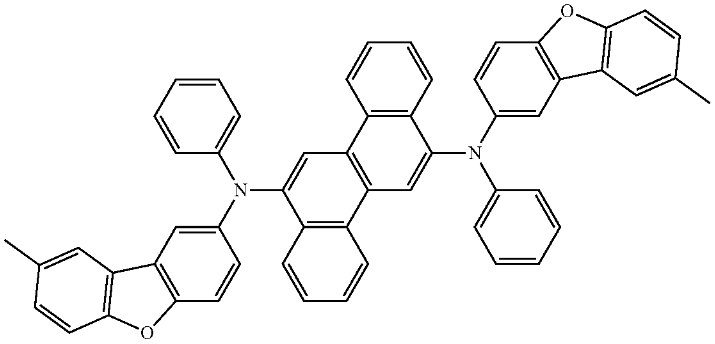
FD11
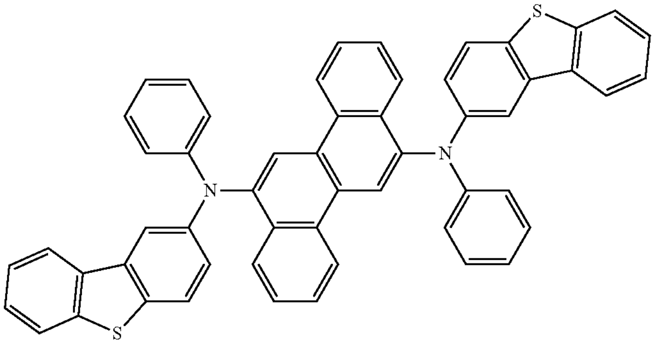
FD12
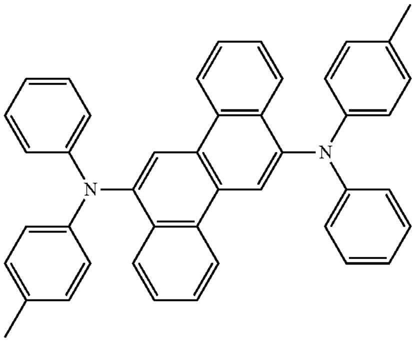
FD13
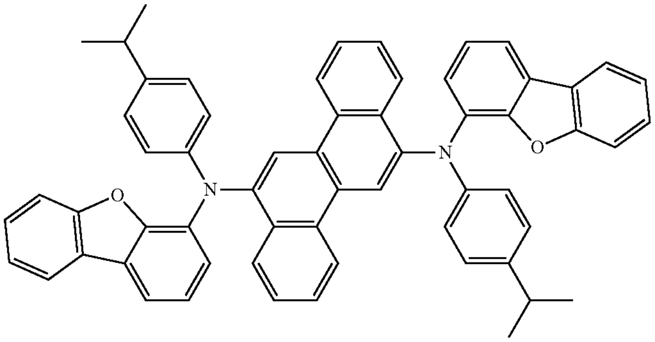
FD14
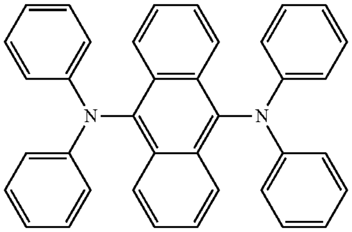

-continued
FD15
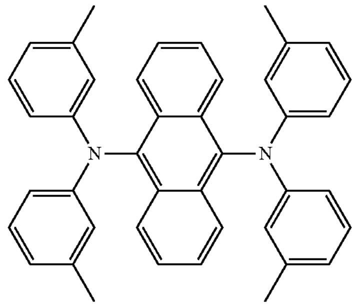
FD16
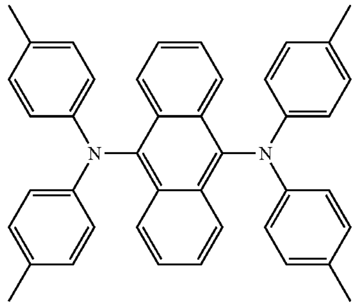
FD17
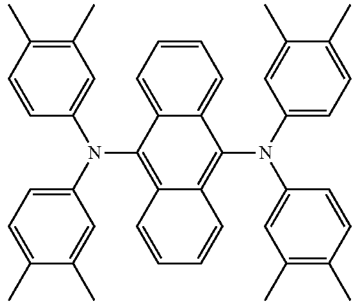
FD18
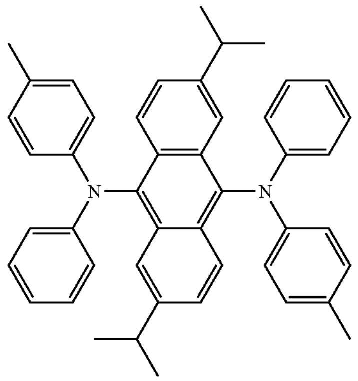

-continued
FD19
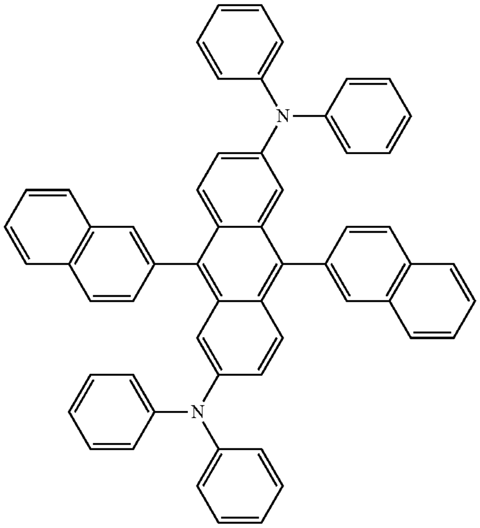
FD20
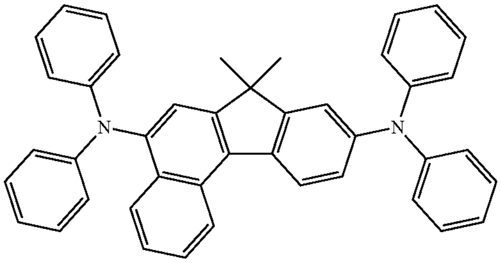
FD21
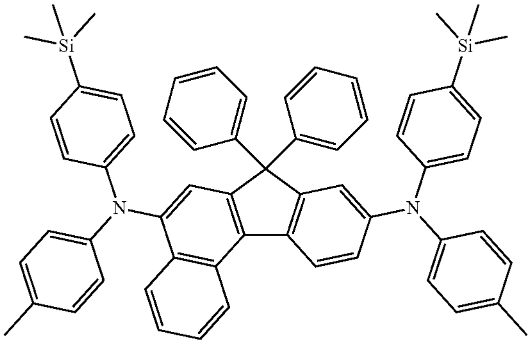
FD22
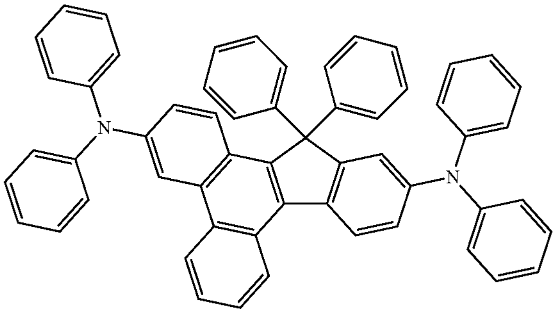

-continued
FD23
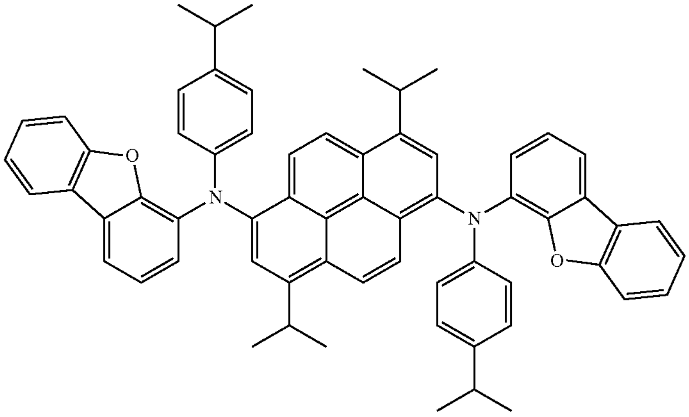
FD24
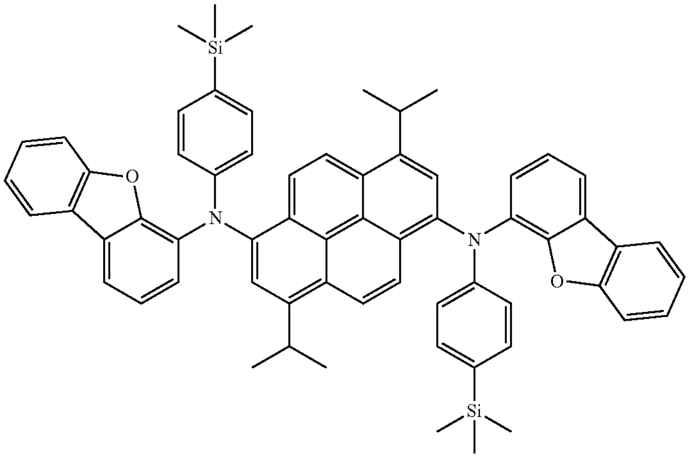
FD25
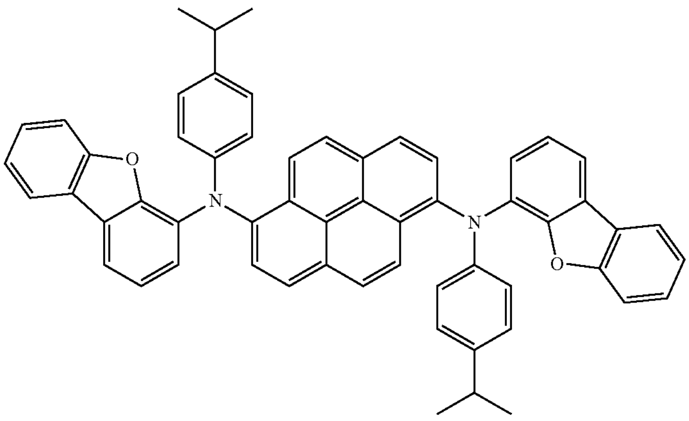

-continued
FD26
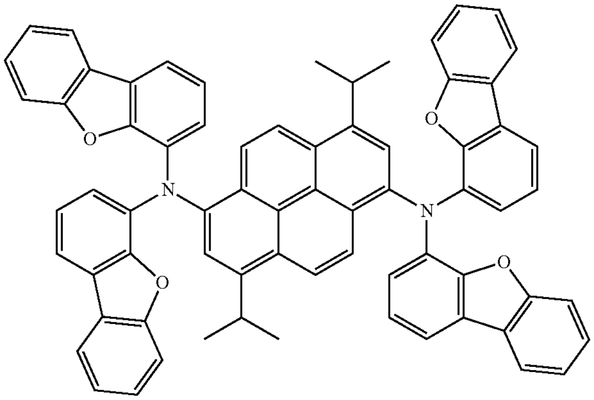
FD27
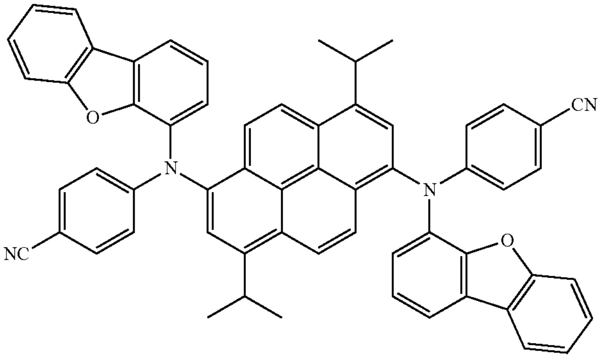
FD28
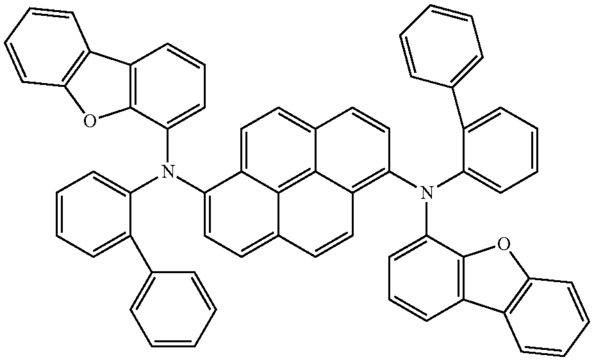
FD29
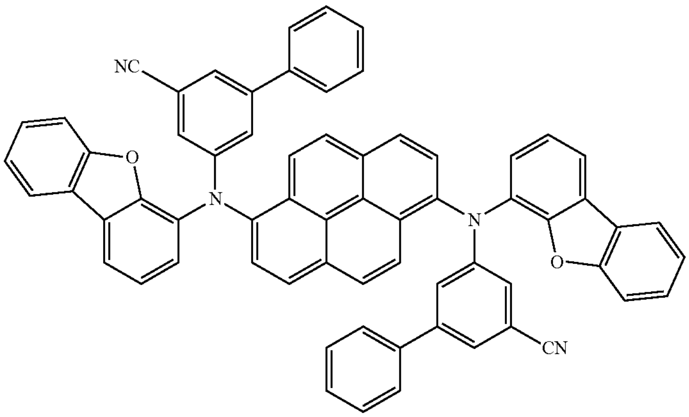

-continued
FD30
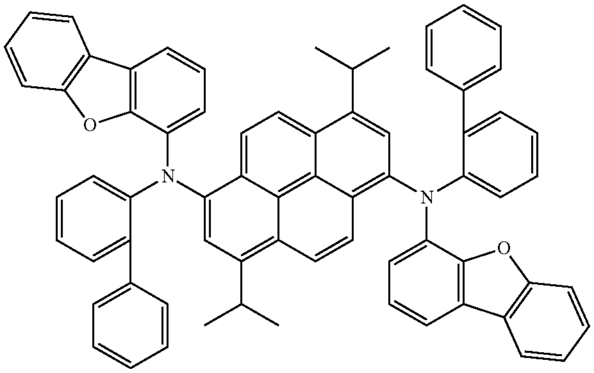
FD31
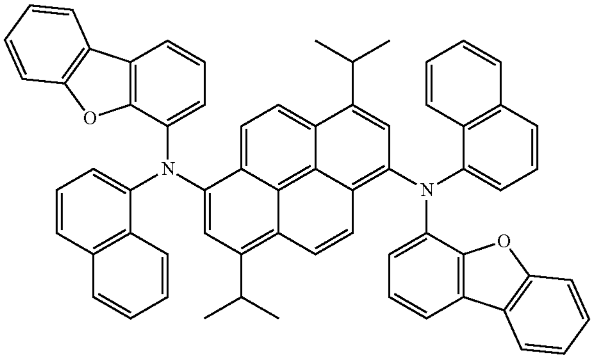
FD32
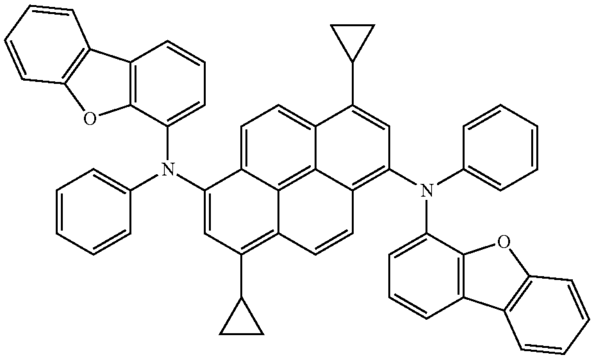
FD33
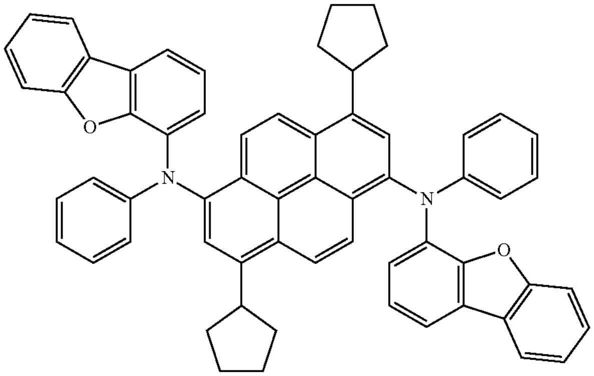

-continued
FD34
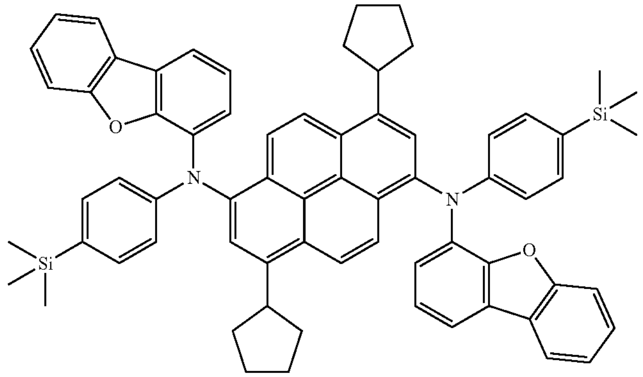
FD35
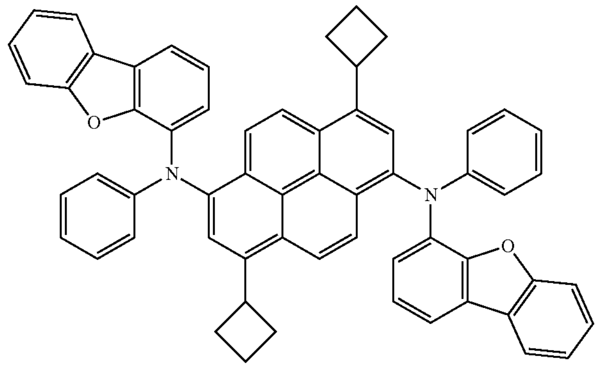
FD36
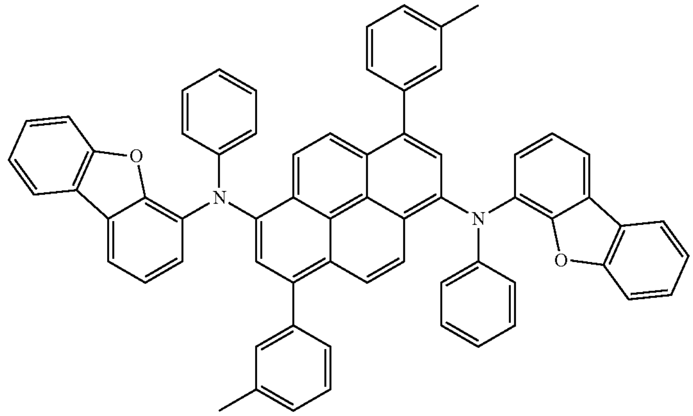
DPVBi
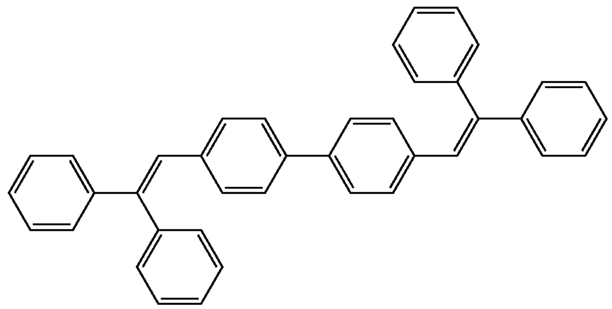

-continued

DPAVBi

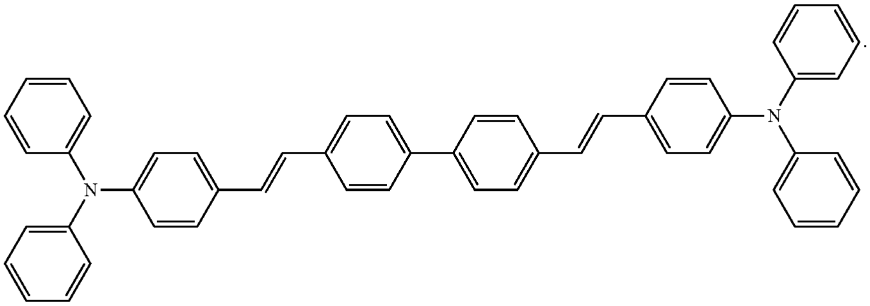

Delayed Fluorescence Material

The emission layer may include a delayed fluorescence material.

In the present disclosure, the delayed fluorescence material may be selected from compounds capable of emitting delayed fluorescence by a delayed fluorescence emission mechanism.

The delayed fluorescence material included in the emission layer may act as a host or a dopant, depending on the type or kind of other materials included in the emission layer.

In an embodiment, a difference between a triplet energy level (eV) of the delayed fluorescence material and a singlet energy level (eV) of the delayed fluorescence material may be about 0 eV or more and about 0.5 eV or less. When the difference between the triplet energy level (eV) of the delayed fluorescence material and the singlet energy level (eV) of the delayed fluorescence material is within the ranges above, up-conversion from the triplet state to the singlet state of the delayed fluorescence materials may effectively occur, thereby improving (increasing) luminescence efficiency and/or the like of the light-emitting device 10.

For example, the delayed fluorescence material may include: i) a material including at least one electron donor (for example, a π electron-rich $C_3$-$C_{60}$ cyclic group and/or the like, such as a carbazole group) and at least one electron acceptor (for example, a sulfoxide group, a cyano group, a π electron-deficient nitrogen-containing $C_1$-$C_{60}$ cyclic group, and/or the like); and ii) a material including a $C_8$-$C_{60}$ polycyclic group in which two or more cyclic groups are condensed together while sharing boron (B).

Examples of the delayed fluorescence material are at least one of Compounds DF1 to DF9 and D-01 to D52:

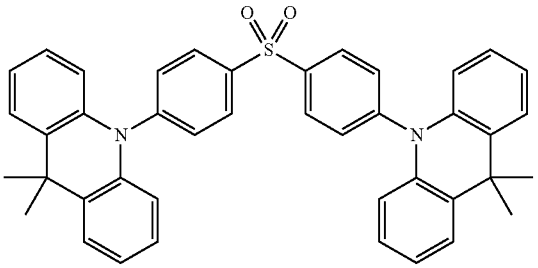

DF1(DMAC-DPS)

-continued

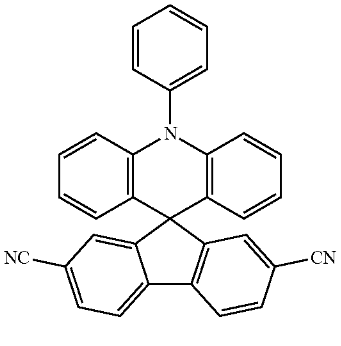

DF2(ACRFLCN)

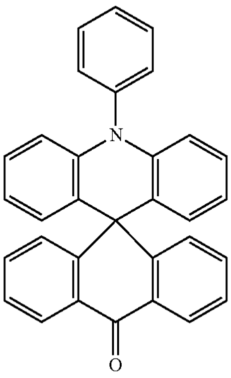

DF3(ACRSA)

-continued
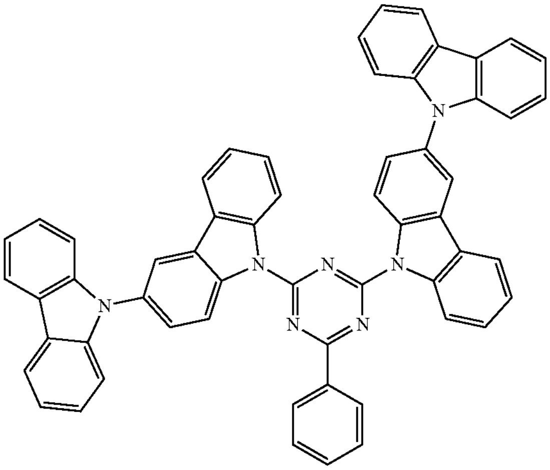
DF4(CC2TA)
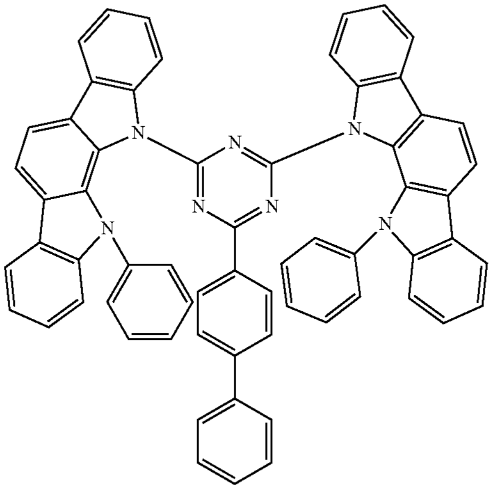
DF5(PIC-TRZ)
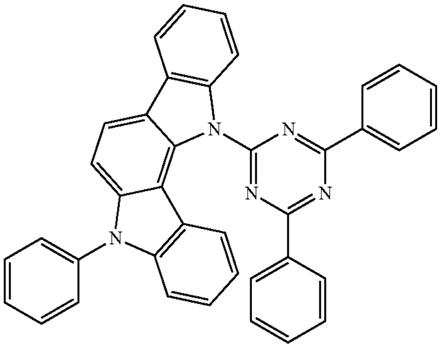
DF6(PIC-TRZ2)
-continued
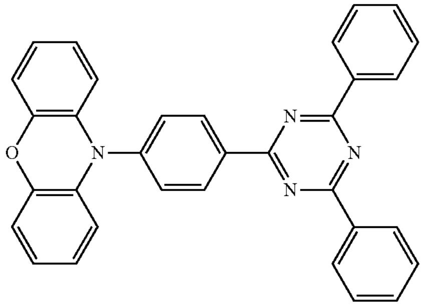
DF7(PXZ-TRZ)
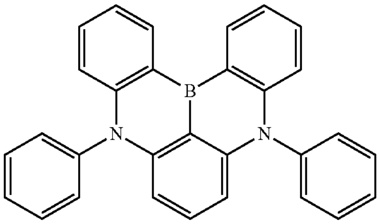
DF8(DABNA-1)
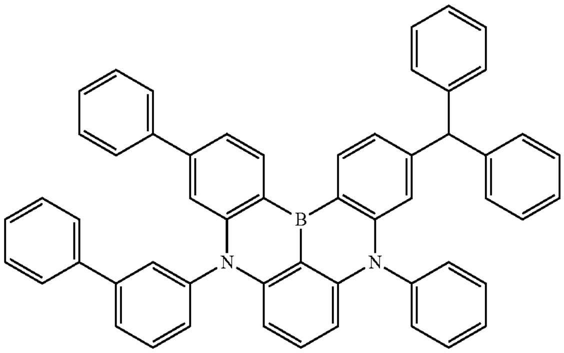
DF9(DABNA-2)
D-01
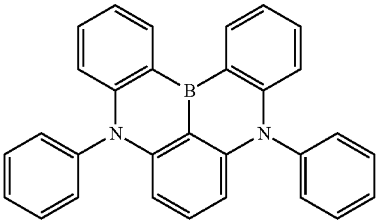
D-02
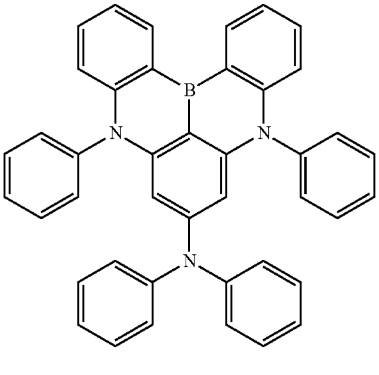

-continued
D-03
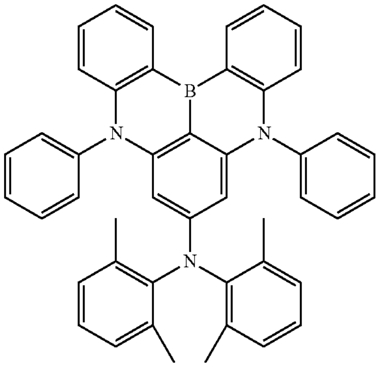
D-04
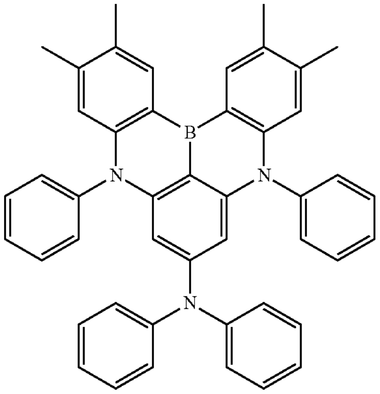
D-05
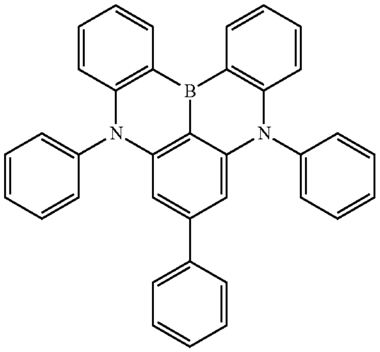
D-06
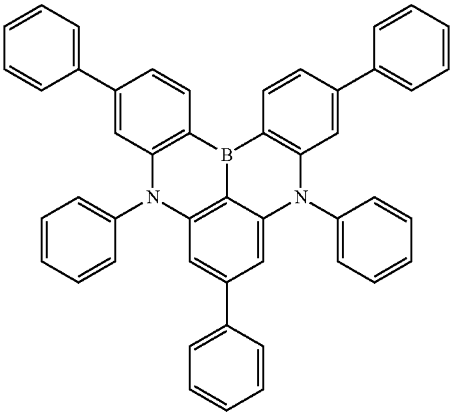
-continued
D-07
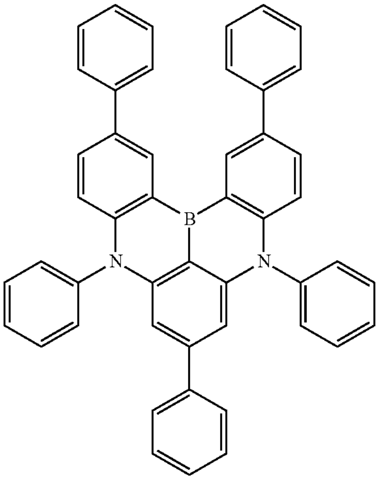
D-08
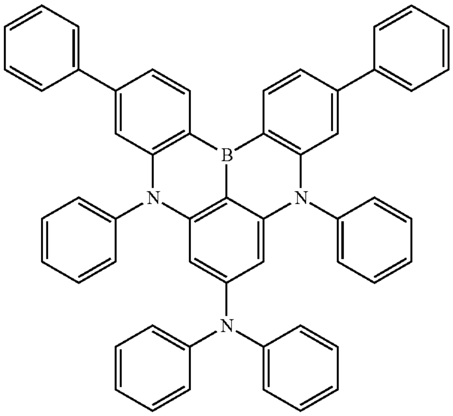
D-09
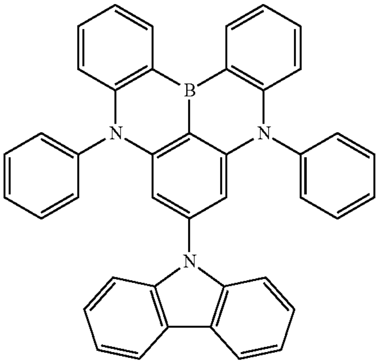

-continued
D-10
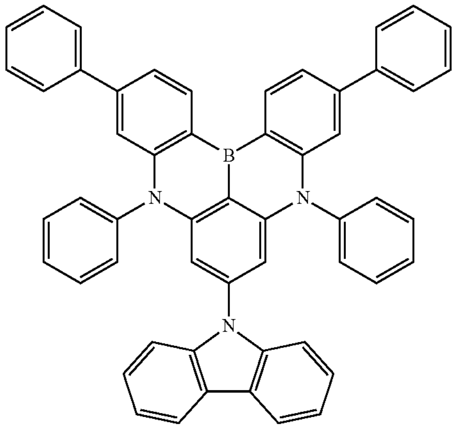
D-11
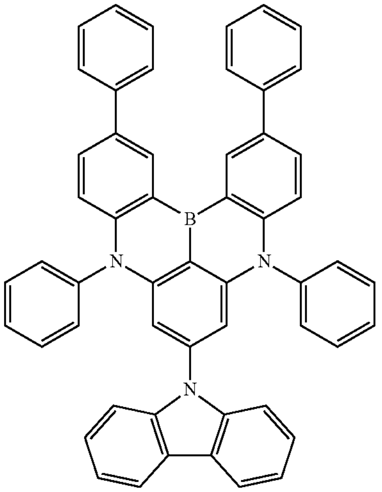
D-12
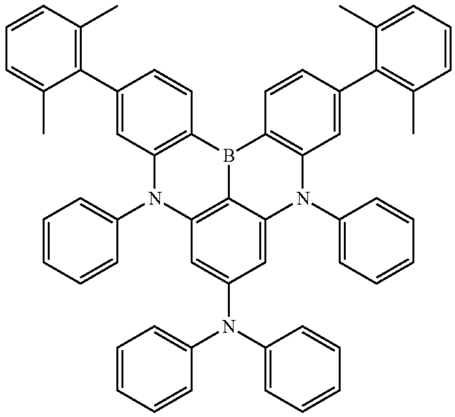
-continued
D-13
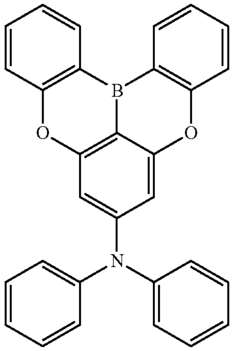
D-14
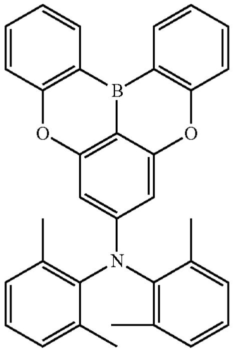
D-15
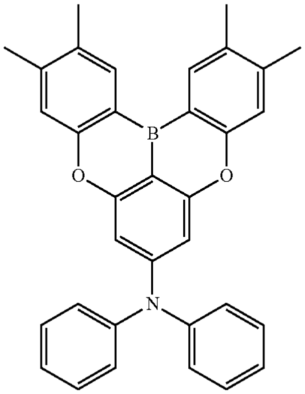
D-16
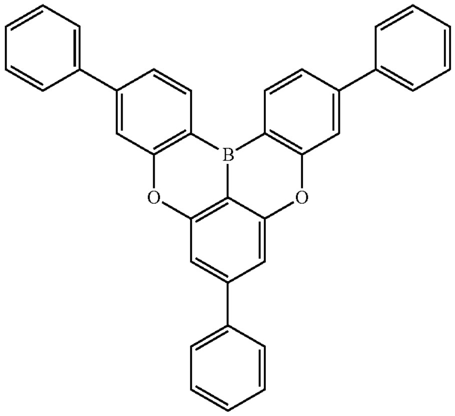

-continued
D-17
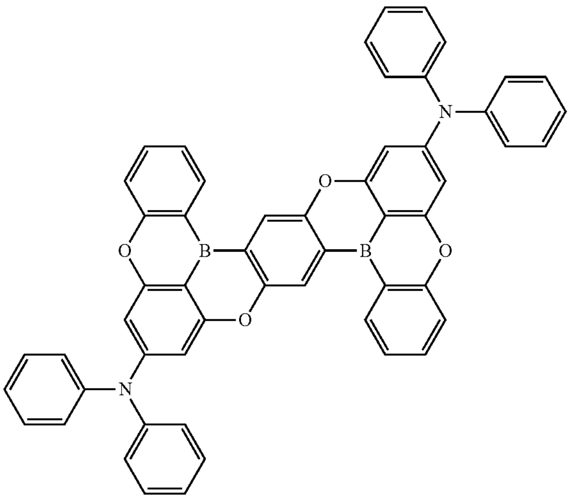
D-18
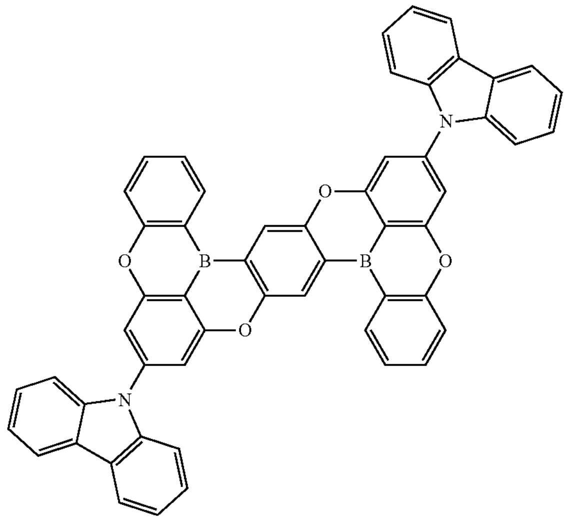
D-19
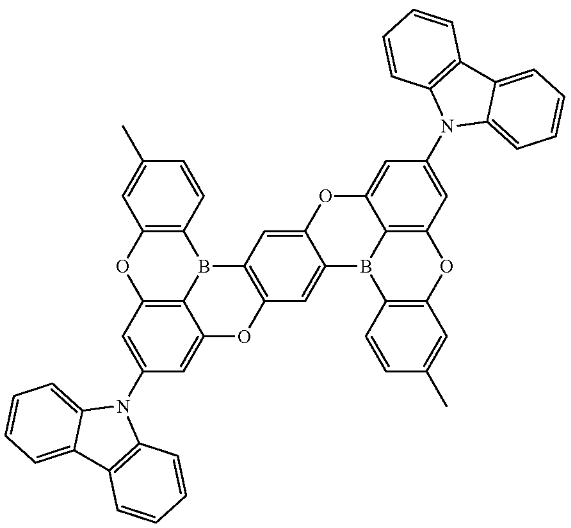
-continued
D-20
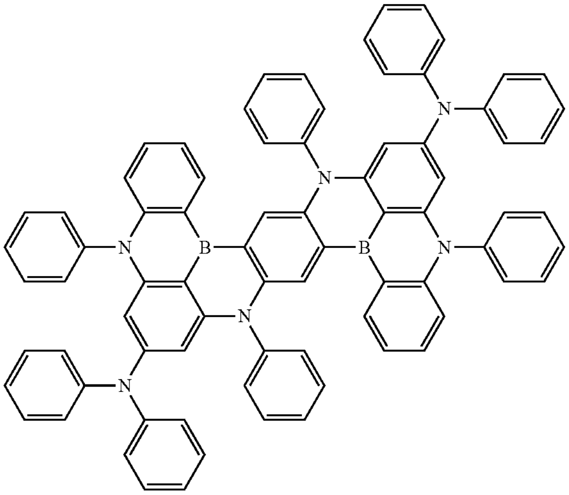
D-21
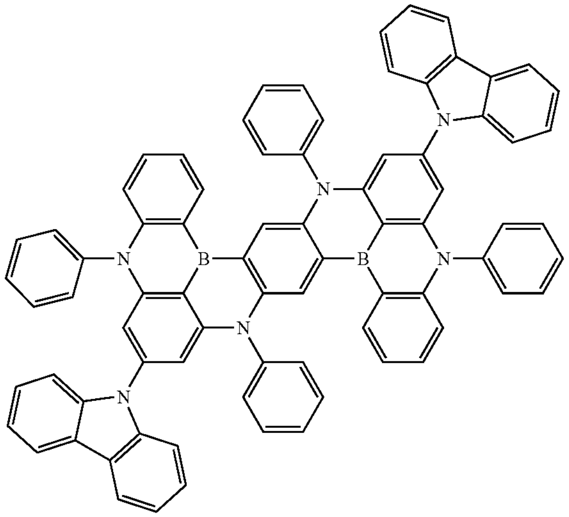
D-22
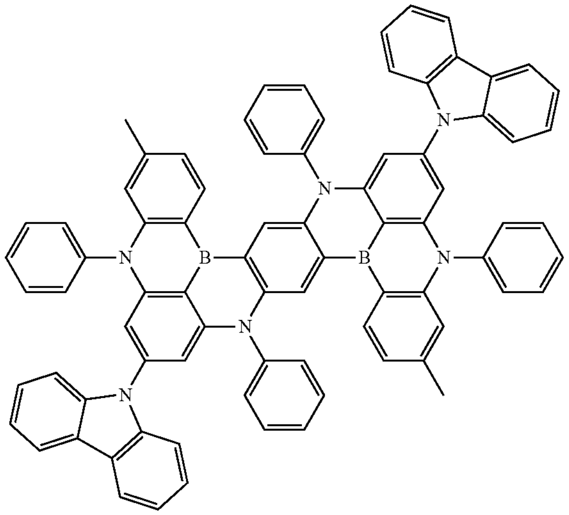

-continued
D-23
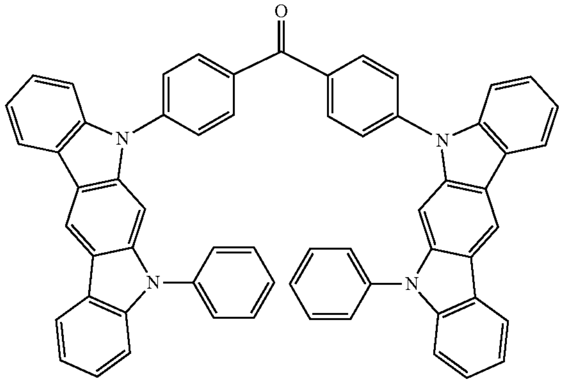
D-24
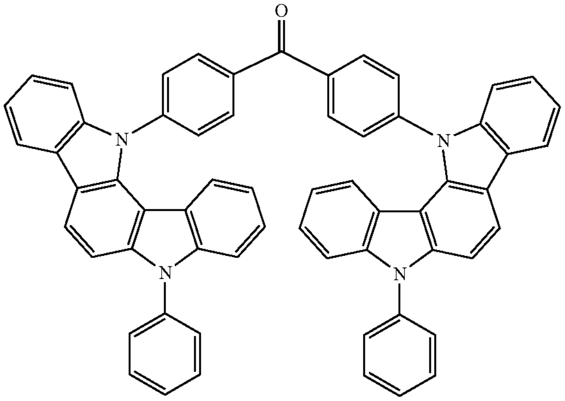
D-25
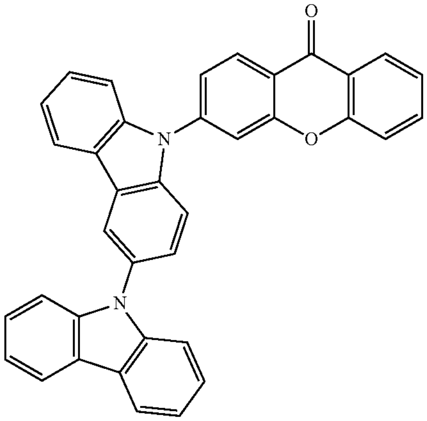
-continued
D-26
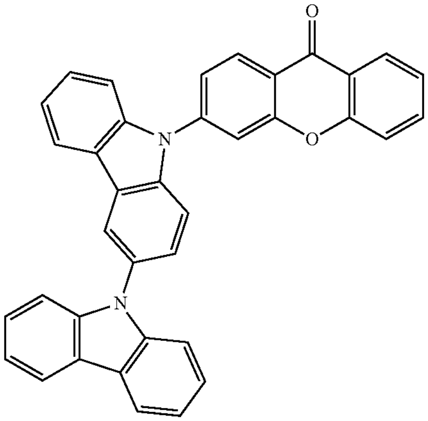
D-27
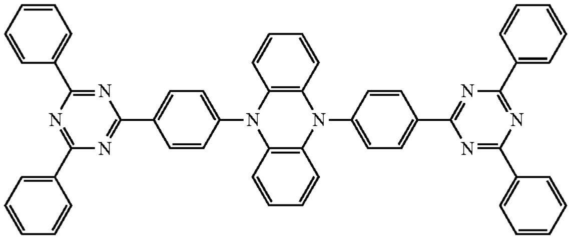
D-28
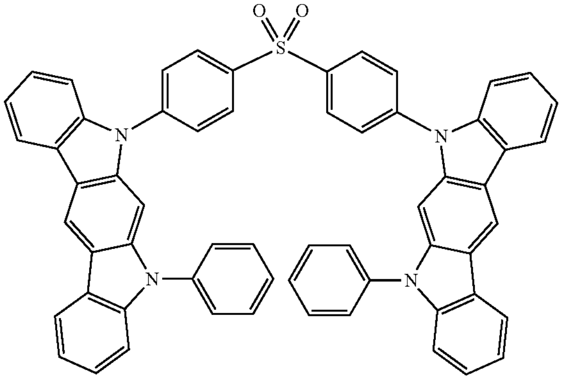
D-29
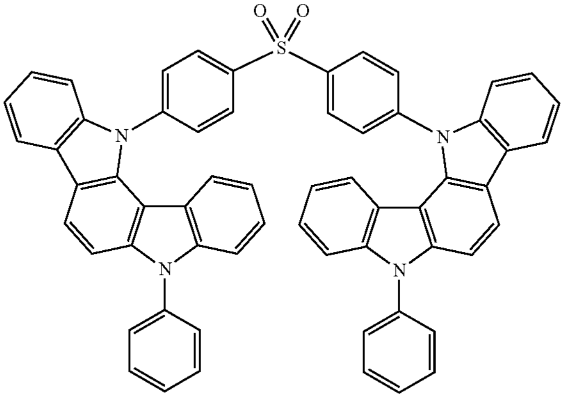

-continued
D-30
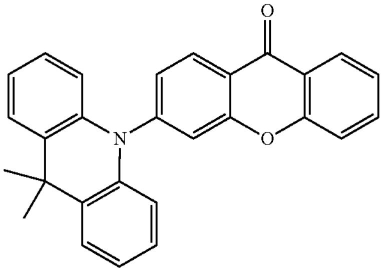
D-31
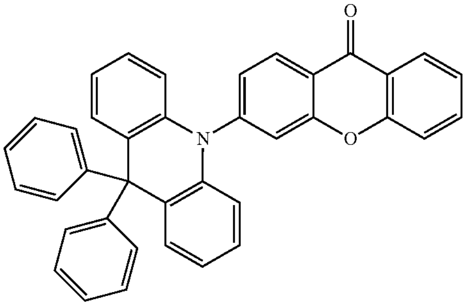
D-32
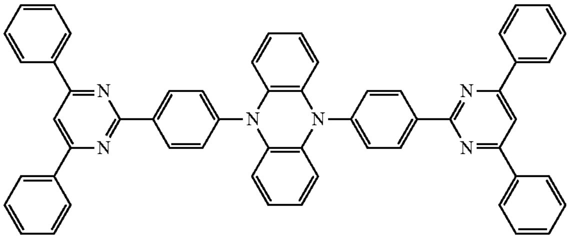
D-33
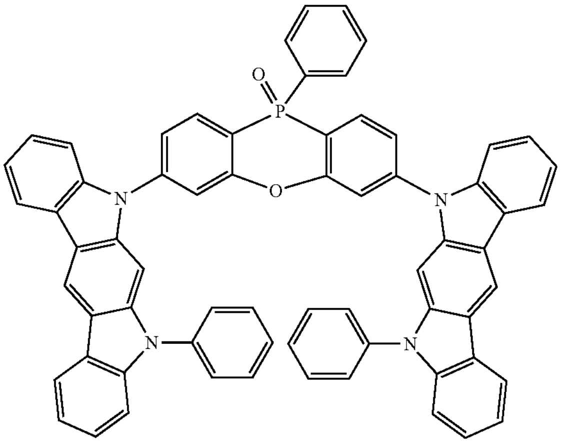
-continued
D-34
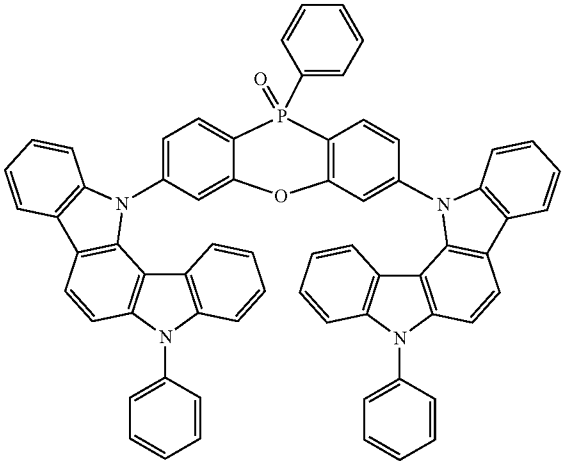
D-35
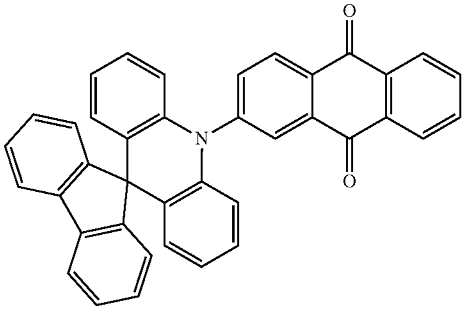
D-36
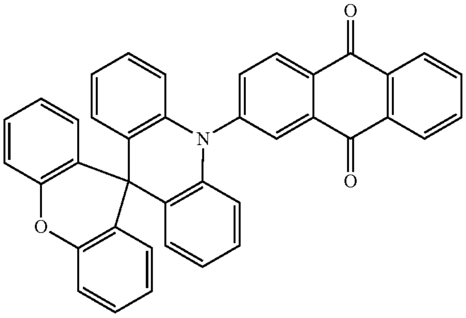
D-37
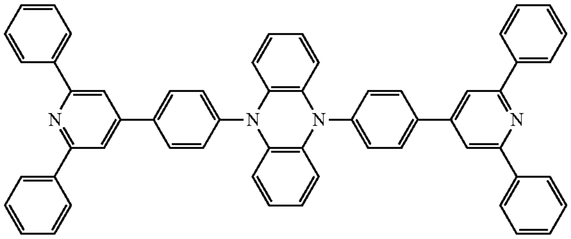

-continued
D-38
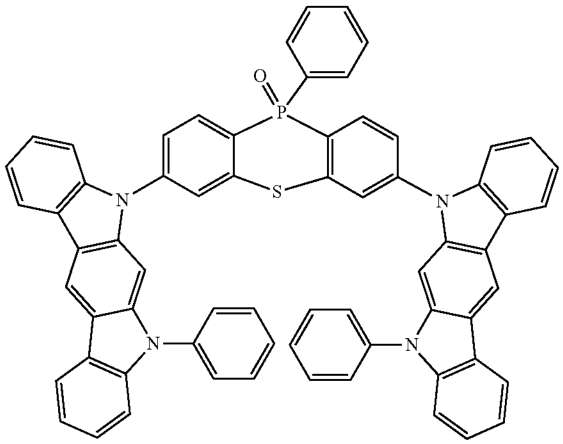
D-39
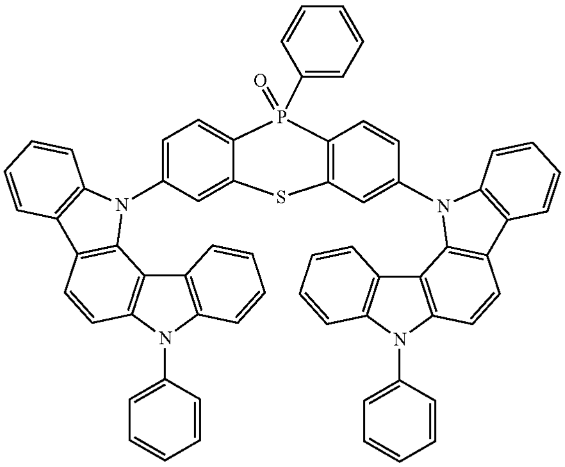
D-40
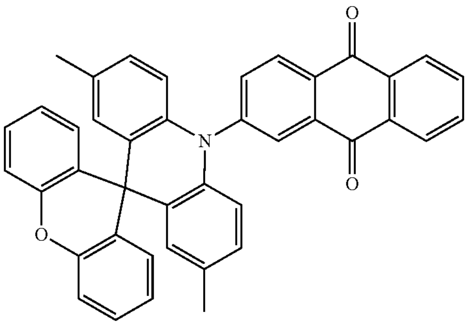
-continued
D-41
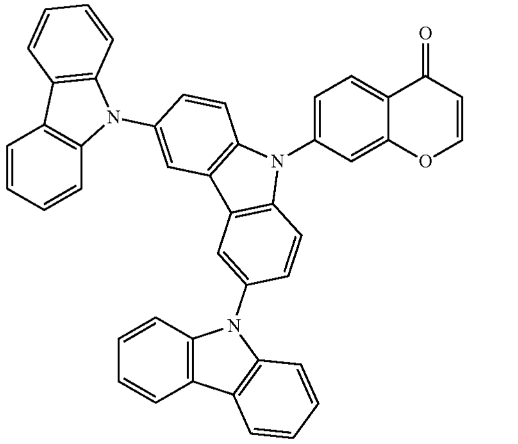
D-42
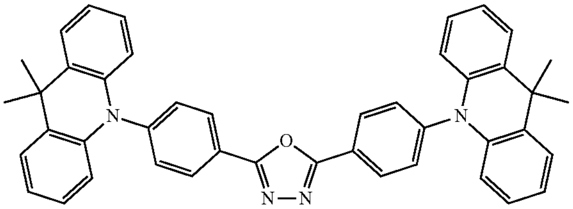
D-43
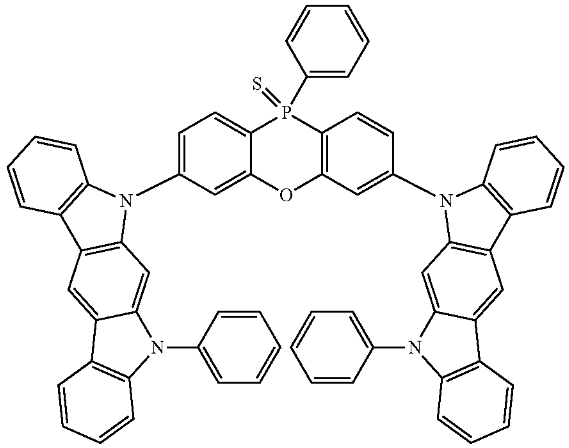
D-44
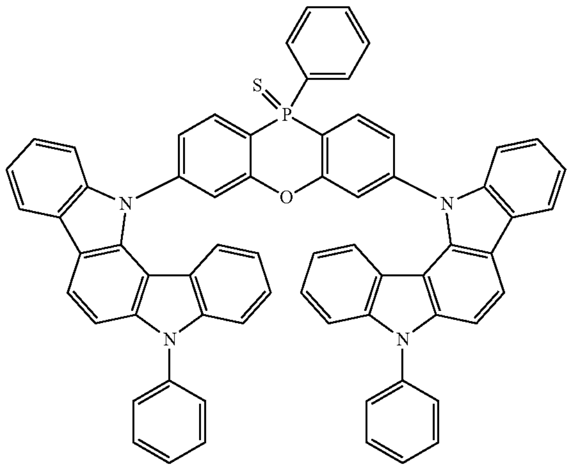

-continued

D-45

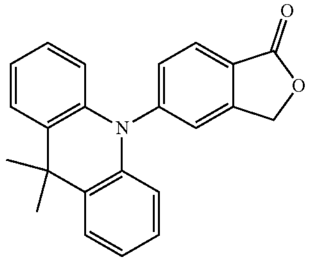

D-46

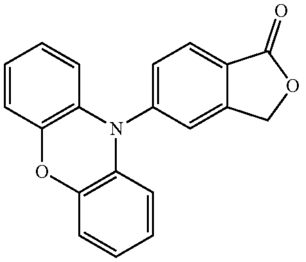

D-47

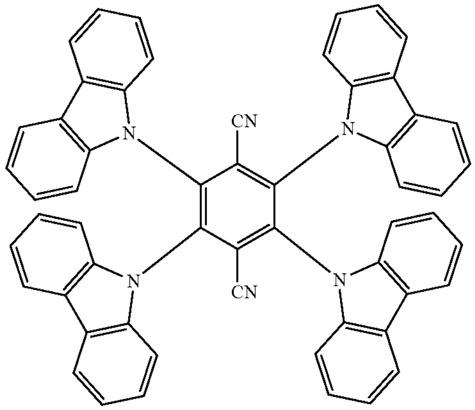

D-48

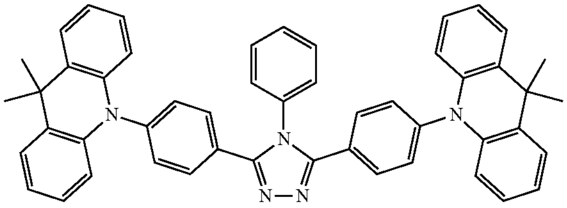

D-49

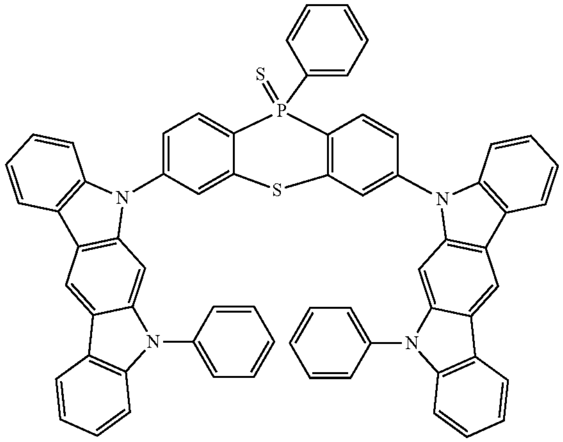

-continued

D-50

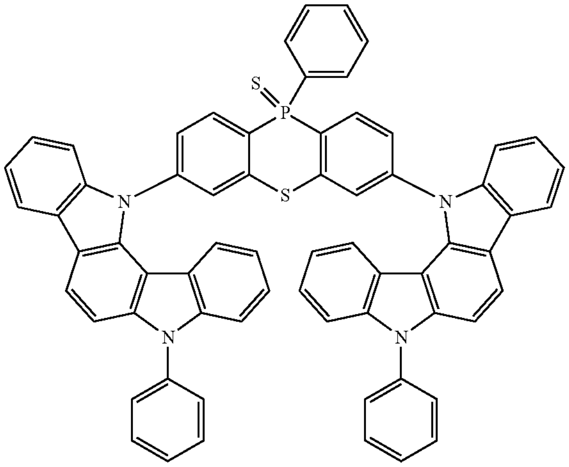

D-51

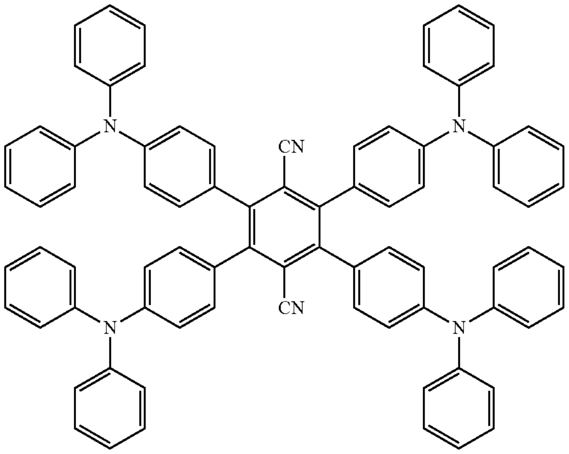

D-52

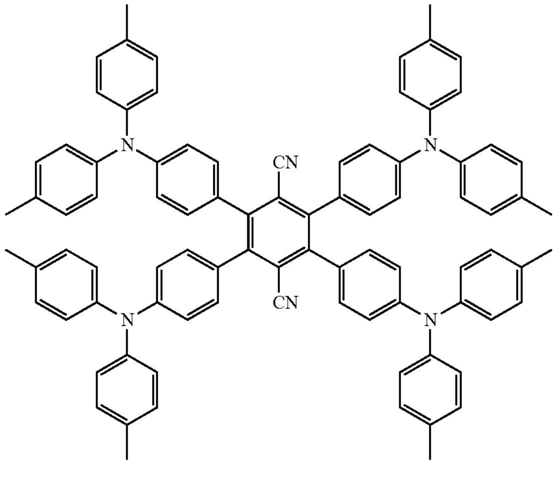

.

Electron Transport Region in Interlayer 130

The electron transport region may have: i) a single-layered structure including (e.g., consisting of) a single layer consisting of a single material, ii) a single-layered structure including (e.g., consisting of) a single layer including (e.g., consisting of) a plurality of different materials, or iii) a multi-layered structure including a plurality of layers including different materials.

The electron transport region may include a hole-blocking layer, an electron transport layer, an electron injection layer, or one or more combinations thereof.

In an embodiment, the electron transport region may have an electron transport layer/electron injection layer structure or a hole-blocking layer/electron transport layer/electron injection layer structure, wherein, in each structure, constituting layers are sequentially stacked from the emission layer.

In an embodiment, the electron transport region (for example, the hole-blocking layer, or the electron transport layer in the electron transport region) may include a metal-free compound including at least one π electron-deficient nitrogen-containing $C_1$-$C_{60}$ cyclic group.

For example, the electron transport region 160 may include a compound represented by Formula 601:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_6$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$ may be linked together via a single bond.

In one or more embodiments, $Ar_{601}$ in Formula 601 may be a substituted or unsubstituted anthracene group.

In one or more embodiments, the electron transport region may include a compound represented by Formula 601-1:

Formula 601-1

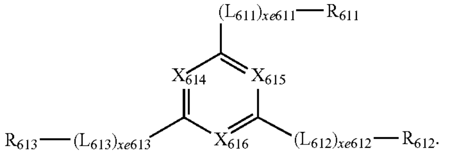

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each be the same as described in connection with $L_{601}$, xe611 to xe613 may each be the same as described in connection with xe1, $R_{611}$ to $R_{613}$ may each be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or one or more combinations thereof:

ET1

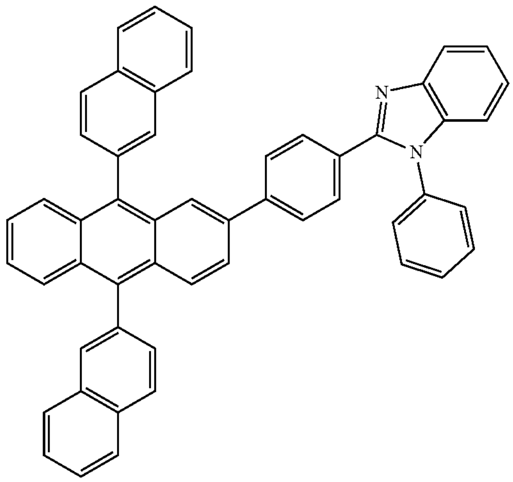

ET2

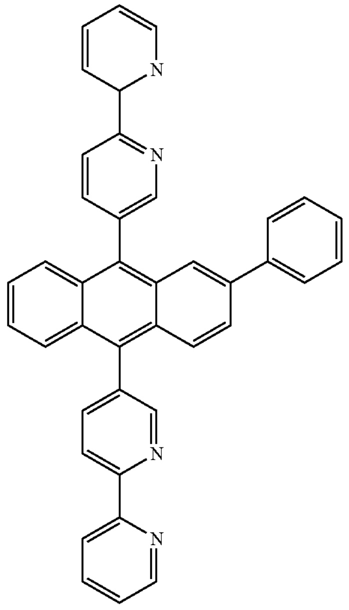

ET3
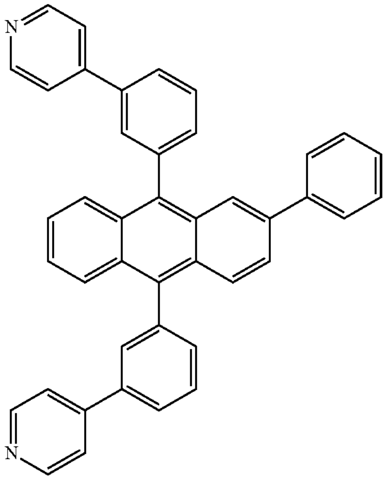
ET4
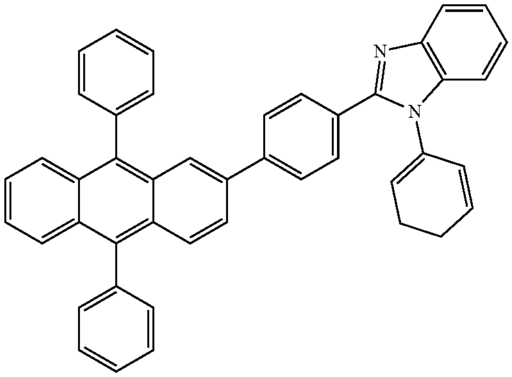
ET5
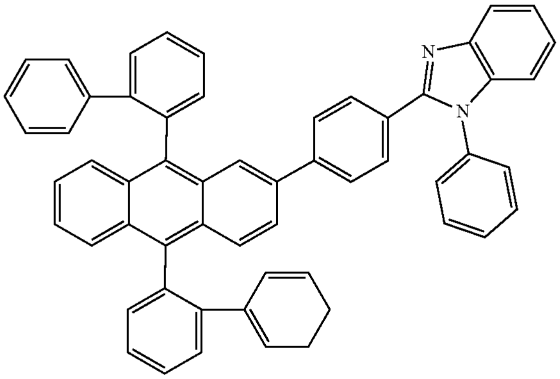
ET6
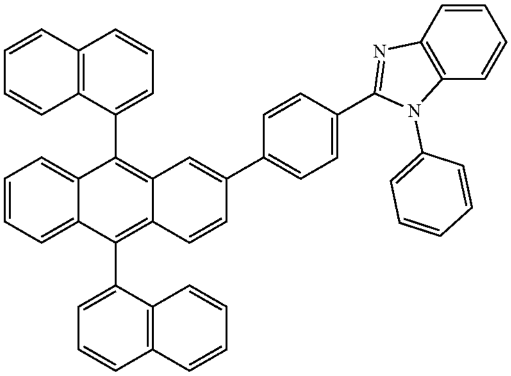
ET7
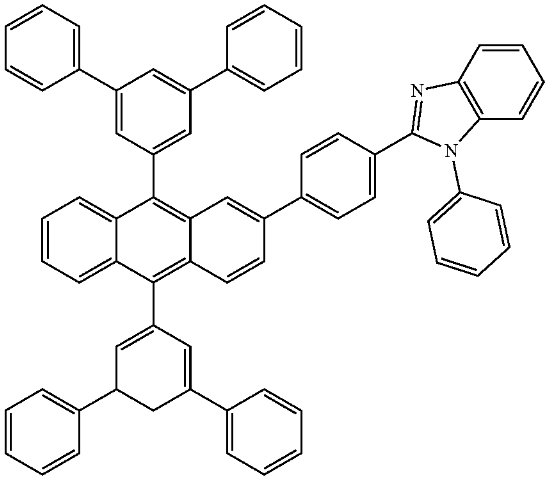
ET8
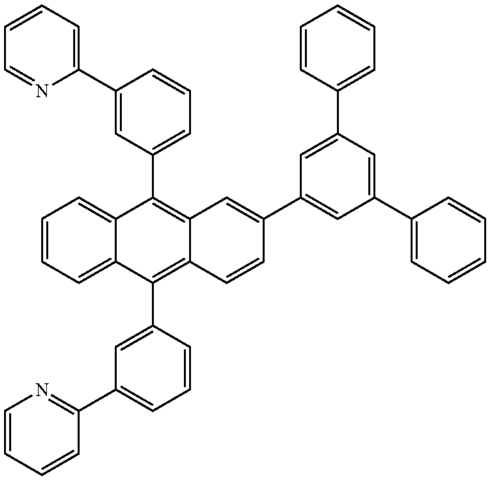

-continued
ET9
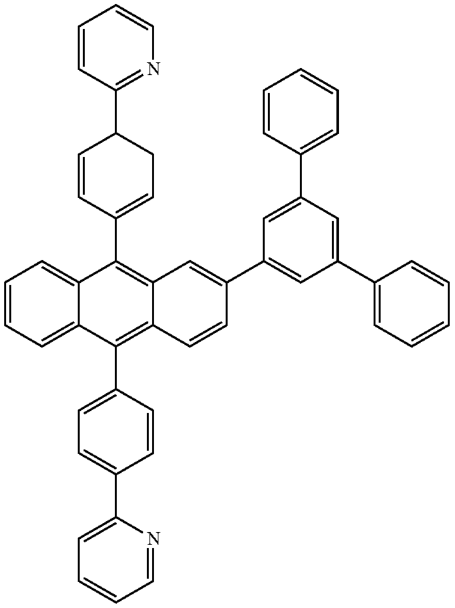
ET10
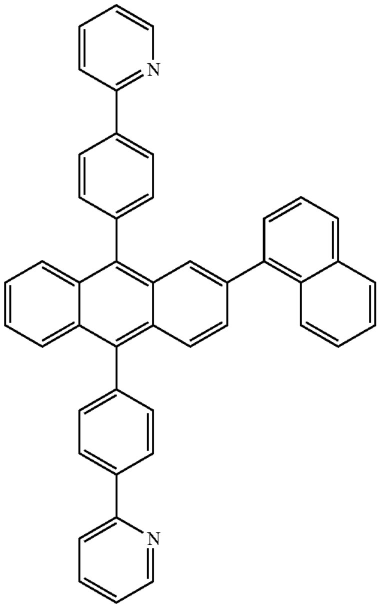
-continued
ET11
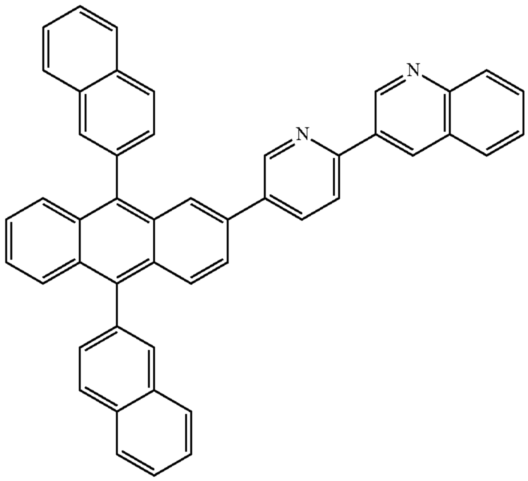
ET12
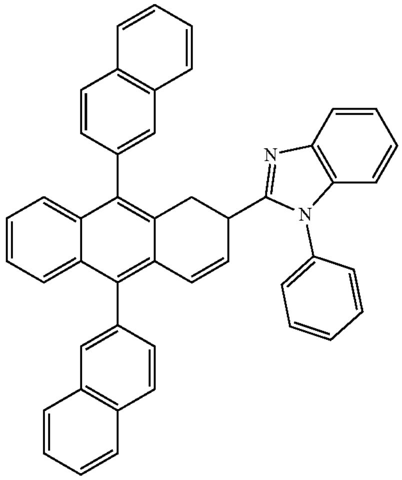
ET13
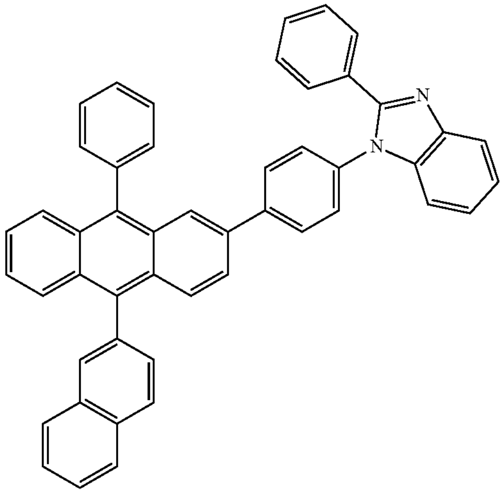

-continued
ET14
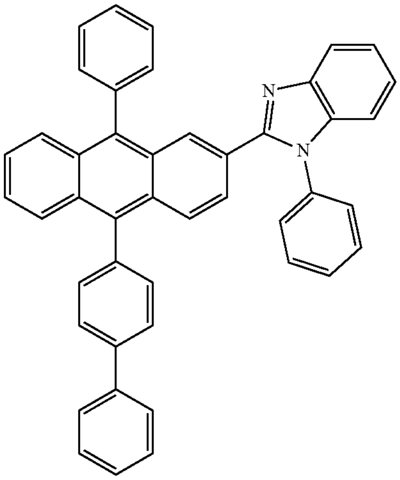
ET15
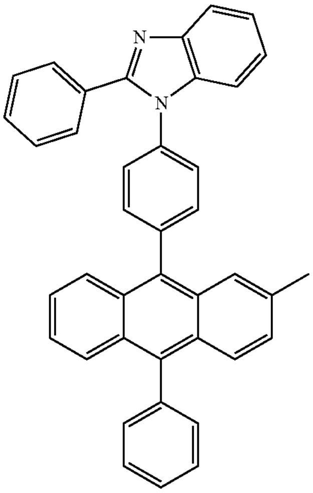
ET16
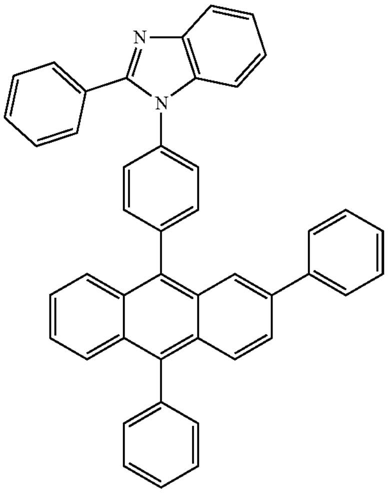
-continued
ET17
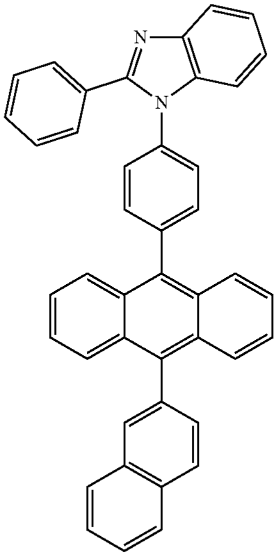
ET18
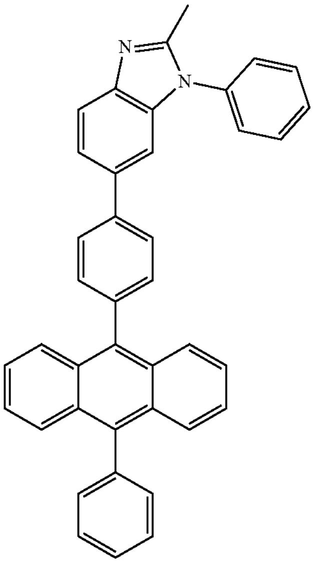
ET19
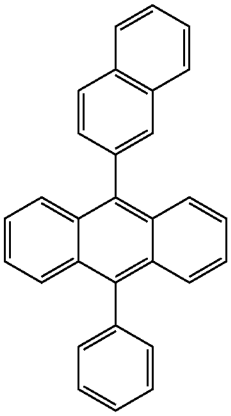

-continued
ET20
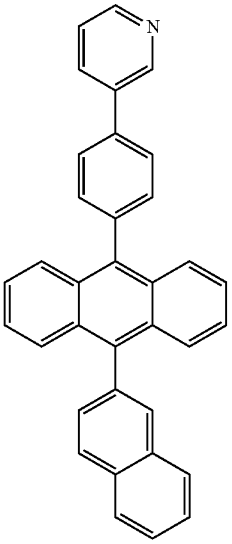
ET21
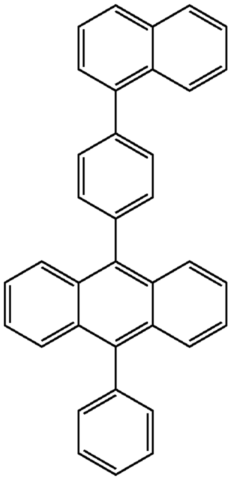
ET22
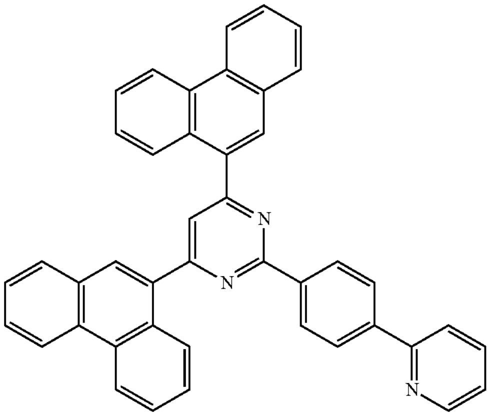
-continued
ET23
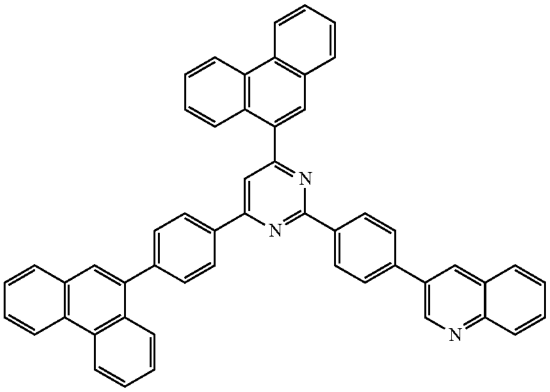
ET24
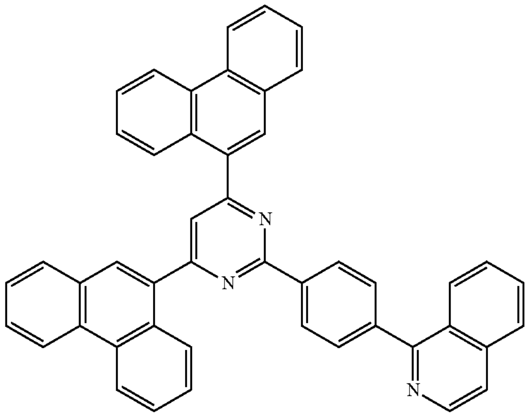
ET25
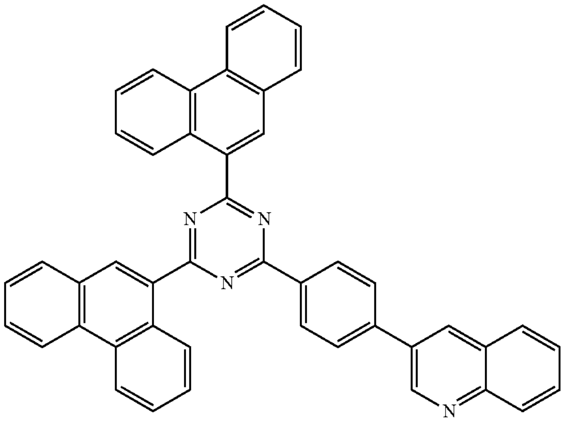

-continued
ET26
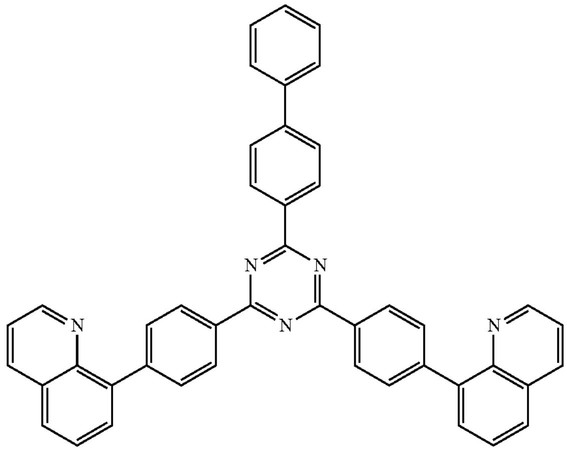
ET27
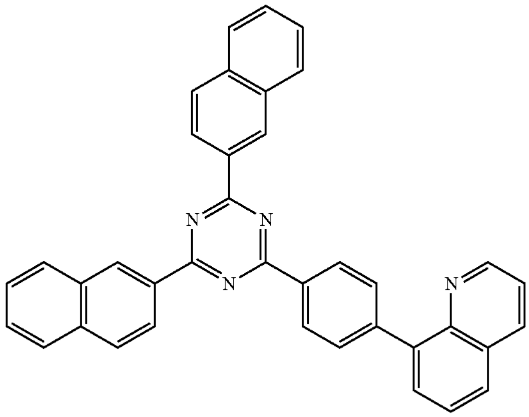
ET28
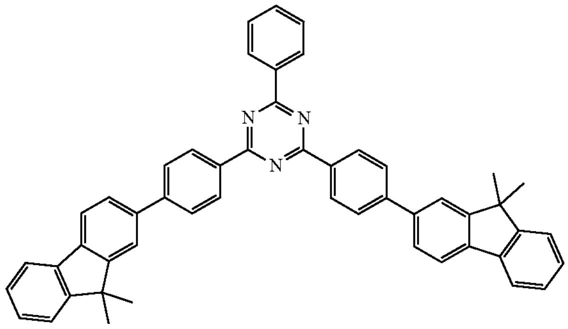
-continued
ET29
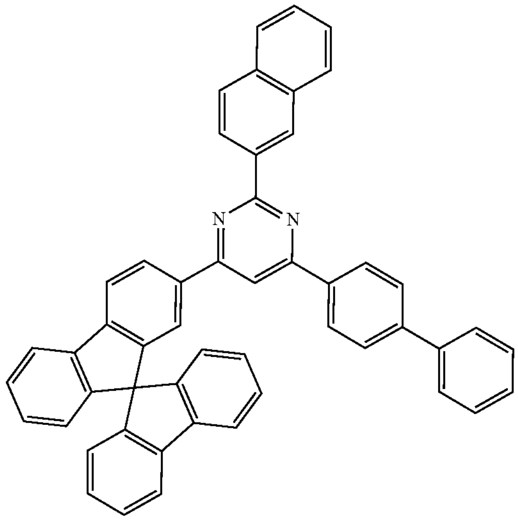
ET30
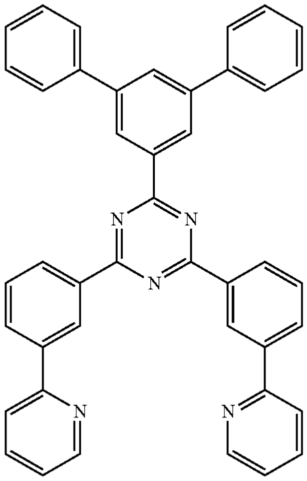
ET31
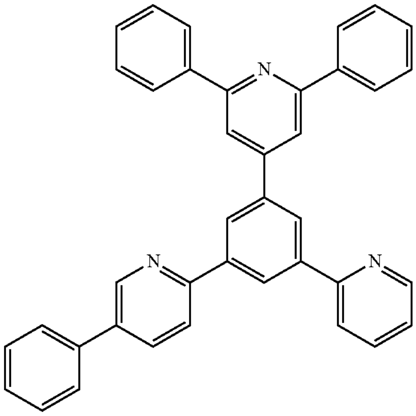

-continued
ET32
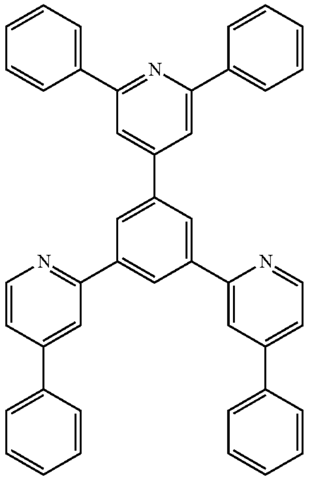
ET33
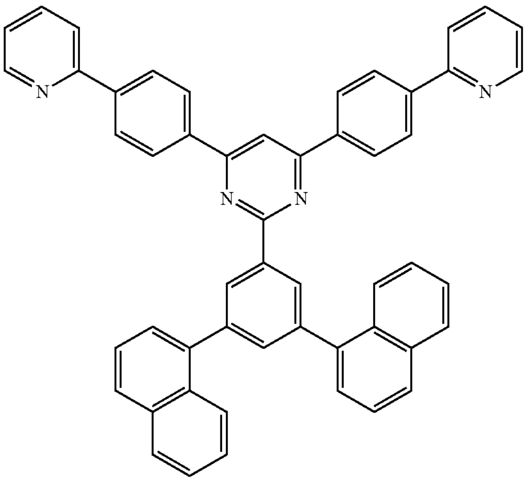
ET34
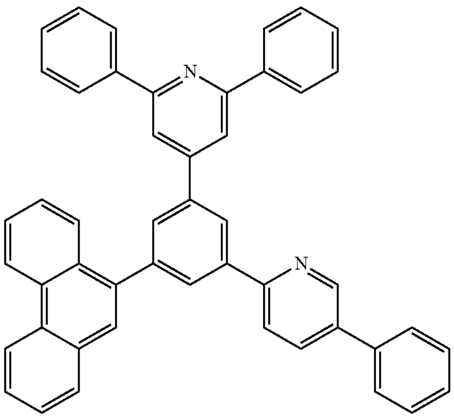
-continued
ET35
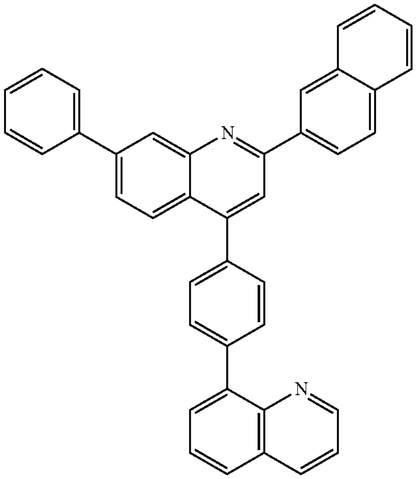
ET36
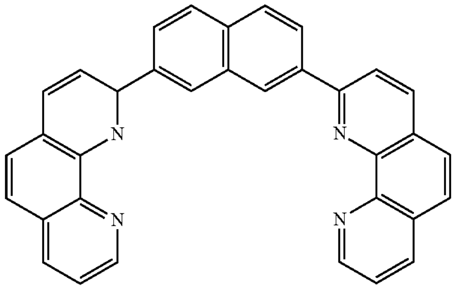
ET37
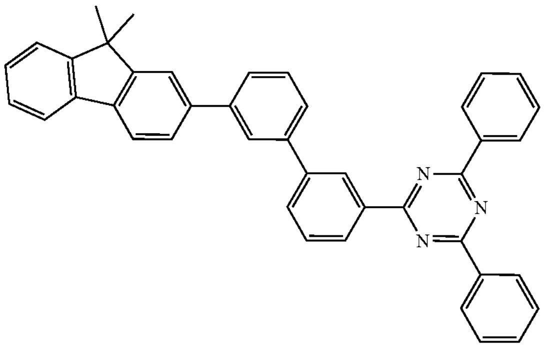
ET38
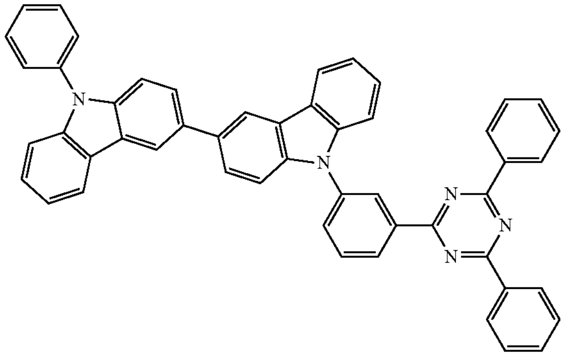

-continued
ET39
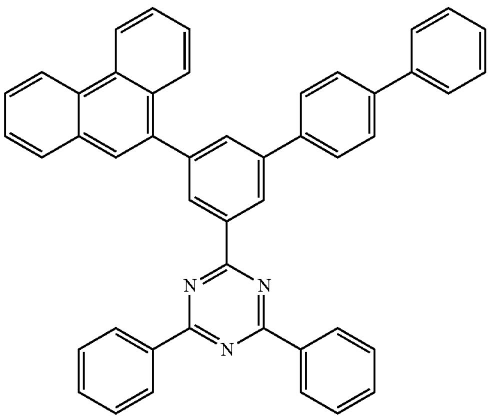
ET40
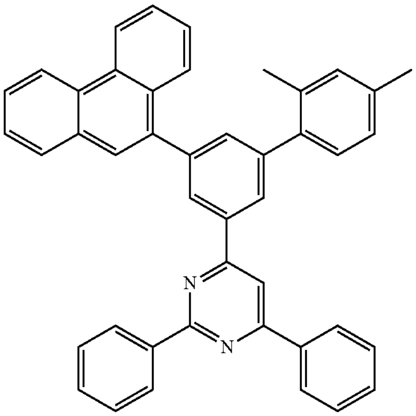
ET41
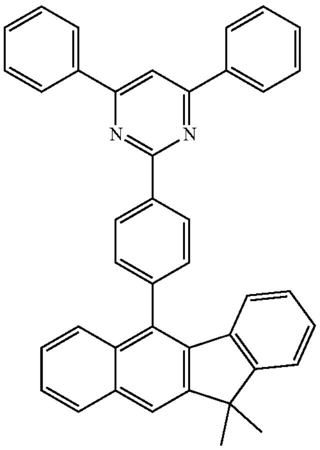
-continued
ET42
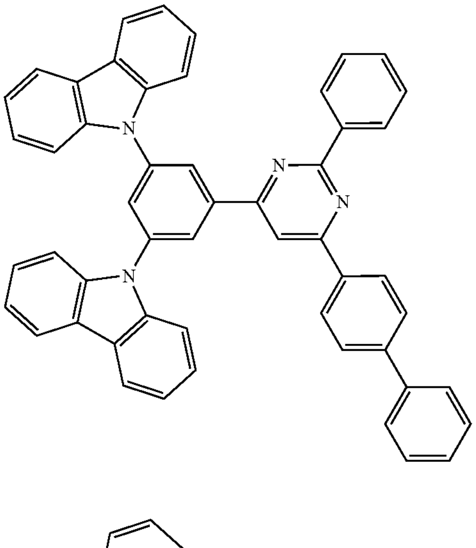
ET43
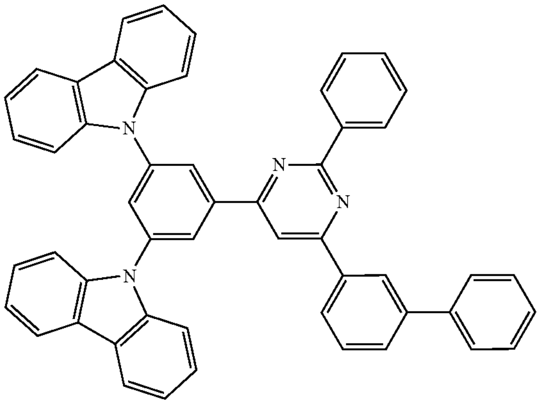
ET44
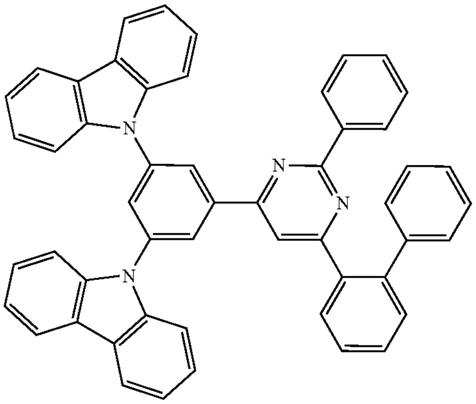
ET45
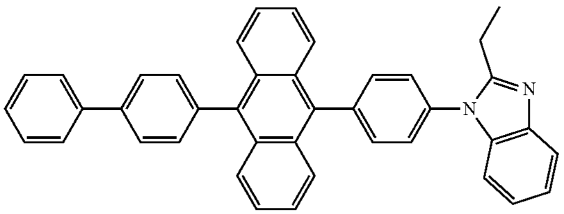

-continued

Alq3

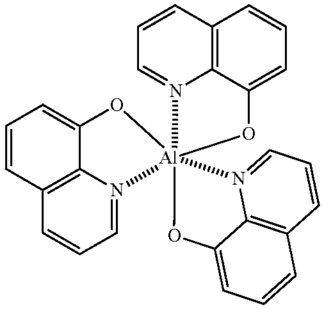

BAlq

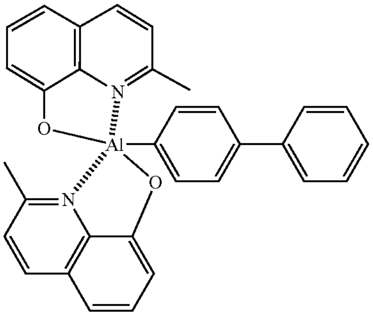

TAZ

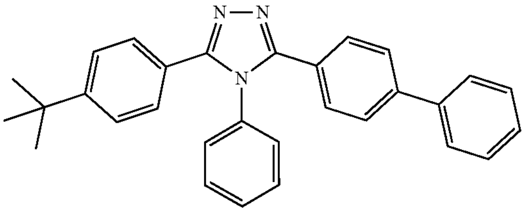

NTAZ

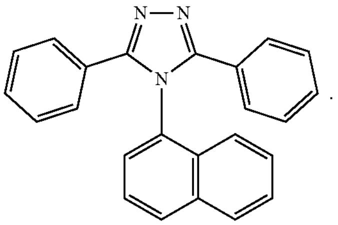

A thickness of the electron transport region may be in a range of about 100 Å to about 5,000 Å, for example, about 160 Å to about 4,000 Å. When the electron transport region includes the hole blocking layer, the electron transport layer, or a combination thereof, a thickness of the hole blocking layer or electron transport layer may each independently be from about 20 Å to about 1,000 Å, for example, about 30 Å to about 300 Å, and the thickness of the electron transport layer may be from about 100 Å to about 1,000 Å, for example, about 150 Å to about 500 Å. When the thicknesses of the hole blocking layer and/or the electron transport layer are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or a combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or one or more combinations thereof.

For example, the metal-containing material may include a Li complex. The Li complex may include, for example, Compound ET-D1 (LiQ) or ET-D2:

ET-D1

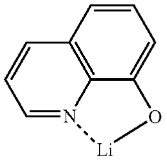

ET-D2

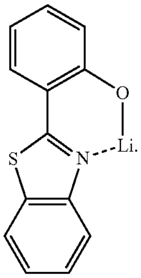

The electron transport region may include an electron injection layer that facilitates the injection of electrons from the second electrode 150. The electron injection layer may directly contact the second electrode 150.

The electron injection layer may have: i) a single-layered structure including (e.g., consisting of) a single layer including (e.g., consisting) of a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, an alkaline earth metal complex, a rare earth metal complex, or one or more combinations thereof.

The alkali metal may include Li, Na, K, Rb, Cs, or any combination thereof. The alkaline earth metal may include Mg, Ca, Sr, Ba, or one or more combinations thereof. The rare earth metal may include Sc, Y, Ce, Tb, Yb, Gd, or one or more combinations thereof.

The alkali metal-containing compound, the alkaline earth metal-containing compound, and the rare earth metal-containing compound may be oxides, halides (for example, fluorides, chlorides, bromides, iodides, and/or the like), or tellurides of the alkali metal, the alkaline earth metal, and the rare earth metal, or one or more combinations thereof.

The alkali metal-containing compound may include alkali metal oxides, such as $Li_2O$, $Cs_2O$, $K_2O$, and/or the like, alkali metal halides, such as LiF, NaF, CsF, KF, LiI, NaI, CsI, KI, and/or the like, or one or more combinations thereof. The alkaline earth metal-containing compound may include an alkaline earth metal compound, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or one or more combinations thereof. For example, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and/or the like.

The alkali metal complex, the alkaline earth-metal complex, and the rare earth metal complex may include: i) one of ions of the alkali metal, the alkaline earth metal, and/or the rare earth metal; and ii), as a ligand linked to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or one or more combinations thereof.

In an embodiment, the electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or one or more combinations thereof, as described above. In one or more embodiments, the electron injection layer may further include an organic material (for example, the compound represented by Formula 601).

In one or more embodiments, the electron injection layer may include (e.g., consist of): i) an alkali metal-containing compound (for example, an alkali metal halide); or ii) a) an alkali metal-containing compound (for example, an alkali metal halide), and/or b) an alkali metal, an alkaline earth metal, a rare earth metal, or one or more combinations thereof. In one or more embodiments, the electron injection layer may be a KI:Yb co-deposited layer, an RbI:Yb co-deposited layer, and/or the like.

When the electron injection layer further includes an organic material, alkali metal, alkaline earth metal, rare earth metal, an alkali metal-containing compound, an alkaline earth metal-containing compound, a rare earth metal-containing compound, an alkali metal complex, an alkaline earth-metal complex, a rare earth metal complex, or one or more combinations thereof may be substantially uniformly or non-uniformly dispersed in a matrix including the organic material.

A thickness of the electron injection layer may be in a range of about 1 Å to about 100 Å, for example, about 3 Å to about 90 Å. When the thickness of the electron injection layer is within these ranges, satisfactory (suitable) electron injection characteristics may be obtained without a substantial increase in driving voltage.

Second Electrode 150

The second electrode 150 is arranged on the above-described interlayer 130. The second electrode 150 may be a cathode, which is an electron injection electrode, and as a material for forming the second electrode 150, a metal, an alloy, an electrically conductive compound, or one or more combinations thereof, each having a low work function, may be utilized.

The anode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or one or more combinations thereof. The anode 150 may be a transmissive electrode, a semi-transmissive electrode, or a reflective electrode.

The second electrode 150 may have a single-layered structure or a multi-layered structure including a plurality of layers.

Capping Layer

A first capping layer may be arranged outside the first electrode 110, and/or a second capping layer may be arranged outside the second electrode 150. In more detail, the light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

In an embodiment, light generated in the emission layer of the interlayer 130 of the light-emitting device 10 may be extracted toward the outside through the first electrode 110, which is a semi-transmissive electrode or a transmissive electrode, and the first capping layer. In one or more embodiments, light generated in the emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 may be increased, so that the luminescence efficiency of the light-emitting device 10 may be also improved (increased).

Each of the first capping layer and the second capping layer may include a material having a refractive index of 1.6 or more (at 589 nm).

The first capping layer and the second capping layer may each independently be an organic capping layer including an organic material, an inorganic capping layer including an inorganic material, or an organic-inorganic composite capping layer including an organic material and an inorganic material.

In an embodiment, at least one of the first capping layer or the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or one or more combinations thereof. The carbocyclic compound, the heterocyclic compound, and the amine group-containing compound may each optionally be substituted with a substituent including O, N, S, Se, Si, F, Cl, Br, I, or one or more combinations thereof. In one or more embodiments, at least one of the first capping layer or the second capping layer may each independently include an amine group-containing compound.

In one or more embodiments, at least one of the first capping layer or the second capping layer may each independently include a compound represented by Formula 201, a compound represented by Formula 202, or a combination thereof.

In one or more embodiments, at least one of the first capping layer or the second capping layer may each independently include one of Compounds CP1 to CP6, β-NPB, or one or more combinations thereof:

CP1

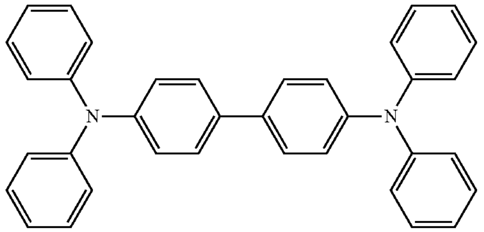

CP2

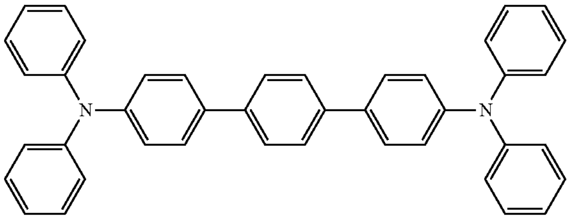

CP3

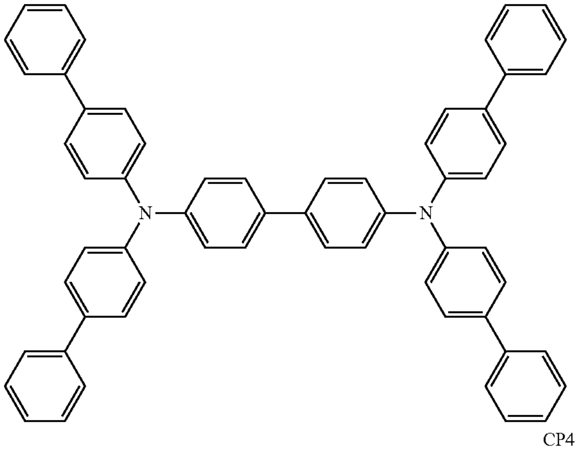

CP4

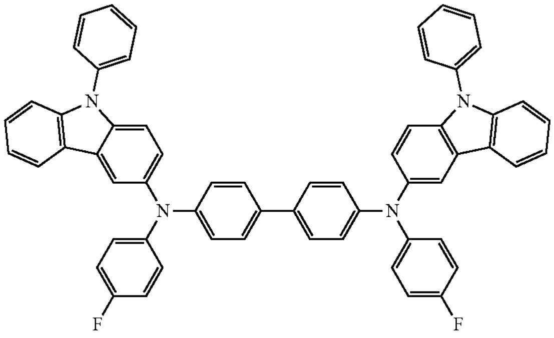

-continued

CP5

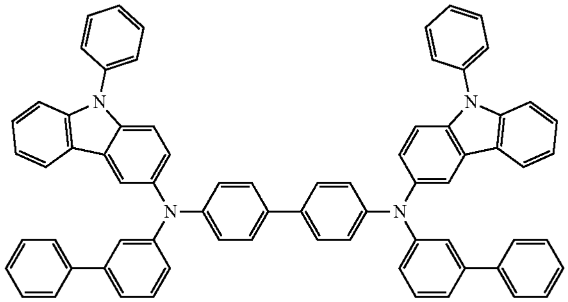

CP6

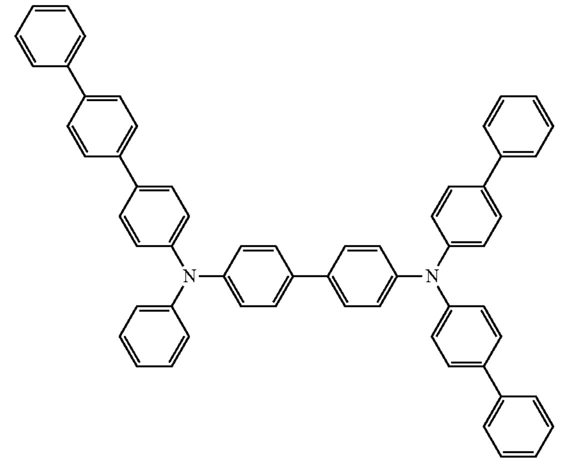

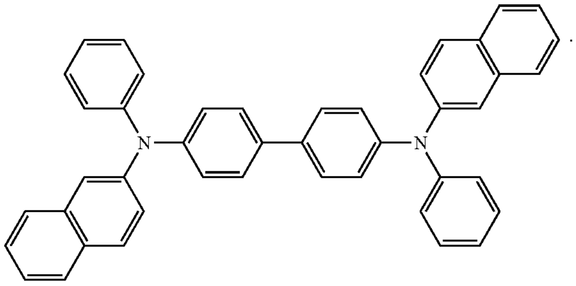

β-NPB

Electronic Apparatus

The light-emitting device may be included in one or more suitable electronic apparatuses. For example, an electronic apparatus including the light-emitting device may be a light-emitting apparatus, an authentication apparatus, and/or the like.

The electronic apparatus (for example, a light-emitting apparatus) may further include, in addition to the light-emitting device, i) a color filter, ii) a color conversion layer, or iii) both (e.g., simultaneously) a color filter and a color conversion layer. The color filter and/or the color conversion layer may be arranged in at least one traveling direction of light emitted from the light-emitting device. For example, the light emitted from the light-emitting device may be blue light. Details for the light-emitting device may each independently be the same as described herein. In an embodiment, the color conversion layer may include a quantum dot.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be arranged among the subpixel areas to define each of the subpixel areas.

The color filter may further include a plurality of color filter areas and light-shielding patterns arranged among the color filter areas, and the color conversion layer may further include a plurality of color conversion areas and light-shielding patterns arranged among the color conversion areas.

The plurality of color filter areas (or the plurality of color conversion areas) may include a first area emitting first-color light, a second area emitting second-color light, and/or a third area emitting third-color light, wherein the first-color light, the second-color light, and/or the third-color light may have different maximum emission wavelengths from one another. For example, the first-color light may be red light, the second-color light may be green light, and the third-color light may be blue light. For example, the plurality of color filter areas (or the plurality of color conversion areas) may include quantum dots. For example, the first region may include red quantum dots, the second region may include green quantum dots, and the third region may not include (e.g., may exclude) quantum dots. Details for the quantum dots may be the same as described herein. The first region, the second region, and/or the third region may each further include a scatterer.

For example, the light-emitting device may emit first light, the first region may absorb the first light and emit first-first color light, the second region may absorb the first light and emit second-first color light, and the third region may absorb the first light and emit third-first color light. Here, the first-first color light, the second-first color light, and the third-first color light may have different maximum emission wavelengths from each other. In more detail, the first light may be blue light, the first-first color light may be red light, the second-first color light may be green light, and/or the third-first color light may be blue light.

The electronic apparatus may further include a thin-film transistor in addition to the above-described light-emitting device. The thin-film transistor may include a source electrode, a drain electrode, and an activation layer, wherein one of the source electrode or the drain electrode may be electrically connected to a corresponding one of the first electrode or the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

The electronic apparatus may further include a sealing portion for sealing the light-emitting device. The sealing portion may be arranged between the color filter and the light-emitting device and/or between the color conversion layer and the light-emitting device. The sealing portion allows light from the light-emitting device to be extracted to the outside, and concurrently (e.g., simultaneously) prevents (reduces) ambient air and moisture from penetrating into the light-emitting device. The sealing portion may be a sealing substrate including a transparent glass substrate or a plastic substrate. The sealing portion may be a thin-film encapsulation layer including at least one of an organic layer and/or an inorganic layer. When the sealing portion is a thin-film encapsulation layer, the electronic apparatus may be flexible.

One or more suitable functional layers may be additionally arranged on the sealing portion, in addition to the color filter and/or the color conversion layer, according to utilize of the electronic apparatus. Examples of the functional layer are a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, and/or the like).

The authentication apparatus may further include, in addition to the light-emitting device as described above, a biometric information collector.

The electronic apparatus may be applied to one or more suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, one or more suitable measuring instruments, meters (for example, meters for a vehicle, an aircraft, and a vessel), projectors, and/or the like.

Figure 2:
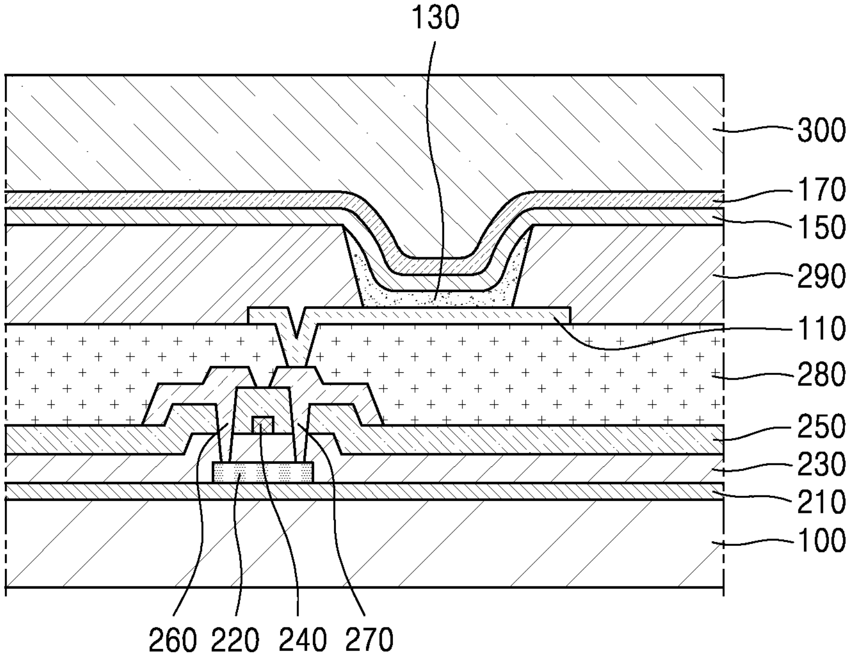
FIG. 2 is a cross-sectional view of an electronic apparatus according to an embodiment.
Figure 3:
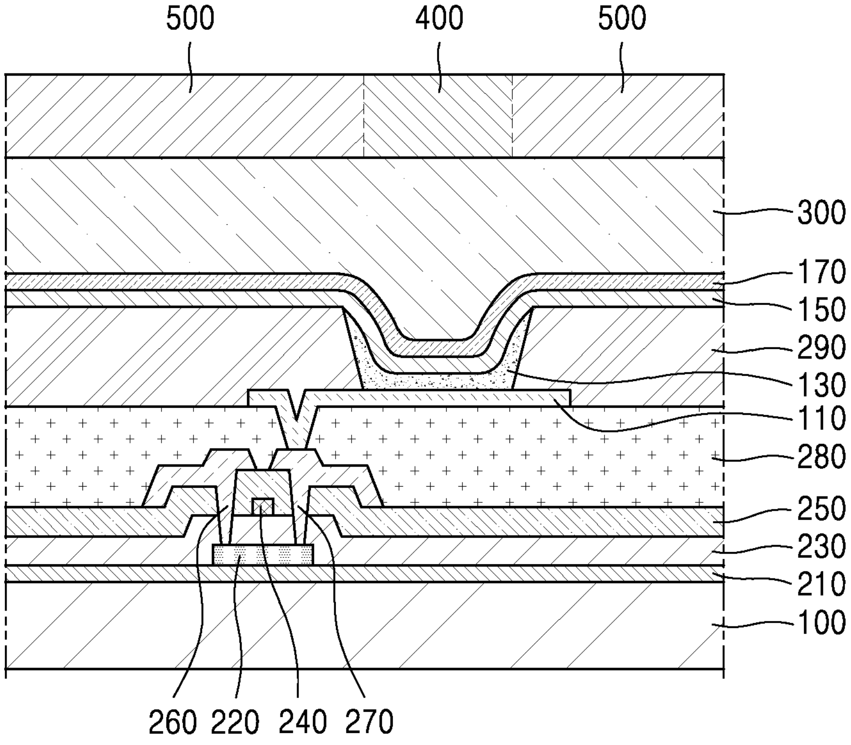
FIG. 3 is a cross-sectional view of an electronic apparatus according to another embodiment.

Description of FIGS. 2 and 3

FIG. 2 is a cross-sectional view of an electronic apparatus according to an embodiment.

The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be arranged on the substrate 100. The buffer layer 210 may prevent or reduce penetration of impurities through the substrate 100 and may provide a flat surface on the substrate 100.

The TFT may be arranged on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may also include a source region, a drain region, and/or a channel region.

A gate insulating film 230 for insulating the activation layer 220 from the gate electrode 240 may be arranged on the activation layer 220, and the gate electrode 240 may be arranged on the gate insulating film 230.

An interlayer insulating film 250 may be arranged on the gate electrode 240. The interlayer insulating film 250 may be arranged between the gate electrode 240 and the source electrode 260 and between the gate electrode 240 and the drain electrode 270, to insulate the electrodes from one another.

The source electrode 260 and the drain electrode 270 may be arranged on the interlayer insulating film 250. The interlayer insulating film 250 and the gate insulating film 230 may be formed to expose the source region and the drain region of the activation layer 220, and the source electrode 260 and the drain electrode 270 may be arranged in contact with the exposed portions of the source region and the drain region of the activation layer 220.

The TFT may be electrically connected to a light-emitting device to drive the light-emitting device, and may be protected as being covered with a passivation layer 280. The passivation layer 280 may include an inorganic insulating film, an organic insulating film, or a combination thereof. A light-emitting device may be provided on the passivation layer 280. The light-emitting device may include the first electrode 110, the interlayer 130, and the second electrode 150.

The first electrode 110 may be arranged on the passivation layer 280. The passivation layer 280 may be arranged to expose a portion of the drain electrode 270, not fully covering the drain electrode 270, and the first electrode 110 may be arranged to be connected to the exposed portion of the drain electrode 270.

A pixel defining layer 290 including an insulating material may be arranged on the first electrode 110. The pixel defining layer 290 may expose a certain region of the first electrode 110, and an interlayer 130 may be formed in the exposed region of the first electrode 110. The pixel defining layer 290 may be a polyimide-based organic film and/or a polyacrylic-based organic film. At least some layers of the interlayer 130 may extend beyond the upper portion of the pixel defining layer 290 to be arranged in the form of a common layer.

The second electrode 150 may be arranged on the interlayer 130, and a capping layer 170 may be additionally formed on the second electrode 150. The capping layer 170 may be formed to cover the second electrode 150.

The encapsulation portion 300 may be arranged on the capping layer 170. The encapsulation portion 300 may be arranged on a light-emitting device to protect the light-emitting device from moisture or oxygen (e.g., reduce the amount of moisture and/or oxygen). The encapsulation portion 300 may include: an inorganic film including silicon nitride (SiNx), silicon oxide (SiOx), indium tin oxide, indium zinc oxide, or one or more combinations thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or one or more combinations thereof; or a combination of the inorganic films and the organic film(s).

FIG. 3 is a cross-sectional view of an electronic apparatus according to another embodiment of the present disclosure.

The electronic apparatus of FIG. 3 is the same as the electronic apparatus of FIG. 2, except that a light-shielding pattern 500 and a functional region 400 are additionally arranged on the encapsulation portion 300. The functional region 400 may be i) a color filter area, ii) a color conversion area, or iii) a combination of the color filter area and the color conversion area. In one or more embodiments, the light-emitting device included in the light-emitting apparatus of FIG. 3 may be a tandem light-emitting device.

Manufacturing Method

The layers included in the hole transport region, the emission layer, and the layers included in the electron transport region may be formed in a certain region by utilizing one or more suitable methods such as vacuum deposition, spin coating, casting, Langmuir-Blodgett (LB) deposition, ink-jet printing, laser-printing, laser-induced thermal imaging, and/or the like.

When the layers constituting the hole transport are included in the hole transport region, the emission layer, and the layers included in the electron transport region are formed by vacuum deposition, the deposition may be performed at a deposition temperature in a range of about 100° C. to about 500° C., a vacuum degree in a range of about $10^{-8}$ torr to about $10^{-3}$ torr, and a deposition speed in a range of about 0.01 Å/sec to about 100 Å/sec, depending on a material to be included in a layer to be formed and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed and the structure of a layer to be formed.

General Definition of Substituents

The term "$C_3$-$C_{60}$ carbocyclic group" as utilized herein refers to a cyclic group consisting of carbon only as a ring-forming atom and having 3 to 60 carbon atoms, and the term "$C_1$-$C_{60}$ heterocyclic group" as utilized herein refers to a cyclic group that has 1 to 60 carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_6$ heterocyclic group has 3 to 61 ring-forming atoms.

The "cyclic group" as utilized herein may include the $C_3$-$C_{60}$ carbocyclic group and the $C_1$-$C_{60}$ heterocyclic group.

The term "π electron-rich $C_3$-$C_{60}$ cyclic group" as utilized herein refers to a cyclic group that has 3 to 60 carbon atoms and does not include *—N═*' as a ring-forming moiety, and the term "π electron-deficient nitrogen-containing $C_1$-$C_{60}$ cyclic group" as utilized herein refers to a heterocyclic group that has 1 to 60 carbon atoms and includes *—N═*' as a ring-forming moiety.

For example, the $C_3$-$C_{60}$ carbocyclic group may be i) a T1 group or ii) a condensed cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a condensed cyclic group in which two or more T2 groups are condensed with each other, or iii) a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the π electron-rich $C_3$-$C_{60}$ cyclic group may be i) a T1 group, ii) a condensed cyclic group in which two or more T1 groups are condensed with each other, iii) a T3 group, iv) a condensed cyclic group in which two or more T3 groups are condensed with each other, or v) a condensed cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and/or the like), the π electron-deficient nitrogen-containing $C_1$-$C_{60}$ cyclic group may be i) a T4 group, ii) a condensed cyclic group in which two or more T4 groups are condensed with each other, iii) a condensed cyclic group in which at least one T4 group and at least one T1 group are condensed with each other, iv) a condensed cyclic group in which at least one T4 group and at least one T3 group are condensed with each other, or v) a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as utilized herein refer to a group condensed to any cyclic group, a monovalent group, or a polyvalent group (for example, a divalent group, a trivalent group, a tetravalent group, and/or the like) according to the structure of a formula for which the corresponding term is utilized. For example, the "benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_6$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and/or a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and/or a divalent non-aromatic condensed heteropolycyclic group.

The term "$C_1$-$C_{60}$ alkyl group" as utilized herein refers to a linear or branched aliphatic hydrocarbon monovalent group that has 1 to 60 carbon atoms, and specific examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, and/or the like. The term "$C_1$-$C_{60}$ alkylene group" as utilized herein refers to a divalent group having the same structure as the $C_1$-$C_{60}$ alkyl group.

The term "$C_2$-$C_{60}$ alkenyl group" as utilized herein refers to a monovalent hydrocarbon group having at least one carbon-carbon double bond in the middle or at the terminus of the $C_2$-$C_{60}$ alkyl group, and examples thereof are an ethenyl group, a propenyl group, a butenyl group, and/or the like. The term "$C_2$-$C_{60}$ alkenylene group" as utilized herein refers to a divalent group having the same structure as the $C_2$-$C_{60}$ alkenyl group.

The term "$C_2$-$C_{60}$ alkynyl group" as utilized herein refers to a monovalent hydrocarbon group having at least one carbon-carbon triple bond in the middle or at the terminus of the $C_2$-$C_{60}$ alkyl group, and examples thereof are an ethynyl group, a propynyl group, and/or the like. The term "$C_2$-$C_{60}$ alkynylene group" as utilized herein refers to a divalent group having the same structure as the $C_2$-$C_{60}$ alkynyl group.

The term "$C_1$-$C_{60}$ alkoxy group" as utilized herein refers to a monovalent group represented by $—OA_{101}$ (wherein $A_{101}$ is the $C_1$-$C_{60}$ alkyl group), and examples thereof are a methoxy group, an ethoxy group, an isopropyloxy group, and/or the like.

The term "$C_3$-$C_{10}$ cycloalkyl group" as utilized herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, a bicyclo[2.2.2]octyl group, and/or the like. The term "$C_3$-$C_{10}$ cycloalkylene group" as utilized herein refers to a divalent group having the same structure as the $C_3$-$C_{10}$ cycloalkyl group.

The term "$C_1$-$C_{10}$ heterocycloalkyl group" as utilized herein refers to a monovalent cyclic group of 1 to 10 carbon atoms, further including, in addition to carbon atoms, at least one heteroatom, as ring-forming atoms, and specific examples are a 1,2,3,4-oxatriazolidinyl group, a tetrahydrofuranyl group, a tetrahydrothiophenyl group, and/or the like. The term "$C_1$-$C_{10}$ heterocycloalkylene group" as utilized herein refers to a divalent group having the same structure as the $C_1$-$C_{10}$ heterocycloalkyl group.

The term "$C_3$-$C_{10}$ cycloalkenyl group" as utilized herein refers to a monovalent cyclic group that has three to ten carbon atoms and at least one carbon-carbon double bond in the ring thereof and no aromaticity, and specific examples thereof are a cyclopentenyl group, a cyclohexenyl group, a cycloheptenyl group, and/or the like. The term "$C_3$-$C_{10}$ cycloalkenylene group" as utilized herein refers to a divalent group having the same structure as the $C_3$-$C_{10}$ cycloalkenyl group.

The term "$C_1$-$C_{10}$ heterocycloalkenyl group" as utilized herein refers to a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group are a 4,5-dihydro-1,2,3,4-oxatriazolyl group, a 2,3-dihydrofuranyl group, a 2,3-dihydrothiophenyl group, and/or the like. The term "$C_1$-$C_{10}$ heterocycloalkenylene group" as utilized herein refers to a divalent group having the same structure as the $C_1$-$C_{10}$ heterocycloalkenyl group.

The term "$C_6$-$C_{60}$ aryl group" as utilized herein refers to a monovalent group having a carbocyclic aromatic system of 6 to 60 carbon atoms, and the term "$C_6$-$C_{60}$ arylene group" as utilized herein refers to a divalent group having a carbocyclic aromatic system of 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and/or the like. When the $C_6$-$C_{60}$ aryl group and the $C_6$-$C_{60}$ arylene group each include two or more rings, the two or more rings may be condensed with each other.

The term "$C_1$-$C_{60}$ heteroaryl group" as utilized herein refers to a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as utilized herein refers to a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, and/or the like. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as utilized herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as utilized herein refers to a divalent group having the same structure as the monovalent non-aromatic condensed polycyclic group described above.

The term "monovalent non-aromatic condensed heteropolycyclic group" as utilized herein refers to a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, a benzothienodibenzothiophenyl group, and/or the like. The term "divalent non-aromatic condensed heteropolycyclic group" as utilized herein refers to a divalent group having the same structure as the monovalent non-aromatic condensed heteropolycyclic group described above.

The term "$C_6$-$C_{60}$ aryloxy group" as utilized herein indicates —$OA_{102}$ (wherein $A_{102}$ is the $C_6$-$C_{60}$ aryl group), and the term "$C_6$-$C_{60}$ arylthio group" as utilized herein indicates —$SA_{103}$ (wherein $A_{103}$ is the $C_6$-$C_{60}$ aryl group).

The term "$C_7$-$C_{60}$ arylalkyl group" as utilized herein refers to -$A_{104}A_{105}$ (where $A_{104}$ is a $C_1$-$C_{54}$ alkylene group, and $A_{105}$ is a $C_6$-$C_{59}$ aryl group), and the term "$C_2$-$C_{60}$ heteroarylalkyl group" as utilized herein refers to -$A_{106}A_{107}$ (where $A_{106}$ is a $C_1$-$C_{59}$ alkylene group, and $A_{107}$ is a $C_1$-$C_{59}$ heteroaryl group).

The term "$R_{10a}$" as utilized herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or one or more combinations thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or one or more combinations thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

In the present specification, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group; a $C_1$-$C_{60}$ heterocyclic group; a $C_7$-$C_{60}$ arylalkyl group; or a $C_2$-$C_{60}$ heteroarylalkyl group unsubstituted or substituted with deuterium, —F, a cyano group, a $C_1$-$C_{60}$ alkyl group, a $C_1$-$C_{60}$ alkoxy group, a phenyl group, a biphenyl group, or one or more combinations thereof.

The term "heteroatom" as utilized herein refers to any atom other than a carbon atom. Examples of the heteroatom are O, S, N, P, Si, B, Ge, Se, or one or more combinations thereof.

The term "third-row transition metal" utilized herein includes hafnium (Hf), tantalum (Ta), tungsten (W), rhenium (Re), osmium (Os), iridium (Ir), platinum (Pt), gold (Au), and/or the like.

"Ph" as utilized herein refers to a phenyl group, "Me" as utilized herein refers to a methyl group, "Et" as utilized herein refers to an ethyl group, "ter-Bu" or "$Bu^t$" as utilized herein refers to a tert-butyl group, and "OMe" as utilized herein refers to a methoxy group.

The term "biphenyl group" as utilized herein refers to "a phenyl group substituted with a phenyl group". For example, the "biphenyl group" is a substituted phenyl group having a $C_6$-$C_{60}$ aryl group as a substituent.

The term "terphenyl group" as utilized herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

The maximum number of carbon atoms in this substituent definition section is an example only. In an embodiment, the maximum carbon number of 60 in the $C_1$-$C_{60}$ alkyl group is an example, and the definition of the alkyl group is equally applied to a $C_1$-$C_{20}$ alkyl group. The same applies to other embodiments.

* and *' as utilized herein, unless defined otherwise, each refer to a binding site to a neighboring atom in a corresponding formula.

Hereinafter, a compound and light-emitting device according to embodiments will be described in more detail with reference to Examples.

EXAMPLES

Manufacture of Light-Emitting Device

Comparative Example 1

A substrate (anode, ITO 300 Å/Ag 50 Å/ITO 300 Å) was cut to a size of 50 mm×50 mm×0.7 mm, cleaned by sonication with isopropyl alcohol and pure water each for 5 minutes, cleaned by irradiation of ultraviolet rays and exposure of ozone thereto for 30 minutes, and then loaded into a vacuum deposition apparatus.

HAT-CN was vacuum-deposited on the substrate to form a hole injection layer having a thickness of 150 Å. Subsequently, NPB as a hole-transporting compound was vacuum-deposited on the hole injection layer to form a hole transport layer having a thickness of 600 Å.

HT-01 as a hole-transporting host was vacuum-deposited on the hole transport layer to form a first layer having a thickness of 50 Å.

Compound HT-10 as a first host, ET-08 as a second host, Compound 1 as a first dopant, and D-01 as a second dopant were deposited on the first layer to form an emission layer having a thickness of 300 Å (wherein a weight ratio of the first host to the second host was 5:5, doping ratios of the first dopant and the second dopant were 10 wt % and 1.5 wt %, respectively based on 100 parts by weight of the sum of the first host and the second host).

ET-01 as an electron-transporting host was vacuum-deposited on the emission layer to form a second layer having a thickness of 50 Å.

TPM-TAZ and LiQ were deposited at a weight ratio of 5:5 on the second layer to form an electron transport layer having a thickness of 300 Å.

Yb was vacuum-deposited on the electron transport layer to a thickness of 10 Å, and subsequently, AgMg was vacuum-deposited thereon to a thickness of 100 Å to form a cathode (wherein a doping ratio of Mg was 5 wt %), and CP1 was deposited on the cathode to form a capping layer having a thickness of 700 Å, thereby completing the manufacture of a light-emitting device.

Example 1

A light-emitting device was manufactured in substantially the same manner as in Comparative Example 1, except that: HT-01 as a hole-transporting host and ET-02 as an electron-transporting host were vacuum-deposited at a weight ratio of 55:45 on the hole transport layer to form a first layer having a thickness of 50 Å; and that an electron transport layer was formed on the emission layer without forming a second layer.

Example 2

A light-emitting device was manufactured in substantially the same manner as in Comparative Example 1, except that: an emission layer was formed on the hole transport layer without forming a first layer; and ET-01 as an electron-transporting host and HT-14 as a hole-transporting host were vacuum-deposited at a weight ratio of 55:45 on the emission layer to form a second layer having a thickness of 50 Å.

Example 3

A light-emitting device was manufactured in substantially the same manner as in Comparative Example 1, except that: HT-07 as a hole-transporting host and ET-04 as an electron-transporting host were vacuum-deposited at a weight ratio of 65:35 on the hole transport layer to form a first layer having a thickness of 50 Å; and ET-06 as an electron-transporting host and HT-16 as a hole-transporting host were vacuum-deposited at a weight ratio of 65:35 on the emission layer to form a second layer having a thickness of 50 Å.

Example 4

A light-emitting device was manufactured in substantially the same manner as in Comparative Example 1, except that: HT-05 as a hole-transporting host and ET-03 as an electron-transporting host were vacuum-deposited at a weight ratio of 80:20 on the hole transport layer to form a first layer having a thickness of 50 Å; and ET-03 as an electron-transporting host and HT-05 as a hole-transporting host were vacuum-deposited at a weight ratio of 80:20 on the emission layer to form a second layer having a thickness of 50 Å.

Example 5

A light-emitting device was manufactured in substantially the same manner as in Comparative Example 1, except that: HT-05 as a hole-transporting host and ET-03 as an electron-transporting host were vacuum-deposited at a weight ratio of 80:20 on the hole transport layer to form a first layer having a thickness of 25 Å; and ET-03 as an electron-transporting host and HT-05 as a hole-transporting host were vacuum-deposited at a weight ratio of 80:20 on the emission layer to form a second layer having a thickness of 25 Å.

Example 6

A light-emitting device was manufactured in substantially the same manner as in Comparative Example 1, except that: HT-05 as a hole-transporting host and ET-03 as an electron-transporting host were vacuum-deposited at a weight ratio of 80:20 on the hole transport layer to form a first layer having a thickness of 50 Å;

ET-03 as an electron-transporting host and HT-05 as a hole-transporting host were vacuum-deposited at a weight ratio of 80:20 on an emission layer to form a second layer having a thickness of 50 Å; and the emission layer was formed in a way that HT-05 as a first host, ET-03 as a second host, Compound 1 as a first dopant, and D-01 as a second dopant were deposited to a thickness of 300 Å (wherein a weight ratio of the first host to the second host was 7:3, and doping ratios of the first dopant and the second dopant were 10 wt % and 1.5 wt %, respectively, based on 100 parts by weight of the sum of the first host and the second host).

Example 7

A light-emitting device was manufactured in substantially the same manner as in Comparative Example 1, except that: only HT-03 as a hole-transporting host was vacuum-deposited on the hole transport layer to form a first layer having a thickness of 50 Å;

ET-08 as an electron-transporting host and HT-03 as a hole-transporting host were vacuum-deposited at a weight ratio of 30:70 on an emission layer to form a second layer having a thickness of 50 Å; and the emission layer was formed in a way that Compound HT-03 as a first host, ET-08 as a second host, Compound 1 as a first dopant, and D-01 as a second dopant were deposited to a thickness of 300 Å (wherein a weight ratio of the first host to the second host was 7:3, and doping ratios of the first dopant and the second dopant were 10 wt % and 1.5 wt %, respectively, based on 100 parts by weight of the sum of the first host and the second host).

Example 8

A light-emitting device was manufactured in substantially the same manner as in Comparative Example 1, except that: HT-03 as a hole-transporting host and ET-08 as an electron-transporting host were vacuum-deposited at a weight ratio of 70:30 on the hole transport layer to form a first layer having a thickness of 50 Å;

only ET-08 as an electron-transporting host was vacuum-deposited on an emission layer to form a second layer having a thickness of 50 Å; and the emission layer was formed in a way that Compound HT-03 as a first host, ET-08 as a second host, Compound 1 as a first dopant, and D-01 as a second dopant were deposited to a thickness of 300 Å (wherein a weight ratio of the first host to the second host was 7:3, and doping ratios of the first dopant and the second dopant were 10 wt % and 1.5 wt %, respectively, based on 100 parts by weight of the sum of the first host and the second host).

To measure characteristics of the light-emitting devices manufactured according to Comparative Example 1 and Examples 1 to 8, driving voltage, efficiency, and lifespan at a current density of 10 mA/cm$^2$ were measured, and results thereof are shown in Table 1. In some embodiments, it was confirmed that the electron-transporting host and the hole-transporting host utilized for the formation of the first layer and the second layer all had $T_1$ energy values of greater than 2.8 eV.

The efficiency of the light-emitting device was measured by utilizing a measurement device C9920-2-12 manufactured by Hamamatsu Photonics Inc.

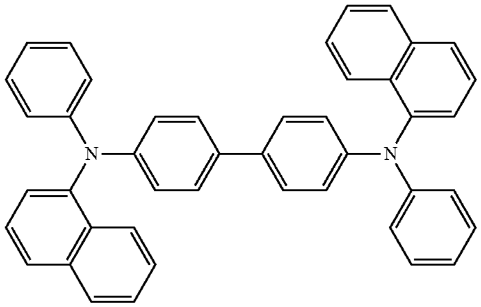

NPB

-continued

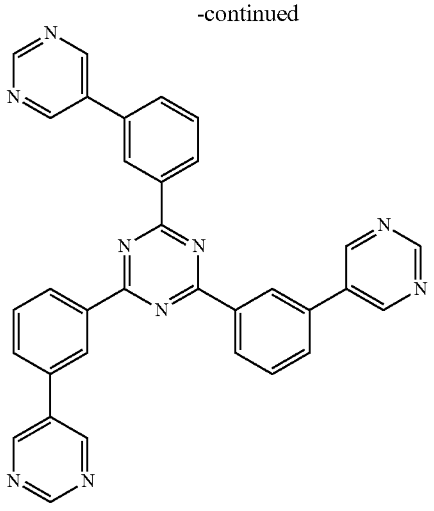

TPM-TAZ

CP1

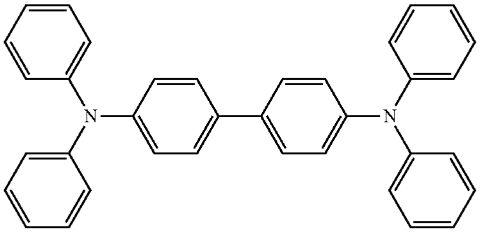

TABLE 1

| | Driving voltage (V) | Efficiency (cd/A/CIE_y) | $T_{95}$ lifespan (relative value) |
|---|---|---|---|
| Comparative Example 1 | 4.0 | 400 | 50 hr (100%) |
| Example 1 | 4.2 | 450 | 80 hr (130%) |
| Example 2 | 4.4 | 470 | 80 hr (130%) |
| Example 3 | 4.1 | 440 | 85 hr (135%) |
| Example 4 | 4.2 | 420 | 80 hr (130%) |
| Example 5 | 3.9 | 420 | 80 hr (130%) |
| Example 6 | 4.1 | 460 | 70 hr (120%) |
| Example 7 | 4.3 | 430 | 65 hr (115%) |
| Example 8 | 4.2 | 440 | 75 hr (125%) |

Referring to Table 1, it was confirmed that the light-emitting devices of Examples 1 to 8 had excellent or suitable efficiency and a long lifespan compared to the light-emitting device of Comparative Example 1.

In this regard, it is determined that such excellent or suitable characteristics above were obtained by which the layer including the electron-transporting host and the hole-transporting host additionally utilized leaking electrons and/or holes to form excitons. By reducing density of over-crowded excitons at the interface of a light-emitting zone, the deterioration of the emission layer was suppressed.

As described above, according to the one or more embodiments, a light-emitting device may exhibit improved efficiency and long lifespan, as compared with devices in the related art (e.g., Comparative Examples).

The use of "may" when describing embodiments of the present disclosure refers to "one or more embodiments of the present disclosure."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this disclosure is intended to include all higher numerical limitations subsumed therein. Accordingly, Applicant reserves the right to amend this disclosure, including the claims, to expressly recite any sub-range subsumed within the ranges expressly recited herein.

The electronic apparatus or any other relevant devices or components according to embodiments of the present disclosure described herein may be implemented utilizing any suitable hardware, firmware (e.g., an application-specific integrated circuit), software, or a combination of software, firmware, and hardware. For example, the various components of the apparatus may be formed on one integrated circuit (IC) chip or on separate IC chips. Further, the various components of the apparatus may be implemented on a flexible printed circuit film, a tape carrier package (TCP), a printed circuit board (PCB), or formed on one substrate. Further, the various components of the apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects In one or more embodiments. While one or more embodiments have been described with reference to the drawings, it will be understood by those of ordinary skill in the art that one or more suitable changes in form and details may be made therein without departing from the spirit and scope of the present disclosure as defined by the following claims and equivalents thereof.

What is claimed is:

1. A light-emitting device comprising:

a first electrode;

a second electrode facing the first electrode; and an interlayer arranged between the first electrode and the second electrode and comprising an emission layer, wherein the interlayer comprises a contact layer, the contact layer consisting of:

an electron-transporting host; and a hole-transporting host, the contact layer is in direct contact with the emission layer, and the emission layer comprises a first dopant and a second dopant, wherein an amount of the electron-transporting host in the contact layer is in a range of about 55 wt % to about 85 wt % based on 100 wt % of a total amount of the electron-transporting host and the hole-transporting host, and wherein the interlayer further comprises an electron transport layer, and the contact layer and the electron transport layer are in direct contact with each other.

2. The light-emitting device of claim 1, wherein the first electrode is an anode, the second electrode is a cathode, and the interlayer further comprises a hole transport region arranged between the first electrode and the emission layer and comprising a hole injection layer, a hole transport layer, or any combination thereof.

3. The light-emitting device of claim 1, wherein the first electrode is an anode, the second electrode is a cathode, and the interlayer further comprises an electron transport region arranged between the second electrode and the emission layer and comprising an electron transport layer, an electron injection layer, or any combination thereof.

4. The light-emitting device of claim 1, wherein the emission layer is configured to emit blue light.

5. The light-emitting device of claim 1, wherein the electron-transporting host and the hole-transporting host each have a $T_1$ energy level of greater than 2.8 eV.

6. The light-emitting device of claim 1, wherein the contact layer comprises a first layer and a second layer, the interlayer further comprises the electron transport layer and a hole transport layer, the first layer comprises an electron-transporting host and a hole-transporting host, and the hole-transporting host is greater in amount than that of the electron-transporting host, the second layer comprises an electron-transporting host and a hole-transporting host, and the electron-transporting host is greater in amount than that of the hole-transporting host, the first layer is in direct contact with the hole transport layer, and the second layer is in direct contact with the electron transport layer.

7. The light-emitting device of claim 1, wherein one of the first dopant or the second dopant is a phosphorescent dopant, and the other of the first dopant or the second dopant is a fluorescent dopant.

8. The light-emitting device of claim 1, wherein in one of the first dopant or the second dopant, intersystem crossing occurs more frequently than emission of light.

9. The light-emitting device of claim 1, wherein one of the first dopant or the second dopant is a phosphorescent dopant, and the other of the first dopant or the second dopant is a fluorescent dopant, and in the phosphorescent dopant, intersystem crossing occurs more frequently than emission of light.

10. The light-emitting device of claim 7, wherein the fluorescent dopant is a thermally activated delayed fluorescence dopant.

11. The light-emitting device of claim 1, wherein the hole-transporting host is one of compounds HT-01 to HT-17:

HT-01

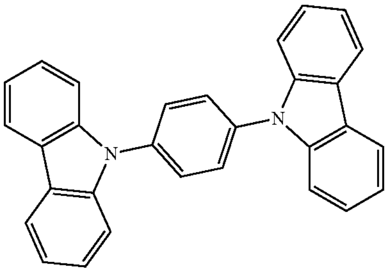

HT-02

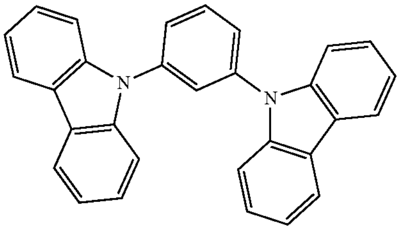

HT-03

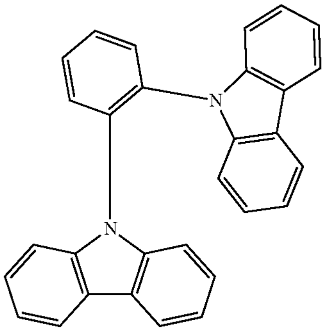

HT-04

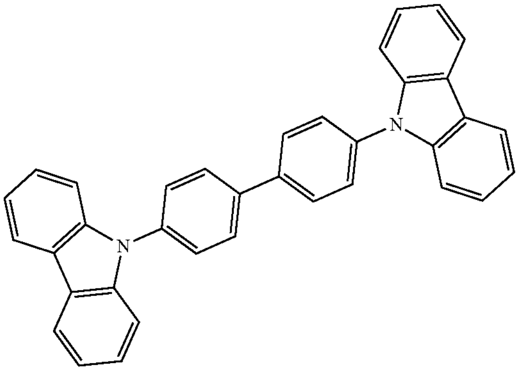

-continued

HT-05

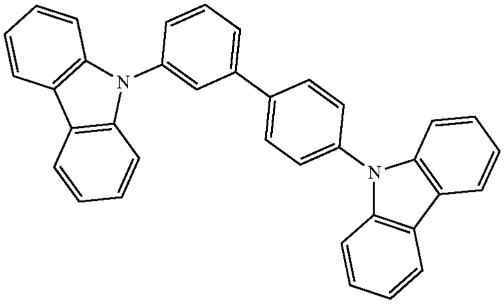

HT-06

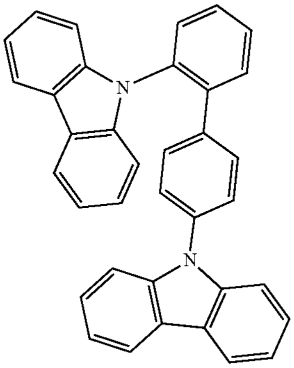

HT-07

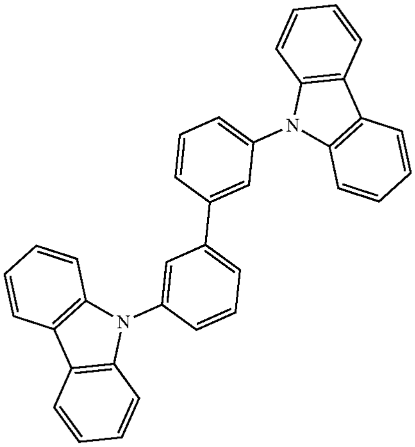

HT-08

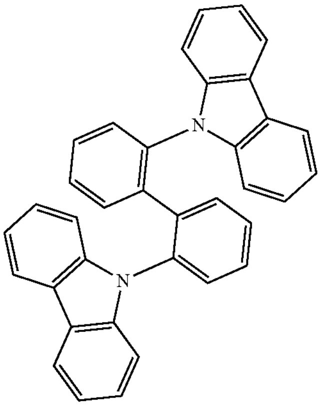

-continued
HT-09
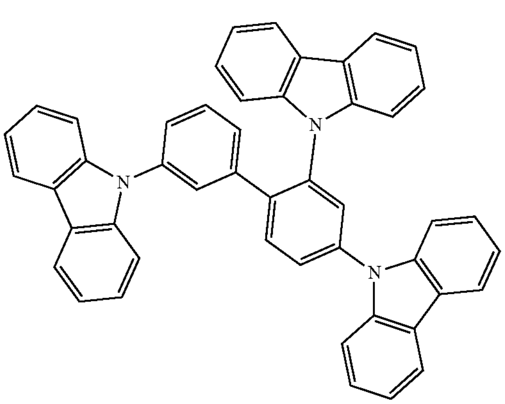
HT-10
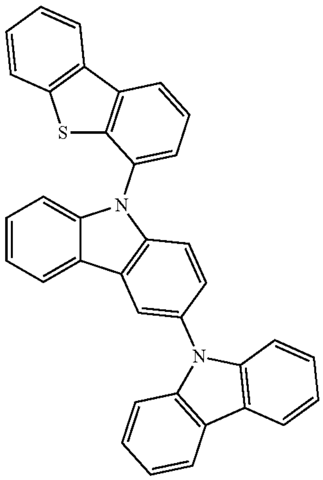
HT-11
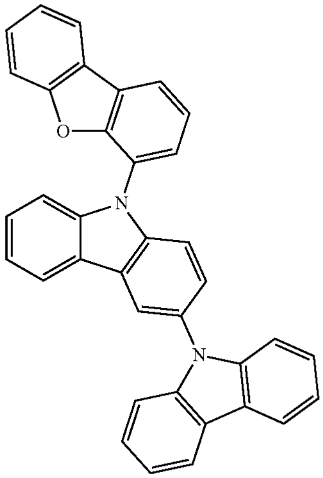
-continued
HT-12
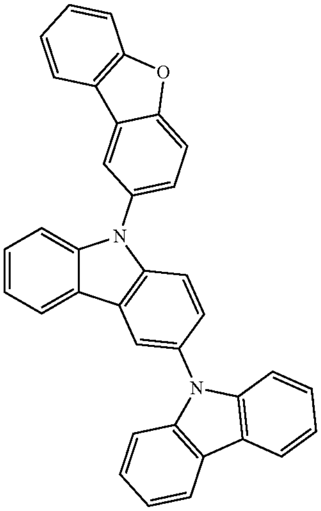
HT-13
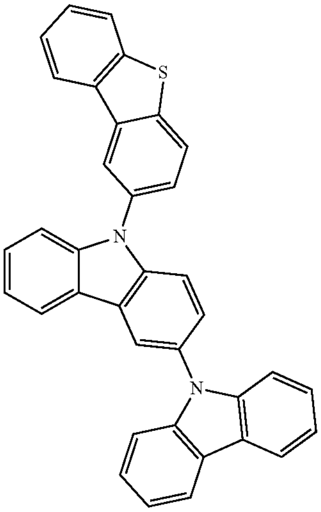
HT-14
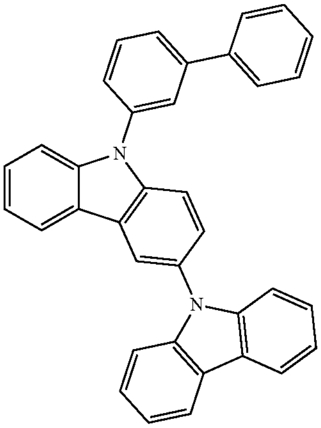

-continued
HT-15
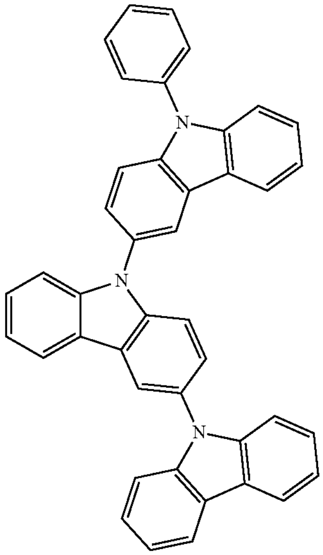
HT-16
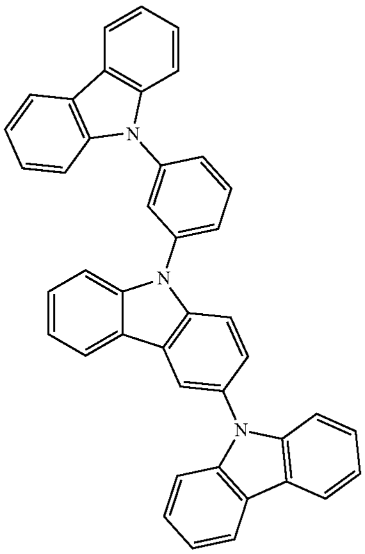
HT-17
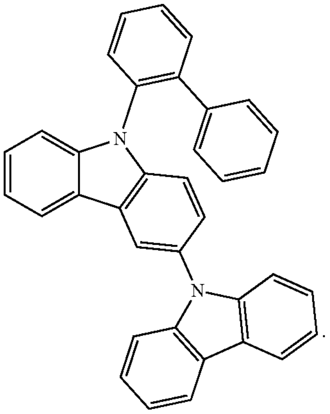
12. The light-emitting device of claim 1, wherein the electron-transporting host is one of compounds ET-01 to ET-015:
ET-01
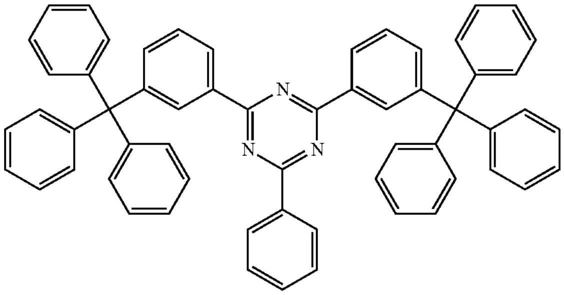
ET-02
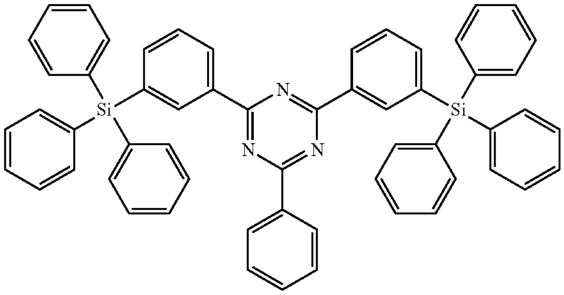
ET-03
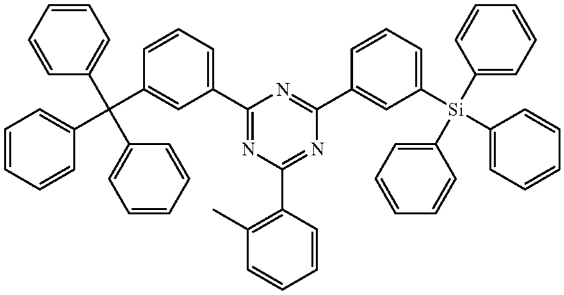
ET-04
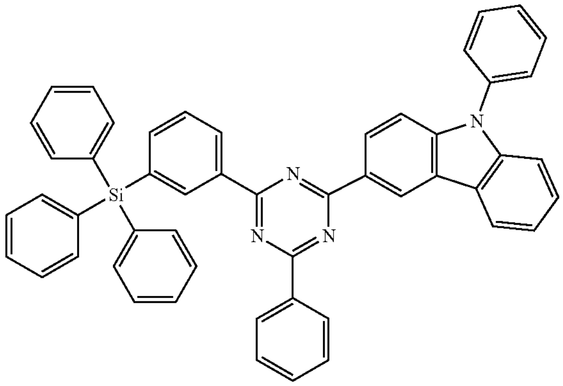

-continued
ET-05
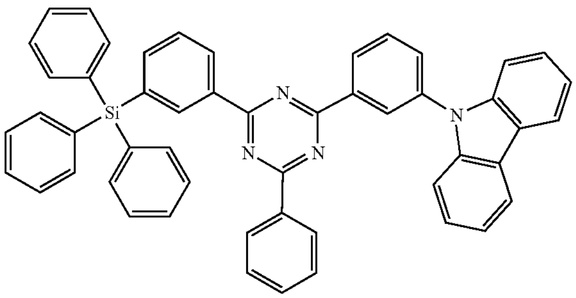
ET-06
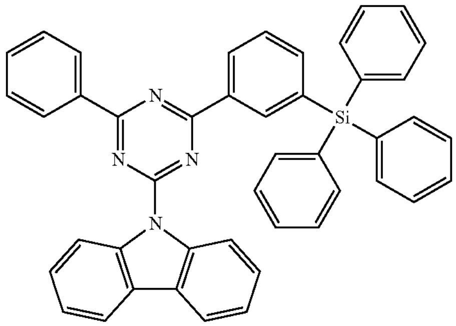
ET-07
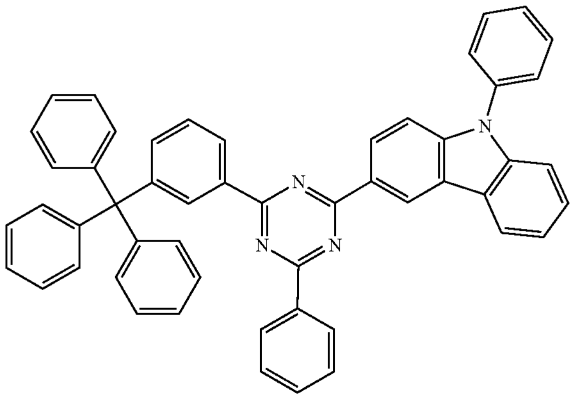
ET-08
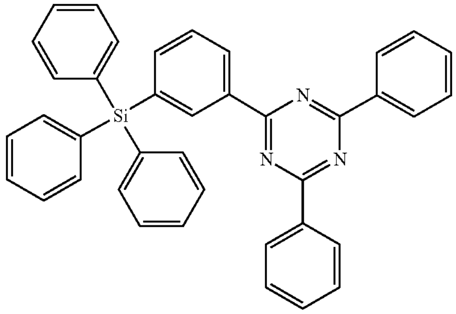
-continued
ET-09
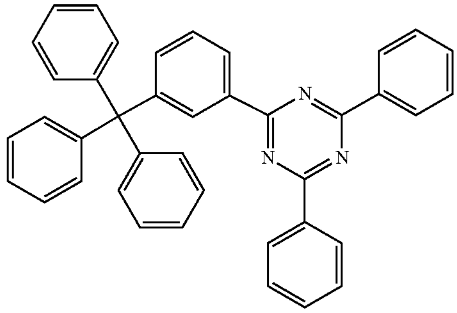
ET-010
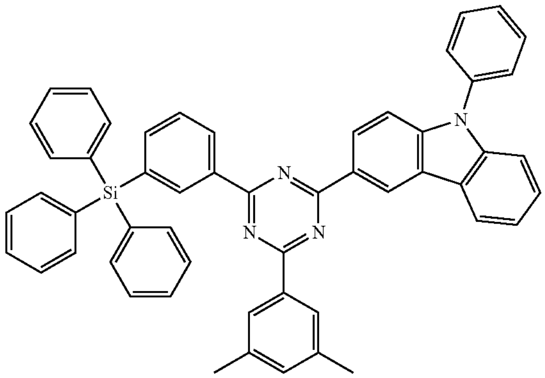
ET-011
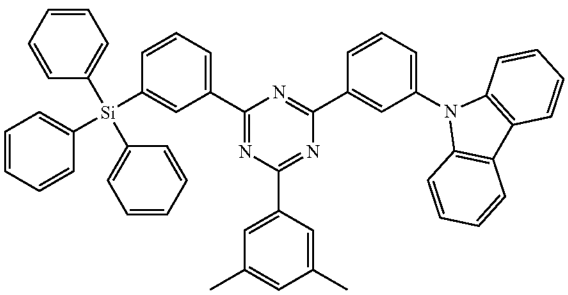
ET-012
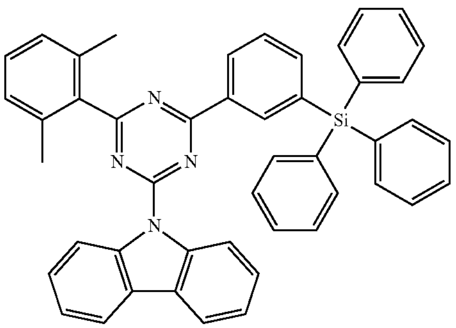

-continued
ET-013
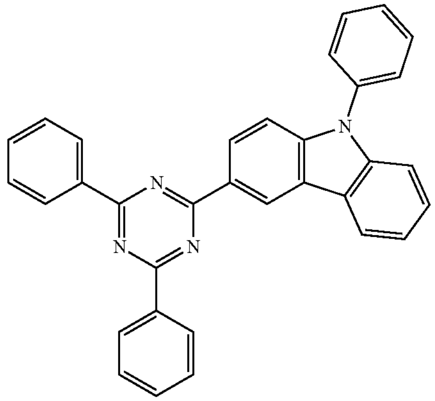
ET-014
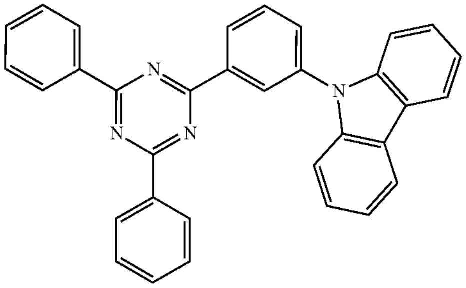
ET-015
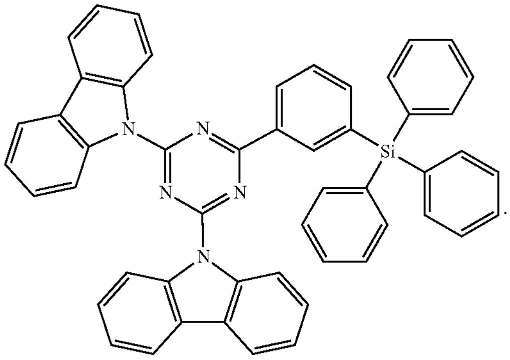
13. The light-emitting device of claim 7, wherein the phosphorescent dopant is one of compounds 1 to 120:
1
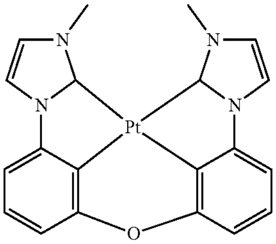
-continued
2
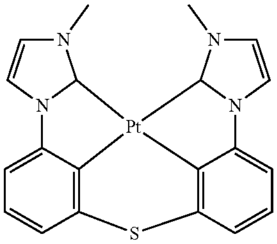
3
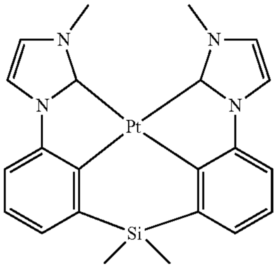
4
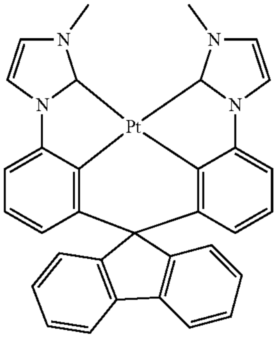
5
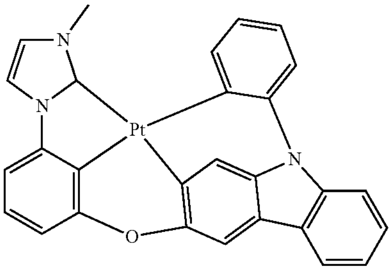
6
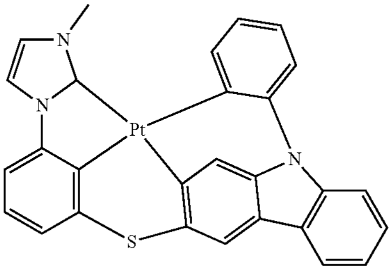

-continued
7
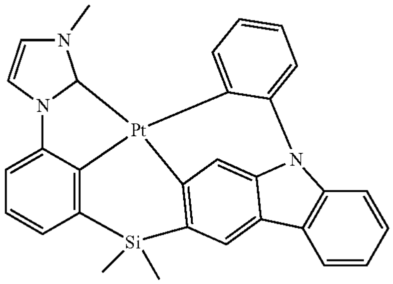
8
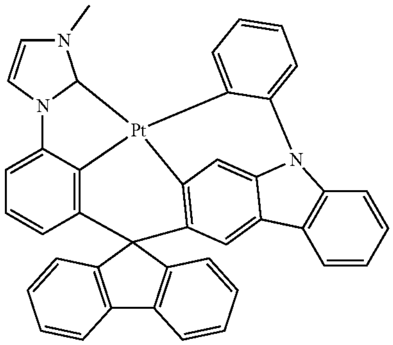
9
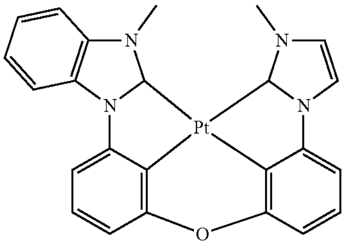
10
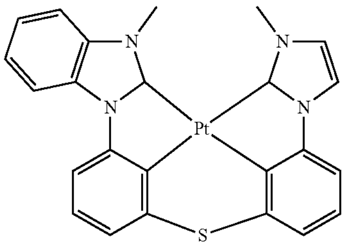
11
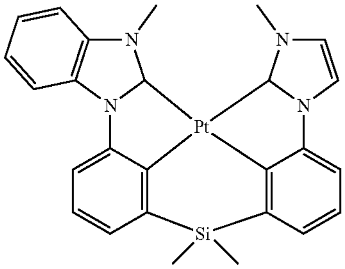
-continued
12
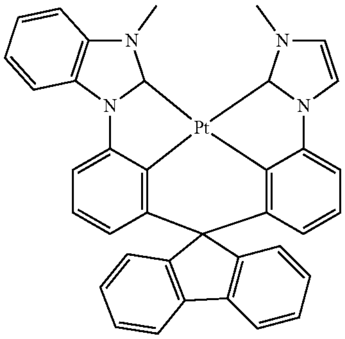
13
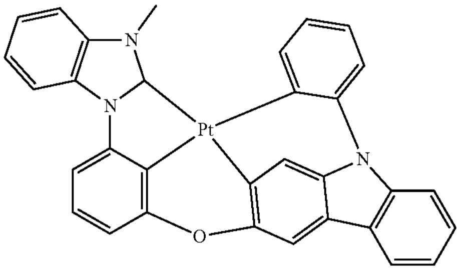
14
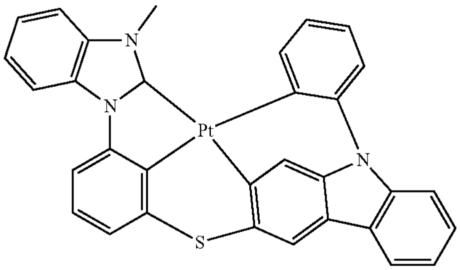
15
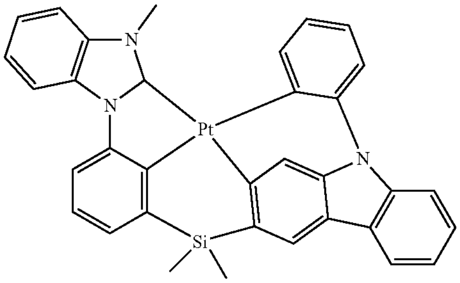
16
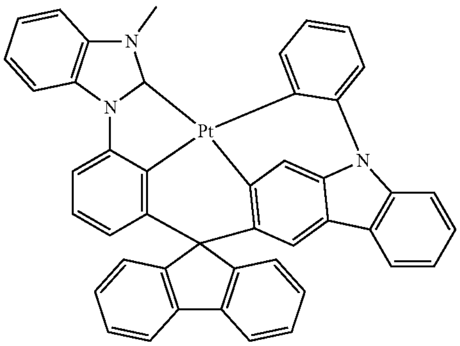

-continued
17
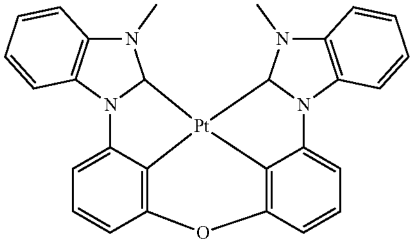
18
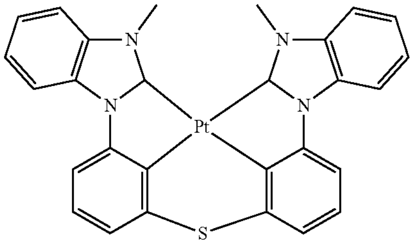
19
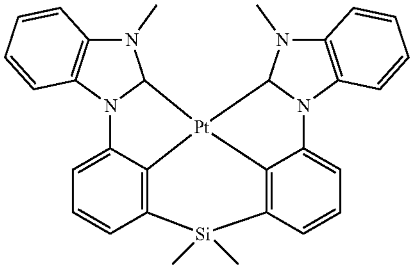
20
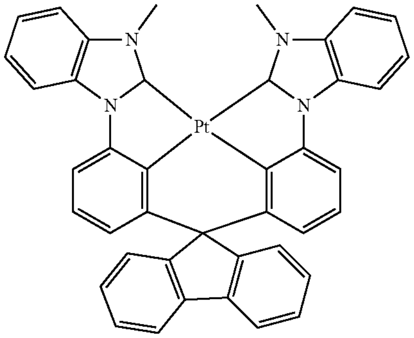
21
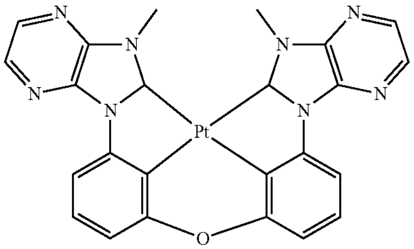
22
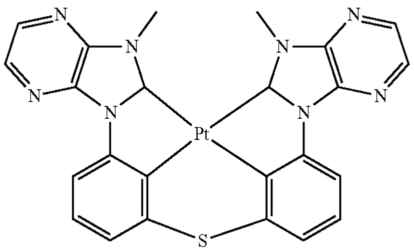
-continued
23
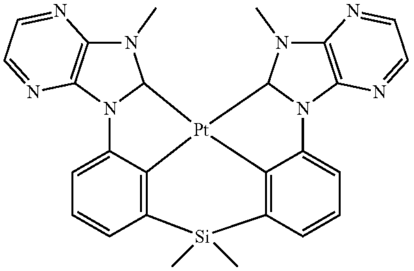
24
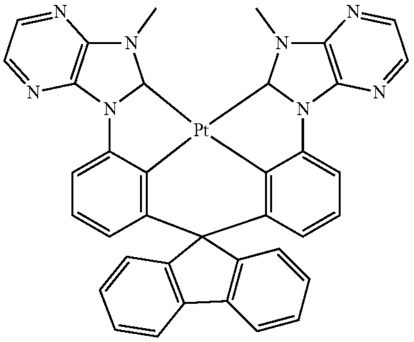
25
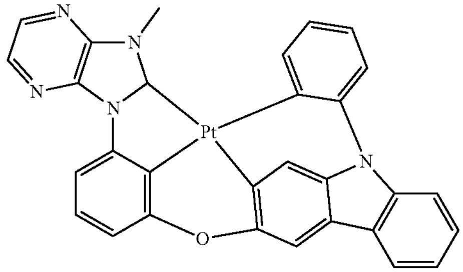
26
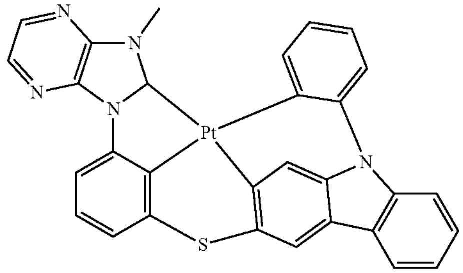
27
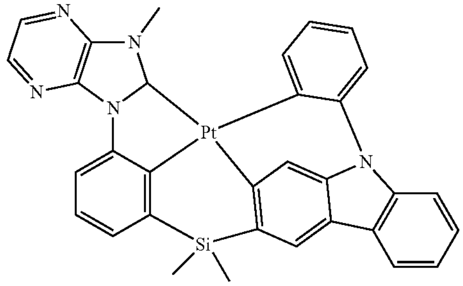

28
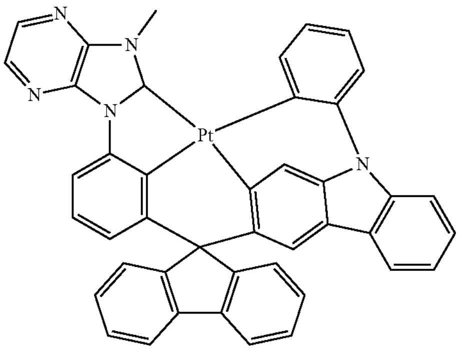
29
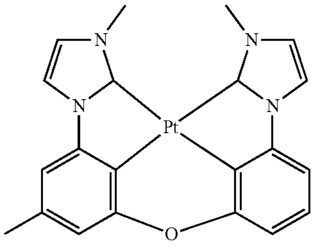
30
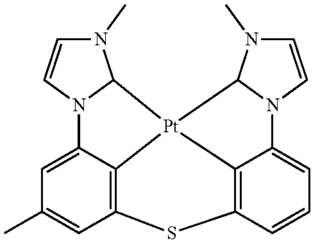
31
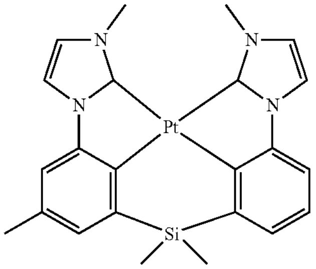
32
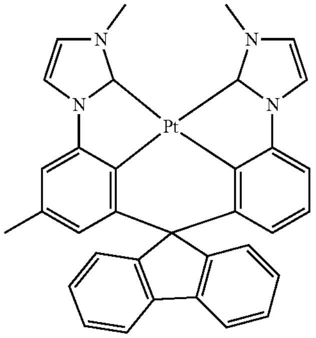
33
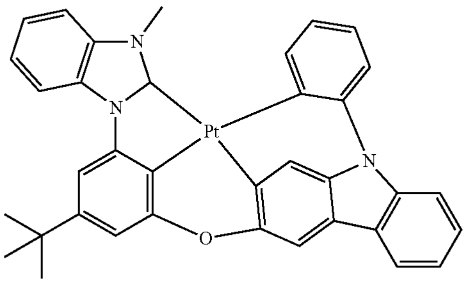
34
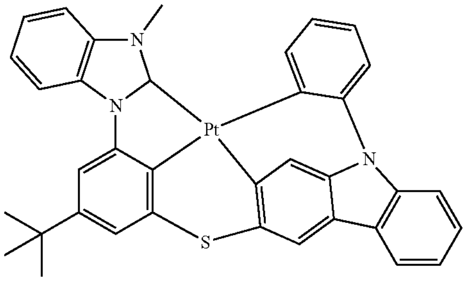
35
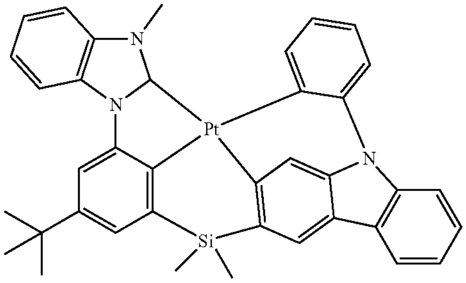
36
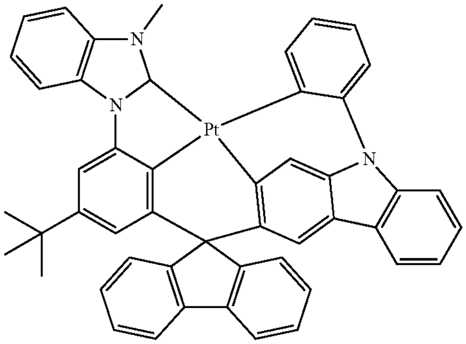
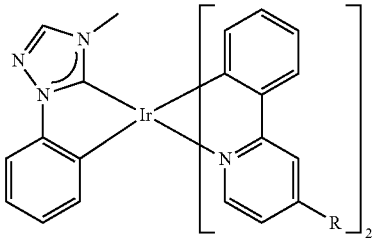
37 (R = H)
38 (R = Me)
39 (R = iso-Pr)
40 (R = tert-Bu)
41 (R = $NMe_2$)

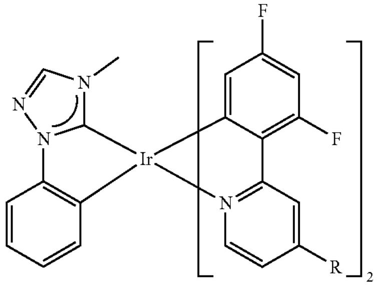
42 (R = H)
43 (R = Me)
44 (R = iso-Pr)
45 (R = tert-Bu)
46 (R = $NMe_2$)
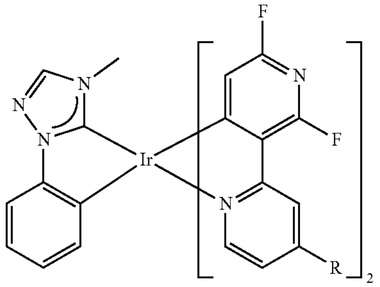
47 (R = H)
48 (R = Me)
49 (R = iso-Pr)
50 (R = tert-Bu)
51 (R = $NMe_2$)
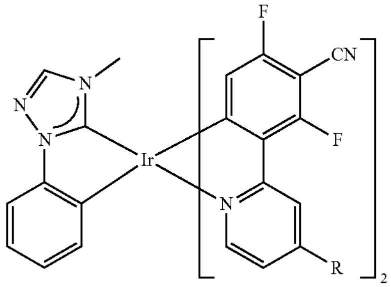
52 (R = H)
53 (R = Me)
54 (R = iso-Pr)
55 (R = tert-Bu)
56 (R = $NMe_2$)
57
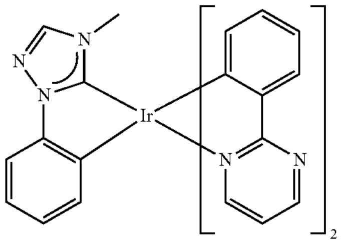
58
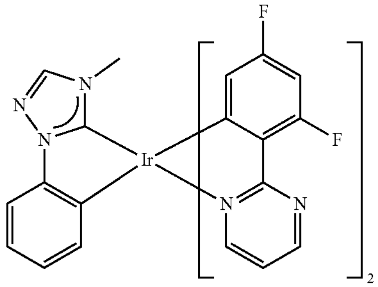
59
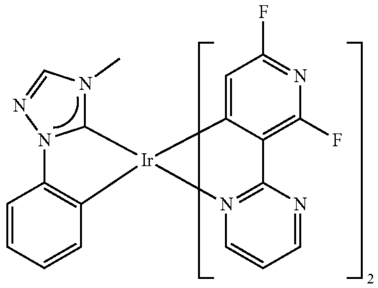
60
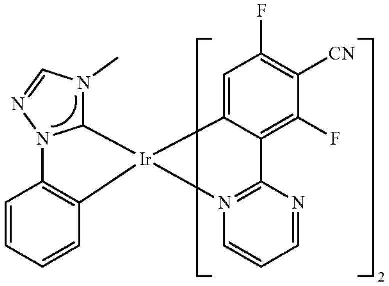
61
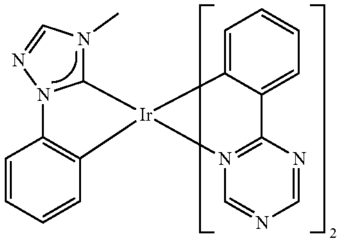
62
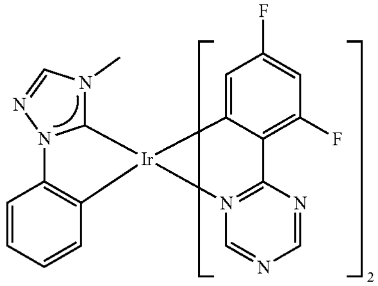

-continued
63
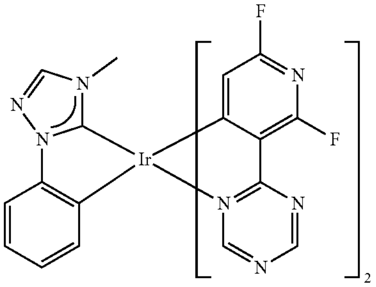
64
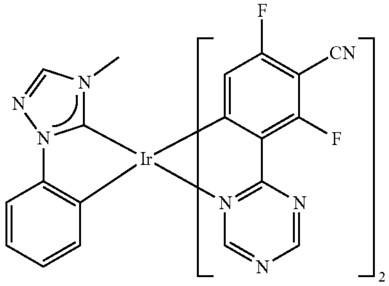
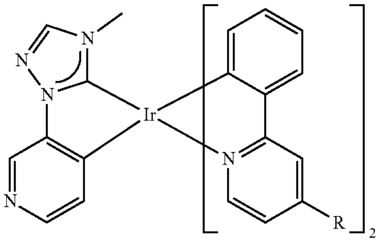
65 (R = H)
66 (R = Me)
67 (R = iso-Pr)
68 (R = tert-Bu)
69 (R = $NMe_2$)
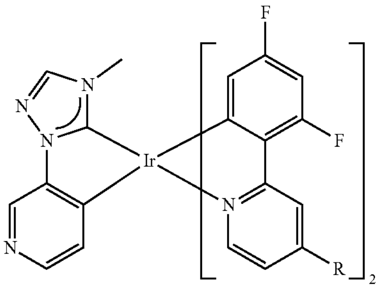
70 (R = H)
71 (R = Me)
72 (R = iso-Pr)
73 (R = tert-Bu)
74 (R = $NMe_2$)
-continued
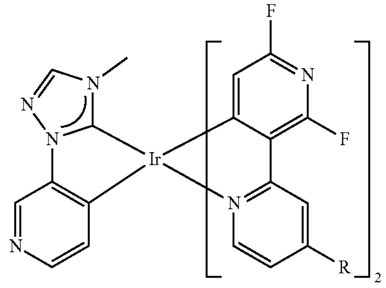
75 (R = H)
76 (R = Me)
77 (R = iso-Pr)
78 (R = tert-Bu)
79 (R = $NMe_2$)
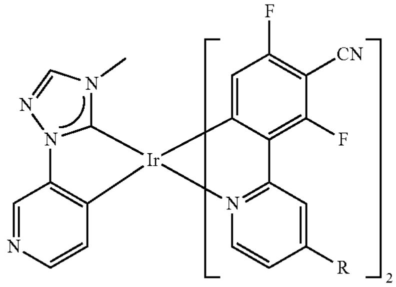
80 (R = H)
81 (R = Me)
82 (R = iso-Pr)
83 (R = tert-Bu)
84 (R = $NMe_2$)
85
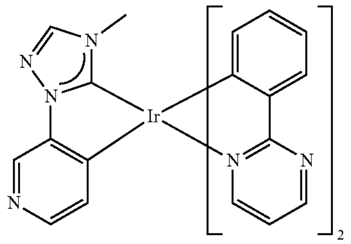
86
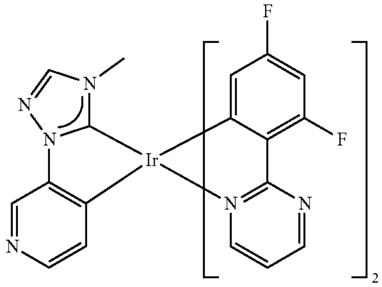
87
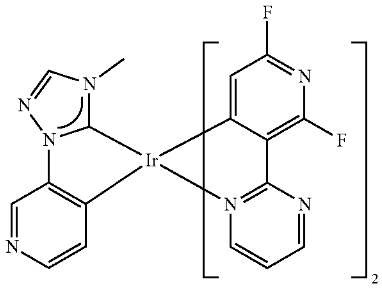

88
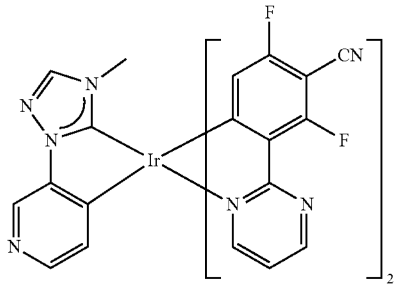
89
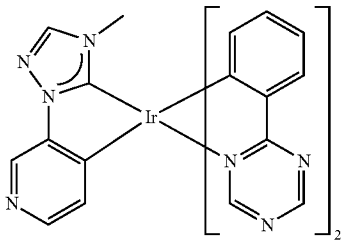
90
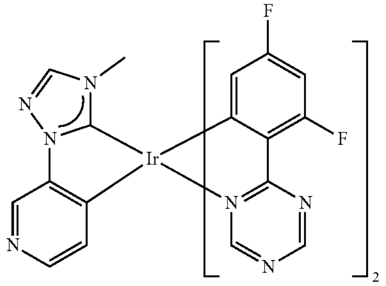
91
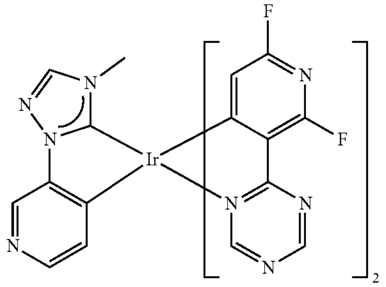
92
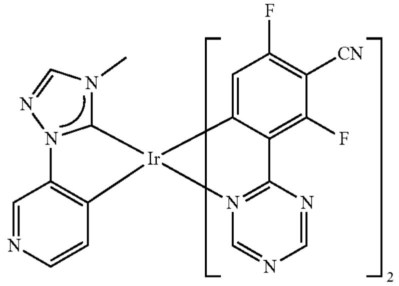
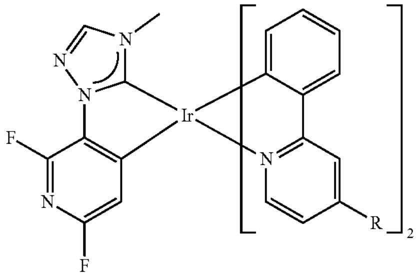
93 (R = H)
94 (R = Me)
95 (R = iso-Pr)
96 (R = tert-Bu)
97 (R = $NMe_2$)
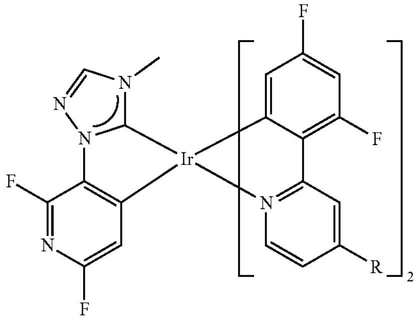
98 (R = H)
99 (R = Me)
100 (R = iso-Pr)
101 (R = tert-Bu)
102 (R = $NMe_2$)
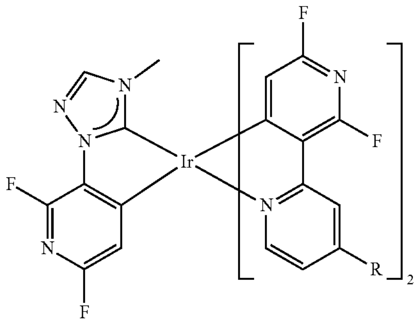
103 (R = H)
104 (R = Me)
105 (R = iso-Pr)
106 (R = tert-Bu)
107 (R = $NMe_2$)

-continued
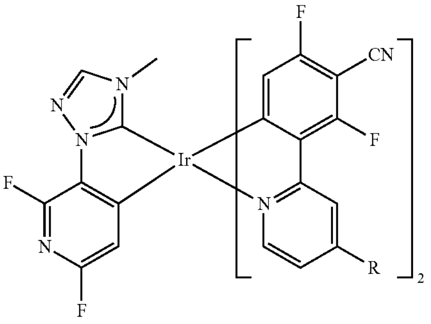
108 (R = H)
109 (R = Me)
110 (R = iso-Pr)
111 (R = tert-Bu)
112 (R = $NMe_2$)
113
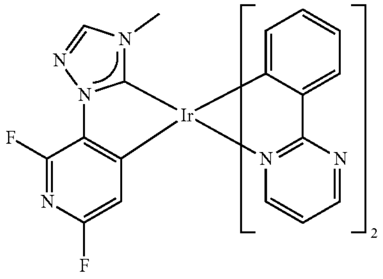
114
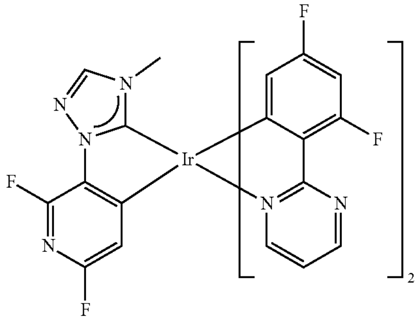
115
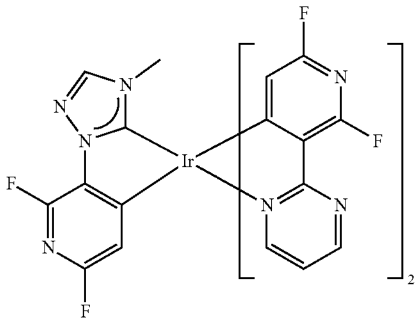
-continued
116
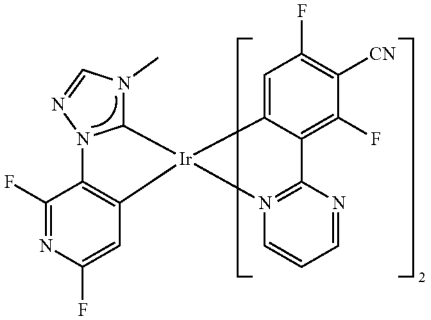
117
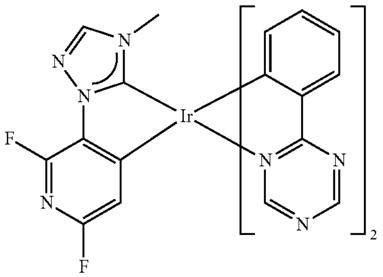
118
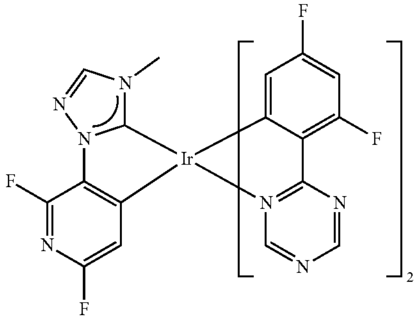
119
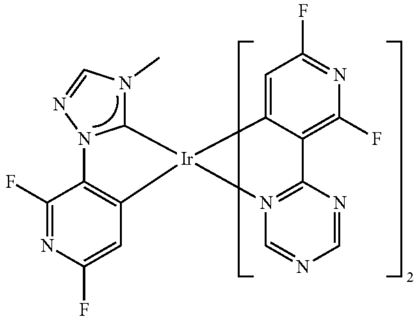
120
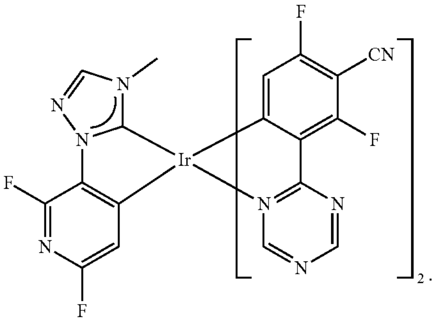
14. The light-emitting device of claim 7, wherein the fluorescent dopant is one of compounds D-01 to D-52:

D-01
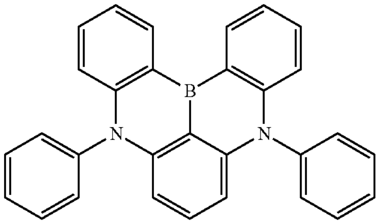
D-02
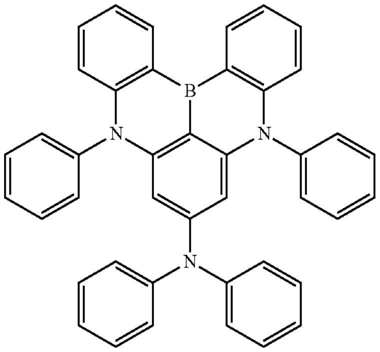
D-03
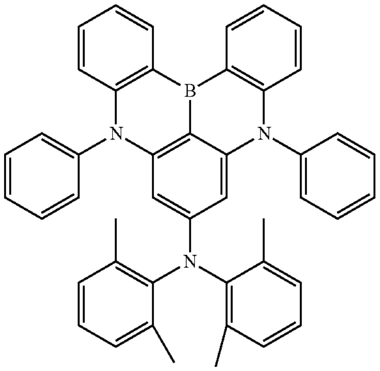
D-04
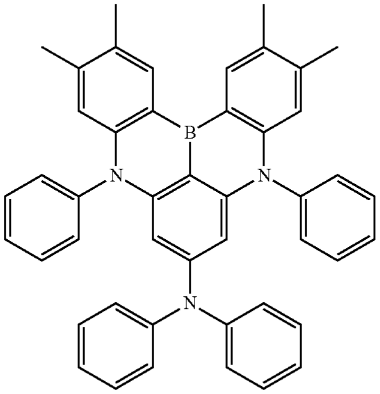
-continued
D-05
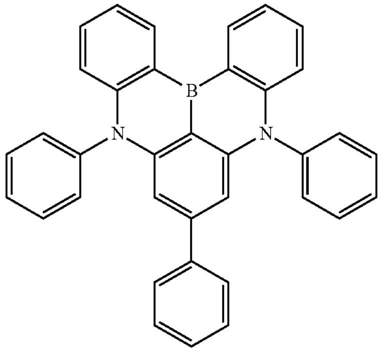
D-06
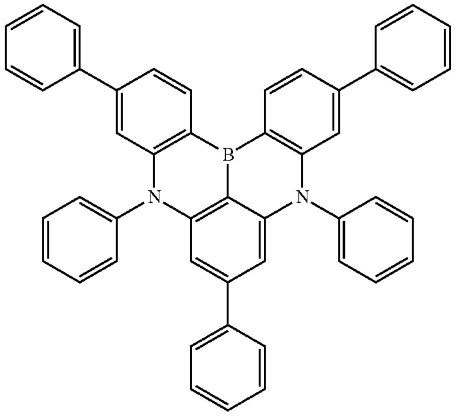
D-07
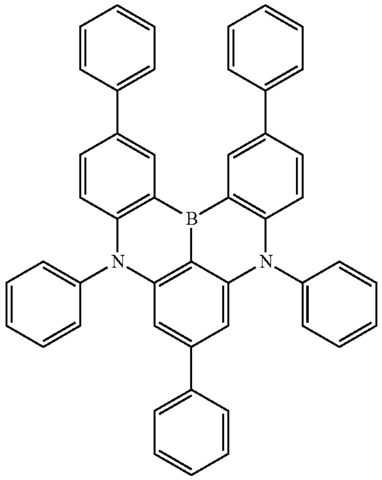

-continued
D-08
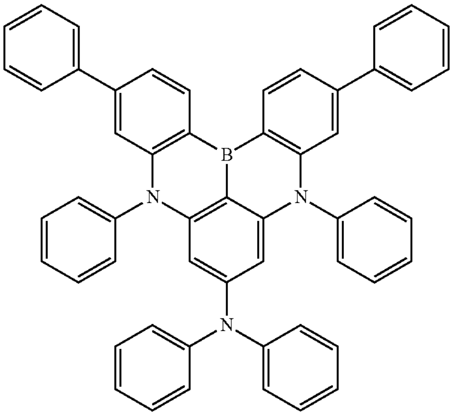
D-09
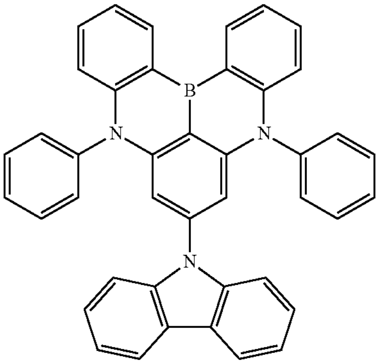
D-10
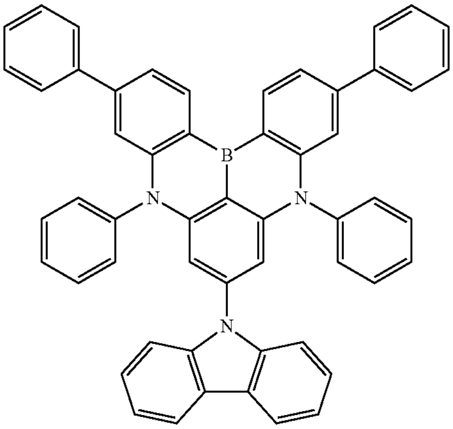
-continued
D-11
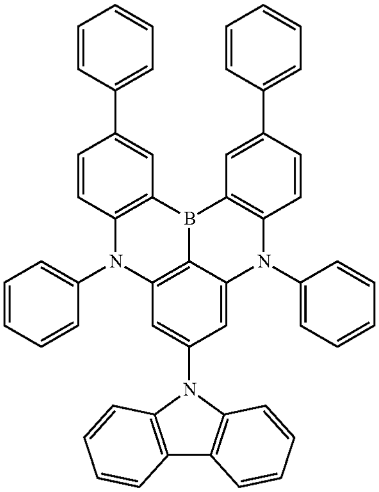
D-12
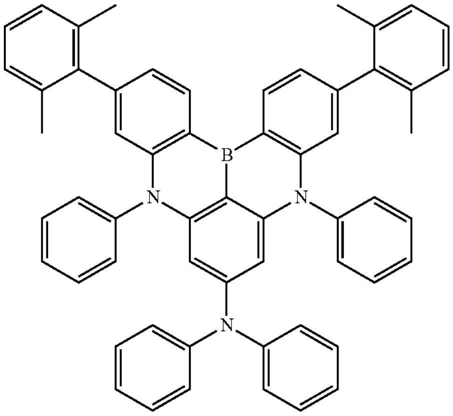
D-13
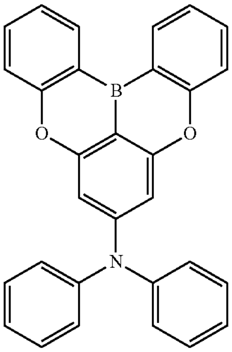
D-14
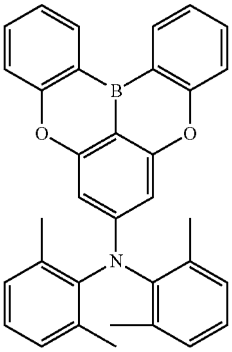

-continued
D-15
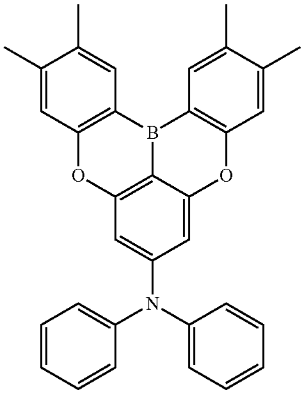
D-16
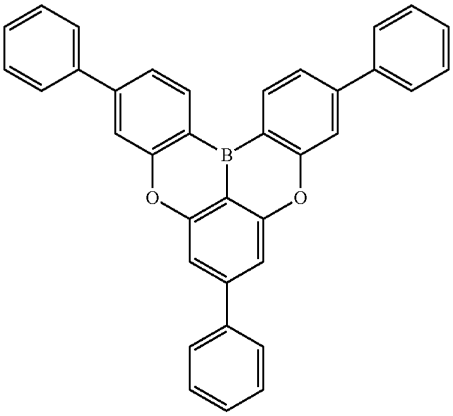
D-17
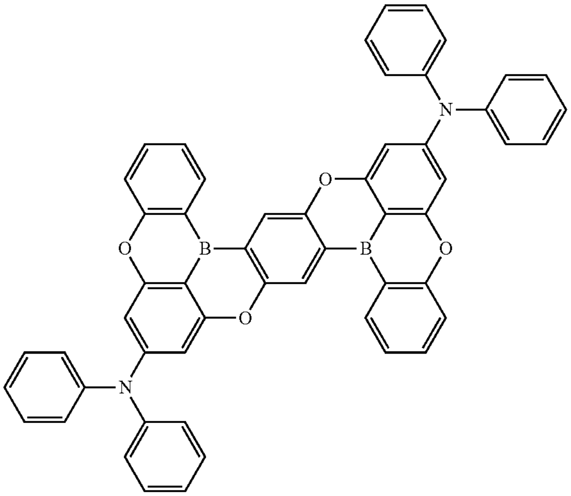
-continued
D-18
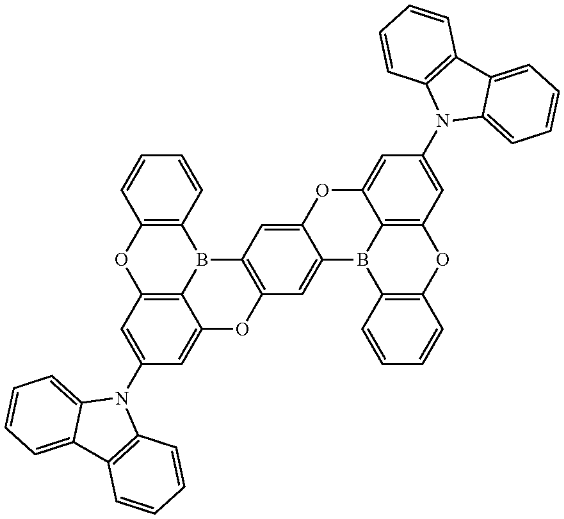
D-19
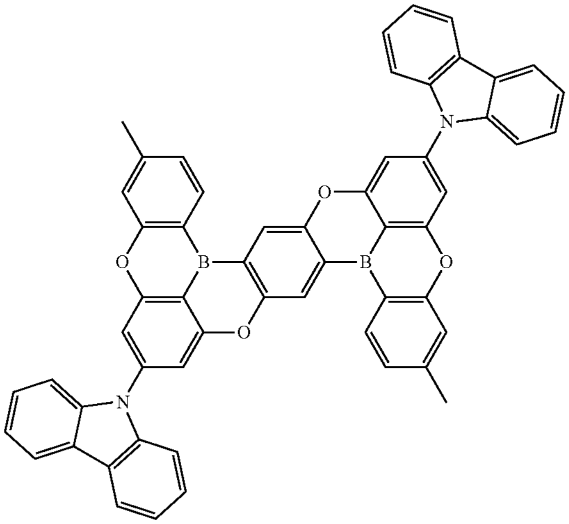
D-20
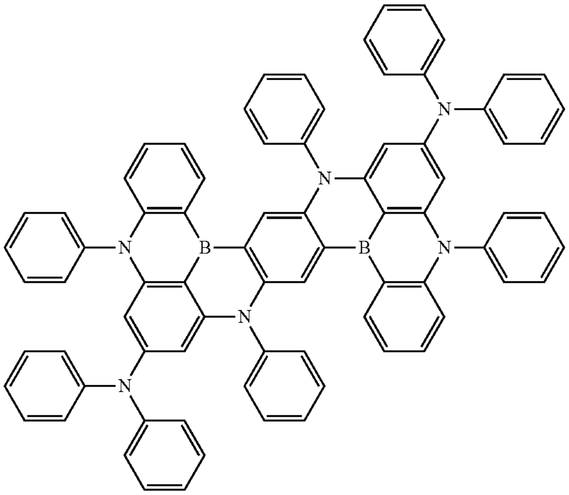

-continued
D-21
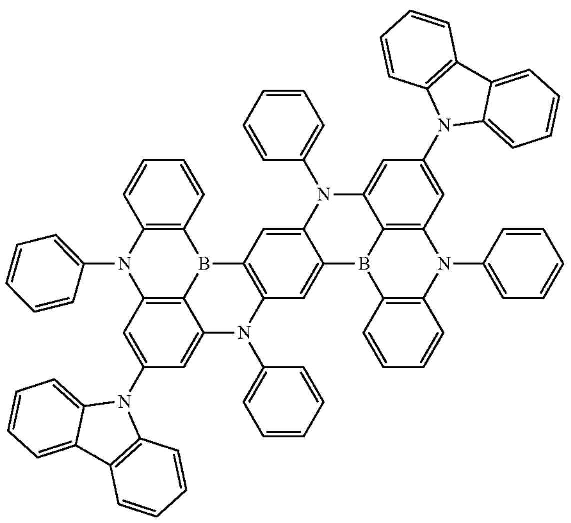
D-22
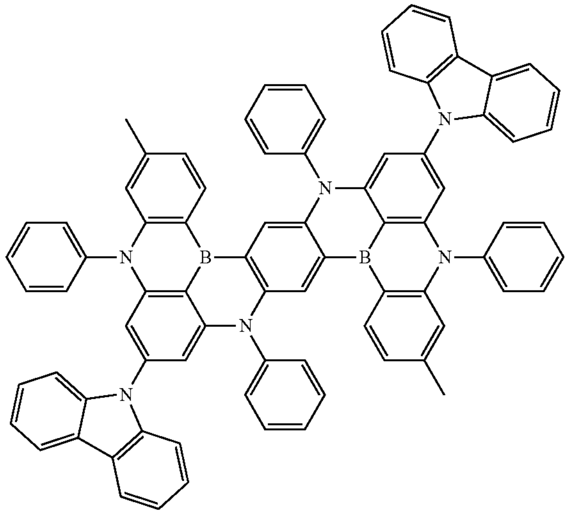
D-23
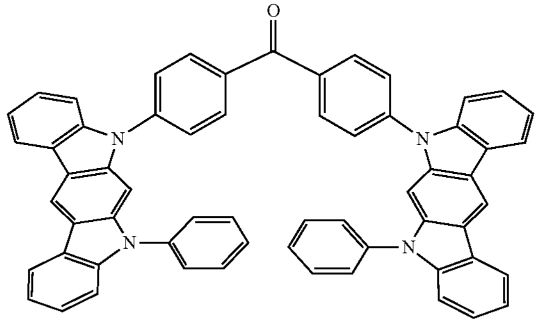
-continued
D-24
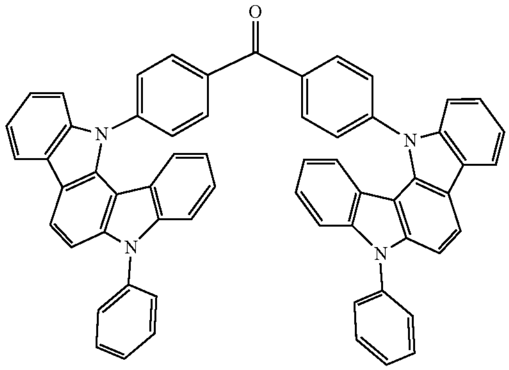
D-25
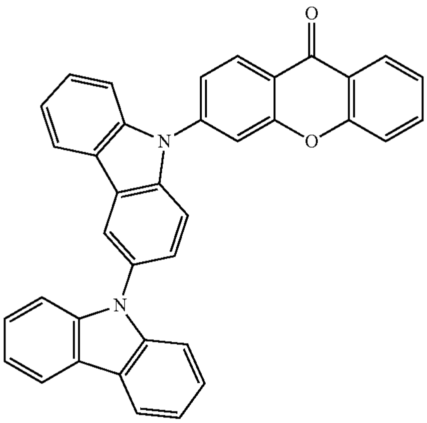
D-26
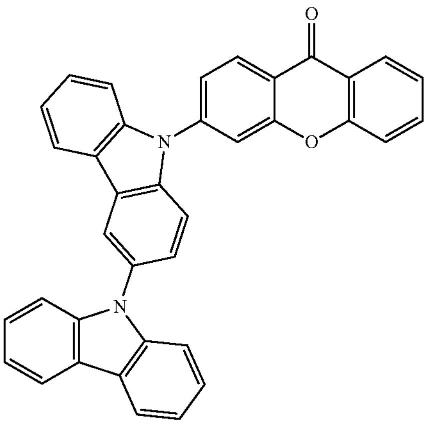
D-27
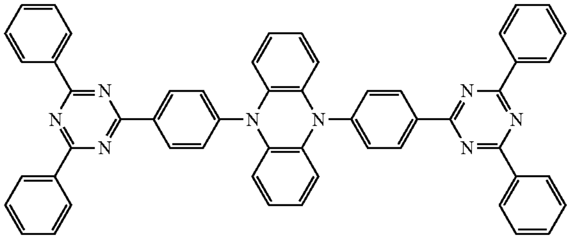

-continued
D-28
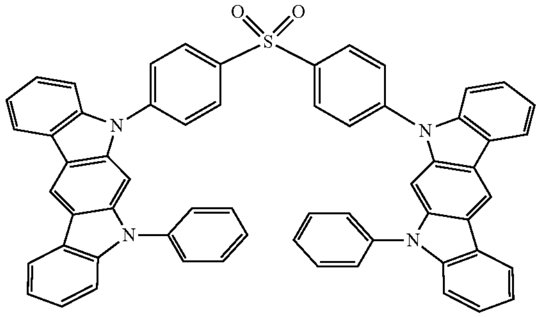
D-29
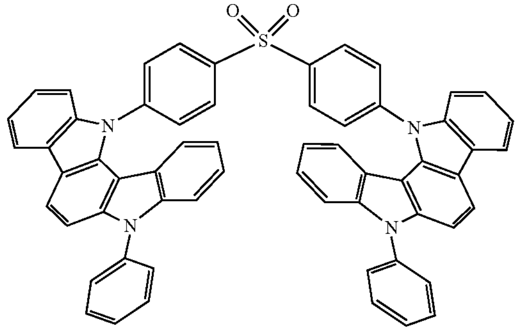
D-30
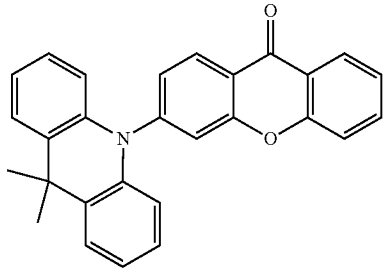
D-31
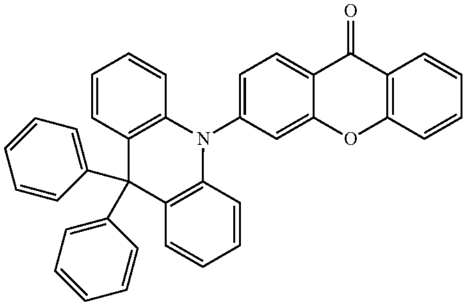
D-32
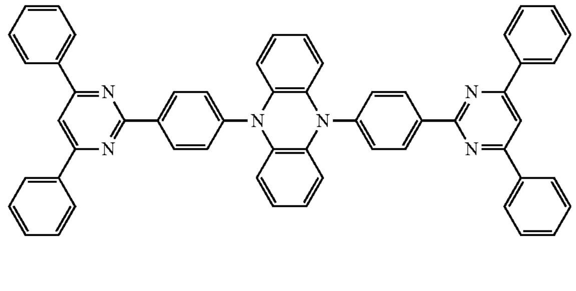
-continued
D-33
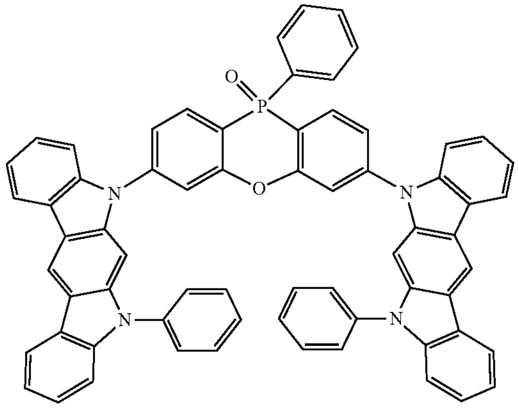
D-34
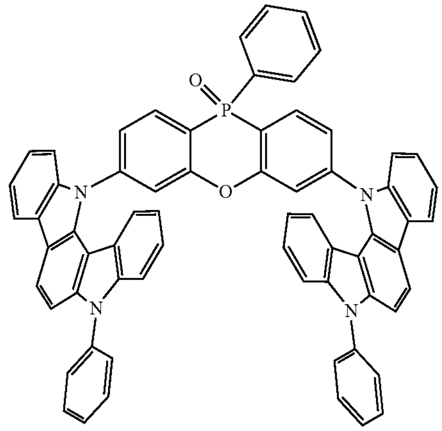
D-35
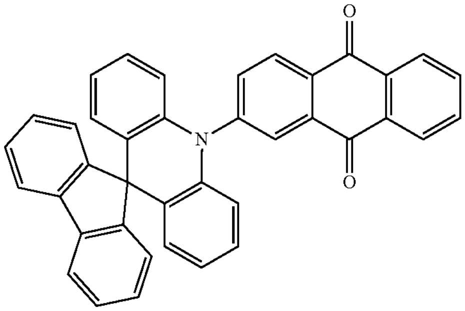
D-36
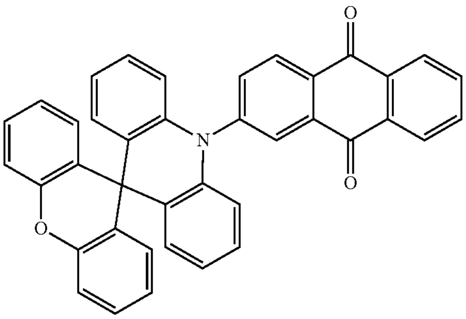

-continued
D-37
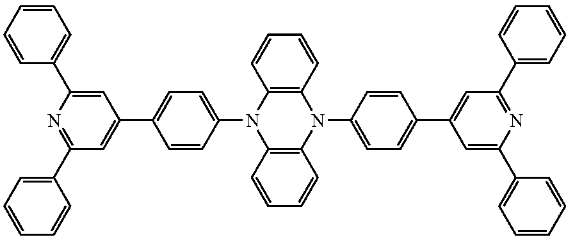
D-38
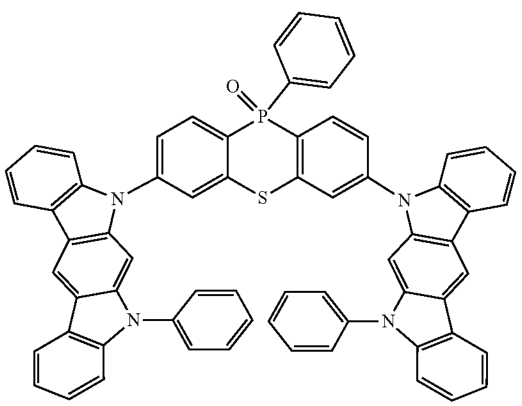
D-39
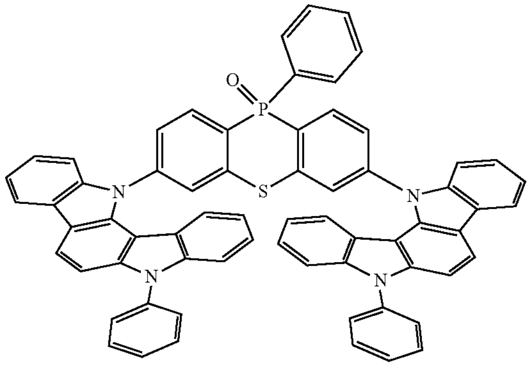
D-40
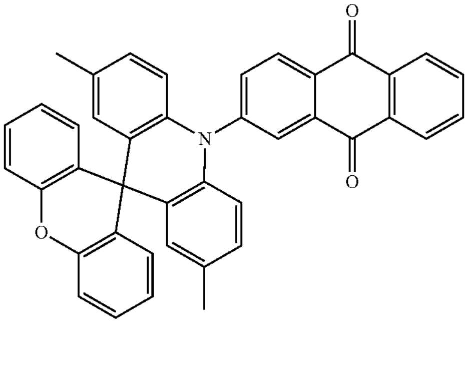
-continued
D-41
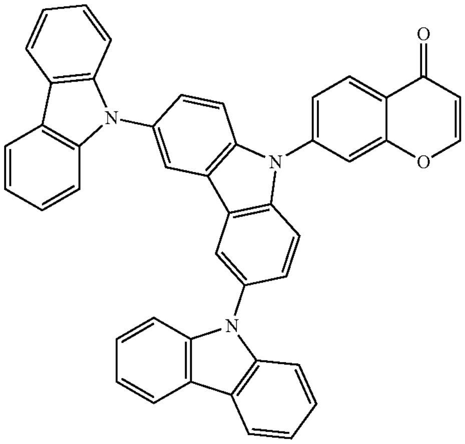
D-42
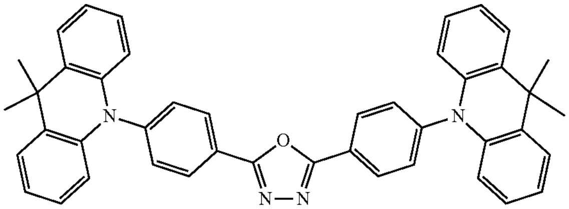
D-43
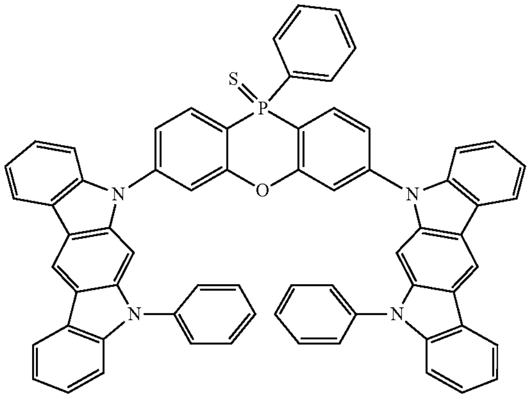
D-44
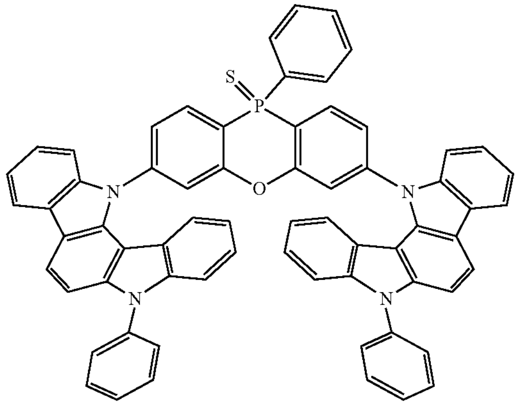

-continued

D-45

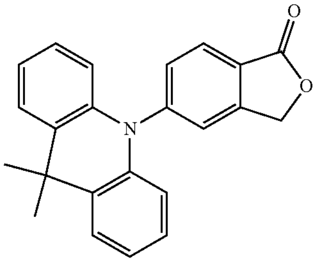

D-46

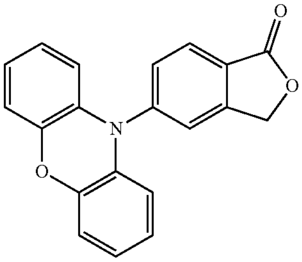

D-47

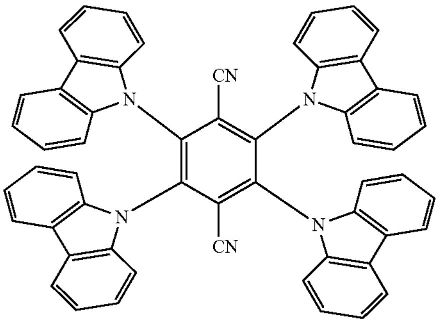

D-48

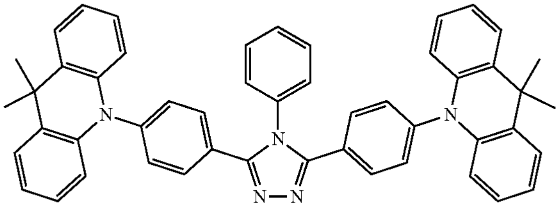

D-49

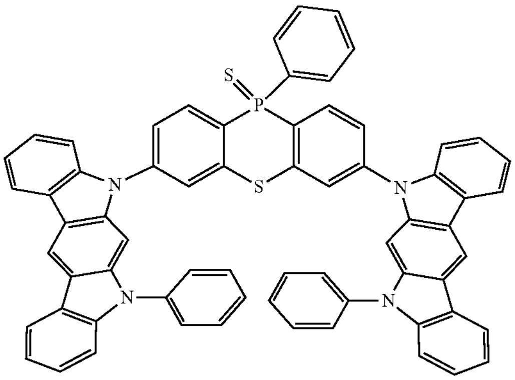

-continued

D-50

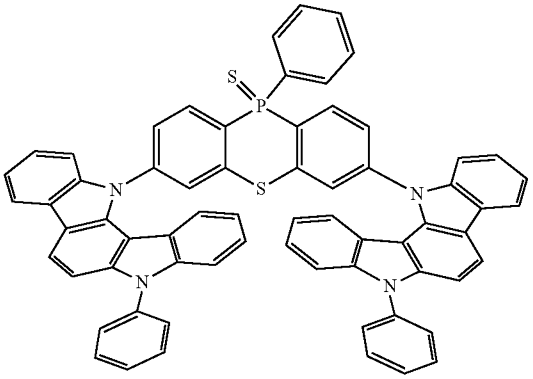

D-51

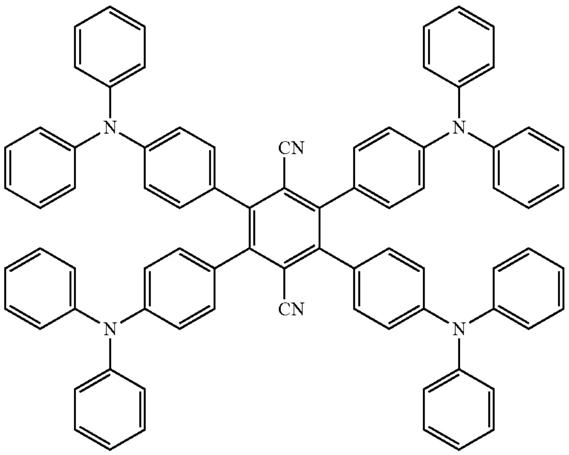

D-52

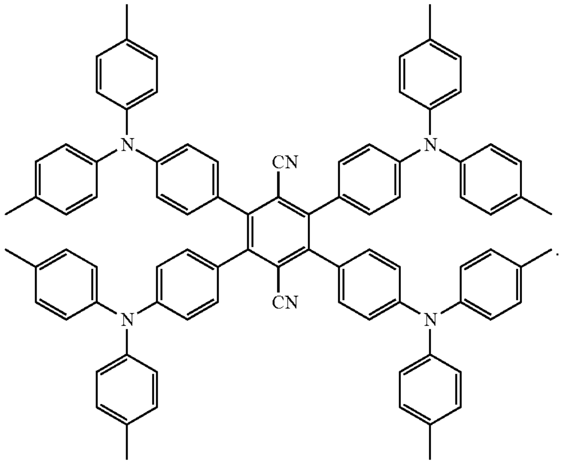

.

15. An electronic apparatus comprising the light-emitting device of claim 1.

16. The electronic apparatus of claim 15, further comprising a thin-film transistor, wherein the thin-film transistor comprises a source electrode and a drain electrode, and the first electrode of the light-emitting device is electrically connected to the source electrode or the drain electrode.

* * * * *